(12) United States Patent
De Bruyn et al.

(10) Patent No.: US 12,545,733 B2
(45) Date of Patent: Feb. 10, 2026

(54) ANTI-CD103 ANTIBODIES

(71) Applicants: IMMIOS HOLDING B.V., Oss (NL); RIJKSUNIVERSITEIT GRONINGEN, Groningen (NL); ACADEMISCH ZIEKENHUIS GRONINGEN, Groningen (NL)

(72) Inventors: Marco De Bruyn, Haren (NL); Klaas Jan-Derek Kol, Groningen (NL); Hans Wilhelm Nijman, Groningen (NL); Hans Van Eenennaam, Velp (NL); Sander Martinus Johannes Van Duijnhoven, Uden (NL)

(73) Assignees: IMMIOS HOLDING B.V., Oss (NL); RIJKSUNIVERSITEIT GRONINGEN, Groningen (NL); ACADEMISCH ZIEKENHUIS GRONINGEN, Groningen (NL)

( * ) Notice: Subject to any disclaimer, the term of this patent is extended or adjusted under 35 U.S.C. 154(b) by 749 days.

(21) Appl. No.: 17/997,240

(22) PCT Filed: Apr. 30, 2021

(86) PCT No.: PCT/EP2021/061450
§ 371 (c)(1),
(2) Date: Mar. 13, 2023

(87) PCT Pub. No.: WO2021/219871
PCT Pub. Date: Nov. 4, 2021

(65) Prior Publication Data
US 2023/0183354 A1      Jun. 15, 2023

Related U.S. Application Data

(60) Provisional application No. 62/704,258, filed on Apr. 30, 2020.

(51) Int. Cl.
| C07K 16/28 | (2006.01) |
| A61K 51/10 | (2006.01) |
| G01N 33/533 | (2006.01) |

(52) U.S. Cl.
CPC ...... *C07K 16/2839* (2013.01); *A61K 51/1027* (2013.01); *A61K 51/1093* (2013.01);
(Continued)

(58) Field of Classification Search
None
See application file for complete search history.

(56) References Cited

U.S. PATENT DOCUMENTS

| 4,399,216 A | 8/1983 | Axel et al. |
| 4,439,196 A | 3/1984 | Higuchi |

(Continued)

FOREIGN PATENT DOCUMENTS

| EP | 0216846 A1 | 4/1987 |
| EP | 0256055 A1 | 2/1988 |

(Continued)

OTHER PUBLICATIONS

International Search Report and Written Opinion issued Dec. 7, 2021 in PCT/EP2021/061450 (49 pages).

(Continued)

*Primary Examiner* — Karl J Puttlitz
(74) *Attorney, Agent, or Firm* — Michael A. Whittaker

(57) ABSTRACT

The present invention relates to anti-CD 103 antibodies, as well as use of these antibodies in diagnosis, prognosis, monitoring, and treatment of diseases. Also disclosed is an imaging agent comprising the anti-CD 103 antibody and a detectable label, wherein the antibody either does not block CD 103 binding to E-cadherin or at least partially blocks CD 103 binding to E-cadherin. The methods of treatment involve administering the anti CD 103 antibody which may (Continued)

be optionally coupled to a cytotoxic agent. Diseases to be treated include e.g. Hairy Cell leukemia, HCLv, intestinal and extraintestinal lymphomas, enteropathy-associated T-cell lymphoma (EATL), T-lymphoblastic leukemia/lymphoma (T-ALL), T-cell prolymphocytic leukemia (T-PLL), adult T cell leukemia/lymphoma (ATLL), mycosis fungoides (ME), anaplastic large cell lymphoma ALCL, cutaneous T-cell lymphoma (CTCL), Sezary Syndrome (SS), Alzheimer's disease, Parkinson's disease or multiple sclerosis.

34 Claims, 16 Drawing Sheets

Specification includes a Sequence Listing.

(52) U.S. Cl.
CPC ....... *G01N 33/533* (2013.01); *C07K 2317/24* (2013.01); *C07K 2317/52* (2013.01); *C07K 2317/565* (2013.01)

(56) References Cited

U.S. PATENT DOCUMENTS

| | | |
|---|---|---|
| 4,447,224 A | 5/1984 | Decant, Jr. et al. |
| 4,447,233 A | 5/1984 | Mayfield |
| 4,487,603 A | 12/1984 | Harris |
| 4,596,556 A | 6/1986 | Morrow et al. |
| 4,740,461 A | 4/1988 | Kaufman |
| 4,790,824 A | 12/1988 | Morrow et al. |
| 4,816,567 A | 3/1989 | Cabilly et al. |
| 4,899,755 A | 2/1990 | Lauffer et al. |
| 4,912,040 A | 3/1990 | Kaufman et al. |
| 4,941,880 A | 7/1990 | Burns |
| 4,946,778 A | 8/1990 | Ladner et al. |
| 4,959,455 A | 9/1990 | Clark et al. |
| 5,064,413 A | 11/1991 | McKinnon et al. |
| 5,260,203 A | 11/1993 | Ladner et al. |
| 5,312,335 A | 5/1994 | McKinnon et al. |
| 5,383,851 A | 1/1995 | McKinnon, Jr. et al. |
| 5,399,163 A | 3/1995 | Peterson et al. |
| 5,474,756 A | 12/1995 | Tweedle et al. |
| 5,530,101 A | 6/1996 | Queen et al. |
| 5,532,210 A | 7/1996 | Shen |
| 5,585,089 A | 12/1996 | Queen et al. |
| 5,624,821 A | 4/1997 | Winter et al. |
| 5,643,575 A | 7/1997 | Martinez et al. |
| 5,648,260 A | 7/1997 | Winter et al. |
| 5,672,662 A | 9/1997 | Harris et al. |
| 5,677,425 A | 10/1997 | Bodmer et al. |
| 5,693,762 A | 12/1997 | Queen et al. |
| 5,705,153 A | 1/1998 | Shorr et al. |
| 5,714,350 A | 2/1998 | Co et al. |
| 5,730,990 A | 3/1998 | Greenwald et al. |
| 5,846,519 A | 12/1998 | Tweedle et al. |
| 5,869,046 A | 2/1999 | Presta et al. |
| 5,902,588 A | 5/1999 | Greenwald et al. |
| 5,932,448 A | 8/1999 | Tso et al. |
| 5,932,462 A | 8/1999 | Harris et al. |
| 6,096,002 A | 8/2000 | Landau |
| 6,121,022 A | 9/2000 | Presta et al. |
| 6,129,914 A | 10/2000 | Weiner et al. |
| 6,143,274 A | 11/2000 | Tweedle et al. |
| 6,165,745 A | 12/2000 | Ward et al. |
| 6,194,551 B1 | 2/2001 | Idusogie et al. |
| 6,277,375 B1 | 8/2001 | Ward |
| 6,329,511 B1 | 12/2001 | Vasquez et al. |
| 6,331,415 B1 | 12/2001 | Cabilly et al. |
| 6,350,861 B1 | 2/2002 | Co et al. |
| 6,620,135 B1 | 9/2003 | Weston et al. |
| 6,946,292 B2 | 9/2005 | Kanda et al. |
| 7,029,872 B2 | 4/2006 | Gerngross |
| 7,125,689 B2 | 10/2006 | Carr et al. |
| 7,214,775 B2 | 5/2007 | Hanai et al. |
| 7,449,308 B2 | 11/2008 | Gerngross et al. |
| 2020/0078401 A1 | 3/2020 | Pandurangan |

FOREIGN PATENT DOCUMENTS

| | | |
|---|---|---|
| EP | 0323997 A1 | 7/1989 |
| EP | 0338841 A1 | 10/1989 |
| EP | 0404097 A2 | 12/1990 |
| WO | 8606605 A1 | 11/1986 |
| WO | 8801649 A1 | 3/1988 |
| WO | 9103200 A1 | 3/1991 |
| WO | 9311161 A1 | 6/1993 |
| WO | 9429351 A2 | 12/1994 |
| WO | 9528179 A1 | 10/1995 |
| WO | 9623526 A2 | 8/1996 |
| WO | 9736619 A2 | 10/1997 |
| WO | 9818496 A2 | 5/1998 |
| WO | 9846612 A1 | 10/1998 |
| WO | 9917809 A2 | 4/1999 |
| WO | 0154316 A2 | 7/2001 |
| WO | 03086310 A2 | 10/2003 |
| WO | 03106478 A2 | 12/2003 |
| WO | 2004001384 A2 | 12/2004 |
| WO | 2005120571 A2 | 12/2005 |
| WO | 2006057702 A2 | 6/2006 |
| WO | 2017027247 A1 | 2/2017 |
| WO | 2018226336 A1 | 12/2018 |

OTHER PUBLICATIONS

Anz et al., "CD103 is a hallmark of tumor-infiltrating regulatory T cells", Int J Cancer. Nov. 15, 2011;129(10):2417-26. doi: 10.1002/ijc.25902. Epub Apr. 1, 2011.
Zhou et al., "Vaccine efficacy against primary and metastatic cancer with in vitro-generated CD103+ conventional dendritic cells", J Immunother Cancer. Apr. 2020;8(1):e000474. doi: 10.1136/jitc-2019-000474.
Quinn et al., "CD103+ intraepithelial lymphocytes—a unique population in microsatellite unstable sporadic colorectal cancer", Eur J Cancer. Mar. 2003;39(4):469-75. doi: 10.1016/s0959-8049(02)00633-0.
Cossarizza et al., "Guidelines for the use of flow cytometry and cell sorting in immunological studies (second edition)", Eur J Immunol. Oct. 2019;49(10):1457-1973. doi: 10.1002/eji.201970107.
Pruett et al., "Critical interactions in binding antibody NC41 to influenza N9 neuraminidase: amino acid contacts on the antibody heavy chain", Biochemistry. Jul. 28, 1998;37(30):10660-70. doi: 10.1021/bi9802059.
Higgins et al., "Direct and regulated interaction of integrin alphaEbeta7 with E-cadherin", J Cell Biol. Jan. 12, 1998;140(1):197-210. doi: 10.1083/jcb.140.1.197.
Swain et al., "CD103 (αE Integrin) Undergoes Endosomal Trafficking in Human Dendritic Cells, but Does Not Mediate Epithelial Adhesion", Front Immunol. Dec. 21, 2018;9:2989. doi: 10.3389/fimmu.2018.02989. eCollection 2018.
Hadley et al., "The epithelial cell-specific integrin, CD103 (alpha E integrin), defines a novel subset of alloreactive CD8+ CTL", J Immunol. Oct. 15, 1997;159(8):3748-56.
Du et al., "Molecular basis of recognition of human osteopontin by 23C3, a potential therapeutic antibody for treatment of rheumatoid arthritis", J Mol Biol. Oct. 17, 2008;382(4):835-42. doi: 10.1016/j.jmb.2008.07.075. Epub Jul. 31, 2008.
Caldas et al., "Humanization of the anti-CD18 antibody 6.7: an unexpected effect of a framework residue in binding to antigen", Mol Immunol. May 2003;39(15):941-52. doi: 10.1016/s0161-5890(03)00022-1.
Xiang et al., "Modification in framework region I results in a decreased affinity of chimeric anti-TAG72 antibody", Mol Immunol. Jan.-Feb. 1991;28(1-2):141-8. doi: 10.1016/0161-5890(91)90097-4.
Panka et al., "Variable region framework differences result in decreased or increased affinity of variant anti-digoxin antibodies", Proc Natl Acad Sci U S A. May 1988;85(9):3080-4. doi: 10.1073/pnas.85.9.3080.

(56) References Cited

OTHER PUBLICATIONS

Corgnac et al., "The Emerging Role of CD8+ Tissue Resident Memory T (TRM) Cells in Antitumor Immunity: A Unique Functional Contribution of the CD103 Integrin", Front Immunol. Aug. 15, 2018;9:1904. doi: 10.3389/fimmu.2018.01904. eCollection 2018.
Propst et al., Proinflammatory and Th2-derived cytokines modulate CD40-mediated expression of inflammatory mediators in airway epithelia: implications for the role of epithelial CD40 in airway inflammation. J Immunol. Aug. 15, 2000;165(4):2214-2221.
Quah et al., Monitoring lymphocyte proliferation in vitro and in vivo with the intracellular fluorescent dye carboxyfluorescein diacetate succinimidyl ester. Nat Protoc. 2007;2(9):2049-2056.
Raghunathan et al, Antigen-binding site anatomy and somatic mutations in antibodies that recognize different types of antigens. J Mol Recognit. Mar. 2012;25(3):103-113.
Ran et al., Genome engineering using the CRISPR-Cas9 system. Nat Protoc. Nov. 2013;8(11):2281-2308.
Raso et al., Intracellular targeting with low pH-triggered bispecific antibodies. J Biol Chem. Oct. 31, 1997;272(44):27623-27628.
Rayburn et al., Anti-Inflammatory Agents for Cancer Therapy. Mol Cell Pharmacol. 2009;1(1):29-43.
Reissner and Aswad, Deamidation and isoaspartate formation in proteins: unwanted alterations or surreptitious signals? Cell Mol Life Sci. Jul. 2003;60(7):1281-1295.
Riechmann et al., Reshaping human antibodies for therapy. Nature. Mar. 24, 1988;332(6162):323-327.
Rizvi et al., Mutational landscape determines sensitivity to PD-1 blockade in non-small cell lung cancer. Science. Apr. 3, 2015;348(6230):124-128.
Rocha et al., CD103+CD8+ Lymphocytes Characterize the Immune Infiltration in a Case With Pseudoprogression in Squamous NSCLC. J Thorac Oncol. Oct. 2018;13(10):e193-e196.
Santoiemma et al., Systematic evaluation of multiple immune markers reveals prognostic factors in ovarian cancer. Gynecol Oncol. Oct. 2016;143(1):120-127.
Schuurman et. al., The inter-heavy chain disulfide bonds of IgG4 are in equilibrium with intra-chain disulfide bonds. Mol Immunol. Jan. 2001;38(1):1-8.
Segal et al., Introduction: bispecific antibodies. J Immunol Methods. Feb. 1, 2001;248(1-2):1-6.
Sharma and Allison, The future of immune checkpoint therapy. Science. Apr. 3, 2015;348(6230):56-61.
Shinkawa et al., The Absence of Fucose but Not the Presence of Galactose or Bisecting N-Acetylglucosamine of Human IgG1 Complex-type Oligosaccharides Shows the Critical Role of Enhancing Antibody-dependent Cellular Cytotoxicity. J Biol Chem. Jan. 31, 2003;278(5):3466-3473.
Slamon et al., Use of chemotherapy plus a monoclonal antibody against HER2 for metastatic breast cancer that overexpresses HER2. N Engl J Med. Mar. 15, 2001;344(11):783-792.
Spick et al., 18F-FDG PET/CT and PET/MRI Perform Equally Well in Cancer: Evidence from Studies on More Than 2,300 Patients. J Nucl Med. Mar. 2016;57(3):420-430.
Spiro, Protein glycosylation: nature, distribution, enzymatic formation, and disease implications of glycopeptide bonds. Glycobiology. Apr. 2002;12(4):43R-56R.
Steenbakkers et al., A new approach to the generation of human or murine antibody producing hybridomas. J Immunol Methods. Jul. 31, 1992;152(1):69-77.
Steenbakkers et al., Efficient generation of monoclonal antibodies from preselected antigen-specific B cells. Efficient immortalization of preselected B cells. Mol Biol Rep. Mar. 1994;19(2):125-134.
Talbot et al., Current applications of PET imaging of sex hormone receptors with a fluorinated analogue of estradiol or of testosterone. Q J Nucl Med Mol Imaging. Mar. 2015,59(1):4-17.
Tang et al., Use of a peptide mimotope to guide the humanization of MRK-16, an anti-P-glycoprotein monoclonal antibody. J Biol Chem. Sep. 24, 1999;274(39):27371-27378.

Topalian et al., Immune Checkpoint Blockade: A Common Denominator Approach to Cancer Therapy. Cancer Cell. Apr. 13, 2015;27(4):450-461.
Topchieva et al., Synthesis and physicochemical properties of protein conjugates with water-soluble poly(alkylene oxides). Bioconjug Chem. Jul.-Aug. 1995;6(4):380-8.
Traunecker et al., Bispecific single chain molecules (Janusins) target cytotoxic lymphocytes on HIV infected cells. EMBO J. Dec. 1991;10(12):3655-3659.
Urbanska et al., Bioengineered Colorectal Cancer Drugs: Orally Delivered Anti-Inflammatory Agents. Cell Biochem Biophys. Jul. 2015;72(3):757-769.
Van Erp et al., Application of a sol particle immunoassay to the determination of affinity constants of monoclonal antibodies. J Immunoassay. 1991;12(3):425-443.
Van Kruchten et al., PET imaging of oestrogen receptors in patients with breast cancer. Lancet Oncol. Oct. 2013;14(11):e465-e475.
Van Kruchten et al., Positron emission tomography imaging of oestrogen receptor-expression in endometrial stromal sarcoma supports oestrogen receptor-targeted therapy: case report and review of the literature. Eur J Cancer. Dec. 2013;49(18):3850-3855.
Vaughan et al., Human antibodies with sub-nanomolar affinities isolated from a large non-immunized phage display library. Nat Biotechnol. Mar. 1996;14(3):309-314.
Volkel et al., Optimized linker sequences for the expression of monomeric and dimeric bispecific single-chain diabodies. Protein Eng. Oct. 2001;14(10):815-823.
Von Heijne, A new method for predicting signal sequence cleavage sites. Nucleic Acids Res. Jun. 11, 1986;14(11):4683-4690.
Von Heijne, Patterns of amino acids near signal-sequence cleavage sites. Eur J Biochem. Jun. 1, 1983;133(1):17-21.
Wallick et al., Glycosylation of a VH Residue of a Monoclonal Antibody Against alpha (1->6) Dextran Increases its Affinity for Antigen. J Exp Med. Sep. 1, 1988;168(3):1099-1109.
Wang et al., CD103 and Intratumoral Immune Response in Breast Cancer. Clin Cancer Res. Dec. 15, 2016;22(24):6290-6297.
Wang et al., CD103+ Tumor Infiltrating Lymphocytes Predict a Favorable Prognosis in Urothelial Cell Carcinoma of the Bladder. J Urol. Aug. 2015;194(2):556-562.
Ward et al., Binding activities of a repertoire of single immunoglobulin variable domains secreted from *Escherichia coli*. Nature. Oct. 12, 1989;341(6242):544-546.
Webb et al., PD-1 and CD103 Are Widely Coexpressed on Prognostically Favorable Intraepithelial CD8 T Cells in Human Ovarian Cancer. Cancer Immunol Res. Aug. 2015;3(8):926-935.
Wen et al., Poly(ethylene glycol)-Conjugated Anti-EGF Receptor Antibody C225 with Radiometal Chelator Attached to the Termini of Polymer Chains. Bioconjug Chem. Jul.-Aug. 2001;12(4):545-553.
Workel et al., CD103 defines intraepithelial CD8+ PD1+ tumour-infiltrating lymphocytes of prognostic significance in endometrial adenocarcinoma. Eur J Cancer. Jun. 2016;60:1-11.
Wren et al., SIGNAL-Sequence Information and GeNomic AnaLysis. Comput Methods Programs Biomed. May 2002;68(2):177-181.
Wright et al., Lymphoid/Neuronal Cell Surface OX2 Glycoprotein Recognizes a Novel Receptor on Macrophages Implicated in the Control of Their Function. Immunity. Aug. 2000;13(2):233-242.
Yang et al., A Randomized Trial of Bevacizumab, an Anti-Vascular Endothelial Growth Factor Antibody, for Metastatic Renal Cancer. N Engl J Med. Jul. 31, 2003;349(5):427-434.
Zheng et al., Expression of the Platelet Receptor GPVI Confers Signaling via the Fc Receptor γ-Chain in Response to the Snake Venom Convulxin but Not to Collagen. J Biol Chem. Apr. 20, 2001;276(16):12999-13006.
Pluckthun, Chapter 11: Antibodies from *Escherichia coli*., The Pharmacology of Monoclonal Antibodies, 1994, vol. 113, Rosenburg and Moore eds. Springer-Verlag, New York, pp. 292-315 (part 2).
Hoogenboom and Chames, Natural and designer binding sites made by phage display technology. Immunol Today. Aug. 2000;21(8):371-377.
Houshmand et al., Applications of Fluorodeoxyglucose PET/Computed Tomography in the Assessment and Prediction of Radiation Therapy-related Complications. PET Clin. 2015;10: 555-71.

(56) References Cited

OTHER PUBLICATIONS

Hsing and Bishop, Requirement for nuclear factor-kappaB activation by a distinct subset of CD40-mediated effector functions in B lymphocytes. J Immunol. Mar. 1, 1999;162(5):2804-2811.
Hudson and Kortt, High avidity scFv multimers; diabodies and triabodies. J Immunol Methods. Dec. 10, 1999;231(1-2):177-189.
Hunter and Greenwood, Preparation of iodine-131 labelled human growth hormone of high specific activity. Nature. May 5, 1962;194:495-496.
Jones et al., Replacing the complementarity-determining regions in a human antibody with those from a mouse. Nature. May 29-Jun 4, 1986;321(6069):522-525.
Kabat et al., Unusual Distributions of Amino Acids in Complementarity-determining (Hypervariable) Segments of Heavy and Light Chains of Immunoglobulins and Their Possible Roles in Specificity of Antibody-combining Sites. J Biol Chem. Oct. 10, 1977;252(19):6609-6616.
Kabat, The Structural Basis of Antibody Complementarity. Adv Protein Chem. 1978;32:1-75.
Kaithamana et al., Induction of experimental autoimmune Graves' disease in BALB/c mice. J Immunol. Nov. 1, 1999;163(9):5157-5164.
Kato et al., Increased Tim-3+ T cells in PBMCs during nivolumab therapy correlate with responses and prognosis of advanced esophageal squamous cell carcinoma patients. Cancer Immunol Immunother. Nov. 2018;67(11):1673-1683.
Khalil et al., The future of cancer treatment: immunomodulation, CARs and combination immunotherapy. Nat Rev Clin Oncol. May 2016;13(5):273-290.
Kita et al., Does IgE bind to and activate eosinophils from patients with allergy? J Immunol. Jun. 1, 1999;162(11):6901-6911.
Kol et la., ADCC responses and blocking ofEGFR-mediated signaling and cell growth by combining the anti-EGFR antibodies imgatuzumab and cetuximab in NSCLC cells., Oncotarget. Jul. 11, 2017;8(28):45432-45446.
Komdeur et al., CD103+ intraepithelial T cells in high-grade serous ovarian cancer are phenotypically diverse TCRαβ+ CD8αβ+ T cells that can be targeted for cancer immunotherapy. Oncotarget. Nov. 15, 2016;7(46):75130-75144.
Krishnamurthy and Manning, The Stability Factor: Importance in Formulation Development. Curr Pharm Biotechnol. Dec. 2002;3(4):361-371.
Labrijn et al., Efficient generation of stable bispecific IgG1 by controlled Fab-arm exchange. Proc Natl Acad Sci U S A. Mar. 26, 2013;110(13):5145-5150.
Le Doussal et al., Enhanced in vivo targeting of an asymmetric bivalent hapten to double-antigen-positive mouse B cells with monoclonal antibody conjugate cocktails. J Immunol. Jan. 1, 1991;146(1):169-175.
Le et al., A Mismatch-repair deficiency predicts response of solid tumors to PD-1 blockade. Science. Jul. 28, 2017;357(6349):409-413.
Lee et al., Prolonged circulating lives of single-chain Fv proteins conjugated with polyethylene glycol: a comparison of conjugation chemistries and compounds. Bioconjug Chem. Nov.-Dec. 1999;10(6):973-981.
Lesterhuis et al., A Dynamic versus static biomarkers in cancer immune checkpoint blockade: unravelling complexity. Nat Rev Drug Discov. Apr. 2017;16(4):264-272 (author's accepted version).
Li et al., Optimization of humanized IgGs in glycoengineered Pichia pastoris. Nat Biotechnol. Feb. 2006;24(2):210-215.
Lipsky et al., Infliximab and methotrexate in the treatment of rheumatoid arthritis. Anti-Tumor Necrosis Factor Trial in Rheumatoid Arthritis with Concomitant Therapy Study Group. N Engl J Med. Nov. 30, 2000;343(22):1594-1602.
Liu and Blumhardt, Randomised, double blind, placebo controlled study of interferon beta-1a in relapsing-remitting multiple sclerosis analysed by area under disability/time curves. J Neurol Neurosurg Psychiatry. Oct. 1999;67(4):451-456.

Long, Regulation of immune responses through inhibitory receptors. Annu Rev Immunol. 1999;17:875-904.
Mack et al., A small bispecific antibody construct expressed as a functional single-chain molecule with high tumor cell cytotoxicity. Proc Natl Acad Sci U S A. Jul. 18, 1995;92(15):7021-7025.
Mahoney et al., Combination cancer immunotherapy and new immunomodulatory targets. Nat Rev Drug Discov. Aug. 2015;14(8):561-584.
Malecki et al., Molecular immunolabeling with recombinant single-chain variable fragment (scFv) antibodies designed with metal-binding domains. Proc Natl Acad Sci U S A. Jan. 8, 2002;99(1):213-218.
Marshall, Glycoproteins. Annu Rev Biochem. 1972;41:673-702.
McGranahan et al., Clonal neoantigens elicit T cell immunoreactivity and sensitivity to immune checkpoint blockade. Science. Mar. 25, 2016;351(6280):1463-1469.
Mendez et al., Functional transplant of megabase human immunoglobulin loci recapitulates human antibody response in mice. Nat Genet. Feb. 1997;15(2):146-156.
Menne et al., A comparison of signal sequence prediction methods using a test set of signal peptides. Bioinformatics. Aug. 2000;16(8):741-742.
Merchant et al., The LMP2A ITAM is essential for providing B cells with development and survival signals in vivo. J Virol. Oct. 2000;74(19):9115-9124.
Meyaard et al., LAIR-1, a novel inhibitory receptor expressed on human mononuclear leukocytes. Immunity. Aug. 1997;7(2):283-290.
Milgrom et al., Treatment of allergic asthma with monoclonal anti-IgE antibody. rhuMAb-E25 Study Group. N Engl J Med. Dec. 23, 1999;341(26):1966-1973.
Mimura et al., The influence of glycosylation on the thermal stability and effector function expression of human IgG1-Fc: properties of a series of truncated glycoforms. Mol Immunol. Aug.-Sep. 2000;37(12-13):697-706.
Morrison et al., Chimeric human antibody molecules: Mouse antigen-binding domains with human constant region domains. Proc Natl Acad Sci U S A. Nov. 1984;81(21):6851-6855.
Morrison, Transfectomas provide novel chimeric antibodies. Science. Sep. 20, 1985;229(4719):1202-1207.
Murray et al., Epitope Affinity Chromatography and Biophysical Studies of Monoclonal Antibodies and Recombinant Antibody Fragments. J Chromatogr Sci. Jul. 2002;40(6):343-349.
Nelson and Griswold, A computer program for calculating antibody affinity constants. Comput Methods Programs Biomed. Jul.-Aug. 1988;27(1):65-8.
Nett et al., A combinatorial genetic library approach to target heterologous glycosylation enzymes to the endoplasmic reticulum or the Golgi apparatus of Pichia pastoris. Yeast. Mar. 2011;28(3):237-252.
Nishina et al., Monitoring immune-checkpoint blockade: response evaluation and biomarker development. Nat Rev Clin Oncol. Nov. 2017;14(11):655-668.
Nygren, Conjugation of horseradish peroxidase to Fab fragments with different homobifunctional and heterobifunctional cross-linking reagents. A comparative study. J Histochem Cytochem. May 1982;30(5):407-12.
Pain and Surolia, Preparation of Protein A-Peroxidase Monoconjugate Using a Heterobifunctional Reagent, and its Use in Enzyme Immunoassays. J Immunol Methods. 1981;40(2):219-230.
Pandey et al., Identification of a novel immunoreceptor tyrosine-based activation motif-containing molecule, STAM2, by mass spectrometry and its involvement in growth factor and cytokine receptor signaling pathways. J Biol Chem. Dec. 8, 2000;275(49):38633-38639.
Parekh et al., Association of rheumatoid arthritis and primary osteoarthritis with changes in the glycosylation pattern of total serum IgG. Nature. Aug. 1985;316(6027):452-457.
Pluckthun, Chapter 11: Antibodies from *Escherichia coli.*, The Pharmacology of Monoclonal Antibodies, 1994, vol. 113, Rosenburg and Moore eds. Springer-Verlag, New York, pp. 269-291 (part 1).
Portielji et al., IL-12: a promising adjuvant for cancer vaccination. Cancer Immunol Immunother. Mar. 2003;52(3):133-144.

(56) References Cited

OTHER PUBLICATIONS

Postow et al., Immune Checkpoint Blockade in Cancer Therapy. J Clin Oncol. Jun. 10, 2015;33(17):1974-1982.
Presta, Antibody engineering. Curr Opin Struct Biol., Aug. 1992;2(4):593-596.
Presta, Selection, design, and engineering of therapeutic antibodies. J Allergy Clin Immunol. Oct. 2005;116(4):731-736.
Okawa, Comprehensive Diagnosis and Treatment of Cancer Using Radiolabeled Probes; Radiotheranostics. Analysis 2019;2:76-77—incl AI generated Engl transl (5 pages total).
Takenaka et al., PET Imaging Utilizing 89Zr-labeled Human Antibody Variant and Theranostic Technologies Provided by a Novel DDS Carrier. Drug Delivery System 2018; 33(3):214-222—incl AI generated Engl lang transl (25 pages total).
Office Action issued by the JPO in related Japanese patent application No. 2022-566117 dated May 2, 2025—incl Engl lang transl (29 pages total).
Adams et al., Big opportunities for small molecules in immuno-oncology. Nat Rev Drug Discov. Sep. 2015;14(9):603-622.
Alexander and Hughes, Monitoring of IgG antibody thermal stability by micellar electrokinetic capillary chromatography and matrix-assisted laser desorption/ionization mass spectrometry. Anal Chem. Oct. 15, 1995;67(20):3626-3632.
Angal et al., A single amino acid substitution abolishes the heterogeneity of chimeric mouse/human (IgG4) antibody. Mol Immunol. Jan. 1993;30(1):105-108.
Azzoni et al., Differential transcriptional regulation of CD161 and a novel gene, 197/15a, by IL-2, IL-15, and IL-12 in NK and T cells. J Immunol. Oct. 1, 1998;161(7):3493-3500.
Baca et al., Antibody humanization using monovalent phage display. J Biol Chem. Apr. 18, 1997;272(16):10678-10684.
Baert et al., Influence of immunogenicity on the long-term efficacy of infliximab in Crohn's disease. N Engl J Med. Feb. 13, 2003;348(7):601-608.
Barbas, Synthetic human antibodies. Nat Med. Aug. 1995;1(8):837-839.
Beniaminovitz et al., Prevention of rejection in cardiac transplantation by blockade of the interleukin-2 receptor with a monoclonal antibody. N Engl J Med. Mar. 2, 2000;342(9):613-619.
Bernard-Gauthier et al., Recent Advances in the Development and Application of Radiolabeled Kinase Inhibitors for PET Imaging. Molecules. Dec. 9, 2015;20(12):22000-22027.
Bischoff and Kolbe, Deamidation of asparagine and glutamine residues in proteins and peptides: structural determinants and analytical methodology. J Chromatogr B Biomed Appl. Dec. 9, 1994;662(2):261-278.
Bollineni et al., A systematic review on [(18)F]FLT-PET uptake as a measure of treatment response in cancer patients. Eur J Cancer. Mar. 2016;55:81-97.
Bosmuller et al., Combined Immunoscore of CD103 and CD3 Identifies Long-Term Survivors in High-Grade Serous Ovarian Cancer.: Int J Gynecol Cancer. May 2016;26(4):671-679.
Boutet et al., TGFβ Signaling Intersects with CD103 Integrin Signaling to Promote T-Lymphocyte Accumulation and Antitumor Activity in the Lung Tumor Microenvironment. Cancer Res. Apr. 1, 2016;76(7):1757-1769.
Brennan et al., Preparation of bispecific antibodies by chemical recombination of monoclonal immunoglobulin G1 fragments. Science. Jul. 5, 1985;229(4708):81-83.
Buchbinder and Hodi, Cytotoxic T lymphocyte antigen-4 and immune checkpoint blockade. J Clin Invest. Sep. 2015;125(9):3377-3383.
Carpenter et al., Non-Fc Receptor-Binding Humanized Anti-CD3 Antibodies Induce Apoptosis of Activated Human T Cells. J Immunol. Dec. 1, 2000;165(11):6205-6213.
Carter, Bispecific human IgG by design. J Immunol Methods. Feb. 1, 2001;248(1-2):7-15.
Challapalli and Aboagye, Positron Emission Tomography Imaging of Tumor Cell Metabolism and Application to Therapy Response Monitoring. Front Oncol. Feb. 29, 2016;6:44;6:44.
Chen et al., Influence of histidine on the stability and physical properties of a fully human antibody in aqueous and solid forms. Pharm Res. Dec. 2003;20(12):1952-60.
Chennamsetty et al., Prediction of Aggregation Prone Regions of Therapeutic Proteins. J Phys Chem B. May 20, 2010;114(19):6614-6624.
Choi et al, Use of combinatorial genetic libraries to humanize N-linked glycosylation in the yeast *Pichia pastoris*. Proc Natl Acad Sci U S A. Apr. 29, 2003;100(9):5022-5027.
Chothia and Lesk, Canonical structures for the hypervariable regions of immunoglobulins . J Mol Biol. Aug. 20, 1987;196(4):901-917.
Chothia et al., Conformations of immunoglobulin hypervariable regions. Nature. Dec. 1989;342(6252):877-883.
Clark, Antibody humanization: a case of the 'Emperor's new clothes'? Immunol Today. Aug. 2000;21(8):397-402.
Conrath et al., Camel single-domain antibodies as modular building units in bispecific and bivalent antibody constructs. J Biol Chem. Mar. 9, 2001;276(10):7346-7350.
David and Reisfeld, Protein iodination with solid state lactoperoxidase Biochemistry. Feb. 26, 1974;13(5):1014-1021.
De Bruin et al., Selection of high-affinity phage antibodies from phage display libraries. Nat Biotechnol. Apr. 1999;17 (4):397-399.
Desmyter et al., Antigen specificity and high affinity binding provided by one single loop of a camel single-domain antibody. J Biol Chem. Jul. 13, 2001;276(28):26285-26290.
Dijkers et al., Development and Characterization of Clinical-Grade 89Zr-Trastuzumab for HER2/neu ImmunoPET Imaging. J Nucl Med. Jun. 2009;50(6):974-981.
Djenidi et al., CD8+CD103+ Tumor-Infiltrating Lymphocytes Are Tumor-Specific Tissue-Resident Memory T Cells and a Prognostic Factor for Survival in Lung Cancer Patients. J Immunol. Apr. 1, 2015;194(7):3475-3486.
Edwards et al., CD103+ Tumor-Resident CD8+ T Cells Are Associated with Improved Survival in Immunotherapy—Naïve Melanoma Patients and Expand Significantly During Anti-PD-1 Treatment. Clin Cancer Res. Jul. 1, 2018;24(13):3036-3045.
Eggink et al., Immunological profiling of molecularly classified high-risk endometrial cancers identifies POLE-mutant and microsatellite unstable carcinomas as candidates for checkpoint inhibition. Oncoimmunology. Dec. 9, 2016;6(2):e1264565.
Everts et al., Selective intracellular delivery of dexamethasone into activated endothelial cells using an E-selectin-directed immunoconjugate. J Immunol. Jan. 15, 2002;168(2):883-889.
Foote and Winter, Antibody framework residues affecting the conformation of the hypervariable loops. J Mol Biol. Mar. 20, 1992;224(2):487-499.
Frankle et al., Neuroreceptor imaging in psychiatry: theory and applications . Int Rev Neurobiol. 2005;67:385-440.
Gala and Morrison, V Region Carbohydrate and Antibody Expression. J Immunol. May 1, 2004;172(9):5489-5494.
Ganesan et al., Tissue-resident memory features are linked to the magnitude of cytotoxic T cell responses in human lung cancer. Nat Immunol. Aug. 2017;18(8):940-950.
Ghirlando et al., Glycosylation of human IgG-Fc: influences on structure revealed by differential scanning micro-calorimetry. Immunol Lett. May 3, 1999;68(1):47-52.
Ghosh et al., Natalizumab for active Crohn's disease . N Engl J Med. Jan. 2, 2003;348(1):24-32.
Gibellini et al., Extracellular HIV-1 Tat protein induces the rapid Ser133 phosphorylation and activation of CREB transcription factor in both Jurkat lymphoblastoid T cells and primary peripheral blood mononuclear cells. J Immunol. Apr. 15, 1998;160(8):3891-3898.
Giudicelli et al., IMGT/Gene-DB: a comprehensive database for human and mouse immunoglobulin and T cell receptor genes. Nucleic Acids Res. Jan. 1, 2005;33(Database issue):D256-D261.
Gnjatic et al., Identifying baseline immune-related biomarkers to predict clinical outcome of immunotherapy. J Immunother Cancer. May 16, 2017;5:44.
Grootjans et al., PET in the management of locally advanced and metastatic NSCLC. Nat Rev Clin Oncol. Jul. 2015;12(7):395-407.
Hamilton and Gerngross, Glycosylation engineering in yeast: the advent of fully humanized yeast. Curr Opin Biotechnol. Oct. 2007;18(5):387-392.

(56) References Cited

OTHER PUBLICATIONS

Hamilton et al., Humanization of Yeast to Produce Complex Terminally Sialylated Glycoproteins. Science. Sep. 8, 2006;313(5792):1441-1443.
Hamilton et al., Production of Complex Human Glycoproteins in Yeast. Science. Aug. 29, 2003;301(5637):1244-1246.
He et al., Humanization and Pharmacokinetics of a Monoclonal Antibody with Specificity for Both E- and P-Selectin. J Immunol. Jan. 15, 1998;160(2):1029-1035.
Herold et al., Anti-CD3 monoclonal antibody in new-onset type 1 diabetes mellitus. N Engl J Med. May 30, 2002;346(22):1692-1698.
Holliger and Hudson, Engineered antibody fragments and the rise of single domains. Nat Biotechnol. Sep. 2005;23(9):1126-1136.
Holliger et al., "Diabodies": Small bivalent and bispecific antibody fragments. Proc Natl Acad Sci U S A. Jul. 15, 1993;90(14):6444-6448.

Fig. 5 OC433 (CD3 positive cells)
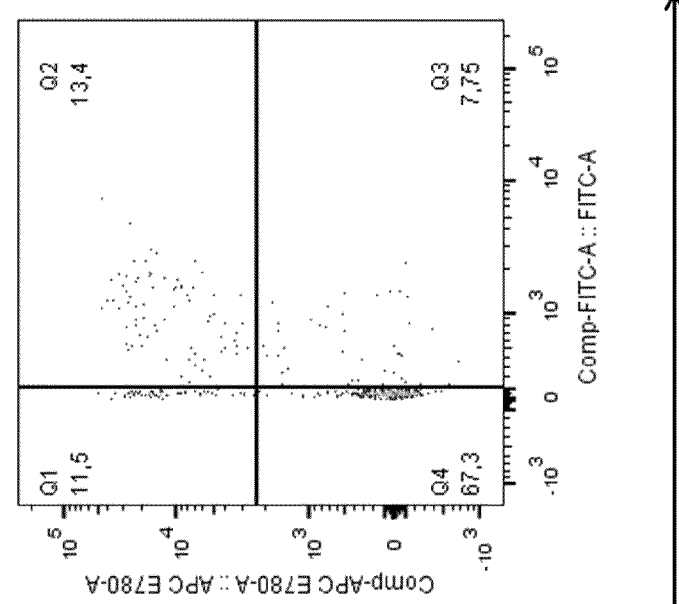
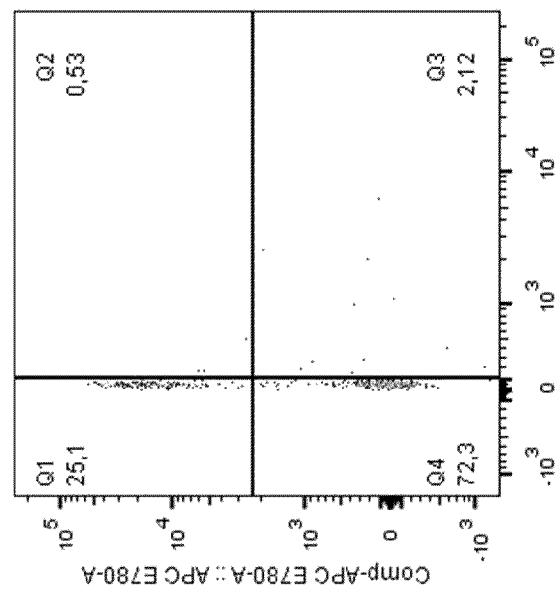

Fig. 8 n=1

| | BERACT | 01A | 05A | 06A | 07A |
|---|---|---|---|---|---|
| IgG | 100,0 | 100,0 | 100,0 | 100,0 | 100,0 |
| MCA708 | 115,1 | 83,9 | 94,6 | 0,7 | 92,0 |
| BERACT | 1,9 | 2,5 | 4,2 | 84,9 | 0,7 |
| 01A | 0,9 | 1,5 | 2,6 | 96,0 | 0,7 |
| 02A | 1,4 | 2,3 | 4,3 | 103,5 | 0,5 |
| 03A | 97,0 | 96,7 | 100,0 | 101,3 | 94,4 |
| 05A | 50,9 | 71,8 | 13,1 | 101,4 | 7,9 |
| 06A | 96,6 | 81,8 | 101,3 | 18,7 | 73,2 |
| 07A | 27,2 | 27,5 | 66,3 | 93,2 | 33,7 | n=2

| | BERACT | 01A | 05A | 06A | 07A |
|---|---|---|---|---|---|
| IgG | 100,0 | 100,0 | 100,0 | 100,0 | 100,0 |
| MCA708 | 108,7 | 92,3 | 89,7 | 1,0 | 92,5 |
| BERACT | 3,5 | 4,0 | 4,9 | 109,4 | 1,0 |
| 01A | 2,3 | 2,2 | 2,2 | 99,1 | 0,7 |
| 02A | 2,9 | 3,0 | 4,6 | 102,7 | 0,9 |
| 03A | 100,7 | 97,3 | 90,9 | 107,7 | 77,8 |
| 05A | 60,6 | 77,4 | 14,2 | 101,6 | 11,4 |
| 06A | 103,4 | 90,9 | 87,4 | 18,9 | 81,6 |
| 07A | 29,2 | 26,6 | 56,9 | 97,0 | 29,8 |

SEQUENCE LISTING

```
<160> NUMBER OF SEQ ID NOS: 45

<210> SEQ ID NO 1
<211> LENGTH: 8
<212> TYPE: PRT
<213> ORGANISM: Artificial Sequence
<220> FEATURE:
<223> OTHER INFORMATION: Synthetic: hCD103.01A heavy chain CDR1 (amino
      acid sequence)

<400> SEQUENCE: 1

Gly Asp Ser Ile Thr Ser Gly Tyr
1               5

<210> SEQ ID NO 2
<211> LENGTH: 7
<212> TYPE: PRT
<213> ORGANISM: Artificial Sequence
<220> FEATURE:
<223> OTHER INFORMATION: Synthetic: hCD103.01A heavy chain CDR2 (amino
      acid sequence)

<400> SEQUENCE: 2

Ile Thr Tyr Ser Gly Ser Thr
1               5
```

```
<210> SEQ ID NO 3
<211> LENGTH: 12
<212> TYPE: PRT
<213> ORGANISM: Artificial Sequence
<220> FEATURE:
<223> OTHER INFORMATION: Synthetic: hCD103.01A heavy chain CDR3 (amino
      acid sequence)

<400> SEQUENCE: 3

Thr Arg His Tyr Tyr Gly Ser Asp Ala Met Asp Tyr
1               5                   10

<210> SEQ ID NO 4
<211> LENGTH: 6
<212> TYPE: PRT
<213> ORGANISM: Artificial Sequence
<220> FEATURE:
<223> OTHER INFORMATION: Synthetic: hCD103.01A light chain CDR1 (amino
      acid sequence)

<400> SEQUENCE: 4

Gln Asp Val Ser Ile Ala
1               5

<210> SEQ ID NO 5
<211> LENGTH: 3
<212> TYPE: PRT
<213> ORGANISM: Artificial Sequence
<220> FEATURE:
<223> OTHER INFORMATION: Synthetic: hCD103.01A light chain CDR2 (amino
      acid sequence)

<400> SEQUENCE: 5

Ser Ala Ser
1

<210> SEQ ID NO 6
<211> LENGTH: 9
<212> TYPE: PRT
<213> ORGANISM: Artificial Sequence
<220> FEATURE:
<223> OTHER INFORMATION: Synthetic: hCD103.01A light chain CDR3 (amino
      acid sequence)

<400> SEQUENCE: 6

Gln Gln His Tyr Ser Thr Pro Trp Thr
1               5

<210> SEQ ID NO 7
<211> LENGTH: 118
<212> TYPE: PRT
<213> ORGANISM: Artificial Sequence
<220> FEATURE:
<223> OTHER INFORMATION: Synthetic: hCD103.01A heavy chain (amino acid
      sequence)

<400> SEQUENCE: 7

Glu Val Gln Leu Gln Glu Ser Gly Pro Ser Leu Val Lys Pro Ser Gln
1               5                   10                  15

Thr Leu Ser Leu Thr Cys Ser Val Thr Gly Asp Ser Ile Thr Ser Gly
            20                  25                  30

Tyr Trp Asn Trp Ile Arg Lys Phe Pro Gly Asn Lys Leu Glu Tyr Met
        35                  40                  45

Gly Tyr Ile Thr Tyr Ser Gly Ser Thr Tyr Tyr Asn Pro Ser Leu Lys
    50                  55                  60

Ser Arg Ile Ser Ile Thr Arg Asp Thr Ser Lys Asn Gln Tyr Tyr Leu
```

```
                65                  70                  75                  80
Gln Leu Asn Ser Val Thr Thr Glu Asp Thr Ala Thr Tyr Tyr Cys Thr
                    85                  90                  95

Arg His Tyr Tyr Gly Ser Asp Ala Met Asp Tyr Trp Gly Gln Gly Thr
                100                 105                 110

Ser Val Thr Val Ser Ser
            115

<210> SEQ ID NO 8
<211> LENGTH: 107
<212> TYPE: PRT
<213> ORGANISM: Artificial Sequence
<220> FEATURE:
<223> OTHER INFORMATION: Synthetic: hCD103.01A light chain (amino acid
      sequence)

<400> SEQUENCE: 8

Asp Ile Val Met Thr Gln Ser His Lys Phe Met Ser Thr Ser Val Gly
1               5                   10                  15

Asp Arg Val Ser Ile Thr Cys Lys Ala Ser Gln Asp Val Ser Ile Ala
                20                  25                  30

Val Ala Trp Tyr Gln Gln Arg Pro Gly Gln Ser Pro Lys Leu Leu Ile
            35                  40                  45

Tyr Ser Ala Ser Tyr Arg Tyr Thr Gly Val Pro Asp Arg Phe Thr Gly
        50                  55                  60

Ser Gly Ser Gly Thr Asp Phe Thr Phe Thr Ile Ser Ser Val Gln Ala
65                  70                  75                  80

Glu Asp Leu Ala Val Tyr Tyr Cys Gln Gln His Tyr Ser Thr Pro Trp
                85                  90                  95

Thr Phe Gly Gly Gly Thr Lys Leu Glu Ile Lys
            100                 105

<210> SEQ ID NO 9
<211> LENGTH: 8
<212> TYPE: PRT
<213> ORGANISM: Artificial Sequence
<220> FEATURE:
<223> OTHER INFORMATION: Synthetic: hCD103.02A heavy chain CDR1 (amino
      acid sequence)

<400> SEQUENCE: 9

Gly Asp Ser Ile Thr Ser Gly Tyr
1               5

<210> SEQ ID NO 10
<211> LENGTH: 7
<212> TYPE: PRT
<213> ORGANISM: Artificial Sequence
<220> FEATURE:
<223> OTHER INFORMATION: Synthetic: hCD103.02A heavy chain CDR2 (amino
      acid sequence)

<400> SEQUENCE: 10

Ile Thr Tyr Ser Gly Ser Thr
1               5

<210> SEQ ID NO 11
<211> LENGTH: 12
<212> TYPE: PRT
<213> ORGANISM: Artificial Sequence
<220> FEATURE:
<223> OTHER INFORMATION: Synthetic: hCD103.02A heavy chain CDR3 (amino
      acid sequence)
```

<400> SEQUENCE: 11

Ala Arg Gly Tyr Tyr Gly Ser Asp Ala Met Asp Tyr
1               5                   10

<210> SEQ ID NO 12
<211> LENGTH: 6
<212> TYPE: PRT
<213> ORGANISM: Artificial Sequence
<220> FEATURE:
<223> OTHER INFORMATION: Synthetic: hCD103.02A light chain CDR1 (amino
      acid sequence)

<400> SEQUENCE: 12

Gln Asp Val Ser Thr Ala
1               5

<210> SEQ ID NO 13
<211> LENGTH: 3
<212> TYPE: PRT
<213> ORGANISM: Artificial Sequence
<220> FEATURE:
<223> OTHER INFORMATION: Synthetic: hCD103.02A light chain CDR2 (amino
      acid sequence)

<400> SEQUENCE: 13

Ser Ala Ser
1

<210> SEQ ID NO 14
<211> LENGTH: 9
<212> TYPE: PRT
<213> ORGANISM: Artificial Sequence
<220> FEATURE:
<223> OTHER INFORMATION: Synthetic: hCD103.02A light chain CDR3 (amino
      acid sequence)

<400> SEQUENCE: 14

Gln Gln His Tyr Ser Pro Pro Trp Thr
1               5

<210> SEQ ID NO 15
<211> LENGTH: 118
<212> TYPE: PRT
<213> ORGANISM: Artificial Sequence
<220> FEATURE:
<223> OTHER INFORMATION: Synthetic: hCD103.02A heavy chain (amino acid
      sequence)

<400> SEQUENCE: 15

Glu Val Gln Leu Gln Glu Ser Gly Pro Ser Leu Val Lys Pro Ser Gln
1               5                   10                  15

Thr Leu Ser Leu Thr Cys Ser Val Thr Gly Asp Ser Ile Thr Ser Gly
            20                  25                  30

Tyr Trp Asn Trp Ile Arg Lys Phe Pro Gly Asn Lys Leu Glu Tyr Met
        35                  40                  45

Gly Tyr Ile Thr Tyr Ser Gly Ser Thr Tyr Tyr Asn Pro Ser Leu Lys
    50                  55                  60

Ser Arg Ile Ser Ile Thr Arg Asp Thr Ser Lys Asn Gln Tyr Tyr Leu
65                  70                  75                  80

Gln Phe Asn Ser Val Thr Thr Glu Asp Thr Ala Thr Tyr Tyr Cys Ala
                85                  90                  95

Arg Gly Tyr Tyr Gly Ser Asp Ala Met Asp Tyr Trp Gly Gln Gly Thr
            100                 105                 110

```
Ser Val Thr Val Ser Ser
        115

<210> SEQ ID NO 16
<211> LENGTH: 107
<212> TYPE: PRT
<213> ORGANISM: Artificial Sequence
<220> FEATURE:
<223> OTHER INFORMATION: Synthetic: hCD103.02A light chain (amino acid
      sequence)

<400> SEQUENCE: 16

Asp Ile Val Met Thr Gln Ser His Lys Phe Met Ser Thr Ser Val Gly
1               5                   10                  15

Asp Arg Val Ser Ile Thr Cys Lys Ala Ser Gln Asp Val Ser Thr Ala
            20                  25                  30

Val Ala Trp Tyr Gln Gln Lys Pro Gly Gln Ser Pro Lys Leu Leu Ile
        35                  40                  45

Tyr Ser Ala Ser Tyr Arg Tyr Thr Gly Val Pro Asp Arg Phe Thr Gly
50                  55                  60

Ser Gly Ser Gly Thr Asp Phe Thr Phe Thr Ile Ser Ser Val Gln Ala
65                  70                  75                  80

Glu Asp Leu Ala Val Tyr Tyr Cys Gln Gln His Tyr Ser Pro Pro Trp
                85                  90                  95

Thr Phe Gly Gly Gly Thr Lys Leu Glu Ile Lys
            100                 105

<210> SEQ ID NO 17
<211> LENGTH: 8
<212> TYPE: PRT
<213> ORGANISM: Artificial Sequence
<220> FEATURE:
<223> OTHER INFORMATION: Synthetic: hCD103.05A heavy chain CDR1 (amino
      acid sequence)

<400> SEQUENCE: 17

Gly Tyr Ser Phe Thr Gly Tyr Asn
1               5

<210> SEQ ID NO 18
<211> LENGTH: 8
<212> TYPE: PRT
<213> ORGANISM: Artificial Sequence
<220> FEATURE:
<223> OTHER INFORMATION: Synthetic: hCD103.05A heavy chain CDR2 (amino
      acid sequence)

<400> SEQUENCE: 18

Ile Asp Pro Tyr Tyr Gly Gly Thr
1               5

<210> SEQ ID NO 19
<211> LENGTH: 19
<212> TYPE: PRT
<213> ORGANISM: Artificial Sequence
<220> FEATURE:
<223> OTHER INFORMATION: Synthetic: hCD103.05A heavy chain CDR3 (amino
      acid sequence)

<400> SEQUENCE: 19

Ala Arg Ser Phe Tyr Gly Tyr Asp Ala Gly Ser Pro Tyr Asn Tyr Ala
1               5                   10                  15

Met Asp Tyr
```

<210> SEQ ID NO 20
<211> LENGTH: 6
<212> TYPE: PRT
<213> ORGANISM: Artificial Sequence
<220> FEATURE:
<223> OTHER INFORMATION: Synthetic: hCD103.05A light chain CDR1 (amino
      acid sequence)

<400> SEQUENCE: 20

Gln Asp Val Gly Thr Phe
1               5

<210> SEQ ID NO 21
<211> LENGTH: 3
<212> TYPE: PRT
<213> ORGANISM: Artificial Sequence
<220> FEATURE:
<223> OTHER INFORMATION: Synthetic: hCD103.05A light chain CDR2 (amino
      acid sequence)

<400> SEQUENCE: 21

Trp Ala Ser
1

<210> SEQ ID NO 22
<211> LENGTH: 9
<212> TYPE: PRT
<213> ORGANISM: Artificial Sequence
<220> FEATURE:
<223> OTHER INFORMATION: Synthetic: hCD103.05A light chain CDR3 (amino
      acid sequence)

<400> SEQUENCE: 22

His Gln Tyr Ser Ser Tyr Pro Tyr Thr
1               5

<210> SEQ ID NO 23
<211> LENGTH: 126
<212> TYPE: PRT
<213> ORGANISM: Artificial Sequence
<220> FEATURE:
<223> OTHER INFORMATION: Synthetic: hCD103.05A heavy chain (amino acid
      sequence)

<400> SEQUENCE: 23

Glu Val Gln Leu Gln Gln Ser Gly Pro Glu Leu Glu Lys Pro Gly Ala
1               5                   10                  15

Ser Ala Lys Ile Ser Cys Lys Ala Ser Gly Tyr Ser Phe Thr Gly Tyr
            20                  25                  30

Asn Met Asn Trp Val Lys Gln Ser Asn Gly Lys Ser Leu Glu Trp Ile
        35                  40                  45

Gly Asn Ile Asp Pro Tyr Tyr Gly Gly Thr Ser Tyr Asn Gln Lys Phe
    50                  55                  60

Lys Gly Lys Ala Thr Leu Thr Val Asp Lys Ser Ser Thr Ala Tyr
65                  70                  75                  80

Met Gln Leu Lys Ser Leu Thr Ser Glu Asp Ser Ala Val Tyr Tyr Cys
                85                  90                  95

Ala Arg Ser Phe Tyr Gly Tyr Asp Ala Gly Ser Pro Tyr Asn Tyr Ala
            100                 105                 110

Met Asp Tyr Trp Gly Gln Gly Thr Pro Val Thr Val Ser Pro
        115                 120                 125

```
<210> SEQ ID NO 24
<211> LENGTH: 107
<212> TYPE: PRT
<213> ORGANISM: Artificial Sequence
<220> FEATURE:
<223> OTHER INFORMATION: Synthetic: hCD103.05A light chain (amino acid
      sequence)

<400> SEQUENCE: 24

Asp Ile Val Met Thr Gln Ser His Lys Phe Met Ser Thr Ser Val Gly
1               5                   10                  15

Asp Arg Val Ser Ile Thr Cys Lys Ala Ser Gln Asp Val Gly Thr Phe
            20                  25                  30

Val Ala Trp Tyr Gln Gln Lys Pro Gly Gln Ser Pro Lys Leu Leu Ile
        35                  40                  45

Tyr Trp Ala Ser Thr Arg His Thr Gly Val Pro Asp Arg Phe Thr Gly
    50                  55                  60

Ser Gly Ser Gly Thr Asp Phe Thr Leu Thr Ile Ser Asn Val Gln Ser
65                  70                  75                  80

Glu Asp Leu Ala Asp Tyr Phe Cys His Gln Tyr Ser Ser Tyr Pro Tyr
                85                  90                  95

Thr Phe Gly Gly Gly Thr Gln Leu Glu Ile Lys
            100                 105

<210> SEQ ID NO 25
<211> LENGTH: 8
<212> TYPE: PRT
<213> ORGANISM: Artificial Sequence
<220> FEATURE:
<223> OTHER INFORMATION: Synthetic: hCD103.06A heavy chain CDR1 (amino
      acid sequence)

<400> SEQUENCE: 25

Gly Tyr Thr Phe Thr Ser Tyr Trp
1               5

<210> SEQ ID NO 26
<211> LENGTH: 8
<212> TYPE: PRT
<213> ORGANISM: Artificial Sequence
<220> FEATURE:
<223> OTHER INFORMATION: Synthetic: hCD103.06A heavy chain CDR2 (amino
      acid sequence)

<400> SEQUENCE: 26

Ile Tyr Pro Gly Ser Gly Ser Thr
1               5

<210> SEQ ID NO 27
<211> LENGTH: 13
<212> TYPE: PRT
<213> ORGANISM: Artificial Sequence
<220> FEATURE:
<223> OTHER INFORMATION: Synthetic: hCD103.06A heavy chain CDR3 (amino
      acid sequence)

<400> SEQUENCE: 27

Thr Arg Gly Val Tyr Asp Asn Pro Tyr Tyr Phe Asp Tyr
1               5                   10

<210> SEQ ID NO 28
<211> LENGTH: 6
<212> TYPE: PRT
<213> ORGANISM: Artificial Sequence
<220> FEATURE:
```

```
<223> OTHER INFORMATION: Synthetic: hCD103.06A light chain CDR1 (amino
      acid sequence)

<400> SEQUENCE: 28

Asp His Ile Asn Asn Trp
1               5

<210> SEQ ID NO 29
<211> LENGTH: 3
<212> TYPE: PRT
<213> ORGANISM: Artificial Sequence
<220> FEATURE:
<223> OTHER INFORMATION: Synthetic: hCD103.06A light chain CDR2 (amino
      acid sequence)

<400> SEQUENCE: 29

Gly Ala Thr
1

<210> SEQ ID NO 30
<211> LENGTH: 9
<212> TYPE: PRT
<213> ORGANISM: Artificial Sequence
<220> FEATURE:
<223> OTHER INFORMATION: Synthetic: hCD103.06A light chain CDR3 (amino
      acid sequence)

<400> SEQUENCE: 30

Gln Gln Tyr Trp Ser Ile Pro Leu Thr
1               5

<210> SEQ ID NO 31
<211> LENGTH: 120
<212> TYPE: PRT
<213> ORGANISM: Artificial Sequence
<220> FEATURE:
<223> OTHER INFORMATION: Synthetic: hCD103.06A heavy chain (amino acid
      sequence)

<400> SEQUENCE: 31

Gln Val Gln Leu Gln Gln Pro Gly Ser Glu Leu Val Arg Pro Gly Ala
1               5                   10                  15

Ser Val Lys Leu Ser Cys Lys Ala Ser Gly Tyr Thr Phe Thr Ser Tyr
            20                  25                  30

Trp Met His Trp Val Lys Gln Arg His Gly Gln Gly Leu Glu Trp Ile
        35                  40                  45

Gly Asn Ile Tyr Pro Gly Ser Gly Ser Thr Asn Tyr Asp Glu Lys Phe
    50                  55                  60

Lys Ser Lys Gly Thr Leu Thr Val Asp Thr Ser Ser Ser Thr Ala Tyr
65                  70                  75                  80

Met His Leu Ser Ser Leu Thr Ser Glu Asp Ser Ala Val Tyr Tyr Cys
                85                  90                  95

Thr Arg Gly Val Tyr Asp Asn Pro Tyr Tyr Phe Asp Tyr Trp Gly Gln
            100                 105                 110

Gly Thr Thr Leu Thr Val Ser Ser
        115                 120

<210> SEQ ID NO 32
<211> LENGTH: 107
<212> TYPE: PRT
<213> ORGANISM: Artificial Sequence
<220> FEATURE:
<223> OTHER INFORMATION: Synthetic: hCD103.06A light chain (amino acid
      sequence)
```

<400> SEQUENCE: 32

Asp Ile Gln Met Thr Gln Ser Ser Ser Asn Leu Ser Val Ser Leu Gly
1               5                   10                  15

Gly Arg Val Thr Ile Thr Cys Lys Ala Ser Asp His Ile Asn Asn Trp
            20                  25                  30

Leu Ala Trp Tyr Gln Gln Lys Pro Gly Asn Ala Pro Arg Val Leu Ile
        35                  40                  45

Ser Gly Ala Thr Ser Leu Glu Thr Gly Val Pro Ser Arg Phe Ser Gly
    50                  55                  60

Ser Gly Ser Gly Lys Asp Tyr Thr Leu Ser Ile Thr Ser Leu Gln Thr
65                  70                  75                  80

Glu Asp Val Ala Thr Tyr Tyr Cys Gln Gln Tyr Trp Ser Ile Pro Leu
                85                  90                  95

Thr Phe Gly Ala Gly Thr Lys Leu Glu Leu Lys
            100                 105

<210> SEQ ID NO 33
<211> LENGTH: 8
<212> TYPE: PRT
<213> ORGANISM: Artificial Sequence
<220> FEATURE:
<223> OTHER INFORMATION: Synthetic: hCD103.07A heavy chain CDR1 (amino
      acid sequence)

<400> SEQUENCE: 33

Gly Asp Ser Ile Thr Ser Gly Tyr
1               5

<210> SEQ ID NO 34
<211> LENGTH: 7
<212> TYPE: PRT
<213> ORGANISM: Artificial Sequence
<220> FEATURE:
<223> OTHER INFORMATION: Synthetic: hCD103.07A heavy chain CDR2 (amino
      acid sequence)

<400> SEQUENCE: 34

Ile Thr Tyr Ser Gly Ser Thr
1               5

<210> SEQ ID NO 35
<211> LENGTH: 12
<212> TYPE: PRT
<213> ORGANISM: Artificial Sequence
<220> FEATURE:
<223> OTHER INFORMATION: Synthetic: hCD103.07A heavy chain CDR3 (amino
      acid sequence)

<400> SEQUENCE: 35

Ala Arg Asn Tyr Tyr Gly Ser Ser Ser Met Asp Tyr
1               5                   10

<210> SEQ ID NO 36
<211> LENGTH: 6
<212> TYPE: PRT
<213> ORGANISM: Artificial Sequence
<220> FEATURE:
<223> OTHER INFORMATION: Synthetic: hCD103.07A light chain CDR1 (amino
      acid sequence)

<400> SEQUENCE: 36

Gln Asn Val Gly Ser Asp
1               5

<210> SEQ ID NO 37
<211> LENGTH: 3
<212> TYPE: PRT
<213> ORGANISM: Artificial Sequence
<220> FEATURE:
<223> OTHER INFORMATION: Synthetic: hCD103.07A light chain CDR2 (amino
      acid sequence)

<400> SEQUENCE: 37

Ser Ala Ser
1

<210> SEQ ID NO 38
<211> LENGTH: 9
<212> TYPE: PRT
<213> ORGANISM: Artificial Sequence
<220> FEATURE:
<223> OTHER INFORMATION: Synthetic: hCD103.07A light chain CDR3 (amino
      acid sequence)

<400> SEQUENCE: 38

Gln Gln Tyr Asn Ser Tyr Pro Ser Thr
1               5

<210> SEQ ID NO 39
<211> LENGTH: 118
<212> TYPE: PRT
<213> ORGANISM: Artificial Sequence
<220> FEATURE:
<223> OTHER INFORMATION: Synthetic: hCD103.07A heavy chain (amino acid
      sequence)

<400> SEQUENCE: 39

Glu Val Gln Leu Gln Glu Ser Gly Pro Ser Leu Val Lys Pro Ser Gln
1               5                   10                  15

Thr Leu Ser Leu Thr Cys Ser Val Thr Gly Asp Ser Ile Thr Ser Gly
            20                  25                  30

Tyr Trp Asn Trp Ile Arg Lys Phe Pro Gly Asn Lys Leu Glu Tyr Met
        35                  40                  45

Gly Tyr Ile Thr Tyr Ser Gly Ser Thr Tyr Tyr Asn Pro Ser Leu Lys
    50                  55                  60

Ser Arg Ile Ser Ile Thr Arg Asp Thr Ser Lys Asn Gln Tyr Tyr Leu
65                  70                  75                  80

Gln Leu Asn Ser Val Thr Thr Glu Asp Thr Ala Thr Tyr Tyr Cys Ala
                85                  90                  95

Arg Asn Tyr Tyr Gly Ser Ser Met Asp Tyr Trp Gly Gln Gly Thr
            100                 105                 110

Ser Val Thr Val Ser Ser
        115

<210> SEQ ID NO 40
<211> LENGTH: 107
<212> TYPE: PRT
<213> ORGANISM: Artificial Sequence
<220> FEATURE:
<223> OTHER INFORMATION: Synthetic: hCD103.07A light chain (amino acid
      sequence)

<400> SEQUENCE: 40

Asp Ile Val Met Thr Gln Ser Gln Lys Phe Met Ser Thr Ser Val Ala
1               5                   10                  15

Asp Arg Val Ser Val Thr Cys Lys Ala Ser Gln Asn Val Gly Ser Asp

```
            20                  25                  30
Val Ala Trp Tyr Gln Gln Lys Pro Gly Gln Ser Pro Lys Ser Leu Ile
            35                  40                  45

Tyr Ser Ala Ser Tyr Arg Tyr Ser Gly Val Pro Asp Arg Phe Thr Gly
    50                  55                  60

Ser Gly Ser Gly Thr Asp Phe Thr Leu Thr Ile Ser Asn Val Gln Ser
65                  70                  75                  80

Glu Asp Leu Ala Glu Tyr Phe Cys Gln Gln Tyr Asn Ser Tyr Pro Ser
                85                  90                  95

Thr Phe Gly Gly Gly Thr Lys Leu Glu Ile Lys
            100                 105

<210> SEQ ID NO 41
<211> LENGTH: 1179
<212> TYPE: PRT
<213> ORGANISM: Homo sapiens
<220> FEATURE:
<223> OTHER INFORMATION: human integrin Alpha-E (amino acid sequence)

<400> SEQUENCE: 41

Met Trp Leu Phe His Thr Leu Leu Cys Ile Ala Ser Leu Ala Leu Leu
1               5                   10                  15

Ala Ala Phe Asn Val Asp Val Ala Arg Pro Trp Leu Thr Pro Lys Gly
            20                  25                  30

Gly Ala Pro Phe Val Leu Ser Ser Leu Leu His Gln Asp Pro Ser Thr
        35                  40                  45

Asn Gln Thr Trp Leu Leu Val Thr Ser Pro Arg Thr Lys Arg Thr Pro
    50                  55                  60

Gly Pro Leu His Arg Cys Ser Leu Val Gln Asp Glu Ile Leu Cys His
65                  70                  75                  80

Pro Val Glu His Val Pro Ile Pro Lys Gly Arg His Arg Gly Val Thr
                85                  90                  95

Val Val Arg Ser His His Gly Val Leu Ile Cys Ile Gln Val Leu Val
            100                 105                 110

Arg Arg Pro His Ser Leu Ser Ser Glu Leu Thr Gly Thr Cys Ser Leu
        115                 120                 125

Leu Gly Pro Asp Leu Arg Pro Gln Ala Gln Ala Asn Phe Phe Asp Leu
    130                 135                 140

Glu Asn Leu Leu Asp Pro Asp Ala Arg Val Asp Thr Gly Asp Cys Tyr
145                 150                 155                 160

Ser Asn Lys Glu Gly Gly Gly Glu Asp Asp Val Asn Thr Ala Arg Gln
                165                 170                 175

Arg Arg Ala Leu Glu Lys Glu Glu Glu Asp Lys Glu Glu Glu
            180                 185                 190

Asp Glu Glu Glu Glu Ala Gly Thr Glu Ile Ala Ile Ile Leu Asp
        195                 200                 205

Gly Ser Gly Ser Ile Asp Pro Pro Asp Phe Gln Arg Ala Lys Asp Phe
    210                 215                 220

Ile Ser Asn Met Met Arg Asn Phe Tyr Glu Lys Cys Phe Glu Cys Asn
225                 230                 235                 240

Phe Ala Leu Val Gln Tyr Gly Gly Val Ile Gln Thr Glu Phe Asp Leu
                245                 250                 255

Arg Asp Ser Gln Asp Val Met Ala Ser Leu Ala Arg Val Gln Asn Ile
            260                 265                 270

Thr Gln Val Gly Ser Val Thr Lys Thr Ala Ser Ala Met Gln His Val
```

```
            275                 280                 285
Leu Asp Ser Ile Phe Thr Ser Ser His Gly Ser Arg Arg Lys Ala Ser
290                 295                 300

Lys Val Met Val Val Leu Thr Asp Gly Gly Ile Phe Glu Asp Pro Leu
305                 310                 315                 320

Asn Leu Thr Thr Val Ile Asn Ser Pro Lys Met Gln Gly Val Glu Arg
                325                 330                 335

Phe Ala Ile Gly Val Gly Glu Glu Phe Lys Ser Ala Arg Thr Ala Arg
                340                 345                 350

Glu Leu Asn Leu Ile Ala Ser Asp Pro Asp Glu Thr His Ala Phe Lys
                355                 360                 365

Val Thr Asn Tyr Met Ala Leu Asp Gly Leu Leu Ser Lys Leu Arg Tyr
370                 375                 380

Asn Ile Ile Ser Met Glu Gly Thr Val Gly Asp Ala Leu His Tyr Gln
385                 390                 395                 400

Leu Ala Gln Ile Gly Phe Ser Ala Gln Ile Leu Asp Glu Arg Gln Val
                405                 410                 415

Leu Leu Gly Ala Val Gly Ala Phe Asp Trp Ser Gly Gly Ala Leu Leu
                420                 425                 430

Tyr Asp Thr Arg Ser Arg Arg Gly Arg Phe Leu Asn Gln Thr Ala Ala
                435                 440                 445

Ala Ala Ala Asp Ala Glu Ala Ala Gln Tyr Ser Tyr Leu Gly Tyr Ala
                450                 455                 460

Val Ala Val Leu His Lys Thr Cys Ser Leu Ser Tyr Ile Ala Gly Ala
465                 470                 475                 480

Pro Arg Tyr Lys His His Gly Ala Val Phe Glu Leu Gln Lys Glu Gly
                485                 490                 495

Arg Glu Ala Ser Phe Leu Pro Val Leu Glu Gly Glu Gln Met Gly Ser
                500                 505                 510

Tyr Phe Gly Ser Glu Leu Cys Pro Val Asp Ile Asp Met Asp Gly Ser
                515                 520                 525

Thr Asp Phe Leu Leu Val Ala Ala Pro Phe Tyr His Val His Gly Glu
                530                 535                 540

Glu Gly Arg Val Tyr Val Tyr Arg Leu Ser Glu Gln Asp Gly Ser Phe
545                 550                 555                 560

Ser Leu Ala Arg Ile Leu Ser Gly His Pro Gly Phe Thr Asn Ala Arg
                565                 570                 575

Phe Gly Phe Ala Met Ala Ala Met Gly Asp Leu Ser Gln Asp Lys Leu
                580                 585                 590

Thr Asp Val Ala Ile Gly Ala Pro Leu Glu Gly Phe Gly Ala Asp Asp
                595                 600                 605

Gly Ala Ser Phe Gly Ser Val Tyr Ile Tyr Asn Gly His Trp Asp Gly
                610                 615                 620

Leu Ser Ala Ser Pro Ser Gln Arg Ile Arg Ala Ser Thr Val Ala Pro
625                 630                 635                 640

Gly Leu Gln Tyr Phe Gly Met Ser Met Ala Gly Gly Phe Asp Ile Ser
                645                 650                 655

Gly Asp Gly Leu Ala Asp Ile Thr Val Gly Thr Leu Gly Gln Ala Val
                660                 665                 670

Val Phe Arg Ser Arg Pro Val Val Arg Leu Lys Val Ser Met Ala Phe
                675                 680                 685

Thr Pro Ser Ala Leu Pro Ile Gly Phe Asn Gly Val Val Asn Val Arg
690                 695                 700
```

```
Leu Cys Phe Glu Ile Ser Ser Val Thr Thr Ala Ser Glu Ser Gly Leu
705                 710                 715                 720

Arg Glu Ala Leu Leu Asn Phe Thr Leu Asp Val Asp Val Gly Lys Gln
            725                 730                 735

Arg Arg Arg Leu Gln Cys Ser Asp Val Arg Ser Cys Leu Gly Cys Leu
            740                 745                 750

Arg Glu Trp Ser Ser Gly Ser Gln Leu Cys Glu Asp Leu Leu Leu Met
            755                 760                 765

Pro Thr Glu Gly Glu Leu Cys Glu Glu Asp Cys Phe Ser Asn Ala Ser
770                 775                 780

Val Lys Val Ser Tyr Gln Leu Gln Thr Pro Glu Gly Gln Thr Asp His
785                 790                 795                 800

Pro Gln Pro Ile Leu Asp Arg Tyr Thr Glu Pro Phe Ala Ile Phe Gln
                805                 810                 815

Leu Pro Tyr Glu Lys Ala Cys Lys Asn Lys Leu Phe Cys Val Ala Glu
                820                 825                 830

Leu Gln Leu Ala Thr Thr Val Ser Gln Gln Glu Leu Val Val Gly Leu
                835                 840                 845

Thr Lys Glu Leu Thr Leu Asn Ile Asn Leu Thr Asn Ser Gly Glu Asp
850                 855                 860

Ser Tyr Met Thr Ser Met Ala Leu Asn Tyr Pro Arg Asn Leu Gln Leu
865                 870                 875                 880

Lys Arg Met Gln Lys Pro Pro Ser Pro Asn Ile Gln Cys Asp Asp Pro
                885                 890                 895

Gln Pro Val Ala Ser Val Leu Ile Met Asn Cys Arg Ile Gly His Pro
                900                 905                 910

Val Leu Lys Arg Ser Ser Ala His Val Ser Val Val Trp Gln Leu Glu
                915                 920                 925

Glu Asn Ala Phe Pro Asn Arg Thr Ala Asp Ile Thr Val Thr Val Thr
930                 935                 940

Asn Ser Asn Glu Arg Arg Ser Leu Ala Asn Glu Thr His Thr Leu Gln
945                 950                 955                 960

Phe Arg His Gly Phe Val Ala Val Leu Ser Lys Pro Ser Ile Met Tyr
                965                 970                 975

Val Asn Thr Gly Gln Gly Leu Ser His His Lys Glu Phe Leu Phe His
                980                 985                 990

Val His Gly Glu Asn Leu Phe Gly Ala Glu Tyr Gln Leu Gln Ile Cys
                995                 1000                1005

Val Pro Thr Lys Leu Arg Gly Leu Gln Val Val Ala Val Lys Lys Leu
                1010                1015                1020

Thr Arg Thr Gln Ala Ser Thr Val Cys Thr Trp Ser Gln Glu Arg Ala
1025                1030                1035                1040

Cys Ala Tyr Ser Ser Val Gln His Val Glu Glu Trp His Ser Val Ser
                1045                1050                1055

Cys Val Ile Ala Ser Asp Lys Glu Asn Val Thr Val Ala Ala Glu Ile
                1060                1065                1070

Ser Trp Asp His Ser Glu Glu Leu Leu Lys Asp Val Thr Glu Leu Gln
                1075                1080                1085

Ile Leu Gly Glu Ile Ser Phe Asn Lys Ser Leu Tyr Glu Gly Leu Asn
                1090                1095                1100

Ala Glu Asn His Arg Thr Lys Ile Thr Val Val Phe Leu Lys Asp Glu
1105                1110                1115                1120
```

```
Lys Tyr His Ser Leu Pro Ile Ile Ile Lys Gly Ser Val Gly Gly Leu
                    1125                1130                1135

Leu Val Leu Ile Val Ile Leu Val Ile Leu Phe Lys Cys Gly Phe Phe
                1140                1145                1150

Lys Arg Lys Tyr Gln Gln Leu Asn Leu Glu Ser Ile Arg Lys Ala Gln
            1155                1160                1165

Leu Lys Ser Glu Asn Leu Leu Glu Glu Glu Asn
        1170                1175

<210> SEQ ID NO 42
<211> LENGTH: 798
<212> TYPE: PRT
<213> ORGANISM: Homo sapiens
<220> FEATURE:
<223> OTHER INFORMATION: human integrin Beta-7 (amino acid sequence)

<400> SEQUENCE: 42

Met Val Ala Leu Pro Met Val Leu Val Leu Leu Leu Val Leu Ser Arg
1               5                   10                  15

Gly Glu Ser Glu Leu Asp Ala Lys Ile Pro Ser Thr Gly Asp Ala Thr
            20                  25                  30

Glu Trp Arg Asn Pro His Leu Ser Met Leu Gly Ser Cys Gln Pro Ala
        35                  40                  45

Pro Ser Cys Gln Lys Cys Ile Leu Ser His Pro Ser Cys Ala Trp Cys
    50                  55                  60

Lys Gln Leu Asn Phe Thr Ala Ser Gly Glu Ala Glu Ala Arg Arg Cys
65              70                  75                  80

Ala Arg Arg Glu Glu Leu Leu Ala Arg Gly Cys Pro Leu Glu Glu Leu
                85                  90                  95

Glu Glu Pro Arg Gly Gln Gln Glu Val Leu Gln Asp Gln Pro Leu Ser
            100                 105                 110

Gln Gly Ala Arg Gly Glu Gly Ala Thr Gln Leu Ala Pro Gln Arg Val
        115                 120                 125

Arg Val Thr Leu Arg Pro Gly Glu Pro Gln Gln Leu Gln Val Arg Phe
130             135                 140

Leu Arg Ala Glu Gly Tyr Pro Val Asp Leu Tyr Tyr Leu Met Asp Leu
145             150                 155                 160

Ser Tyr Ser Met Lys Asp Asp Leu Glu Arg Val Arg Gln Leu Gly His
                165                 170                 175

Ala Leu Leu Val Arg Leu Gln Glu Val Thr His Ser Val Arg Ile Gly
            180                 185                 190

Phe Gly Ser Phe Val Asp Lys Thr Val Leu Pro Phe Val Ser Thr Val
        195                 200                 205

Pro Ser Lys Leu Arg His Pro Cys Pro Thr Arg Leu Glu Arg Cys Gln
    210                 215                 220

Ser Pro Phe Ser Phe His His Val Leu Ser Leu Thr Gly Asp Ala Gln
225             230                 235                 240

Ala Phe Glu Arg Glu Val Gly Arg Gln Ser Val Ser Gly Asn Leu Asp
                245                 250                 255

Ser Pro Glu Gly Gly Phe Asp Ala Ile Leu Gln Ala Ala Leu Cys Gln
            260                 265                 270

Glu Gln Ile Gly Trp Arg Asn Val Ser Arg Leu Leu Val Phe Thr Ser
        275                 280                 285

Asp Asp Thr Phe His Thr Ala Gly Asp Gly Lys Leu Gly Gly Ile Phe
    290                 295                 300
```

-continued

```
Met Pro Ser Asp Gly His Cys His Leu Asp Ser Asn Gly Leu Tyr Ser
305                 310                 315                 320

Arg Ser Thr Glu Phe Asp Tyr Pro Ser Val Gly Gln Val Ala Gln Ala
            325                 330                 335

Leu Ser Ala Ala Asn Ile Gln Pro Ile Phe Ala Val Thr Ser Ala Ala
            340                 345                 350

Leu Pro Val Tyr Gln Glu Leu Ser Lys Leu Ile Pro Lys Ser Ala Val
            355                 360                 365

Gly Glu Leu Ser Glu Asp Ser Ser Asn Val Val Gln Leu Ile Met Asp
            370                 375                 380

Ala Tyr Asn Ser Leu Ser Ser Thr Val Thr Leu Glu His Ser Ser Leu
385                 390                 395                 400

Pro Pro Gly Val His Ile Ser Tyr Glu Ser Gln Cys Glu Gly Pro Glu
            405                 410                 415

Lys Arg Glu Gly Lys Ala Glu Asp Arg Gly Gln Cys Asn His Val Arg
            420                 425                 430

Ile Asn Gln Thr Val Thr Phe Trp Val Ser Leu Gln Ala Thr His Cys
            435                 440                 445

Leu Pro Glu Pro His Leu Leu Arg Leu Arg Ala Leu Gly Phe Ser Glu
    450                 455                 460

Glu Leu Ile Val Glu Leu His Thr Leu Cys Asp Cys Asn Cys Ser Asp
465                 470                 475                 480

Thr Gln Pro Gln Ala Pro His Cys Ser Asp Gly Gln His Leu Gln
            485                 490                 495

Cys Gly Val Cys Ser Cys Ala Pro Gly Arg Leu Gly Arg Leu Cys Glu
            500                 505                 510

Cys Ser Val Ala Glu Leu Ser Ser Pro Asp Leu Glu Ser Gly Cys Arg
    515                 520                 525

Ala Pro Asn Gly Thr Gly Pro Leu Cys Ser Gly Lys Gly His Cys Gln
    530                 535                 540

Cys Gly Arg Cys Ser Cys Ser Gly Gln Ser Ser Gly His Leu Cys Glu
545                 550                 555                 560

Cys Asp Asp Ala Ser Cys Glu Arg His Glu Gly Ile Leu Cys Gly Gly
            565                 570                 575

Phe Gly Arg Cys Gln Cys Gly Val Cys His Cys His Ala Asn Arg Thr
            580                 585                 590

Gly Arg Ala Cys Glu Cys Ser Gly Asp Met Asp Ser Cys Ile Ser Pro
            595                 600                 605

Glu Gly Gly Leu Cys Ser Gly His Gly Arg Cys Lys Cys Asn Arg Cys
            610                 615                 620

Gln Cys Leu Asp Gly Tyr Tyr Gly Ala Leu Cys Asp Gln Cys Pro Gly
625                 630                 635                 640

Cys Lys Thr Pro Cys Glu Arg His Arg Asp Cys Ala Glu Cys Gly Ala
            645                 650                 655

Phe Arg Thr Gly Pro Leu Ala Thr Asn Cys Ser Thr Cys Ala His
            660                 665                 670

Thr Asn Val Thr Leu Ala Leu Ala Pro Ile Leu Asp Asp Gly Trp Cys
            675                 680                 685

Lys Glu Arg Thr Leu Asp Asn Gln Leu Phe Phe Leu Val Glu Asp
            690                 695                 700

Asp Ala Arg Gly Thr Val Val Leu Arg Val Arg Pro Gln Glu Lys Gly
705                 710                 715                 720

Ala Asp His Thr Gln Ala Ile Val Leu Gly Cys Val Gly Gly Ile Val
```

-continued

```
                    725                 730                 735
Ala Val Gly Leu Gly Leu Val Leu Ala Tyr Arg Leu Ser Val Glu Ile
                740                 745                 750

Tyr Asp Arg Arg Glu Tyr Ser Arg Phe Glu Lys Glu Gln Gln Gln Leu
            755                 760                 765

Asn Trp Lys Gln Asp Ser Asn Pro Leu Tyr Lys Ser Ala Ile Thr Thr
        770                 775                 780

Thr Ile Asn Pro Arg Phe Gln Glu Ala Asp Ser Pro Thr Leu
785                 790                 795

<210> SEQ ID NO 43
<211> LENGTH: 1178
<212> TYPE: PRT
<213> ORGANISM: Macaca mulatta
<220> FEATURE:
<223> OTHER INFORMATION: rhesus integrin Alpha-E (amino acid sequence)

<400> SEQUENCE: 43

Met Trp Leu Val His Thr Leu Leu Cys Met Ala Ser Leu Ala Pro Leu
1               5                   10                  15

Ala Ala Phe Asn Val Asp Val Ala Arg Pro Trp Leu Thr Pro Lys Gly
                20                  25                  30

Gly Ala Pro Phe Val Leu Ser Ser Leu Leu His Gln Asp Pro Gly Thr
            35                  40                  45

Asn His Thr Trp Leu Leu Val Thr Ser Pro Arg Thr Glu Arg Thr Pro
        50                  55                  60

Val Pro Leu His Arg Cys Ser Leu Val Gln Asp Glu Ile Leu Cys His
65                  70                  75                  80

Ser Val Glu His Val Pro Ile Pro Lys Gly Arg His Arg Gly Val Thr
                85                  90                  95

Val Ala Arg Ser His His Gly Val Leu Ile Cys Ile Gln Val Leu Ala
                100                 105                 110

Arg Arg Pro Tyr Ser Leu Ser Ser Glu Phe Thr Gly Thr Cys Gly Leu
            115                 120                 125

Leu Gly Pro Asp Leu Arg Pro Gln Ala Gln Ala Asn Phe Phe Asp Leu
        130                 135                 140

Glu Asn Leu Leu Asp Pro Asp Ala Arg Val Asp Thr Gly Asp Cys Tyr
145                 150                 155                 160

Ser Asn Lys Glu Gly Ser Arg Gly Glu Asp Val Asn Thr Ala Arg Arg
                165                 170                 175

Arg Arg Ala Leu Glu Lys Glu Glu Glu Glu Asp Glu Glu Glu Glu
            180                 185                 190

Glu Asp Glu Glu Glu Ala Gly Thr Glu Ile Ala Ile Ile Leu Asp
        195                 200                 205

Gly Ser Gly Ser Ile Asp Pro Pro Asp Phe Gln Arg Ala Lys Asp Phe
        210                 215                 220

Ile Ser Asn Met Met Arg Asn Phe Tyr Glu Lys Cys Phe Glu Cys Asn
225                 230                 235                 240

Phe Ala Leu Val Gln Tyr Gly Gly Val Ile Gln Thr Glu Phe Asp Leu
                245                 250                 255

Arg Asp Ser Gln Asp Val Met Ala Ser Leu Ala Lys Val Gln Asn Ile
            260                 265                 270

Thr Gln Val Gly Ser Val Thr Lys Thr Ala Ser Ala Met Gln His Val
        275                 280                 285

Leu Asp Asn Ile Phe Thr Ser Ser His Gly Ser Arg Arg Lys Ala Ser
```

```
                290                 295                 300
Lys Val Met Val Val Leu Thr Asp Gly Gly Ile Phe Glu Asp Pro Leu
305                 310                 315                 320

Asp Leu Thr Thr Val Ile Asn Ser Pro Lys Met His Gly Val Glu Arg
                325                 330                 335

Phe Ala Ile Gly Val Gly Glu Glu Phe Lys Ser Ala Arg Thr Glu Arg
                340                 345                 350

Glu Leu Asn Leu Ile Ala Ser Asp Pro Asp Glu Thr His Ala Phe Lys
                355                 360                 365

Val Thr Asn Tyr Met Ala Leu Asp Gly Leu Leu Ser Lys Leu Arg Tyr
370                 375                 380

Asn Ile Ile Ser Met Glu Gly Thr Val Gly Asp Ala Leu His Tyr Gln
385                 390                 395                 400

Leu Ala Gln Ile Gly Phe Ser Ala Gln Ile Leu Asp Glu Arg Gln Val
                405                 410                 415

Leu Leu Gly Ala Val Gly Ala Phe Asp Trp Ser Gly Gly Ala Leu Leu
                420                 425                 430

Tyr Asn Thr Arg Ser Arg Arg Gly Arg Phe Leu Asn Gln Thr Ala Ala
                435                 440                 445

Ala Val Asp Gly Glu Ala Ala Gln Tyr Ser Tyr Leu Gly Tyr Ala Val
                450                 455                 460

Ala Val Leu His Lys Thr Cys Ser Val Ser Tyr Val Ala Gly Ala Pro
465                 470                 475                 480

Arg Tyr Lys His His Gly Ala Val Phe Glu Leu Gln Lys Glu Gly Thr
                485                 490                 495

Glu Thr Ser Phe Leu Pro Val Leu Glu Gly Glu Gln Met Gly Ser Tyr
                500                 505                 510

Phe Gly Ser Glu Leu Cys Pro Val Asp Ile Asp Met Asp Gly Thr Thr
                515                 520                 525

Asp Phe Leu Leu Val Ala Ala Pro Phe Tyr His Val His Gly Glu Glu
                530                 535                 540

Gly Arg Val Tyr Val Tyr Arg Leu Ser Glu Gln Asp Gly Ser Phe Ser
545                 550                 555                 560

Leu Ala Arg Ile Leu Ser Gly His Pro Gly Phe Ala Ser Ala Arg Phe
                565                 570                 575

Gly Phe Ala Met Ala Ala Val Gly Asp Ile Ser Gln Asp Lys Leu Thr
                580                 585                 590

Asp Val Ala Ile Gly Ala Pro Leu Glu Gly Phe Gly Ala Gly Asp Gly
                595                 600                 605

Ala Ser Phe Gly Ser Val Tyr Ile Tyr Asn Gly His Trp Asp Gly Leu
610                 615                 620

Ser Ala Gly Pro Ser Gln Arg Ile Arg Ala Ser Ala Val Ala Pro Gly
625                 630                 635                 640

Leu Gln Tyr Phe Gly Met Ser Val Ala Gly Gly Phe Asp Ile Ser Gly
                645                 650                 655

Asp Gly Leu Ala Asp Ile Thr Val Gly Thr Leu Gly Arg Ala Val Val
                660                 665                 670

Phe Arg Ser Arg Pro Val Val Arg Leu Glu Val Ser Met Ala Phe Thr
                675                 680                 685

Pro Ser Ala Leu Pro Ile Gly Phe Asn Gly Val Val Asn Val Arg Leu
                690                 695                 700

Cys Phe Glu Ile Ser Ser Val Ala Thr Val Ser Ala Ser Gly Leu Arg
705                 710                 715                 720
```

```
Gly Ala Phe Leu Asn Phe Thr Leu Asp Val Asp Val Gly Lys Glu Arg
            725                 730                 735

Lys Arg Leu Gln Cys Ser Asp Gly Arg Ser Cys Leu Gly Cys Leu Arg
            740                 745                 750

Glu Trp Ser Ser Gly Ser Arg Leu Cys Glu Asp Leu Leu Leu Val Pro
            755                 760                 765

Thr Glu Gly Glu Leu His Glu Glu Asp Cys Phe Ser Asn Ala Thr Val
770                 775                 780

Lys Val Gly Tyr Gln Leu Gln Thr Pro Glu Gly Gln Thr Asp His Pro
785                 790                 795                 800

Gln Pro Ile Leu Asp Arg Tyr Ala Glu Thr Phe Ala Ile Phe Gln Leu
            805                 810                 815

Pro Tyr Glu Lys Ala Cys Lys Asn Lys Leu Phe Cys Val Ala Glu Leu
            820                 825                 830

Gln Leu Ala Thr Thr Val Ser Gln Gln Glu Leu Val Val Gly Leu Thr
            835                 840                 845

Lys Glu Leu Thr Leu Asn Ile Ser Leu Thr Asn Ser Gly Glu Asp Ser
            850                 855                 860

Tyr Met Thr Ser Met Ala Leu Asn Tyr Pro Arg Asn Leu Gln Phe Lys
865                 870                 875                 880

Arg Met Gln Lys Pro Pro Ser Pro Asn Ile Gln Cys Asp Asp Pro Gln
            885                 890                 895

Pro Ala Ala Ser Val Leu Val Met Thr Cys Arg Ile Gly His Pro Val
            900                 905                 910

Leu Arg Arg Ser Ser Ala His Val Ser Val Val Trp Gln Leu Glu Glu
            915                 920                 925

Asn Ala Phe Pro Asn Arg Thr Ala Asp Ile Thr Val Thr Val Thr Asn
            930                 935                 940

Ser Asn Glu Arg Arg Ser Val Ala Glu Thr His Thr Leu Gln Phe
945                 950                 955                 960

Arg His Gly Phe Val Ala Val Leu Ser Lys Pro Ser Ile Met Tyr Val
            965                 970                 975

His Thr Gly Gln Val Leu Ser His His Lys Glu Phe Val Phe His Ile
            980                 985                 990

His Gly Glu Asn Leu Phe Gly Ala Glu Tyr Gln Leu Arg Ile Cys Val
            995                 1000                1005

Pro Thr Lys Leu Arg Gly Leu Gln Ile Val Thr Val Lys Asn Leu Thr
            1010                1015                1020

Arg Thr Gln Ala Phe Thr Val Cys Thr Trp Ser Gln Glu Arg Ala Cys
1025                1030                1035                1040

Gly Phe Ile Pro Val Gln His Val Glu Glu Trp His Ser Val Ser Cys
            1045                1050                1055

Val Ile Ala Ser Asp Lys Glu Asn Val Thr Val Ala Ala Glu Ile Ser
            1060                1065                1070

Val Asp His Ser Glu Glu Leu Leu Lys Asp Val Thr Glu Leu Gln Ile
            1075                1080                1085

Leu Gly Glu Ile Ser Phe Asn Lys Ser Leu Tyr Glu Gly Leu Asn Ala
            1090                1095                1100

Glu Asn His Arg Thr Lys Ile Thr Val Val Phe Leu Lys Asp Glu Lys
1105                1110                1115                1120

Tyr His Ser Leu Pro Val Ile Ile Lys Gly Ser Ile Gly Gly Leu Leu
            1125                1130                1135
```

```
Val Leu Ile Val Ile Leu Val Ile Leu Phe Lys Cys Gly Phe Phe Lys
        1140            1145            1150

Arg Lys Tyr Gln Gln Leu Asn Leu Glu Asn Ile Arg Lys Ala Gln Leu
        1155            1160            1165

Lys Ser Glu Thr Leu Leu Glu Glu Asn
        1170            1175

<210> SEQ ID NO 44
<211> LENGTH: 807
<212> TYPE: PRT
<213> ORGANISM: Macaca mulatta
<220> FEATURE:
<223> OTHER INFORMATION: rhesus integrin Beta-7 (amino acid sequence)

<400> SEQUENCE: 44

Met Gly Phe Cys His Val Asp Gln Gly Met Val Ala Leu Pro Val Val
1               5                   10                  15

Leu Val Leu Leu Leu Val Leu Ser Arg Gly Glu Ser Glu Leu Asp Ala
            20                  25                  30

Lys Thr Pro Ser Thr Gly Glu Ala Thr Glu Trp Gly Asn Pro His Leu
        35                  40                  45

Ser Leu Leu Gly Ser Cys Gln Pro Ala Pro Ser Cys Gln Lys Cys Ile
    50                  55                  60

Val Ser His Pro Ser Cys Ala Trp Cys Lys Gln Leu Asn Phe Thr Ala
65                  70                  75                  80

Ser Gly Glu Ala Glu Ala Arg Arg Cys Ala Arg Arg Glu Glu Leu Leu
                85                  90                  95

Ala Arg Gly Cys Pro Leu Glu Glu Leu Glu Glu Pro Arg Gly Gln Gln
            100                 105                 110

Glu Val Leu Gln Asp Gln Pro Leu Ser Gln Gly Ala Arg Gly Glu Gly
        115                 120                 125

Ala Thr Gln Leu Ala Pro Gln Arg Val Arg Ile Thr Leu Arg Pro Gly
    130                 135                 140

Glu Pro Gln Gln Leu Gln Val Arg Phe Leu Arg Ala Glu Gly Tyr Pro
145                 150                 155                 160

Val Asp Leu Tyr Tyr Leu Met Asp Leu Ser Tyr Ser Met Lys Asp Asp
                165                 170                 175

Leu Glu Arg Val Arg Gln Leu Gly His Ala Leu Leu Val Arg Leu Gln
            180                 185                 190

Glu Val Thr His Ser Val Arg Ile Gly Phe Gly Ser Phe Val Asp Lys
        195                 200                 205

Thr Val Leu Pro Phe Val Ser Thr Val Pro Ser Lys Leu Arg His Pro
    210                 215                 220

Cys Pro Thr Arg Leu Glu Arg Cys Gln Ser Pro Phe Ser Phe His His
225                 230                 235                 240

Val Leu Ser Leu Thr Gly Asp Ala Gln Ala Phe Glu Arg Glu Val Gly
                245                 250                 255

Arg Gln Ser Val Ser Gly Asn Leu Asp Ser Pro Glu Gly Gly Phe Asp
            260                 265                 270

Ala Ile Leu Gln Ala Ala Leu Cys Gln Glu Gln Ile Gly Trp Arg Asn
        275                 280                 285

Val Ser Arg Leu Leu Val Phe Thr Ser Asp Asp Thr Phe His Thr Ala
    290                 295                 300

Gly Asp Gly Lys Leu Gly Gly Ile Phe Met Pro Ser Asp Gly His Cys
305                 310                 315                 320
```

-continued

His Leu Asp Ser Asn Gly Leu Tyr Ser Arg Ser Thr Glu Phe Asp Tyr
            325                 330                 335

Pro Ser Val Gly Gln Val Ala Gln Ala Leu Ser Ala Ala Asn Ile Gln
            340                 345                 350

Pro Ile Phe Ala Val Thr Ser Ala Ala Leu Pro Val Tyr Gln Glu Leu
            355                 360                 365

Ser Lys Leu Ile Pro Lys Ser Ala Val Gly Glu Leu Ser Glu Asp Ser
            370                 375                 380

Ser Asn Val Val Gln Leu Ile Met Asp Ala Tyr Asn Ser Leu Ser Ser
385                 390                 395                 400

Thr Val Thr Leu Glu His Ser Ser Leu Pro Pro Gly Val His Ile Ser
                405                 410                 415

Tyr Glu Ser Gln Cys Glu Gly Pro Lys Thr Glu Gly Lys Ala Glu
            420                 425                 430

Asp Arg Gly Gln Cys Asn His Val Gln Ile Asn Gln Thr Val Thr Phe
            435                 440                 445

Trp Val Ser Leu Gln Ala Thr His Cys Leu Pro Glu Pro His Leu Leu
            450                 455                 460

Arg Leu Arg Ala Leu Gly Phe Ser Glu Glu Leu Ile Val Glu Leu His
465                 470                 475                 480

Thr Leu Cys Asp Cys Asn Cys Ser Asp Thr Gln Ala Gln Ala Pro His
                485                 490                 495

Cys Ser Asp Gly Gln Gly His Leu Gln Cys Gly Val Cys Ser Cys Ala
            500                 505                 510

Pro Gly Arg Leu Gly Arg Leu Cys Glu Cys Ser Glu Ala Glu Leu Ser
            515                 520                 525

Ser Leu Asp Leu Glu Ser Gly Cys Arg Ala Pro Asn Gly Thr Gly Pro
            530                 535                 540

Leu Cys Ser Gly Lys Gly Gln Cys Gln Cys Gly His Cys Ser Cys Asn
545                 550                 555                 560

Gly Gln Ser Ser Gly His Leu Cys Glu Cys Asp Asp Ala Ser Cys Glu
                565                 570                 575

Arg His Glu Gly Ile Leu Cys Gly Gly Phe Gly Arg Cys Gln Cys Gly
            580                 585                 590

Val Cys His Cys His Ala Asn Arg Thr Gly Arg Ala Cys Glu Cys Ser
            595                 600                 605

Gly Asp Met Asp Ser Cys Ile Ser Pro Glu Gly Gly Leu Cys Ser Gly
            610                 615                 620

His Gly Arg Cys Lys Cys Asn Arg Cys Gln Cys Ser Asp Gly Tyr Tyr
625                 630                 635                 640

Gly Ala Leu Cys Asp Gln Cys Pro Gly Cys Lys Thr Pro Cys Glu Arg
                645                 650                 655

His Arg Asp Cys Ala Glu Cys Gly Ala Phe Gly Thr Gly Leu Leu Ala
            660                 665                 670

Thr Asn Cys Ser Thr Ala Cys Ala His Thr Asn Val Thr Leu Val Leu
            675                 680                 685

Ala Pro Ile Leu Asp Asp Gly Trp Cys Lys Glu Arg Thr Leu Asp Asn
            690                 695                 700

His Leu Phe Phe Phe Leu Val Glu Asp Asp Ala Arg Gly Arg Val Val
705                 710                 715                 720

Leu Arg Val Arg Pro Gln Glu Lys Gly Ala Asp His Thr Gln Ala Ile
                725                 730                 735

Val Leu Gly Cys Val Gly Gly Ile Val Ala Val Gly Leu Gly Leu Val

```
                740             745             750
Leu Ala Tyr Arg Leu Ser Val Glu Ile Tyr Asp Arg Arg Glu Tyr Ser
            755             760             765

Arg Phe Glu Lys Glu Gln Gln Gln Leu Asn Trp Lys Gln Asp Ser Asn
            770             775             780

Pro Leu Tyr Lys Ser Ala Ile Thr Thr Thr Ile Asn Pro Arg Phe Gln
785             790             795             800

Glu Ala Asp Ser Pro Ile Leu
            805

<210> SEQ ID NO 45
<211> LENGTH: 1032
<212> TYPE: PRT
<213> ORGANISM: Homo sapiens
<220> FEATURE:
<223> OTHER INFORMATION: human integrin Alpha-4 (amino acid sequence)

<400> SEQUENCE: 45

Met Ala Trp Glu Ala Arg Arg Glu Pro Gly Pro Arg Arg Ala Ala Val
1               5               10              15

Arg Glu Thr Val Met Leu Leu Leu Cys Leu Gly Val Pro Thr Gly Arg
            20              25              30

Pro Tyr Asn Val Asp Thr Glu Ser Ala Leu Leu Tyr Gln Gly Pro His
            35              40              45

Asn Thr Leu Phe Gly Tyr Ser Val Val Leu His Ser His Gly Ala Asn
            50              55              60

Arg Trp Leu Leu Val Gly Ala Pro Thr Ala Asn Trp Leu Ala Asn Ala
65              70              75              80

Ser Val Ile Asn Pro Gly Ala Ile Tyr Arg Cys Arg Ile Gly Lys Asn
                85              90              95

Pro Gly Gln Thr Cys Glu Gln Leu Gln Leu Gly Ser Pro Asn Gly Glu
            100             105             110

Pro Cys Gly Lys Thr Cys Leu Glu Glu Arg Asp Asn Gln Trp Leu Gly
            115             120             125

Val Thr Leu Ser Arg Gln Pro Gly Glu Asn Gly Ser Ile Val Thr Cys
130             135             140

Gly His Arg Trp Lys Asn Ile Phe Tyr Ile Lys Asn Glu Asn Lys Leu
145             150             155             160

Pro Thr Gly Gly Cys Tyr Gly Val Pro Pro Asp Leu Arg Thr Glu Leu
                165             170             175

Ser Lys Arg Ile Ala Pro Cys Tyr Gln Asp Tyr Val Lys Lys Phe Gly
            180             185             190

Glu Asn Phe Ala Ser Cys Gln Ala Gly Ile Ser Ser Phe Tyr Thr Lys
            195             200             205

Asp Leu Ile Val Met Gly Ala Pro Gly Ser Ser Tyr Trp Thr Gly Ser
        210             215             220

Leu Phe Val Tyr Asn Ile Thr Thr Asn Lys Tyr Lys Ala Phe Leu Asp
225             230             235             240

Lys Gln Asn Gln Val Lys Phe Gly Ser Tyr Leu Gly Tyr Ser Val Gly
                245             250             255

Ala Gly His Phe Arg Ser Gln His Thr Thr Glu Val Val Gly Gly Ala
            260             265             270

Pro Gln His Glu Gln Ile Gly Lys Ala Tyr Ile Phe Ser Ile Asp Glu
            275             280             285

Lys Glu Leu Asn Ile Leu His Glu Met Lys Gly Lys Lys Leu Gly Ser
```

-continued

```
            290                 295                 300

Tyr Phe Gly Ala Ser Val Cys Ala Val Asp Leu Asn Ala Asp Gly Phe
305                 310                 315                 320

Ser Asp Leu Leu Val Gly Ala Pro Met Gln Ser Thr Ile Arg Glu Glu
                325                 330                 335

Gly Arg Val Phe Val Tyr Ile Asn Ser Gly Ser Gly Ala Val Met Asn
                340                 345                 350

Ala Met Glu Thr Asn Leu Val Gly Ser Asp Lys Tyr Ala Ala Arg Phe
            355                 360                 365

Gly Glu Ser Ile Val Asn Leu Gly Asp Ile Asp Asn Asp Gly Phe Glu
        370                 375                 380

Asp Val Ala Ile Gly Ala Pro Gln Glu Asp Asp Leu Gln Gly Ala Ile
385                 390                 395                 400

Tyr Ile Tyr Asn Gly Arg Ala Asp Gly Ile Ser Ser Thr Phe Ser Gln
                405                 410                 415

Arg Ile Glu Gly Leu Gln Ile Ser Lys Ser Leu Ser Met Phe Gly Gln
                420                 425                 430

Ser Ile Ser Gly Gln Ile Asp Ala Asp Asn Asn Gly Tyr Val Asp Val
            435                 440                 445

Ala Val Gly Ala Phe Arg Ser Asp Ser Ala Val Leu Leu Arg Thr Arg
        450                 455                 460

Pro Val Val Ile Val Asp Ala Ser Leu Ser His Pro Glu Ser Val Asn
465                 470                 475                 480

Arg Thr Lys Phe Asp Cys Val Glu Asn Gly Trp Pro Ser Val Cys Ile
                485                 490                 495

Asp Leu Thr Leu Cys Phe Ser Tyr Lys Gly Lys Glu Val Pro Gly Tyr
            500                 505                 510

Ile Val Leu Phe Tyr Asn Met Ser Leu Asp Val Asn Arg Lys Ala Glu
        515                 520                 525

Ser Pro Pro Arg Phe Tyr Phe Ser Ser Asn Gly Thr Ser Asp Val Ile
530                 535                 540

Thr Gly Ser Ile Gln Val Ser Ser Arg Glu Ala Asn Cys Arg Thr His
545                 550                 555                 560

Gln Ala Phe Met Arg Lys Asp Val Arg Asp Ile Leu Thr Pro Ile Gln
                565                 570                 575

Ile Glu Ala Ala Tyr His Leu Gly Pro His Val Ile Ser Lys Arg Ser
            580                 585                 590

Thr Glu Glu Phe Pro Pro Leu Gln Pro Ile Leu Gln Gln Lys Lys Glu
        595                 600                 605

Lys Asp Ile Met Lys Lys Thr Ile Asn Phe Ala Arg Phe Cys Ala His
610                 615                 620

Glu Asn Cys Ser Ala Asp Leu Gln Val Ser Ala Lys Ile Gly Phe Leu
625                 630                 635                 640

Lys Pro His Glu Asn Lys Thr Tyr Leu Ala Val Gly Ser Met Lys Thr
                645                 650                 655

Leu Met Leu Asn Val Ser Leu Phe Asn Ala Gly Asp Asp Ala Tyr Glu
            660                 665                 670

Thr Thr Leu His Val Lys Leu Pro Val Gly Leu Tyr Phe Ile Lys Ile
        675                 680                 685

Leu Glu Leu Glu Glu Lys Gln Ile Asn Cys Glu Val Thr Asp Asn Ser
    690                 695                 700

Gly Val Val Gln Leu Asp Cys Ser Ile Gly Tyr Ile Tyr Val Asp His
705                 710                 715                 720
```

```
Leu Ser Arg Ile Asp Ile Ser Phe Leu Leu Asp Val Ser Ser Leu Ser
            725                 730                 735

Arg Ala Glu Glu Asp Leu Ser Ile Thr Val His Ala Thr Cys Glu Asn
        740                 745                 750

Glu Glu Glu Met Asp Asn Leu Lys His Ser Arg Val Thr Val Ala Ile
        755                 760                 765

Pro Leu Lys Tyr Glu Val Lys Leu Thr Val His Gly Phe Val Asn Pro
        770                 775             780

Thr Ser Phe Val Tyr Gly Ser Asn Asp Glu Asn Pro Glu Thr Cys
785                 790                 795                 800

Met Val Glu Lys Met Asn Leu Thr Phe His Val Ile Asn Thr Gly Asn
            805                 810                 815

Ser Met Ala Pro Asn Val Ser Val Glu Ile Met Val Pro Asn Ser Phe
            820                 825                 830

Ser Pro Gln Thr Asp Lys Leu Phe Asn Ile Leu Asp Val Gln Thr Thr
        835                 840                 845

Thr Gly Glu Cys His Phe Glu Asn Tyr Gln Arg Val Cys Ala Leu Glu
        850                 855                 860

Gln Gln Lys Ser Ala Met Gln Thr Leu Lys Gly Ile Val Arg Phe Leu
865                 870                 875                 880

Ser Lys Thr Asp Lys Arg Leu Leu Tyr Cys Ile Lys Ala Asp Pro His
            885                 890                 895

Cys Leu Asn Phe Leu Cys Asn Phe Gly Lys Met Glu Ser Gly Lys Glu
            900                 905                 910

Ala Ser Val His Ile Gln Leu Glu Gly Arg Pro Ser Ile Leu Glu Met
            915                 920                 925

Asp Glu Thr Ser Ala Leu Lys Phe Glu Ile Arg Ala Thr Gly Phe Pro
        930                 935             940

Glu Pro Asn Pro Arg Val Ile Glu Leu Asn Lys Asp Glu Asn Val Ala
945                 950                 955                 960

His Val Leu Leu Glu Gly Leu His His Gln Arg Pro Lys Arg Tyr Phe
            965                 970                 975

Thr Ile Val Ile Ile Ser Ser Ser Leu Leu Leu Gly Leu Ile Val Leu
            980                 985                 990

Leu Leu Ile Ser Tyr Val Met Trp Lys Ala Gly Phe Phe Lys Arg Gln
        995                 1000                1005

Tyr Lys Ser Ile Leu Gln Glu Glu Asn Arg Arg Asp Ser Trp Ser Tyr
        1010                1015                1020

Ile Asn Ser Lys Ser Asn Asp Asp
1025                1030
```

ANTI-CD103 ANTIBODIES

RELATED APPLICATION

The present invention is filed under 35 U.S.C. § 371 as the U.S. national phase of International Application No. PCT/EP2021/061450, filed Apr. 30, 2021, which designated the United States and claims priority to U.S. Provisional Application Ser. No. 62/704,258, filed Apr. 30, 2020, each of which is hereby incorporated by reference in its entirety.

FIELD OF THE INVENTION

The present invention relates to anti-CD103 antibodies, as well as use of these antibodies in the diagnosis, prognosis, monitoring, and treatment of diseases.

BACKGROUND OF THE INVENTION

CD103 (Integrin αE) is type I membrane protein expressed on a subpopulation of lamina propria T cells, epithelial dendritic cells, lamina propria-derived dendritic cells, and a small subset of peripheral lymphocytes. $T_{reg}$ cells express a high level of CD103. Mature CD103 protein can be cleaved into 2 chains, a 150 kD (C-terminal) chain and a 25 kD (N-terminal) chain, which remain linked by disulfide bonds. In combination with the β7 integrin, CD103 forms an αE/β7 heterodimer, which represents the E-cadherin binding integrin known as the human mucosal lymphocyte-1 antigen.

The identification and understanding of immune checkpoint proteins and their role in the immune response represents a breakthrough in cancer therapy. With this discovery, efforts focused on blocking the immune checkpoint pathways in an attempt to activate T-cells directed at cancer cells that were found to be ineffective in stimulating a productive antitumor response. Ipilimumab, an antibody which binds to and functionally blocks CTLA-4, was approved by the US Food and Drug Administration (FDA) for the treatment of metastatic melanoma in 2011. Following on the heels of ipilimumab, antibodies targeting the programmed cell death-1 (PD-1) receptor, and its ligand found on many cancer cells programmed death-ligand 1 (PD-L1), were also approved. These checkpoint inhibitors have led to a revolution in cancer therapy.

Despite significant clinical benefit ascribed to immunotherapy targeting immune checkpoint pathways, a majority of cancer patients fail to respond to checkpoint inhibitors. In particular, studies suggest that checkpoint inhibition may not be sufficient in patients that display limited functional T cell infiltration into the tumor environment. Moreover, while T cells may accumulate in tissues surrounding the tumor mass, they may not be interacting with tumor cells themselves.

Through their ability to produce T cell-specific chemokines and present antigens together with costimulatory or inhibitory signals, tumor-associated antigen presenting cells are best poised to shape anti-tumoral effector immunity. Tissue-resident dendritic cells consist of two functionally specialized subsets: the CD103$^+$-CD8$^+$ DCs that participate in priming and cross-presentation of cell-associated antigens to CD8$^+$ T cells, and CD11b$^+$ DCs that are more potent at driving CD4$^+$ helper T cell responses. Type I interferon production by the CD103$^+$-CD8$^+$ DC lineage controls spontaneous T cell priming to tumor antigens. Thus, the composition of the tumor-associated myeloid compartment likely plays a key role in tumor response to checkpoint blockade.

The reported association of CD103$^+$ tumor-infiltrating T lymphocytes with improved clinical outcomes in cancer patients highlights the need to have a clear and comprehensive understanding of the expression characteristics of cancer-specific lymphocytes and their implications for future immunotherapies.

SUMMARY OF THE INVENTION

In a first aspect, the invention provides anti-CD103 antibodies and antigen binding fragments thereof comprising the structural and functional features specified below.

In various embodiments, the invention provides an antibody or antigen binding fragment thereof that binds to human CD103 comprising:
- a. a heavy chain variable region CDR1 comprising the amino acid sequence of SEQ ID NO: 1 or an amino acid sequence differing from SEQ ID NO: 1 by 1, 2, or 3 conservative substitutions,
- b. a heavy chain variable region CDR2 comprising the amino acid sequence of SEQ ID NO: 2 or an amino acid sequence differing from SEQ ID NO: 2 by 1, 2, or 3 conservative substitutions,
- c. a heavy chain variable region CDR3 comprising the amino acid sequence of SEQ ID NO: 3 or an amino acid sequence differing from SEQ ID NO: 3 by 1, 2, or 3 conservative substitutions,
- d. a light chain variable region CDR1 comprising the amino acid sequence of SEQ ID NO: 4 or an amino acid sequence differing from SEQ ID NO: 4 by 1, 2, or 3 conservative substitutions,
- e. a light chain variable region CDR2 comprising the amino acid sequence of SEQ ID NO: 5 or an amino acid sequence differing from SEQ ID NO: 5 by 1, 2, or 3 conservative substitutions, and
- f. a light chain variable region CDR3 comprising the amino acid sequence of SEQ ID NO: 6 or an amino acid sequence differing from SEQ ID NO: 6 by 1, 2, or 3 conservative substitutions;

or
- g. a heavy chain variable region CDR1 comprising the amino acid sequence of SEQ ID NO: 9 or an amino acid sequence differing from SEQ ID NO: 9 by 1, 2, or 3 conservative substitutions,
- h. a heavy chain variable region CDR2 comprising the amino acid sequence of SEQ ID NO: 10 or an amino acid sequence differing from SEQ ID NO: 10 by 1, 2, or 3 conservative substitutions,
- i. a heavy chain variable region CDR3 comprising the amino acid sequence of SEQ ID NO: 11 or an amino acid sequence differing from SEQ ID NO: 11 by 1, 2, or 3 conservative substitutions,
- j. a light chain variable region CDR1 comprising the amino acid sequence of SEQ ID NO: 12 or an amino acid sequence differing from SEQ ID NO: 12 by 1, 2, or 3 conservative substitutions,
- k. a light chain variable region CDR2 comprising the amino acid sequence of SEQ ID NO: 13 or an amino acid sequence differing from SEQ ID NO: 13 by 1, 2, or 3 conservative substitutions, and
- l. a light chain variable region CDR3 comprising the amino acid sequence of SEQ ID NO: 14 or an amino acid sequence differing from SEQ ID NO: 14 by 1, 2, or 3 conservative substitutions;

or
- m. a heavy chain variable region CDR1 comprising the amino acid sequence of SEQ ID NO: 17 or an amino acid sequence differing from SEQ ID NO: 17 by 1, 2, or 3 conservative substitutions,
n. a heavy chain variable region CDR2 comprising the amino acid sequence of SEQ ID NO: 18 or an amino acid sequence differing from SEQ ID NO: 18 by 1, 2, or 3 conservative substitutions,
o. a heavy chain variable region CDR3 comprising the amino acid sequence of SEQ ID NO: 19 or an amino acid sequence differing from SEQ ID NO: 19 by 1, 2, or 3 conservative substitutions,
p. a light chain variable region CDR1 comprising the amino acid sequence of SEQ ID NO: 20 or an amino acid sequence differing from SEQ ID NO: 20 by 1, 2, or 3 conservative substitutions,
q. a light chain variable region CDR2 comprising the amino acid sequence of SEQ ID NO: 21 or an amino acid sequence differing from SEQ ID NO: 21 by 1, 2, or 3 conservative substitutions, and
r. a light chain variable region CDR3 comprising the amino acid sequence of SEQ ID NO: 22 or an amino acid sequence differing from SEQ ID NO: 22 by 1, 2, or 3 conservative substitutions;
or
s. a heavy chain variable region CDR1 comprising the amino acid sequence of SEQ ID NO: 25 or an amino acid sequence differing from SEQ ID NO: 25 by 1, 2, or 3 conservative substitutions,
t. a heavy chain variable region CDR2 comprising the amino acid sequence of SEQ ID NO: 26 or an amino acid sequence differing from SEQ ID NO: 26 by 1, 2, or 3 conservative substitutions,
u. a heavy chain variable region CDR3 comprising the amino acid sequence of SEQ ID NO: 27 or an amino acid sequence differing from SEQ ID NO: 27 by 1, 2, or 3 conservative substitutions,
v. a light chain variable region CDR1 comprising the amino acid sequence of SEQ ID NO: 28 or an amino acid sequence differing from SEQ ID NO: 28 by 1, 2, or 3 conservative substitutions,
w. a light chain variable region CDR2 comprising the amino acid sequence of SEQ ID NO: 29 or an amino acid sequence differing from SEQ ID NO: 29 by 1, 2, or 3 conservative substitutions, and
x. a light chain variable region CDR3 comprising the amino acid sequence of SEQ ID NO: 30 or an amino acid sequence differing from SEQ ID NO: 30 by 1, 2, or 3 conservative substitutions;
or
y. a heavy chain variable region CDR1 comprising the amino acid sequence of SEQ ID NO: 33 or an amino acid sequence differing from SEQ ID NO: 33 by 1, 2, or 3 conservative substitutions,
z. a heavy chain variable region CDR2 comprising the amino acid sequence of SEQ ID NO: 34 or an amino acid sequence differing from SEQ ID NO: 34 by 1, 2, or 3 conservative substitutions,
aa. a heavy chain variable region CDR3 comprising the amino acid sequence of SEQ ID NO: 35 or an amino acid sequence differing from SEQ ID NO: 35 by 1, 2, or 3 conservative substitutions,
bb. a light chain variable region CDR1 comprising the amino acid sequence of SEQ ID NO: 36 or an amino acid sequence differing from SEQ ID NO: 36 by 1, 2, or 3 conservative substitutions,
cc. a light chain variable region CDR2 comprising the amino acid sequence of SEQ ID NO: 37 or an amino acid sequence differing from SEQ ID NO: 37 by 1, 2, or 3 conservative substitutions, and
dd. a light chain variable region CDR3 comprising the amino acid sequence of SEQ ID NO: 38 or an amino acid sequence differing from SEQ ID NO: 38 by 1, 2, or 3 conservative substitutions.

In one embodiment, the invention provides an antibody that binds to human CD103 comprising:
a. a heavy chain variable region CDR1 comprising the amino acid sequence of SEQ ID NO: 1,
b. a heavy chain variable region CDR2 comprising the amino acid sequence of SEQ ID NO: 2,
c. a heavy chain variable region CDR3 comprising the amino acid sequence of SEQ ID NO: 3,
d. a light chain variable region CDR1 comprising the amino acid sequence of SEQ ID NO: 4,
e. a light chain variable region CDR2 comprising the amino acid sequence of SEQ ID NO: 5, and
f. a light chain variable region CDR3 comprising the amino acid sequence of SEQ ID NO: 6.

In one embodiment, the invention provides an antibody that binds to human CD103 comprising:
a. a heavy chain variable region CDR1 comprising the amino acid sequence of SEQ ID NO: 9,
b. a heavy chain variable region CDR2 comprising the amino acid sequence of SEQ ID NO: 10,
c. a heavy chain variable region CDR3 comprising the amino acid sequence of SEQ ID NO: 11,
d. a light chain variable region CDR1 comprising the amino acid sequence of SEQ ID NO: 12,
e. a light chain variable region CDR2 comprising the amino acid sequence of SEQ ID NO: 13, and
f. a light chain variable region CDR3 comprising the amino acid sequence of SEQ ID NO: 14.

In one embodiment, the invention provides an antibody that binds to human CD103 comprising:
a. a heavy chain variable region CDR1 comprising the amino acid sequence of SEQ ID NO: 17,
b. a heavy chain variable region CDR2 comprising the amino acid sequence of SEQ ID NO: 18,
c. a heavy chain variable region CDR3 comprising the amino acid sequence of SEQ ID NO: 19,
d. a light chain variable region CDR1 comprising the amino acid sequence of SEQ ID NO: 20,
e. a light chain variable region CDR2 comprising the amino acid sequence of SEQ ID NO: 21, and
f. a light chain variable region CDR3 comprising the amino acid sequence of SEQ ID NO: 22.

In one embodiment, the invention provides an antibody that binds to human CD103 comprising:
a. a heavy chain variable region CDR1 comprising the amino acid sequence of SEQ ID NO: 25,
b. a heavy chain variable region CDR2 comprising the amino acid sequence of SEQ ID NO: 26,
c. a heavy chain variable region CDR3 comprising the amino acid sequence of SEQ ID NO: 27,
d. a light chain variable region CDR1 comprising the amino acid sequence of SEQ ID NO: 28,
e. a light chain variable region CDR2 comprising the amino acid sequence of SEQ ID NO: 29, and
f. a light chain variable region CDR3 comprising the amino acid sequence of SEQ ID NO: 30.

In one embodiment, the invention provides an antibody that binds to human CD103 comprising:
a. a heavy chain variable region CDR1 comprising the amino acid sequence of SEQ ID NO: 33, b. a heavy chain variable region CDR2 comprising the amino acid sequence of SEQ ID NO: 34,
c. a heavy chain variable region CDR3 comprising the amino acid sequence of SEQ ID NO: 35,
d. a light chain variable region CDR1 comprising the amino acid sequence of SEQ ID NO: 36,
e. a light chain variable region CDR2 comprising the amino acid sequence of SEQ ID NO: 37, and
f. a light chain variable region CDR3 comprising the amino acid sequence of SEQ ID NO: 38.

In one embodiment, the invention provides an antibody that binds to human CD103 comprising:
a. a heavy chain variable region CDR1 comprising an amino acid sequence differing from SEQ ID NO: 1 by 1 conservative substitution,
b. a heavy chain variable region CDR2 comprising an amino acid sequence differing from SEQ ID NO: 2 by 1 conservative substitution,
c. a heavy chain variable region CDR3 comprising an amino acid sequence differing from SEQ ID NO: 3 by 1 conservative substitution,
d. a light chain variable region CDR1 comprising an amino acid sequence differing from SEQ ID NO: 4 by 1 conservative substitution,
e. a light chain variable region CDR2 comprising an amino acid sequence differing from SEQ ID NO: 5 by 1 conservative substitution, and
f. a light chain variable region CDR3 comprising an amino acid sequence differing from SEQ ID NO: 6 by 1 conservative substitution.

In one embodiment, the invention provides an antibody that binds to human CD103 comprising:
a. a heavy chain variable region CDR1 comprising an amino acid sequence differing from SEQ ID NO: 9 by 1 conservative substitution,
b. a heavy chain variable region CDR2 comprising an amino acid sequence differing from SEQ ID NO: 10 by 1 conservative substitution,
c. a heavy chain variable region CDR3 comprising an amino acid sequence differing from SEQ ID NO: 11 by 1 conservative substitution,
d. a light chain variable region CDR1 comprising an amino acid sequence differing from SEQ ID NO: 12 by 1 conservative substitution,
e. a light chain variable region CDR2 comprising an amino acid sequence differing from SEQ ID NO: 13 by 1 conservative substitution, and
f. a light chain variable region CDR3 comprising an amino acid sequence differing from SEQ ID NO: 14 by 1 conservative substitution.

In one embodiment, the invention provides an antibody that binds to human CD103 comprising:
a. a heavy chain variable region CDR1 comprising an amino acid sequence differing from SEQ ID NO: 17 by 1 conservative substitution,
b. a heavy chain variable region CDR2 comprising an amino acid sequence differing from SEQ ID NO: 18 by 1 conservative substitution,
c. a heavy chain variable region CDR3 comprising an amino acid sequence differing from SEQ ID NO: 19 by 1 conservative substitution,
d. a light chain variable region CDR1 comprising an amino acid sequence differing from SEQ ID NO: 20 by 1 conservative substitution,
e. a light chain variable region CDR2 comprising an amino acid sequence differing from SEQ ID NO: 21 by 1 conservative substitution, and
f. a light chain variable region CDR3 comprising an amino acid sequence differing from SEQ ID NO: 22 by 1 conservative substitution.

In one embodiment, the invention provides an antibody that binds to human CD103 comprising:
a. a heavy chain variable region CDR1 comprising an amino acid sequence differing from SEQ ID NO: 25 by 1 conservative substitution,
b. a heavy chain variable region CDR2 comprising an amino acid sequence differing from SEQ ID NO: 26 by 1 conservative substitution,
c. a heavy chain variable region CDR3 comprising an amino acid sequence differing from SEQ ID NO: 27 by 1 conservative substitution,
d. a light chain variable region CDR1 comprising an amino acid sequence differing from SEQ ID NO: 28 by 1 conservative substitution,
e. a light chain variable region CDR2 comprising an amino acid sequence differing from SEQ ID NO: 29 by 1 conservative substitution, and
f. a light chain variable region CDR3 comprising an amino acid sequence differing from SEQ ID NO: 30 by 1 conservative substitution.

In one embodiment, the invention provides an antibody that binds to human CD103 comprising:
a. a heavy chain variable region CDR1 comprising an amino acid sequence differing from SEQ ID NO: 33 by 1 conservative substitution,
b. a heavy chain variable region CDR2 comprising an amino acid sequence differing from SEQ ID NO: 34 by 1 conservative substitution,
c. a heavy chain variable region CDR3 comprising an amino acid sequence differing from SEQ ID NO: 35 by 1 conservative substitution,
d. a light chain variable region CDR1 comprising an amino acid sequence differing from SEQ ID NO: 36 by 1 conservative substitution,
e. a light chain variable region CDR2 comprising an amino acid sequence differing from SEQ ID NO: 37 by 1 conservative substitution, and
f. a light chain variable region CDR3 comprising an amino acid sequence differing from SEQ ID NO: 38 by 1 conservative substitution.

In one embodiment, the invention provides an antibody that binds to human CD103 comprising:
a. a heavy chain variable region CDR1 comprising an amino acid sequence differing from SEQ ID NO: 1 by 2 conservative substitutions,
b. a heavy chain variable region CDR2 comprising an amino acid sequence differing from SEQ ID NO: 2 by 2 conservative substitutions,
c. a heavy chain variable region CDR3 comprising an amino acid sequence differing from SEQ ID NO: 3 by 2 conservative substitutions,
d. a light chain variable region CDR1 comprising an amino acid sequence differing from SEQ ID NO: 4 by 2 conservative substitutions,
e. a light chain variable region CDR2 comprising an amino acid sequence differing from SEQ ID NO: 5 by 2 conservative substitutions, and
f. a light chain variable region CDR3 comprising an amino acid sequence differing from SEQ ID NO: 6 by 2 conservative substitutions.

In one embodiment, the invention provides an antibody that binds to human CD103 comprising:

a. a heavy chain variable region CDR1 comprising an amino acid sequence differing from SEQ ID NO: 9 by 2 conservative substitutions,
b. a heavy chain variable region CDR2 comprising an amino acid sequence differing from SEQ ID NO: 10 by 2 conservative substitutions,
c. a heavy chain variable region CDR3 comprising an amino acid sequence differing from SEQ ID NO: 11 by 2 conservative substitutions,
d. a light chain variable region CDR1 comprising an amino acid sequence differing from SEQ ID NO: 12 by 2 conservative substitutions,
e. a light chain variable region CDR2 comprising an amino acid sequence differing from SEQ ID NO: 13 by 2 conservative substitutions, and
f. a light chain variable region CDR3 comprising an amino acid sequence differing from SEQ ID NO: 14 by 2 conservative substitutions.

In one embodiment, the invention provides an antibody that binds to human CD103 comprising:
a. a heavy chain variable region CDR1 comprising an amino acid sequence differing from SEQ ID NO: 17 by 2 conservative substitutions,
b. a heavy chain variable region CDR2 comprising an amino acid sequence differing from SEQ ID NO: 18 by 2 conservative substitutions,
c. a heavy chain variable region CDR3 comprising an amino acid sequence differing from SEQ ID NO: 19 by 2 conservative substitutions,
d. a light chain variable region CDR1 comprising an amino acid sequence differing from SEQ ID NO: 20 by 2 conservative substitutions,
e. a light chain variable region CDR2 comprising an amino acid sequence differing from SEQ ID NO: 21 by 2 conservative substitutions, and
f. a light chain variable region CDR3 comprising an amino acid sequence differing from SEQ ID NO: 22 by 2 conservative substitutions.

In one embodiment, the invention provides an antibody that binds to human CD103 comprising:
a. a heavy chain variable region CDR1 comprising an amino acid sequence differing from SEQ ID NO: 25 by 2 conservative substitutions,
b. a heavy chain variable region CDR2 comprising an amino acid sequence differing from SEQ ID NO: 26 by 2 conservative substitutions,
c. a heavy chain variable region CDR3 comprising an amino acid sequence differing from SEQ ID NO: 27 by 2 conservative substitutions,
d. a light chain variable region CDR1 comprising an amino acid sequence differing from SEQ ID NO: 28 by 2 conservative substitutions,
e. a light chain variable region CDR2 comprising an amino acid sequence differing from SEQ ID NO: 29 by 2 conservative substitutions, and
f. a light chain variable region CDR3 comprising an amino acid sequence differing from SEQ ID NO: 30 by 2 conservative substitutions.

In one embodiment, the invention provides an antibody that binds to human CD103 comprising:
a. a heavy chain variable region CDR1 comprising an amino acid sequence differing from SEQ ID NO: 33 by 2 conservative substitutions,
b. a heavy chain variable region CDR2 comprising an amino acid sequence differing from SEQ ID NO: 34 by 2 conservative substitutions,
c. a heavy chain variable region CDR3 comprising an amino acid sequence differing from SEQ ID NO: 35 by 2 conservative substitutions,
d. a light chain variable region CDR1 comprising an amino acid sequence differing from SEQ ID NO: 36 by 2 conservative substitutions,
e. a light chain variable region CDR2 comprising an amino acid sequence differing from SEQ ID NO: 37 by 2 conservative substitutions, and
f. a light chain variable region CDR3 comprising an amino acid sequence differing from SEQ ID NO: 38 by 2 conservative substitutions.

In one embodiment, the invention provides an antibody that binds to human CD103 comprising:
a. a heavy chain variable region CDR1 comprising an amino acid sequence differing from SEQ ID NO: 1 by 3 conservative substitutions,
b. a heavy chain variable region CDR2 comprising an amino acid sequence differing from SEQ ID NO: 2 by 3 conservative substitutions,
c. a heavy chain variable region CDR3 comprising an amino acid sequence differing from SEQ ID NO: 3 by 3 conservative substitutions,
d. a light chain variable region CDR1 comprising an amino acid sequence differing from SEQ ID NO: 4 by 3 conservative substitutions,
e. a light chain variable region CDR2 comprising an amino acid sequence differing from SEQ ID NO: 5 by 3 conservative substitutions, and
f. a light chain variable region CDR3 comprising an amino acid sequence differing from SEQ ID NO: 6 by 3 conservative substitutions.

In one embodiment, the invention provides an antibody that binds to human CD103 comprising:
a. a heavy chain variable region CDR1 comprising an amino acid sequence differing from SEQ ID NO: 9 by 3 conservative substitutions,
b. a heavy chain variable region CDR2 comprising an amino acid sequence differing from SEQ ID NO: 10 by 3 conservative substitutions,
c. a heavy chain variable region CDR3 comprising an amino acid sequence differing from SEQ ID NO: 11 by 3 conservative substitutions,
d. a light chain variable region CDR1 comprising an amino acid sequence differing from SEQ ID NO: 12 by 3 conservative substitutions,
e. a light chain variable region CDR2 comprising an amino acid sequence differing from SEQ ID NO: 13 by 3 conservative substitutions, and
f. a light chain variable region CDR3 comprising an amino acid sequence differing from SEQ ID NO: 14 by 3 conservative substitutions.

In one embodiment, the invention provides an antibody that binds to human CD103 comprising:
a. a heavy chain variable region CDR1 comprising an amino acid sequence differing from SEQ ID NO: 17 by 3 conservative substitutions,
b. a heavy chain variable region CDR2 comprising an amino acid sequence differing from SEQ ID NO: 18 by 3 conservative substitutions,
c. a heavy chain variable region CDR3 comprising an amino acid sequence differing from SEQ ID NO: 19 by 3 conservative substitutions,
d. a light chain variable region CDR1 comprising an amino acid sequence differing from SEQ ID NO: 20 by 3 conservative substitutions, e. a light chain variable region CDR2 comprising an amino acid sequence differing from SEQ ID NO: 21 by 3 conservative substitutions, and
f. a light chain variable region CDR3 comprising an amino acid sequence differing from SEQ ID NO: 22 by 3 conservative substitutions.

In one embodiment, the invention provides an antibody that binds to human CD103 comprising:
a. a heavy chain variable region CDR1 comprising an amino acid sequence differing from SEQ ID NO: 25 by 3 conservative substitutions,
b. a heavy chain variable region CDR2 comprising an amino acid sequence differing from SEQ ID NO: 26 by 3 conservative substitutions,
c. a heavy chain variable region CDR3 comprising an amino acid sequence differing from SEQ ID NO: 27 by 3 conservative substitutions,
d. a light chain variable region CDR1 comprising an amino acid sequence differing from SEQ ID NO: 28 by 3 conservative substitutions,
e. a light chain variable region CDR2 comprising an amino acid sequence differing from SEQ ID NO: 29 by 3 conservative substitutions, and
f. a light chain variable region CDR3 comprising an amino acid sequence differing from SEQ ID NO: 30 by 3 conservative substitutions.

In one embodiment, the invention provides an antibody that binds to human CD103 comprising:
a. a heavy chain variable region CDR1 comprising an amino acid sequence differing from SEQ ID NO: 33 by 3 conservative substitutions,
b. a heavy chain variable region CDR2 comprising an amino acid sequence differing from SEQ ID NO: 34 by 3 conservative substitutions,
c. a heavy chain variable region CDR3 comprising an amino acid sequence differing from SEQ ID NO: 35 by 3 conservative substitutions,
d. a light chain variable region CDR1 comprising an amino acid sequence differing from SEQ ID NO: 36 by 3 conservative substitutions,
e. a light chain variable region CDR2 comprising an amino acid sequence differing from SEQ ID NO: 37 by 3 conservative substitutions, and
f. a light chain variable region CDR3 comprising an amino acid sequence differing from SEQ ID NO: 38 by 3 conservative substitutions.

In various other embodiments, the invention provides an antibody or antigen binding fragment thereof that binds to human CD103 comprising:
a. a heavy chain of the antibody or antigen binding fragment that comprises the amino acid sequence of SEQ ID NO: 7 and a light chain of the antibody or antigen binding fragment that comprises the amino acid sequence of SEQ ID NO: 8; or
b. a heavy chain of the antibody or antigen binding fragment that comprises the amino acid sequence of SEQ ID NO: 15 and a light chain of the antibody or antigen binding fragment that comprises the amino acid sequence of SEQ ID NO: 16; or
c. a heavy chain of the antibody or antigen binding fragment that comprises the amino acid sequence of SEQ ID NO: 23 and a light chain of the antibody or antigen binding fragment that comprises the amino acid sequence of SEQ ID NO: 24; or
d. a heavy chain of the antibody or antigen binding fragment that comprises the amino acid sequence of SEQ ID NO: 31 and a light chain of the antibody or antigen binding fragment that comprises the amino acid sequence of SEQ ID NO: 32; or
e. a heavy chain of the antibody or antigen binding fragment that comprises the amino acid sequence of SEQ ID NO: 39 and a light chain of the antibody or antigen binding fragment that comprises the amino acid sequence of SEQ ID NO: 40;

or in each case a sequence having at least 95% (and more preferably 97% or 99%) sequence similarity or identity to a given SEQ ID NO, with any difference in such sequence being confined to amino acids that are not a part of a CDR sequence within the SEQ ID NO.

In one embodiment, the invention provides an antibody that binds to human CD103 comprising a heavy chain of the antibody that comprises the amino acid sequence of SEQ ID NO: 7 and a light chain of the antibody comprises the amino acid sequence of SEQ ID NO: 8.

In one embodiment, the invention provides an antibody that binds to human CD103 comprising a heavy chain of the antibody that comprises the amino acid sequence of SEQ ID NO: 15 and a light chain of the antibody that comprises the amino acid sequence of SEQ ID NO: 16.

In one embodiment, the invention provides an antibody that binds to human CD103 comprising a heavy chain of the antibody that comprises the amino acid sequence of SEQ ID NO: 23 and a light chain of the antibody that comprises the amino acid sequence of SEQ ID NO: 24.

In one embodiment, the invention provides an antibody that binds to human CD103 comprising a heavy chain of the antibody that comprises the amino acid sequence of SEQ ID NO: 31 and a light chain of the antibody that comprises the amino acid sequence of SEQ ID NO: 32.

In one embodiment, the invention provides an antibody that binds to human CD103 comprising a heavy chain of the antibody that comprises the amino acid sequence of SEQ ID NO: 39 and a light chain of the antibody that comprises the amino acid sequence of SEQ ID NO: 40.

In one embodiment, the invention provides an antibody that binds to human CD103 comprising a heavy chain of the antibody that comprises the amino acid sequence having at least 95% (and more preferably 97% or most preferably 99%) sequence identity to SEQ ID NO: 7, with any difference in such sequence being confined to amino acids that are not a part of a CDR sequence within SEQ ID NO: 7, and a light chain of the antibody comprises the amino acid sequence having at least 95% (and more preferably 97% or most preferably 99%) sequence identity to SEQ ID NO: 8, with any difference in such sequence being confined to amino acids that are not a part of a CDR sequence within SEQ ID NO: 8.

In one embodiment, the invention provides an antibody that binds to human CD103 comprising a heavy chain of the antibody that comprises the amino acid sequence having at least 95% (and more preferably 97% or most preferably 99%) sequence identity to SEQ ID NO: 15, with any difference in such sequence being confined to amino acids that are not a part of a CDR sequence within SEQ ID NO: 15, and a light chain of the antibody comprises the amino acid sequence having at least 95% (and more preferably 97% or most preferably 99%) sequence identity to SEQ ID NO: 16, with any difference in such sequence being confined to amino acids that are not a part of a CDR sequence within SEQ ID NO: 16.

In one embodiment, the invention provides an antibody that binds to human CD103 comprising a heavy chain of the antibody that comprises the amino acid sequence having at least 95% (and more preferably 97% or most preferably 99%) sequence identity to SEQ ID NO: 23, with any difference in such sequence being confined to amino acids that are not a part of a CDR sequence within SEQ ID NO: 23, and a light chain of the antibody comprises the amino acid sequence having at least 95% (and more preferably 97% or most preferably 99%) sequence identity to SEQ ID NO: 24, with any difference in such sequence being confined to amino acids that are not a part of a CDR sequence within SEQ ID NO: 24.

In one embodiment, the invention provides an antibody that binds to human CD103 comprising a heavy chain of the antibody that comprises the amino acid sequence having at least 95% (and more preferably 97% or most preferably 99%) sequence identity to SEQ ID NO: 31, with any difference in such sequence being confined to amino acids that are not a part of a CDR sequence within SEQ ID NO: 31, and a light chain of the antibody comprises the amino acid sequence having at least 95% (and more preferably 97% or most preferably 99%) sequence identity to SEQ ID NO: 32, with any difference in such sequence being confined to amino acids that are not a part of a CDR sequence within SEQ ID NO: 32.

In one embodiment, the invention provides an antibody that binds to human CD103 comprising a heavy chain of the antibody that comprises the amino acid sequence having at least 95% (and more preferably 97% or most preferably 99%) sequence identity to SEQ ID NO: 39, with any difference in such sequence being confined to amino acids that are not a part of a CDR sequence within SEQ ID NO: 39, and a light chain of the antibody comprises the amino acid sequence having at least 95% (and more preferably 97% or most preferably 99%) sequence identity to SEQ ID NO: 40, with any difference in such sequence being confined to amino acids that are not a part of a CDR sequence within SEQ ID NO: 40.

In this context, "sequence similarity" is based on the extent of identity combined with the extent of conservative changes. The percentage of "sequence similarity" is the percentage of amino acids or nucleotides which is either identical or conservatively changed viz. "sequence similarity"=percent sequence identity)+percent conservative changes). Thus, for the purpose of this invention "conservative changes" and "identity" are considered to be species of the broader term "similarity". Thus, whenever the term sequence "similarity" is used it embraces sequence "identity" and "conservative changes". According to certain embodiments the conservative changes are disregarded and the percent sequence similarity refers to percent sequence identity. In certain embodiments, the changes in a sequence permitted by the referenced percent sequence identity are all or nearly all conservative changes; that is, when a sequence is 90% identical, the remaining 10% are all or nearly all conservative changes. The term "nearly all" in this context refers to at least 75% of the permitted sequence changes are conservative changes, more preferably at least 85%, still more preferably at least 90%, and most preferably at least 95%. In certain embodiments of antibody heavy and/or light chains, the permitted sequence changes are within the framework regions and not in the CDRs.

In any of the above embodiments, the antibody or antigen binding fragment thereof may be isolated, as that term is defined herein.

In any of the above embodiments, the antibody or antigen binding fragment thereof is a recombinant antibody, as that term is defined herein.

In any of the above embodiments, the antibody or antigen binding fragment thereof is a full-length antibody, as that term is defined herein.

Antibodies or antigen binding fragments of the present invention may be obtained from a variety of species. For example, the antibodies of the present invention may comprise immunoglobulin sequences which are rabbit, mouse, rat, guinea pig, chicken, goat, sheep, donkey, human, llama or camelid sequences, or combinations of such sequences (so-called chimeric antibodies). Most preferably, the antibodies or antigen binding fragments are human antibodies or antigen binding fragments. Most preferably, the antibodies or antigen binding fragments are humanized antibodies or antigen binding fragments.

The term antibody includes antigen-binding portions, i.e., "antigen binding sites," (e.g., fragments, subsequences, complementarity determining regions (CDRs)) that retain capacity to bind antigen, including (i) a Fab fragment, a monovalent fragment consisting of the $V_L$, $V_H$, $C_L$ and $C_H1$ domains; (ii) a F(ab')2 fragment, a bivalent fragment comprising two Fab fragments linked by a disulfide bridge at the hinge region; (iii) a Fd fragment consisting of the $V_H$ and $C_H1$ domains; (iv) a Fv fragment consisting of the $V_L$ and $V_H$ domains of a single arm of an antibody, (v) a dAb fragment (Ward et al., (1989) Nature 341:544-546), which consists of a VH domain; and (vi) an isolated complementarity determining region (CDR). Single chain antibodies are also included by reference in the term "antibody." Preferred therapeutic antibodies are intact IgG antibodies. The term "intact IgG" as used herein is meant as a polypeptide belonging to the class of antibodies that are substantially encoded by a recognized immunoglobulin gamma gene. In humans this class comprises IgG1, IgG2, IgG3, and IgG4. In mice this class comprises IgG1, IgG2a, IgG2b, and IgG3. The known Ig domains in the IgG class of antibodies are $V_H$, $C\gamma1$, $C\gamma2$, $C\gamma3$, $V_L$, and $C_L$.

In any of the above embodiments, the antibody or antigen binding fragment thereof is a human or humanized antibody comprising two heavy chains and two light chains. In one embodiment, the antibody is an IgG. In preferred embodiments, antibody is an IgG1, IgG2, or IgG4, and preferably a human IgG1, IgG2, or IgG4.

In one embodiment, the anti-CD103 antibody of the invention comprises a full length antibody structure having two light chains and two heavy chains as recited above, wherein each light chain comprises a human kappa light chain or a human lambda light chain constant domain; and each heavy chain comprises a human IgG1 constant region.

In one embodiment, the anti-CD103 antibody of the invention comprises a full length antibody structure having two light chains and two heavy chains as recited above, wherein each light chain comprises a human kappa light chain or a human lambda light chain constant domain; and each heavy chain comprises a human IgG2 constant region.

In one embodiment, the anti-CD103 antibody of the invention comprises a full-length antibody structure having two light chains and two heavy chains as recited above, wherein each light chain comprises a human kappa light chain or a human lambda light chain constant domain; and each heavy chain comprises a human IgG4 constant region.

In certain embodiments, the anti-CD103 antibody of the invention can be conjugated to at least one diagnostic label for in vivo imaging studies. In certain embodiments, the antigen binding fragment of anti-CD103 antibody of the invention can be conjugated to at least one diagnostic label for in vivo imaging studies. In certain embodiments, the anti-CD103 antibody of the invention can be conjugated to at least one therapeutic agent. In certain embodiments, the antigen binding fragment of anti-CD103 antibody of the invention can be conjugated to at least one therapeutic agent. In one embodiment, the therapeutic agent is a second antibody or fragment thereof. In one embodiment, the therapeutic agent is a second antibody. In one embodiment, the therapeutic agent is an immunomodulator. In one embodiment, the therapeutic agent is a hormone. In one embodiment, the therapeutic agent is a cytotoxic agent. In one embodiment, the therapeutic agent is an enzyme. In one embodiment, the therapeutic agent is a radionuclide. In one embodiment, the therapeutic agent is a second antibody conjugated to at least one immunomodulator. In one embodiment, the therapeutic agent is a second antibody conjugated to at least one enzyme. In one embodiment, the therapeutic agent is a second antibody conjugated to at least one radioactive label. In one embodiment, the therapeutic agent is a second antibody conjugated to at least one hormone. In one embodiment, the therapeutic agent is a second antibody conjugated to at least one antisense oligonucleotide. In one embodiment, the therapeutic agent is a second antibody conjugated to at least one cytotoxic agent. In one embodiment, the therapeutic agent is a second antibody conjugated to a combination thereof. In one embodiment, the therapeutic agent is a combination of any one of a second antibody or fragment thereof, an immunomodulator, a hormone, a cytotoxic agent, an enzyme, a radionuclide, or a second antibody conjugated to at least one immunomodulator, enzyme, radioactive label, hormone, antisense oligonucleotide, or cytotoxic agent. In another embodiment the diagnostic label is one applicable to PET imaging. In another embodiment the diagnostic label is one applicable to single-photon emission computed tomography (SPECT) imaging. In another embodiment the diagnostic label is one applicable to MRI. In another embodiment the diagnostic label is one applicable to optical imaging. In another embodiment the diagnostic label is one applicable to (photo)acoustic imaging etc., such as $^{11}$C, $^{13}$N, $^{15}$O, $^{99m}$Tc, $^{61}$Cu, $^{62}$Cu, $^{64}$Cu, $^{67}$Cu, $^{18}$F, $^{19}$F, $^{66}$Ga, $^{67}$Ga, $^{68}$Ga, $^{72}$Ga, $^{123}$I, $^{124}$I, $^{111}$In, $^{177}$Lu, $^{44}$Sc, $^{47}$Sc, $^{86}$Y, $^{88}$Y, $^{90}$Y, $^{45}$Ti, $^{89}$Zr, indocyanine green, IRDye 800CW, fluorescein (FITC), magnetic (e.g., iron oxide) nanoparticles. This list is not meant to be limiting.

The invention also provides isolated nucleic acids encoding anyone of the anti-CD103 antibodies or antigen binding fragments of the invention.

The invention also provides expression vectors comprising one or more nucleic acids of the present invention. An expression vector is a DNA molecule comprising the regulatory elements necessary for transcription of a target nucleic acid in a host cell. Typically, the target nucleic acid is placed under the control of certain regulatory elements including constitutive or inducible promoters, tissue-specific regulatory elements, and enhancer elements. Such a target nucleic acid is said to be "operably linked to" the regulatory elements when the regulating element controls the expression of the gene.

These isolated nucleic acids and the expression vectors comprising them may be used to express the antibodies of the invention or antigen binding fragments thereof in recombinant host cells. Thus, the invention also provides host cells comprising an expression vector of the present invention.

The invention also provides a vessel or injection device comprising anyone of the anti-CD103 antibodies or antigen binding fragments of the invention.

The invention also provides a method of producing an anti-CD103 antibody or antigen binding fragment of the invention comprising: culturing a host cell comprising a polynucleotide encoding a heavy chain and/or light chain of an antibody of the invention (or an antigen binding fragment thereof) under conditions favorable to expression of the polynucleotide; and optionally, recovering the antibody or antigen binding fragment from the host cell and/or culture medium. In one embodiment, the polynucleotide encoding the heavy chain and the polynucleotide encoding the light chain are in a single vector. In another embodiment, the polynucleotide encoding the heavy chain and the polynucleotide encoding the light chain are in different vectors.

In another aspect, the invention relates to methods of imaging tissue or other biological specimen. These methods comprise contacting the biological specimen with an anti-CD103 antibody, and detecting the presence or amount of binding of the antibody to CD103 present in the biological specimen. Thus, an anti-CD103 antibody is used as an imaging agent.

In a related aspect, the invention relates to methods for producing an imaging agent comprising an anti-CD103 antibody and a diagnostic label. These methods comprise forming a covalent association between the anti-CD103 antibody and the diagnostic label. Alternatively, these methods comprise forming a non-covalent association between the anti-CD103 antibody and the diagnostic label. In the case of radiolabels, the isotope may be chelated using a bifunctional chelator comprising a first functional group for the immobilization of the radiometal and a second functional group for the covalent attachment to the antibody. Examples of such chelators include, but are not limited to, DOTA, NOTA, TRITA, TETA, TACN, cyclen, cyclam, homocyclen, EDTA, DTPA, DOTP, and NOTMP. Functionalized versions of the chelators provide a linkage chemistry which provides a terminal functional moiety which may be selected from the group consisting of protected or unprotected sulfhydryl moieties, protected or unprotected amine moieties, protected or unprotected hydroxyl moieties, primary amine-reactive moieties, sulfhydryl-reactive moieties, photoreactive moieties, carboxyl-reactive moieties, arginine-reactive moieties, and carbonyl-reactive moieties. Functionalized versions of the chelators provide a linkage chemistry which provides a terminal functional moiety (i.e. protected sulfhydryl moieties). Functionalized versions of the chelators provide a linkage chemistry which provides a terminal functional moiety (i.e. unprotected sulfhydryl moieties). Functionalized versions of the chelators provide a linkage chemistry which provides a terminal functional moiety (i.e. protected amine moieties). Functionalized versions of the chelators provide a linkage chemistry which provides a terminal functional moiety (i.e. unprotected amine moieties). Functionalized versions of the chelators provide a linkage chemistry which provides a terminal functional moiety (i.e. protected hydroxyl moieties). Functionalized versions of the chelators provide a linkage chemistry which provides a terminal functional moiety (i.e. unprotected hydroxyl moieties). Functionalized versions of the chelators provide a linkage chemistry which provides a terminal functional moiety (i.e. amine-reactive moieties). Functionalized versions of the chelators provide a linkage chemistry which provides a terminal functional moiety (i.e. sulfhydryl-reactive moieties). Functionalized versions of the chelators provide a linkage chemistry which provides a terminal functional moiety (i.e. photoreactive moieties). Functionalized versions of the chelators provide a linkage chemistry which provides a terminal functional moiety (i.e. carboxyl-reactive moieties). Functionalized versions of the chelators provide a linkage chemistry which provides a terminal functional moiety (i.e. arginine-reactive moieties). Functionalized versions of the chelators provide a linkage chemistry which provides a terminal functional moiety (i.e. carbonyl-reactive moieties). A direct labeling approach in which a reducing agent converts disulfide linkages to free thiols which bind to the radiolabel is also contemplated.

In various embodiments, the diagnostic label may be selected from the group consisting of an enzyme, a nucleic acid, a fluorophore, biotin, avidin, streptavidin, digoxigenin, maltose, oligohistidine, 2,4-dintrobenzene, phenylarsenate, a metal, a peptide tag, a fluorescent or colored microsphere, a fluorescent particle, and a colored latex particle. This list is not meant to be limiting. In various embodiments, the diagnostic label is an enzyme. In various embodiments, the diagnostic label is a nucleic acid. In various embodiments, the diagnostic label is a fluorophore. In various embodiments, the diagnostic label is biotin. In various embodiments, the diagnostic label is avidin. In various embodiments, the diagnostic label is streptavidin. In various embodiments, the diagnostic label is digoxigenin. In various embodiments, the diagnostic label is maltose. In various embodiments, the diagnostic label is oligohistidine. In various embodiments, the diagnostic label is 2,4-dintrobenzene. In various embodiments, the diagnostic label is phenylarsenate. In various embodiments, the diagnostic label is a metal. In various embodiments, the diagnostic label is a peptide tag. In various embodiments, the diagnostic label is a fluorescent microsphere. In various embodiments, the diagnostic label is a colored microsphere. In various embodiments, the diagnostic label is a fluorescent particle. In various embodiments, the diagnostic label is a colored latex particle. Such a label may be conjugated to the antibody by means of a crosslinker which contains a maleimide, an alkyl halide, an aryl halide, an alpha-haloacyl, an activated aryl, a pyridyl disulfide, a carbonyl, a carboxyl, a thiol, a thioester, disulfide, a N-hydroxy-succinimide, or a cyclic thiolactone, etc.

In certain embodiments, the biological specimen is tissue within a living body, and the method is an in vivo imaging method. In certain embodiments, the biological specimen is tissue within a living body, and the method is an in vivo imaging method such as PET imaging. In certain embodiments, the biological specimen is tissue within a living body, and the method is an in vivo imaging method single-photon emission computed tomography (SPECT) imaging. In certain embodiments, the biological specimen is tissue within a living body, and the method is an in vivo imaging method MRI. In these methods, the anti-CD103 antibody is detectably labeled according to the requirements of the imaging methodology employed. Suitable diagnostic labels are described herein, and include, but are not limited to, $^{11}C$, $^{13}N$, $^{15}O$, $^{99m}Tc$, $^{61}Cu$, $^{62}Cu$, $^{64}Cu$, $^{67}Cu$, $^{18}F$, $^{19}F$, $^{66}Ga$, $^{67}Ga$, $^{68}Ga$, $^{72}Ga$, $^{123}I$, $^{124}I$, $^{111}In$, $^{177}Lu$, $^{44}Sc$, $^{47}Sc$, $^{86}Y$, $^{88}Y$, $^{90}Y$, $^{45}Ti$, $^{89}Zr$, indocyanine green, IRDye 800CW, fluorescein (FITC), and magnetic (e.g., iron oxide) nanoparticles.

In various embodiments, the anti-CD103 antibody used as an imaging agent blocks CD103 binding to its cognate receptor E-cadherin. In various embodiments, the anti-CD103 antibody used as an imaging agent does not block CD103 binding to its cognate receptor E-cadherin. In various embodiments, the anti-CD103 antibody used as an imaging agent partially blocks CD103 binding to its cognate receptor E-cadherin. Examples of each of these types of anti-CD103 antibody are described hereinafter.

In various embodiments, the methods of imaging tissue or other biological specimen utilizes an antibody of the invention as an imaging agent.

In various embodiments, the methods of imaging tissue or other biological specimen utilizes an antigen binding fragment of an antibody of the invention as an imaging agent.

In various embodiments, the methods of imaging tissue or other biological specimen utilizes an antibody or antigen binding fragment thereof as an imaging agent which comprises:
  a. a heavy chain variable region CDR1 comprising the amino acid sequence of SEQ ID NO: 1 or an amino acid sequence differing from SEQ ID NO: 1 by 1, 2, or 3 conservative substitutions,
  b. a heavy chain variable region CDR2 comprising the amino acid sequence of SEQ ID NO: 2 or an amino acid sequence differing from SEQ ID NO: 2 by 1, 2, or 3 conservative substitutions,
  c. a heavy chain variable region CDR3 comprising the amino acid sequence of SEQ ID NO: 3 or an amino acid sequence differing from SEQ ID NO: 3 by 1, 2, or 3 conservative substitutions,
  d. a light chain variable region CDR1 comprising the amino acid sequence of SEQ ID NO: 4 or an amino acid sequence differing from SEQ ID NO: 4 by 1, 2, or 3 conservative substitutions,
  e. a light chain variable region CDR2 comprising the amino acid sequence of SEQ ID NO: 5 or an amino acid sequence differing from SEQ ID NO: 5 by 1, 2, or 3 conservative substitutions, and
  f. a light chain variable region CDR3 comprising the amino acid sequence of SEQ ID NO: 6 or an amino acid sequence differing from SEQ ID NO: 6 by 1, 2, or 3 conservative substitutions;
or
  g. a heavy chain variable region CDR1 comprising the amino acid sequence of SEQ ID NO: 9 or an amino acid sequence differing from SEQ ID NO: 9 by 1, 2, or 3 conservative substitutions,
  h. a heavy chain variable region CDR2 comprising the amino acid sequence of SEQ ID NO: 10 or an amino acid sequence differing from SEQ ID NO: 10 by 1, 2, or 3 conservative substitutions,
  i. a heavy chain variable region CDR3 comprising the amino acid sequence of SEQ ID NO: 11 or an amino acid sequence differing from SEQ ID NO: 11 by 1, 2, or 3 conservative substitutions,
  j. a light chain variable region CDR1 comprising the amino acid sequence of SEQ ID NO: 12 or an amino acid sequence differing from SEQ ID NO: 12 by 1, 2, or 3 conservative substitutions,
  k. a light chain variable region CDR2 comprising the amino acid sequence of SEQ ID NO: 13 or an amino acid sequence differing from SEQ ID NO: 13 by 1, 2, or 3 conservative substitutions, and
  l. a light chain variable region CDR3 comprising the amino acid sequence of SEQ ID NO: 14 or an amino acid sequence differing from SEQ ID NO: 14 by 1, 2, or 3 conservative substitutions;
or
  m. a heavy chain variable region CDR1 comprising the amino acid sequence of SEQ ID NO: 17 or an amino acid sequence differing from SEQ ID NO: 17 by 1, 2, or 3 conservative substitutions,
  n. a heavy chain variable region CDR2 comprising the amino acid sequence of SEQ ID NO: 18 or an amino acid sequence differing from SEQ ID NO: 18 by 1, 2, or 3 conservative substitutions,
o. a heavy chain variable region CDR3 comprising the amino acid sequence of SEQ ID NO: 19 or an amino acid sequence differing from SEQ ID NO: 19 by 1, 2, or 3 conservative substitutions,
p. a light chain variable region CDR1 comprising the amino acid sequence of SEQ ID NO: 20 or an amino acid sequence differing from SEQ ID NO: 20 by 1, 2, or 3 conservative substitutions,
q. a light chain variable region CDR2 comprising the amino acid sequence of SEQ ID NO: 21 or an amino acid sequence differing from SEQ ID NO: 21 by 1, 2, or 3 conservative substitutions, and
r. a light chain variable region CDR3 comprising the amino acid sequence of SEQ ID NO: 22 or an amino acid sequence differing from SEQ ID NO: 22 by 1, 2, or 3 conservative substitutions;
or
s. a heavy chain variable region CDR1 comprising the amino acid sequence of SEQ ID NO: 25 or an amino acid sequence differing from SEQ ID NO: 25 by 1, 2, or 3 conservative substitutions,
t. a heavy chain variable region CDR2 comprising the amino acid sequence of SEQ ID NO: 26 or an amino acid sequence differing from SEQ ID NO: 26 by 1, 2, or 3 conservative substitutions,
u. a heavy chain variable region CDR3 comprising the amino acid sequence of SEQ ID NO: 27 or an amino acid sequence differing from SEQ ID NO: 27 by 1, 2, or 3 conservative substitutions,
v. a light chain variable region CDR1 comprising the amino acid sequence of SEQ ID NO: 28 or an amino acid sequence differing from SEQ ID NO: 28 by 1, 2, or 3 conservative substitutions,
w. a light chain variable region CDR2 comprising the amino acid sequence of SEQ ID NO: 29 or an amino acid sequence differing from SEQ ID NO: 29 by 1, 2, or 3 conservative substitutions, and
x. a light chain variable region CDR3 comprising the amino acid sequence of SEQ ID NO: 30 or an amino acid sequence differing from SEQ ID NO: 30 by 1, 2, or 3 conservative substitutions;
or
y. a heavy chain variable region CDR1 comprising the amino acid sequence of SEQ ID NO: 33 or an amino acid sequence differing from SEQ ID NO: 33 by 1, 2, or 3 conservative substitutions,
z. a heavy chain variable region CDR2 comprising the amino acid sequence of SEQ ID NO: 34 or an amino acid sequence differing from SEQ ID NO: 34 by 1, 2, or 3 conservative substitutions,
aa. a heavy chain variable region CDR3 comprising the amino acid sequence of SEQ ID NO: 35 or an amino acid sequence differing from SEQ ID NO: 35 by 1, 2, or 3 conservative substitutions,
bb. a light chain variable region CDR1 comprising the amino acid sequence of SEQ ID NO: 36 or an amino acid sequence differing from SEQ ID NO: 36 by 1, 2, or 3 conservative substitutions,
cc. a light chain variable region CDR2 comprising the amino acid sequence of SEQ ID NO: 37 or an amino acid sequence differing from SEQ ID NO: 37 by 1, 2, or 3 conservative substitutions, and
dd. a light chain variable region CDR3 comprising the amino acid sequence of SEQ ID NO: 38 or an amino acid sequence differing from SEQ ID NO: 38 by 1, 2, or 3 conservative substitutions.

In various other embodiments, the methods of imaging tissue or other biological specimen utilizes an antibody or antigen binding fragment thereof as an imaging agent which comprises:
a. a heavy chain of the antibody or antigen binding fragment that comprises the amino acid sequence of SEQ ID NO: 7 and a light chain of the antibody or antigen binding fragment that comprises the amino acid sequence of SEQ ID NO: 8; or
b. a heavy chain of the antibody or antigen binding fragment that comprises the amino acid sequence of SEQ ID NO: 15 and a light chain of the antibody or antigen binding fragment that comprises the amino acid sequence of SEQ ID NO: 16; or
c. a heavy chain of the antibody or antigen binding fragment that comprises the amino acid sequence of SEQ ID NO: 23 and a light chain of the antibody or antigen binding fragment that comprises the amino acid sequence of SEQ ID NO: 24; or
d. a heavy chain of the antibody or antigen binding fragment that comprises the amino acid sequence of SEQ ID NO: 31 and a light chain of the antibody or antigen binding fragment that comprises the amino acid sequence of SEQ ID NO: 32; or
e. a heavy chain of the antibody or antigen binding fragment that comprises the amino acid sequence of SEQ ID NO: 39 and a light chain of the antibody or antigen binding fragment that comprises the amino acid sequence of SEQ ID NO: 40;
or in each case a sequence having at least 95% (and more preferably 97% or 99%) sequence similarity or identity to a given SEQ ID NO, with any difference in such sequence being confined to amino acids that are not a part of a CDR sequence within the SEQ ID NO.

In another aspect, the invention relates to methods for the use of an anti-CD103 antibody of the invention as a therapeutic agent. In a related aspect, the invention relates to the use of an anti-CD103 antibody of the invention in the manufacture of a medicament. In another related aspect, the invention relates to methods for the use of an anti-CD103 antibody of the invention to inhibit CD103 signaling. In another related aspect, the invention relates to methods for the use of an anti-CD103 antibody of the invention to block CD103 binding to E-cadherin.

In one embodiment, the methods are for treating a CD103 signaling-mediated condition in an individual in need thereof, and the methods comprise administering an effective amount of an anti-CD103 antibody of the invention to the individual wherein the anti-CD103 antibody is optionally coupled to a cytotoxic agent.

In one embodiment, the methods are for treating a CD103 signaling-mediated condition in an individual in need thereof, and the methods comprise administering an effective amount of an antigen binding fragment of an anti-CD103 antibody of the invention to the individual wherein the anti-CD103 antibody is optionally coupled to a cytotoxic agent.

In one embodiment, the methods are for preventing a CD103 signaling-mediated condition in an individual in need thereof, and the methods comprise administering an effective amount of an anti-CD103 antibody of the invention, or antigen binding fragment thereof, to the individual wherein the anti-CD103 antibody is optionally coupled to a cytotoxic agent In one embodiment, the methods are for preventing a CD103 signaling-mediated condition in an individual in need thereof, and the methods comprise administering an effective amount of an antigen binding fragment of an anti-CD103 antibody of the invention to the individual wherein the anti-CD103 antibody is optionally coupled to a cytotoxic agent.

In another embodiment, the methods are for inhibiting CD103 signaling in a cell, and the methods comprise contacting the cell with an anti-CD103 antibody of the invention, or antigen binding fragment thereof.

In another embodiment, the methods are for inhibiting CD103 binding to E-cadherin present on a cell, and the methods comprise contacting the cell with an anti-CD103 antibody of the invention, or antigen binding fragment thereof.

In yet another embodiment, the methods are for depleting CD103-expressing cells in an individual, and the methods comprise administering an effective amount of an anti-CD103 antibody of the invention, or antigen binding fragment thereof, to the individual wherein the anti-CD103 antibody is optionally coupled to a cytotoxic agent.

In yet another embodiment, the methods are for method for treating or preventing a disease selected from the group consisting of Hairy Cell leukemia, HCLv, intestinal and extraintestinal lymphomas, enteropathy-associated T-cell lymphoma (EATL), T-lymphoblastic leukemia/lymphoma (T-ALL), T-cell prolymphocytic leukemia (T-PLL), adult T cell leukemia/lymphoma (ATLL), mycosis fungoides (WMF), anaplastic large cell lymphoma ALCL, cutaneous T-cell lymphoma (CTCL), Sezary Syndrome (SS), Alzheimer's disease, Parkinson's disease, multiple sclerosis, IgM polyneuropathies, myasthenia gravis, atopic dermatitis, allergy, asthma, systemic inflammatory response syndrome (SIRS), sepsis, septic shock, atherosclerosis, celiac disease, dermatomyositis, scleroderma, interstitial cystitis, transplant rejection, graft-versus-host disease, Aicardi-Goutieres Syndrome, Hutchison Guilford progeria syndrome, Singleton-Merten Syndrome, proteasome-associated autoinflammatory syndrome, SAVI (STING-associated vasculopathy with onset in infancy), CANDLE (Chronic Atypical Neutrophilic Dermatosis with Lipodystrophy and Elevated Temperature) syndrome, chilblain lupus erythematosus, systemic lupus erythematosus, rheumatoid arthritis, juvenile rheumatoid arthritis, Wegener's disease, inflammatory bowel disease (e.g. ulcerative colitis, Crohn's disease), idiopathic thrombocytopenic purpura, thrombotic thrombocytopenic purpura, autoimmune thrombocytopenia, multiple sclerosis, psoriasis, IgA nephropathy, IgM polyneuropathies, glomerulonephritis, autoimmune myocarditis, myasthenia gravis, vasculitis, Type 1 diabetes, Type 2 diabetes, Sjorgen's syndrome, X-linked reticulate pigmentary disorder, polymyositis, spondyloenchondrodysplasia, and age-related macular degeneration in an individual in need thereof, and the methods comprise administering an effective amount of an anti-CD103 antibody of the invention, or antigen binding fragment thereof, to the individual wherein the anti-CD103 antibody is optionally coupled to a cytotoxic agent.

In yet another embodiment, the methods are for method for treating a disease selected from the group consisting of Hairy Cell leukemia, HCLv, intestinal and extraintestinal lymphomas, enteropathy-associated T-cell lymphoma (EATL), T-lymphoblastic leukemia/lymphoma (T-ALL), T-cell prolymphocytic leukemia (T-PLL), adult T cell leukemia/lymphoma (ATLL), mycosis fungoides (VMF), anaplastic large cell lymphoma ALCL, cutaneous T-cell lymphoma (CTCL), Sezary Syndrome (SS), Alzheimer's disease, Parkinson's disease, multiple sclerosis, IgM polyneuropathies, myasthenia gravis, atopic dermatitis, allergy, asthma, systemic inflammatory response syndrome (SIRS), sepsis, septic shock, atherosclerosis, celiac disease, dermatomyositis, scleroderma, interstitial cystitis, transplant rejection, graft-versus-host disease, Aicardi-Goutieres Syndrome, Hutchison Guilford progeria syndrome, Singleton-Merten Syndrome, proteasome-associated autoinflammatory syndrome, SAVI (STING-associated vasculopathy with onset in infancy), CANDLE (Chronic Atypical Neutrophilic Dermatosis with Lipodystrophy and Elevated Temperature) syndrome, chilblain lupus erythematosus, systemic lupus erythematosus, rheumatoid arthritis, juvenile rheumatoid arthritis, Wegener's disease, inflammatory bowel disease (e.g. ulcerative colitis, Crohn's disease), idiopathic thrombocytopenic purpura, thrombotic thrombocytopenic purpura, autoimmune thrombocytopenia, multiple sclerosis, psoriasis, IgA nephropathy, IgM polyneuropathies, glomerulonephritis, autoimmune myocarditis, myasthenia gravis, vasculitis, Type 1 diabetes, Type 2 diabetes, Sjorgen's syndrome, X-linked reticulate pigmentary disorder, polymyositis, spondyloenchondrodysplasia, and age-related macular degeneration in an individual in need thereof, and the methods comprise administering an effective amount of an anti-CD103 antibody of the invention to the individual wherein the anti-CD103 antibody is optionally coupled to a cytotoxic agent.

In yet another embodiment, the methods are for method for preventing a disease selected from the group consisting of Hairy Cell leukemia, HCLv, intestinal and extraintestinal lymphomas, enteropathy-associated T-cell lymphoma (EATL), T-lymphoblastic leukemia/lymphoma (T-ALL), T-cell prolymphocytic leukemia (T-PLL), adult T cell leukemia/lymphoma (ATLL), mycosis fungoides (WMF), anaplastic large cell lymphoma ALCL, cutaneous T-cell lymphoma (CTCL), Sezary Syndrome (SS), Alzheimer's disease, Parkinson's disease, multiple sclerosis, IgM polyneuropathies, myasthenia gravis, atopic dermatitis, allergy, asthma, systemic inflammatory response syndrome (SIRS), sepsis, septic shock, atherosclerosis, celiac disease, dermatomyositis, scleroderma, interstitial cystitis, transplant rejection, graft-versus-host disease, Aicardi-Goutieres Syndrome, Hutchison Guilford progeria syndrome, Singleton-Merten Syndrome, proteasome-associated autoinflammatory syndrome, SAVI (STING-associated vasculopathy with onset in infancy), CANDLE (Chronic Atypical Neutrophilic Dermatosis with Lipodystrophy and Elevated Temperature) syndrome, chilblain lupus erythematosus, systemic lupus erythematosus, rheumatoid arthritis, juvenile rheumatoid arthritis, Wegener's disease, inflammatory bowel disease (e.g. ulcerative colitis, Crohn's disease), idiopathic thrombocytopenic purpura, thrombotic thrombocytopenic purpura, autoimmune thrombocytopenia, multiple sclerosis, psoriasis, IgA nephropathy, IgM polyneuropathies, glomerulonephritis, autoimmune myocarditis, myasthenia gravis, vasculitis, Type 1 diabetes, Type 2 diabetes, Sjorgen's syndrome, X-linked reticulate pigmentary disorder, polymyositis, spondyloenchondrodysplasia, and age-related macular degeneration in an individual in need thereof, and the methods comprise administering an effective amount of an anti-CD103 antibody of the invention to the individual wherein the anti-CD103 antibody is optionally coupled to a cytotoxic agent.

In various embodiments, these methods utilize an antibody of the invention.

In various embodiments, these methods utilize antigen binding fragment of an antibody of the invention.

In various embodiments, these methods utilize an antibody or antigen binding fragment thereof which comprises:

a. a heavy chain variable region CDR1 comprising the amino acid sequence of SEQ ID NO: 1 or an amino acid sequence differing from SEQ ID NO: 1 by 1, 2, or 3 conservative substitutions,
b. a heavy chain variable region CDR2 comprising the amino acid sequence of SEQ ID NO: 2 or an amino acid sequence differing from SEQ ID NO: 2 by 1, 2, or 3 conservative substitutions,
c. a heavy chain variable region CDR3 comprising the amino acid sequence of SEQ ID NO: 3 or an amino acid sequence differing from SEQ ID NO: 3 by 1, 2, or 3 conservative substitutions,
d. a light chain variable region CDR1 comprising the amino acid sequence of SEQ ID NO: 4 or an amino acid sequence differing from SEQ ID NO: 4 by 1, 2, or 3 conservative substitutions,
e. a light chain variable region CDR2 comprising the amino acid sequence of SEQ ID NO: 5 or an amino acid sequence differing from SEQ ID NO: 5 by 1, 2, or 3 conservative substitutions, and
f. a light chain variable region CDR3 comprising the amino acid sequence of SEQ ID NO: 6 or an amino acid sequence differing from SEQ ID NO: 6 by 1, 2, or 3 conservative substitutions;

or g. a heavy chain variable region CDR1 comprising the amino acid sequence of SEQ ID NO: 9 or an amino acid sequence differing from SEQ ID NO: 9 by 1, 2, or 3 conservative substitutions,
h. a heavy chain variable region CDR2 comprising the amino acid sequence of SEQ ID NO: 10 or an amino acid sequence differing from SEQ ID NO: 10 by 1, 2, or 3 conservative substitutions,
i. a heavy chain variable region CDR3 comprising the amino acid sequence of SEQ ID NO: 11 or an amino acid sequence differing from SEQ ID NO: 11 by 1, 2, or 3 conservative substitutions,
j. a light chain variable region CDR1 comprising the amino acid sequence of SEQ ID NO: 12 or an amino acid sequence differing from SEQ ID NO: 12 by 1, 2, or 3 conservative substitutions,
k. a light chain variable region CDR2 comprising the amino acid sequence of SEQ ID NO: 13 or an amino acid sequence differing from SEQ ID NO: 13 by 1, 2, or 3 conservative substitutions, and
l. a light chain variable region CDR3 comprising the amino acid sequence of SEQ ID NO: 14 or an amino acid sequence differing from SEQ ID NO: 14 by 1, 2, or 3 conservative substitutions;

or m. a heavy chain variable region CDR1 comprising the amino acid sequence of SEQ ID NO: 17 or an amino acid sequence differing from SEQ ID NO: 17 by 1, 2, or 3 conservative substitutions,
n. a heavy chain variable region CDR2 comprising the amino acid sequence of SEQ ID NO: 18 or an amino acid sequence differing from SEQ ID NO: 18 by 1, 2, or 3 conservative substitutions,
o. a heavy chain variable region CDR3 comprising the amino acid sequence of SEQ ID NO: 19 or an amino acid sequence differing from SEQ ID NO: 19 by 1, 2, or 3 conservative substitutions,
p. a light chain variable region CDR1 comprising the amino acid sequence of SEQ ID NO: 20 or an amino acid sequence differing from SEQ ID NO: 20 by 1, 2, or 3 conservative substitutions,
q. a light chain variable region CDR2 comprising the amino acid sequence of SEQ ID NO: 21 or an amino acid sequence differing from SEQ ID NO: 21 by 1, 2, or 3 conservative substitutions, and
r. a light chain variable region CDR3 comprising the amino acid sequence of SEQ ID NO: 22 or an amino acid sequence differing from SEQ ID NO: 22 by 1, 2, or 3 conservative substitutions;

or s. a heavy chain variable region CDR1 comprising the amino acid sequence of SEQ ID NO: 25 or an amino acid sequence differing from SEQ ID NO: 25 by 1, 2, or 3 conservative substitutions,
t. a heavy chain variable region CDR2 comprising the amino acid sequence of SEQ ID NO: 26 or an amino acid sequence differing from SEQ ID NO: 26 by 1, 2, or 3 conservative substitutions,
u. a heavy chain variable region CDR3 comprising the amino acid sequence of SEQ ID NO: 27 or an amino acid sequence differing from SEQ ID NO: 27 by 1, 2, or 3 conservative substitutions,
v. a light chain variable region CDR1 comprising the amino acid sequence of SEQ ID NO: 28 or an amino acid sequence differing from SEQ ID NO: 28 by 1, 2, or 3 conservative substitutions,
w. a light chain variable region CDR2 comprising the amino acid sequence of SEQ ID NO: 29 or an amino acid sequence differing from SEQ ID NO: 29 by 1, 2, or 3 conservative substitutions, and
x. a light chain variable region CDR3 comprising the amino acid sequence of SEQ ID NO: 30 or an amino acid sequence differing from SEQ ID NO: 30 by 1, 2, or 3 conservative substitutions;

or y. a heavy chain variable region CDR1 comprising the amino acid sequence of SEQ ID NO: 33 or an amino acid sequence differing from SEQ ID NO: 33 by 1, 2, or 3 conservative substitutions,
z. a heavy chain variable region CDR2 comprising the amino acid sequence of SEQ ID NO: 34 or an amino acid sequence differing from SEQ ID NO: 34 by 1, 2, or 3 conservative substitutions,
aa. a heavy chain variable region CDR3 comprising the amino acid sequence of SEQ ID NO: 35 or an amino acid sequence differing from SEQ ID NO: 35 by 1, 2, or 3 conservative substitutions,
bb. a light chain variable region CDR1 comprising the amino acid sequence of SEQ ID NO: 36 or an amino acid sequence differing from SEQ ID NO: 36 by 1, 2, or 3 conservative substitutions,
cc. a light chain variable region CDR2 comprising the amino acid sequence of SEQ ID NO: 37 or an amino acid sequence differing from SEQ ID NO: 37 by 1, 2, or 3 conservative substitutions, and
dd. a light chain variable region CDR3 comprising the amino acid sequence of SEQ ID NO: 38 or an amino acid sequence differing from SEQ ID NO: 38 by 1, 2, or 3 conservative substitutions.

It is to be understood that the invention is capable of embodiments in addition to those described and of being practiced and carried out in various ways. Also, it is to be understood that the phraseology and terminology employed herein, as well as the abstract, are for the purpose of description and should not be regarded as limiting. As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

BRIEF DESCRIPTION OF THE FIGURES

FIG. 5: Representative staining of tumor digest for CD8 and CD103 with control antibodies or anti-hCD103 mAbs.

FIG. 8: CD103+CD8+ T cells were pre-incubated with our CD103 mAbs or the commercial CD103 mAb (Clone BerACT-8, BD bioscience) and subsequently incubated with their fluorescently labeled counterparts to study differences in affinity and competition between the mAbs. Percentage binding of fluorescently labeled mAbs was determined using flow cytometry. Maximum binding was set at 100%.

DETAILED DESCRIPTION

Figure 1:
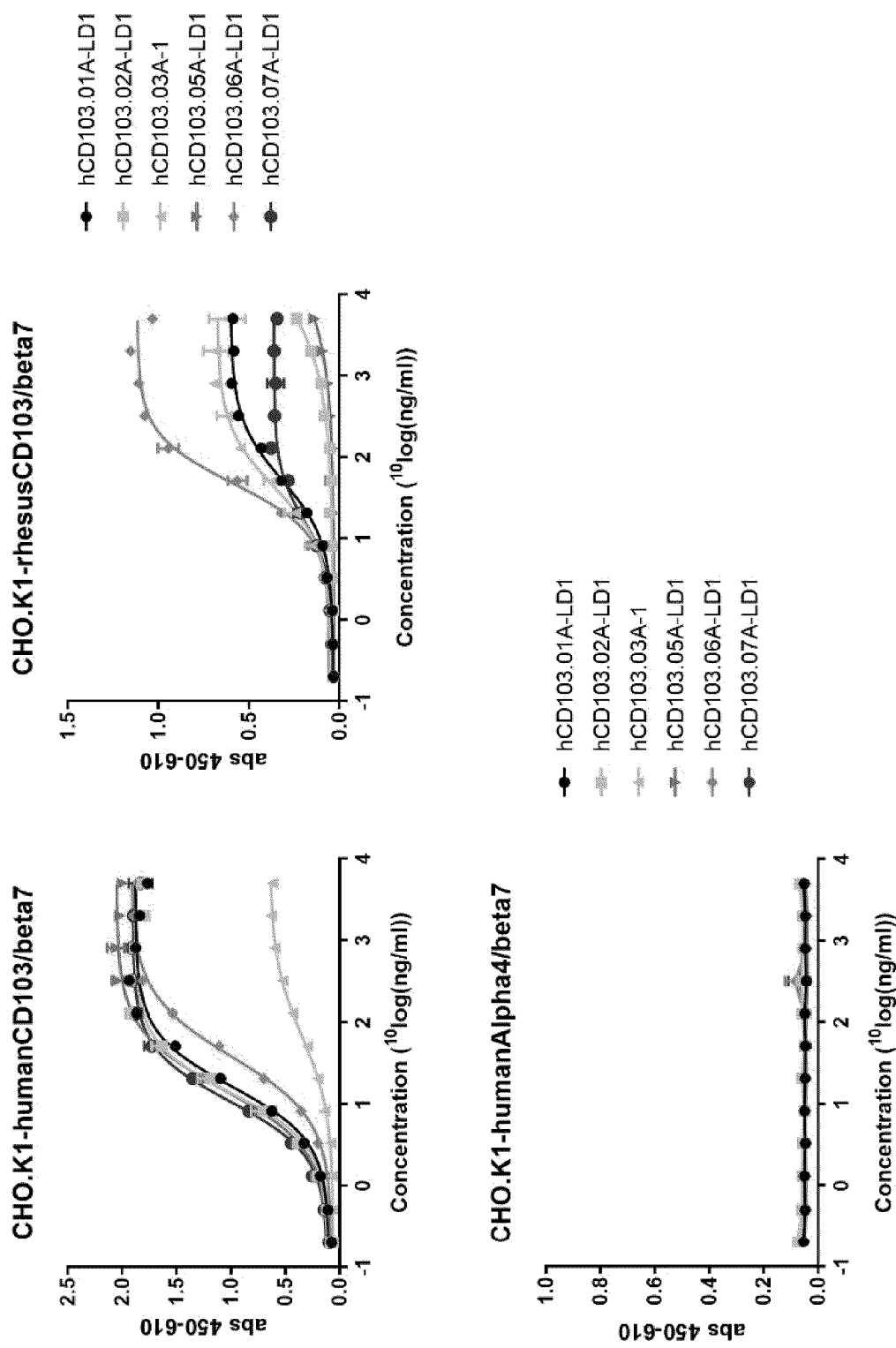
FIG. 1: cell ELISA binding data of anti-hCD103 mAbs to CHO.K1-hCD103/hBeta7, CHO.K1-rhCD103/rhBeta7, and CHO.K1-hAlpha4/hBeta7.

Most, if not all forms of cancer immunotherapy rely on the induction of T cell-based immune responses against antigens preferentially or selectively expressed in cancer cells and presented via major histocompatibility molecules (MHC) on the cell surface. This mode of action is perhaps exemplified most by the exquisite responses of patients with a high tumor mutational burden (TMB) to treatment with monoclonal antibodies that block programmed death-1 (PD-1) or its ligand (PD-L1). In an effort to extend the promise of immunotherapy to more patients, over 2000 (combination) immunotherapy trials have now been initiated across numerous types of cancer. Considering this plethora of treatment options, biomarkers that can guide drug development, treatment decisions and assess therapeutic effects, are urgently needed.

A hallmark of successful immunotherapy is an increase in the activity and number of T cells within the tumor mass (tumor-infiltrating lymphocytes; TIL). TIL "load" in tumor lesions therefore represents an attractive biomarker to support selection and monitoring of patients for immunotherapy. Unfortunately, there is a wide repertoire of TIL and not every T cell within a tumor is involved in the anti-cancer immune response. In recent years, the integrin subunit CD103 has come forward as a marker of TIL for prognostic benefit across epithelial malignancies, including, esophageal, melanoma, lung, breast, bladder and all gynecological cancers. Importantly, CD103$^+$ TIL comprise the CD39$^+$, PD-1$^+$ and CD137$^+$ TIL populations previously linked to anti-cancer effects in tumors. Mechanistic studies have also demonstrated CD103 to be induced after specific activation of T cells against their cognate target, and CD103$^+$ cells expand significantly during successful anti-PD-1 treatment in melanoma, esophageal squamous cell carcinoma and non-small cell lung cancer patients. Finally, CD103 is absent from other immune cell populations in the tumor and therefore provides excellent cell specificity. Taken together, intratumoral CD103 detection may provide an excellent biomarker for determining TIL load and responses to immunotherapy.

The current standard for assessing TIL load is through immunohistochemistry (IHC) on tissue biopsies. However, there are several obstacles known to be associated with biopsy-based techniques, such as poor accessibility of lesions, burden for the patient, tumor heterogeneity within and between lesions and sampling errors. Also using current technologies, it is difficult/not possible to follow T-cell infiltration in tumor lesions over time. In order to overcome these obstacles and obtain information about TIL load in all tumor lesions and toxicity-sensitive organs in the patient, noninvasive whole-body imaging techniques can be applied. Positron emission tomography (PET) is a molecular imaging technique that allows repetitive, non-invasive clinical assessment of tumor characteristics such as the expression of hormone and growth factor receptors. PET is characterized by a high spatial resolution, sensitivity, and possibility to quantify the imaging signal. PET could enable specific monitoring of $CD103^+$ cells in the tumor, provided that a suitably sensitive radiopharmaceutical is available. Therefore, here we describe the development of various anti-CD103 specific antibodies that are suitable for radiopharmaceutical use.

In addition to a diagnostic/prognostic target, CD103 also presents a therapeutic target in a variety of diseases. For example, CD103 is expressed in several subsets of lymphocytes including T cells, intestinal intraepithelial lymphocytes and lamina propria lymphocytes. Interaction between CD103 and E-cadherin results in adhesion of lymphocytes to epithelial cells. While E-cadherin is constitutively expressed in epithelial cells, the expression of CD103 is induced in T cells upon inflammatory stimulation in vitro. Blockade of CD103 is of particular relevance in disorders involving expansion of CD8+ and Th9 cells such as inflammatory bowel disease and in allograft rejection. CD103 is also expressed by dendritic cells and on various T cell types, including malignant forms of these cells. Additionally, tumor-associated CD103+CD8 T cells can have a tolerogenic phenotype, and CD103+ DCs show expression of immunomodulatory molecules and produce immunosuppressive factors such as IL-10, TGF-$\beta$, IL-35, and indoleamine 2,3-dioxygenase (IDO), resulting in T cell anergy and apoptosis and induction of Tregs.

Thus, molecules that bind to CD103 and interfere with its interaction between CD103 and E-cadherin are drug candidates for the diseases. Likewise, molecules that bind to CD103 may be used, for example as part of an antibody-drug conjugate, to deplete CD103-expressing cells for therapeutic purposes.

Definitions

So that the invention may be more readily understood, certain technical and scientific terms are specifically defined below. Unless specifically defined elsewhere in this document, all other technical and scientific terms used herein have the meaning commonly understood by one of ordinary skill in the art to which this invention belongs.

As used herein, including the appended claims, the singular forms of words such as "a," "an," and "the," include their corresponding plural references unless the context clearly dictates otherwise.

"Administration" and "treatment," as it applies to an animal, human, experimental subject, cell, tissue, organ, or biological fluid, refers to contact of an exogenous pharmaceutical, therapeutic, diagnostic agent, or composition to the animal, human, subject, cell, tissue, organ, or biological fluid. Treatment of a cell encompasses contact of a reagent to the cell, as well as contact of a reagent to a fluid, where the fluid is in contact with the cell. "Administration" and "treatment" also means in vitro and ex vivo treatments, e.g., of a cell, by a reagent, diagnostic, binding compound, or by another cell.

"Treat" or "treating" means to administer a therapeutic agent, such as a composition containing any of the antibodies or antigen-binding fragments of the present invention, internally or externally to a subject or patient having one or more disease symptoms, or being suspected of having a disease, for which the agent has therapeutic activity. Typically, the agent is administered in an amount effective to alleviate one or more disease symptoms in the treated subject or population, whether by inducing the regression of or inhibiting the progression of such symptom(s) by any clinically measurable degree. The amount of a therapeutic agent that is effective to alleviate any particular disease symptom may vary according to factors such as the disease state, age, and weight of the patient, and the ability of the drug to elicit a desired response in the subject. Whether a disease symptom has been alleviated can be assessed by any clinical measurement typically used by physicians or other skilled healthcare providers to assess the severity or progression status of that symptom.

"Recombinant expression" of a protein means the transcription and translation of an exogenous gene in a host organism to generate the protein, which is referred to herein as a "recombinant protein."

The term "Positron Emission Tomography (PET)" as used herein refers to a nuclear imaging technique used in the medical field to assist in the diagnosis of diseases. PET allows the physician to examine the whole patient at once by producing pictures of many functions of the human body unobtainable by other imaging techniques. In this regard, PET displays images of how the body works (physiology or function) instead of simply how it looks. Applications for PET imaging include those in the fields of oncology, cardiology, and neurology. In PET, short-lived positron-emitting isotopes, herein referred to as radiopharmaceuticals, are injected into a patient. When these radioactive drugs are administered to a patient, they distribute within the body according to the physiologic pathways associated with their stable counterparts.

The term "SPECT" as used herein refers to "Single-Photon Emission Computed Tomography which is a nuclear medicine tomographic imaging technique using gamma rays. It is very similar to conventional nuclear medicine planar imaging using a gamma camera and able to provide true 3D information. This information is typically presented as cross-sectional slices through the patient, but can be freely reformatted or manipulated as required. The basic technique requires delivery of a gamma-emitting radioisotope (called radionuclide) into the patient, normally through injection into the bloodstream.

By the term "detectable label" is meant, for the purposes of the specification or claims, a label molecule that is attached indirectly or directly to an antibody or antigen-binding fragment thereof according to the disclosure, wherein the label molecule facilitates the detection of the antibody in which it is incorporated. Thus, "detectable label" is used synonymously with "label molecule".

The term "imaging agent" as used herein refers to a labeling moiety that is useful for providing an indication of the position of the label and adherents thereto, in a cell or tissue of an animal or human subject, or a cell or tissue under in vitro conditions. While agents may include those that provide detectable signals such as fluorescence, luminescence, radioactivity, or can be detected by such methods as MRI imaging, and the like, in the context of the probes and methods of use of the disclosure, the term "imaging agent" particularly refers to a label detectable by such as PET or SPECT imaging technology such as, but not limited to, $^{64}$Cu, $^{67}$Cu, $^{89}$Zr, $^{124}$I, $^{86}$Y, $^{90}$Y, $^{111}$In, $^{123/131}$I, $^{177}$Lu, $^{18}$F, $^{99m}$Tc, and the like. In the most preferred embodiments of the immunoconjugate probes of the disclosure the labeling agent is 89-zirconium (Zr) although it is contemplated that any metal isotope (or any other PET-compatible labeling agent) may be used that provides a PET-generated image and may be attached or conjugated to the glypican-3 targeting antibody or antibody fragment.

The term "biological specimen" refers to a tissue, body fluid, or other sample from or in an organism (e.g., a human patient) or from components (e.g., cells) of an organism. The sample may be of any biological tissue or fluid. The specimen may be a "clinical sample" which is a sample derived from a patient. Such specimen include, but are not limited to, sputum, blood, blood cells (e.g., white cells), amniotic fluid, plasma, bone marrow, and tissue or fine needle biopsy samples, urine, peritoneal fluid, and pleural fluid, or cells therefrom. Biological specimen may also include tissues or sections of tissues (such as frozen or paraffin-embedded sections) taken for histological purposes. A biological specimen may also be referred to as a "patient sample."

In certain embodiments a biological specimen may be a tumor, either within a living being or removed therefrom. The term "tumor" as used herein refers to all neoplastic cell growth and proliferation, whether malignant or benign, and all pre-cancerous and cancerous cells and tissues. The terms "cancer" and "cancerous" refer to or describe the physiological condition in mammals that is typically characterized by unregulated cell growth. In particular, the probes and compositions of the disclosure are most advantageous for the detection of a cancer cells of the liver (hepatocellular carcinoma) and especially of such cells bearing epitopes of the glypican-3 membrane-bound protein.

Anti-CD103 Antibodies and Antigen-Binding Fragments Thereof

The present invention provides antibodies that bind human CD103 and uses of such antibodies. The present invention provides antigen-binding fragments that bind human CD103 and uses of such fragments. In some embodiments, the anti-CD103 antibodies are isolated.

Whether an antibody specifically binds to a polypeptide sequence (e.g., human CD103) can be determined using any assay known in the art. Examples of assays known in the art to determining binding affinity include surface plasmon resonance (e.g., BIACORE) or a similar technique (e.g. KinExa or OCTET).

As used herein, the term "antibody" refers to any form of antibody that exhibits the desired biological activity. The term antibody includes antigen-binding portions, i.e., "antigen binding sites," (e.g., fragments, subsequences, complementarity determining regions (CDRs)) that retain capacity to bind antigen, including (i) a Fab fragment, a monovalent fragment consisting of the $V_L$, $V_H$, $C_L$ and $C_H1$ domains; (ii) a F(ab')2 fragment, a bivalent fragment comprising two Fab fragments linked by a disulfide bridge at the hinge region; (iii) a Fd fragment consisting of the $V_H$ and $C_H1$ domains; (iv) a Fv fragment consisting of the $V_L$ and $V_H$ domains of a single arm of an antibody, (v) a dAb fragment (Ward et al., (1989) Nature 341:544-546), which consists of a VH domain; and (vi) an isolated complementarity determining region (CDR). Single chain antibodies are also included by reference in the term "antibody." Preferred therapeutic antibodies are intact IgG antibodies. The term "intact IgG" as used herein is meant as a polypeptide belonging to the class of antibodies that are substantially encoded by a recognized immunoglobulin gamma gene. In humans this class comprises IgG1, IgG2, IgG3, and IgG4. In mice this class comprises IgG1, IgG2a, IgG2b, IgG3. The known Ig domains in the IgG class of antibodies are $V_H$, Cγ1, Cγ2, Cγ3, $V_L$, and $C_L$.

The present invention includes anti-CD103 antigen-binding fragments and methods of use thereof.

As used herein, a "full length antibody" is, in the case of an IgG, a bivalent molecule comprising two heavy chains and two light chains. Each heavy chain comprises a $V_H$ domain followed by a constant domain ($C_{H1}$), a hinge region, and two more constant ($C_{H2}$ and $C_{H3}$) domains; while each light chain comprises one $V_L$ domain and one constant ($C_L$) domain. A full length antibody in the case of an IgM is a decavalent or dodecavalent molecule comprising 5 or 6 linked immunoglobulins in which each immunoglobulin monomer has two antigen binding sites formed of a heavy and light chain.

As used herein, unless otherwise indicated, "antibody fragment" or "antigen-binding fragment" refers to antigen-binding fragments of antibodies, i.e. antibody fragments that retain the ability to bind specifically to the antigen bound by the full-length antibody, e.g. fragments that retain one or more CDR regions. Examples of antigen-binding fragments include, but are not limited to, Fab, Fab', F(ab')$_2$, and Fv fragments; diabodies; linear antibodies; single-chain antibody molecules, e.g., sc-Fv; nanobodies and multispecific antibodies formed from antibody fragments.

The present invention includes anti-CD103 Fab fragments and methods of use thereof. A "Fab fragment" is comprised of one light chain and the $C_H1$ and variable regions of one heavy chain. The heavy chain of a Fab molecule cannot form a disulfide bond with another heavy chain molecule. A "Fab fragment" can be the product of papain cleavage of an antibody.

The present invention includes anti-CD103 antibodies and antigen-binding fragments thereof which comprise an Fc region and methods of use thereof. An "Fc" region contains two heavy chain fragments comprising the $C_H3$ and $C_H2$ domains of an antibody. The two heavy chain fragments are held together by two or more disulfide bonds and by hydrophobic interactions of the $C_H3$ domains.

The present invention includes anti-CD103 Fab' fragments and methods of use thereof. A "Fab' fragment" contains one light chain and a portion or fragment of one heavy chain that contains the $V_H$ domain and the $C_H1$ domain and also the region between the $C_H1$ and $C_H2$ domains, such that an interchain disulfide bond can be formed between the two heavy chains of two Fab' fragments to form a F(ab')$_2$ molecule.

The present invention includes anti-CD103 F(ab')$_2$ fragments and methods of use thereof. A "F(ab')$_2$ fragment" contains two light chains and two heavy chains containing a portion of the constant region between the $C_{H1}$ and $C_{H2}$ domains, such that an interchain disulfide bond is formed between the two heavy chains. A F(ab')$_2$ fragment thus is composed of two Fab' fragments that are held together by a disulfide bond between the two heavy chains. An "F(ab')$_2$ fragment" can be the product of pepsin cleavage of an antibody.

The present invention includes anti-CD103 Fv fragments and methods of use thereof. The "Fv region" comprises the variable regions from both the heavy and light chains, but lacks the constant regions.

The present invention includes anti-CD103 scFv fragments and methods of use thereof. The term "single-chain Fv" or "scFv" antibody refers to antibody fragments comprising the $V_H$ and $V_L$ domains of an antibody, wherein these domains are present in a single polypeptide chain. Generally, the Fv polypeptide further comprises a polypeptide linker between the $V_H$ and $V_L$ domains which enables the scFv to form the desired structure for antigen-binding. For a review of scFv, see Pluckthun (1994) THE PHARMACOLOGY OF MONOCLONAL ANTIBODIES, vol. 113, Rosenburg and Moore eds. Springer-Verlag, New York, pp. 269-315. See also, International Patent Application Publication No. WO 88/01649 and U.S. Pat. Nos. 4,946,778 and 5,260,203.

The present invention includes anti-CD103 domain antibodies and methods of use thereof. A "domain antibody" is an immunologically functional immunoglobulin fragment containing only the variable region of a heavy chain or the variable region of a light chain. In some instances, two or more $V_H$ regions are covalently joined with a peptide linker to create a bivalent domain antibody. The two $V_H$ regions of a bivalent domain antibody may target the same or different antigens.

The present invention includes anti-CD103 bivalent antibodies and methods of use thereof. A "bivalent antibody" comprises two antigen-binding sites. In some instances, the two binding sites have the same antigen specificities. However, bivalent antibodies may be bispecific (see below).

The present invention includes anti-CD103 diabodies and methods of use thereof. As used herein, the term "diabodies" refers to small antibody fragments with two antigen-binding sites, which fragments comprise a heavy chain variable domain ($V_H$) connected to a light chain variable domain ($V_L$) in the same polypeptide chain ($V_H$-$V_L$ or $V_L$-$V_H$). By using a linker that is too short to allow pairing between the two domains on the same chain, the domains are forced to pair with the complementary domains of another chain and create two antigen-binding sites. Diabodies are described more fully in, e.g., EP 404,097; WO 93/11161; and Holliger et al. (1993) Proc. Natl. Acad. Sci. USA 90: 6444-6448. Duobodies are described in Labrijn et al., 2013, Proc. Natl. Acad. Sci. USA 110 (13): 5145-5150. For a review of engineered antibody variants generally see Holliger and Hudson (2005) Nat. Biotechnol. 23:1126-1136.

Typically, an antibody or antigen-binding fragment of the invention which is modified in some way retains at least 10% of its binding activity (when compared to the parental antibody) when that activity is expressed on a molar basis. Preferably, an antibody or antigen-binding fragment of the invention retains at least 20%, 50%, 70%, 80%, 90%, 95% or 100% or more of the CD103 binding affinity as the parental antibody. It is also intended that an antibody or antigen-binding fragment of the invention can include conservative or non-conservative amino acid substitutions (referred to as "conservative variants" or "function conserved variants" of the antibody) that do not substantially alter its biologic activity.

The present invention includes isolated anti-CD103 antibodies and antigen-binding fragments thereof and methods of use thereof. Herein, the term "isolated" is not intended to refer to a complete absence of such biological molecules or to an absence of water, buffers, or salts or to components of a pharmaceutical formulation that includes the antibodies or fragments. An "isolated" antibody, antigen-binding fragment, nucleic acid, etc., is one which has been identified and separated and/or recovered from one or more components of its natural environment. In preferred embodiments, the antibody, antigen-binding fragment, nucleic acid, etc., is purified to 75% by weight or more, more preferably to 90% by weight or more, still more preferably to 95% by weight or more, and still more preferably to 98% by weight or more. Thus, "isolated" biological molecules are at least partially free of other biological molecules from the cells or cell cultures in which they are produced. Such biological molecules include nucleic acids, proteins, lipids, carbohydrates, or other material such as cellular debris and growth medium. An isolated antibody or antigen-binding fragment may further be at least partially free of expression system components such as biological molecules from a host cell or of the growth medium thereof.

The present invention includes anti-CD103 chimeric antibodies (e.g., human constant domain/mouse variable domain) and methods of use thereof. As used herein, a "chimeric antibody" is an antibody having the variable domain from a first antibody and the constant domain from a second antibody, where the first and second antibodies are from different species. (U.S. Pat. No. 4,816,567; and Morrison et al., (1984) Proc. Natl. Acad. Sci. USA 81: 6851-6855). Typically, the variable domains are obtained from an antibody from an experimental animal (the "parental antibody"), such as a rodent, and the constant domain sequences are obtained from human antibodies, so that the resulting chimeric antibody will be less likely to elicit an adverse immune response in a human subject than the parental (e.g., mouse) antibody.

The present invention includes anti-CD103 humanized antibodies and antigen-binding fragments thereof (e.g., rat or mouse antibodies that have been humanized) and methods of use thereof. As used herein, the term "humanized antibody" refers to forms of antibodies that contain sequences from both human and non-human (e.g., mouse or rat) antibodies. In general, the humanized antibody will comprise substantially of at least one, and typically two, variable domains, in which all or substantially all of the hypervariable loops correspond to those of a non-human immunoglobulin, and all or substantially all of the framework (FR) regions are those of a human immunoglobulin sequence. The humanized antibody may optionally comprise at least a portion of a human immunoglobulin constant region (Fc). For more details about humanized antibodies, see, e.g., Jones et al., Nature, 321:522-525 (1986); Reichmann et al., Nature, 332:323-329 (1988); Presta, Curr. Op. Struct. Biol., 2:593-596 (1992); and Clark, Immunol. Today 21: 397-402 (2000).

In general, the basic antibody structural unit comprises a tetramer. Each tetramer includes two identical pairs of polypeptide chains, each pair having one "light" (about 25 kDa) and one "heavy" chain (about 50-70 kDa). The amino-terminal portion of each chain includes a variable region of about 100 to 110 or more amino acids primarily responsible for antigen recognition. The carboxy-terminal portion of the heavy chain may define a constant region primarily responsible for effector function. Typically, human light chains are classified as kappa and lambda light chains. Furthermore, human heavy chains are typically classified as mu, delta, gamma, alpha, or epsilon, and define the antibody's isotype as IgM, IgD, IgG, IgA, and IgE, respectively. Within light and heavy chains, the variable and constant regions are joined by a "J" region of about 12 or more amino acids, with the heavy chain also including a "D" region of about 10 more amino acids. See generally, Fundamental Immunology Ch. 7 (Paul, W., ed., 2nd ed. Raven Press, N.Y. (1989).

The variable regions of each light/heavy chain pair form the antibody binding site. Thus, in general, an intact antibody has two binding sites. Except in bifunctional or bispecific antibodies, the two binding sites are, in general, the same.

Typically, the variable domains of both the heavy and light chains comprise three hypervariable regions, also called complementarity determining regions (CDRs), located within relatively conserved framework regions (FR). The CDRs are usually aligned by the framework regions, enabling binding to a specific epitope. In general, from N-terminal to C-terminal, both light and heavy chains variable domains comprise FR1, CDR1, FR2, CDR2, FR3, CDR3 and FR4. The assignment of amino acids to each domain is, generally, in accordance with the definitions of *Sequences of Proteins of Immunological Interest*, Kabat, et al.; National Institutes of Health, Bethesda, MD; 5$^{th}$ ed.; NIH Publ. No. 91-3242 (1991); Kabat (1978) *Adv. Prot. Chem.* 32:1-75; Kabat, et al., (1977) *J. Biol. Chem.* 252: 6609-6616; Chothia, et al., (1987) *J Mol. Biol.* 196:901-917 or Chothia, et al., (1989) *Nature* 342:878-883.

As used herein, the term "hypervariable region" refers to the amino acid residues of an antibody or antigen-binding fragment thereof that are responsible for antigen-binding. The hypervariable region comprises amino acid residues from a "complementarity determining region" or "CDR" (i.e. CDRL1, CDRL2 and CDRL3 in the light chain variable domain and CDRH1, CDRH2 and CDRH3 in the heavy chain variable domain). See Kabat et al. (1991) Sequences of Proteins of Immunological Interest, 5th Ed. Public Health Service, National Institutes of Health, Bethesda, Md. (defining the CDR regions of an antibody by sequence); see also Chothia and Lesk (1987) *J. Mol. Biol.* 196: 901-917 (defining the CDR regions of an antibody by structure). As used herein, the term "framework" or "FR" residues refers to those variable domain residues other than the hypervariable region residues defined herein as CDR residues.

"Isolated nucleic acid molecule" or "isolated polynucleotide" means a DNA or RNA of genomic, mRNA, cDNA, or synthetic origin or some combination thereof which is not associated with all or a portion of a polynucleotide in which the isolated polynucleotide is found in nature, or is linked to a polynucleotide to which it is not linked in nature. For purposes of this disclosure, it should be understood that "a nucleic acid molecule comprising" a particular nucleotide sequence does not encompass intact chromosomes. Isolated nucleic acid molecules "comprising" specified nucleic acid sequences may include, in addition to the specified sequences, coding sequences for up to ten or even up to twenty or more other proteins or portions or fragments thereof, or may include operably linked regulatory sequences that control expression of the coding region of the recited nucleic acid sequences, and/or may include vector sequences.

The phrase "control sequences" refers to DNA sequences necessary for the expression of an operably linked coding sequence in a particular host organism. The control sequences that are suitable for prokaryotes, for example, include a promoter, optionally an operator sequence, and a ribosome binding site. Eukaryotic cells are known to use promoters, polyadenylation signals, and enhancers.

A nucleic acid or polynucleotide is "operably linked" when it is placed into a functional relationship with another nucleic acid sequence. For example, DNA for a presequence or secretory leader is operably linked to DNA for a polypeptide if it is expressed as a preprotein that participates in the secretion of the polypeptide; a promoter or enhancer is operably linked to a coding sequence if it affects the transcription of the sequence; or a ribosome binding site is operably linked to a coding sequence if it is positioned so as to facilitate translation. Generally, but not always, "operably linked" means that the DNA sequences being linked are contiguous, and, in the case of a secretory leader, contiguous and in reading phase. However, enhancers do not have to be contiguous. Linking is accomplished by ligation at convenient restriction sites. If such sites do not exist, the synthetic oligonucleotide adaptors or linkers are used in accordance with conventional practice.

As used herein, the expressions "cell," "cell line," and "cell culture" are used interchangeably and all such designations include progeny. Thus, the words "transformants" and "transformed cells" include the primary subject cell and cultures derived therefrom without regard for the number of transfers. It is also understood that not all progeny will have precisely identical DNA content, due to deliberate or inadvertent mutations. Mutant progeny that have the same function or biological activity as screened for in the originally transformed cell are included. Where distinct designations are intended, it will be clear from the context.

As used herein, "germline sequence" refers to a sequence of unrearranged immunoglobulin DNA sequences. Any suitable source of unrearranged immunoglobulin sequences may be used. Human germline sequences may be obtained, for example, from JOINSOLVER germline databases on the website for the National Institute of Arthritis and Musculoskeletal and Skin Diseases of the United States National Institutes of Health. Mouse germline sequences may be obtained, for example, as described in Giudicelli et al. (2005) *Nucleic Acids Res.* 33: D256-D261.

Binding Affinity

By way of example, and not limitation, the antibodies disclosed herein may bind human CD103 bivalently with a $K_D$ value of $10 \times 10^{-9}$ M or lower as determined by surface plasmon resonance (e.g., BIACORE) or a similar technique (e.g. KinExa or bio-layer interferometry (OCTET)). In one embodiment, the antibodies disclosed herein may bind human CD103 bivalently with a $K_D$ value of about $5\text{-}10 \times 10^{-9}$ M. The Kd value may be determined by surface plasmon resonance (e.g., BIACORE). The Kd value may be determined by similar techniques (e.g. KinExa or OCTET). By way of example, and not limitation, the antigen-binding fragments disclosed herein may bind human CD103 bivalently with a $K_D$ value of $10 \times 10^{-9}$ M or lower as determined by surface plasmon resonance (e.g., BIACORE) or a similar technique (e.g. KinExa or bio-layer interferometry (OCTET)). In one embodiment, the antigen-binding fragments disclosed herein may bind human CD103 bivalently with a $K_D$ value of about $5\text{-}10 \times 10^{-9}$ M. The Kd value may be determined by surface plasmon resonance (e.g., BIACORE). The Kd value may be determined by similar techniques (e.g. KinExa or OCTET). Affinity is calculated as $K_D = k_{off}/k_{on}$ ($k_{off}$ is the dissociation rate constant, $K_{on}$ is the association rate constant and $K_D$ is the equilibrium constant). Affinity can be determined at equilibrium by measuring the fraction bound (r) of labeled ligand at various concentrations (c). The data are graphed using the Scatchard equation: $r/c = K(n-r)$: where r=moles of bound ligand/mole of receptor at equilibrium; c=free ligand concentration at equilibrium; K=equilibrium association constant; and n=number of ligand binding sites per receptor molecule. By graphical analysis, r/c is plotted on the Y-axis versus r on the X-axis, thus producing a Scatchard plot. Antibody affinity measurement by Scatchard analysis is well known in the art. See, e.g., van Erp et al., *J. Immunoassay* 12: 425-43, 1991; Nelson and Griswold, *Comput. Methods Programs Biomed.* 27: 65-8, 1988.

Methods of Making Antibodies and Antigen-Binding Fragments Thereof

Thus, the present invention includes methods for making an anti-CD103 antibody or antigen-binding fragment thereof of the present invention comprising culturing a hybridoma cell that expresses the antibody or fragment under condition favorable to such expression and, optionally, isolating the antibody or fragment from the hybridoma and/or the growth medium (e.g. cell culture medium).

The anti-CD103 antibodies disclosed herein may also be produced recombinantly (e.g., in an *E. coli*/T7 expression system, a mammalian cell expression system or a lower eukaryote expression system). In this embodiment, nucleic acids encoding the antibody immunoglobulin molecules of the invention (e.g., $V_H$ or $V_L$) may be inserted into a pET-based plasmid and expressed in the *E. coli*/T7 system. For example, the present invention includes methods for expressing an antibody or antigen-binding fragment thereof or immunoglobulin chain thereof in a host cell (e.g., bacterial host cell such as *E. coli* such as BL21 or BL21DE3) comprising expressing T7 RNA polymerase in the cell which also includes a polynucleotide encoding an immunoglobulin chain that is operably linked to a T7 promoter. For example, in an embodiment of the invention, a bacterial host cell, such as a *E. coli*, includes a polynucleotide encoding the T7 RNA polymerase gene operably linked to a lac promoter and expression of the polymerase and the chain is induced by incubation of the host cell with IPTG (isopropyl-beta-D-thiogalactopyranoside).

There are several methods by which to produce recombinant antibodies which are known in the art. One example of a method for recombinant production of antibodies is disclosed in U.S. Pat. No. 4,816,567.

Transformation can be by any known method for introducing polynucleotides into a host cell. Methods for introduction of heterologous polynucleotides into mammalian cells are well known in the art and include dextran-mediated transfection, calcium phosphate precipitation, polybrene-mediated transfection, protoplast fusion, electroporation, encapsulation of the polynucleotide(s) in liposomes, biolistic injection and direct microinjection of the DNA into nuclei. In addition, nucleic acid molecules may be introduced into mammalian cells by viral vectors. Methods of transforming cells are well known in the art. See, for example, U.S. Pat. Nos. 4,399,216; 4,912,040; 4,740,461 and 4,959,455.

Thus, the present invention includes recombinant methods for making an anti-CD103 antibody or antigen-binding fragment thereof of the present invention, or an immunoglobulin chain thereof, comprising introducing a polynucleotide encoding one or more immunoglobulin chains of the antibody or fragment (e.g., heavy and/or light immunoglobulin chain); culturing the host cell (e.g., CHO or *Pichia* or *Pichia pastoris*) under condition favorable to such expression and, optionally, isolating the antibody or fragment or chain from the host cell and/or medium in which the host cell is grown.

Anti-CD103 antibodies can also be synthesized by any of the methods set forth in U.S. Pat. No. 6,331,415.

Eukaryotic and prokaryotic host cells, including mammalian cells as hosts for expression of the antibodies or fragments or immunoglobulin chains disclosed herein are well known in the art and include many immortalized cell lines available from the American Type Culture Collection (ATCC). These include, inter alia, Chinese hamster ovary (CHO) cells, NSO, SP2 cells, HeLa cells, baby hamster kidney (BHK) cells, monkey kidney cells (COS), human hepatocellular carcinoma cells (e.g., Hep G2), A549 cells, 3T3 cells, HEK-293 cells and a number of other cell lines. Mammalian host cells include human, mouse, rat, dog, monkey, pig, goat, bovine, horse and hamster cells. Cell lines of particular preference are selected through determining which cell lines have high expression levels. Other cell lines that may be used are insect cell lines, such as Sf9 cells, amphibian cells, bacterial cells, plant cells and fungal cells. Fungal cells include yeast and filamentous fungus cells including, for example, *Pichia pastoris, Pichia finlandica, Pichia trehalophila, Pichia koclamae, Pichia membranaefaciens, Pichia minuta (Ogataea minuta, Pichia lindneri), Pichia opuntiae, Pichia thermotolerans, Pichia salictaria, Pichia guercuum, Pichia piperi, Pichia stiptis, Pichia methanolica, Pichia* sp., *Saccharomyces cerevisiae, Saccharomyces* sp., *Hansenula polymorpha, Kluyveromyces* sp., *Kluyveromyces lactis, Candida albicans, Aspergillus nidulans, Aspergillus niger, Aspergillus oryzae, Trichoderma reesei, Chrysosporium lucknowense, Fusarium* sp., *Fusarium gramineum, Fusarium venenatum, Physcomitrella patens* and *Neurospora crassa. Pichia* sp., any *Saccharomyces* sp., *Hansenula polymorpha*, any *Kluyveromyces* sp., *Candida albicans*, any *Aspergillus* sp., *Trichoderma reesei, Chrysosporium lucknowense*, any *Fusarium* sp., *Yarrowia lipolytica*, and *Neurospora crassa*. When recombinant expression vectors encoding the heavy chain or antigen-binding portion or fragment thereof, and/or the light chain or antigen-binding fragment thereof are introduced into mammalian host cells, the antibodies are produced by culturing the host cells for a period of time sufficient to allow for expression of the antibody or fragment or chain in the host cells or secretion into the culture medium in which the host cells are grown.

Antibodies and antigen-binding fragments thereof and immunoglobulin chains can be recovered from the culture medium using standard protein purification methods. Further, expression of antibodies and antigen-binding fragments thereof and immunoglobulin chains of the invention (or other moieties therefrom) from production cell lines can be enhanced using a number of known techniques. For example, the glutamine synthetase gene expression system (the GS system) is a common approach for enhancing expression under certain conditions. The GS system is discussed in whole or part in connection with European Patent Nos. 0216846, 0256055, and 0323997 and 0338841. Thus, in an embodiment of the invention, the mammalian host cells (e.g., CHO) lack a glutamine synthetase gene and are grown in the absence of glutamine in the medium wherein, however, the polynucleotide encoding the immunoglobulin chain comprises a glutamine synthetase gene which complements the lack of the gene in the host cell.

The present invention includes methods for purifying an anti-CD103 antibody or antigen-binding fragment thereof of the present invention comprising introducing a sample comprising the antibody or fragment to a purification medium (e.g., cation exchange medium, anion exchange medium, hydrophobic exchange medium, affinity purification medium (e.g., protein-A, protein-G, protein-A/G, protein-L)) and either collecting purified antibody or fragment from the flow-through fraction of said sample that does not bind to the medium; or, discarding the flow-through fraction and eluting bound antibody or fragment from the medium and collecting the eluate. In an embodiment of the invention, the medium is in a column to which the sample is applied. In an embodiment of the invention, the purification method is conducted following recombinant expression of the antibody or fragment in a host cell, e.g., wherein the host cell is first lysed and, optionally, the lysate is purified of insoluble materials prior to purification on a medium.

In general, glycoproteins produced in a particular cell line or transgenic animal will have a glycosylation pattern that is characteristic for glycoproteins produced in the cell line or transgenic animal. Therefore, the particular glycosylation pattern of an antibody will depend on the particular cell line or transgenic animal used to produce the antibody. However, all antibodies encoded by the nucleic acid molecules provided herein, or comprising the amino acid sequences provided herein, comprise the instant invention, independent of the glycosylation pattern the antibodies may have. Similarly, in particular embodiments, antibodies with a glycosylation pattern comprising only non-fucosylated N-glycans may be advantageous, because these antibodies have been shown to typically exhibit more potent efficacy than their fucosylated counterparts both in vitro and in vivo (See for example, Shinkawa et al., *J. Biol. Chem.* 278: 3466-3473 (2003); U.S. Pat. Nos. 6,946,292 and 7,214,775). These antibodies with non-fucosylated N-glycans are not likely to be immunogenic because their carbohydrate structures are a normal component of the population that exists in human serum IgG.

The present invention further includes anti-CD103 antigen-binding fragments of the anti-CD103 antibodies disclosed herein. The antibody fragments include $F(ab)_2$ fragments, which may be produced by enzymatic cleavage of an IgG by, for example, pepsin. Fab fragments may be produced by, for example, reduction of $F(ab)_2$ with dithiothreitol or mercaptoethylamine.

Immunoglobulins may be assigned to different classes depending on the amino acid sequences of the constant domain of their heavy chains. In some embodiments, different constant domains may be appended to humanized $V_L$ and $V_H$ regions derived from the CDRS provided herein. There are at least five major classes of immunoglobulins: IgA, IgD, IgE, IgG and IgM, and several of these may be further divided into subclasses (isotypes), e.g. IgG1, IgG2, IgG3 and IgG4; IgA1 and IgA2. The invention comprises antibodies and antigen-binding fragments of any of these classes or subclasses of antibodies.

In one embodiment, the antibody or antigen-binding fragment comprises a heavy chain constant region, e.g. a human constant region, such as γ1, γ2, γ3, or γ4 human heavy chain constant region or a variant thereof. In another embodiment, the antibody or antigen-binding fragment comprises a light chain constant region, e.g. a human light chain constant region, such as lambda or kappa human light chain region or variant thereof. By way of example, and not limitation the human heavy chain constant region can be γ4 and the human light chain constant region can be kappa. In an alternative embodiment, the Fc region of the antibody is γ4 with a Ser228Pro mutation (Schuurman, J et. al., *Mol. Immunol.* 38: 1-8, 2001).

In one embodiment, the antibody or antigen-binding fragment comprises a heavy chain constant region of the IgG1 subtype. In one embodiment, the antibody or antigen-binding fragment comprises a heavy chain constant region of the IgG2 subtype. In one embodiment, the antibody or antigen-binding fragment comprises a heavy chain constant region of the IgG4 subtype.

Antibody Engineering

Further included are embodiments in which the anti-CD103 antibodies and antigen-binding fragments thereof are engineered antibodies to include modifications to framework residues within the variable domains the antibody, e.g. to improve the properties of the antibody or fragment. Typically, such framework modifications are made to decrease the immunogenicity of the antibody or fragment. This is usually accomplished by replacing non-CDR residues in the variable domains (i.e. framework residues) in a parental (e.g. rodent) antibody or fragment with analogous residues from the immune repertoire of the species in which the antibody is to be used, e.g. human residues in the case of human therapeutics. Such an antibody or fragment is referred to as a "humanized" antibody or fragment. In some cases, it is desirable to increase the affinity, or alter the specificity of an engineered (e.g. humanized) antibody. One approach is to mutate one or more framework residues to the corresponding germline sequence. More specifically, an antibody or fragment that has undergone somatic mutation can contain framework residues that differ from the germline sequence from which the antibody is derived. Such residues can be identified by comparing the antibody or fragment framework sequences to the germline sequences from which the antibody or fragment is derived. Another approach is to revert to the original parental (e.g., rodent) residue at one or more positions of the engineered (e.g. humanized) antibody, e.g. to restore binding affinity that may have been lost in the process of replacing the framework residues. (See, e.g., U.S. Pat. Nos. 5,693,762, 5,585,089 and 5,530,101).

In certain embodiments, the anti-CD103 antibodies and antigen-binding fragments thereof are engineered (e.g. humanized) to include modifications in the framework and/or CDRs to improve their properties. Such engineered changes can be based on molecular modelling. A molecular model for the variable region for the parental (non-human) antibody sequence can be constructed to understand the structural features of the antibody and used to identify potential regions on the antibody that can interact with the antigen. Conventional CDRs are based on alignment of immunoglobulin sequences and identifying variable regions. Kabat et al., (1991) *Sequences of Proteins of Immunological Interest*, Kabat, et al.; National Institutes of Health, Bethesda, Md.; 5$^{th}$ ed.; NIH Publ. No. 91-3242; Kabat (1978) *Adv. Prot. Chem.* 32:1-75; Kabat, et al., (1977) *J. Biol. Chem.* 252:6609-6616. Chothia and coworkers carefully examined conformations of the loops in crystal structures of antibodies and proposed hypervariable loops. Chothia, et al., (1987) *J Mol. Biol.* 196:901-917 or Chothia, et al., (1989) *Nature* 342:878-883. There are variations between regions classified as "CDRs" and "hypervariable loops". Later studies (Raghunathan et al, (2012) *J. Mol Recog.* 25, 3, 103-113) analyzed several antibody-antigen crystal complexes and observed that the antigen binding regions in antibodies do not necessarily conform strictly to the "CDR" residues or "hypervariable" loops. The molecular model for the variable region of the non-human antibody can be used to guide the selection of regions that can potentially bind to the antigen. In practice the potential antigen binding regions based on the model differ from the conventional "CDR"s or "hypervariable" loops. Commercial scientific software such as Discovery Studio (BIOVIA, Dassault Systems)) can be used for molecular modeling. Human frameworks can be selected based on best matches with the non-human sequence both in the frameworks and in the CDRs. For FR4 (framework 4) in VH, VJ regions for the human germlines are compared with the corresponding non-human region. In the case of FR4 (framework 4) in VL, J-kappa and J-Lambda regions of human germline sequences are compared with the corresponding non-human region. Once suitable human frameworks are identified, the CDRs are grafted into the selected human frameworks. In some cases, certain residues in the VL-VH interface can be retained as in the non-human (parental) sequence. Molecular models can also be used for identifying residues that can potentially alter the CDR conformations and hence binding to antigen. In some cases, these residues are retained as in the non-human (parental) sequence. Molecular models can also be used to identify solvent exposed amino acids that can result in unwanted effects such as glycosylation, deamidation and oxidation. Developability filters can be introduced early on in the design stage to eliminate/minimize these potential problems.

Another type of framework modification involves mutating one or more residues within the framework region, or even within one or more CDR regions, to remove T cell epitopes to thereby reduce the potential immunogenicity of the antibody. This approach is also referred to as "deimmunization" and is described in further detail in U.S. Pat. No. 7,125,689.

In particular embodiments, it will be desirable to change certain amino acids containing exposed side-chains to another amino acid residue in order to provide for greater chemical stability of the final antibody, so as to avoid deamidation or isomerization. The deamidation of asparagine may occur on NG, DG, NG, NS, NA, NT, QG or QS sequences and result in the creation of an isoaspartic acid residue that introduces a kink into the polypeptide chain and decreases its stability (isoaspartic acid effect). Isomerization can occur at DG, DS, DA or DT sequences. In certain embodiments, the antibodies of the present disclosure do not contain deamidation or asparagine isomerism sites.

For example, an asparagine (Asn) residue may be changed to Gln or Ala to reduce the potential for formation of isoaspartate at any Asn-Gly sequences, particularly within a CDR. A similar problem may occur at a Asp-Gly sequence. Reissner and Aswad (2003) Cell. Mol. Life Sci. 60:1281. Isoaspartate formation may debilitate or completely abrogate binding of an antibody to its target antigen. See, Presta (2005) J. Allergy Clin. Immunol. 116:731 at 734. In one embodiment, the asparagine is changed to glutamine (Gln). It may also be desirable to alter an amino acid adjacent to an asparagine (Asn) or glutamine (Gln) residue to reduce the likelihood of deamidation, which occurs at greater rates when small amino acids occur adjacent to asparagine or glutamine. See, Bischoff & Kolbe (1994) J. Chromatog. 662:261. In addition, any methionine residues (typically solvent exposed Met) in CDRs may be changed to Lys, Leu, Ala, or Phe or other amino acids in order to reduce the possibility that the methionine sulfur would oxidize, which could reduce antigen-binding affinity and also contribute to molecular heterogeneity in the final antibody preparation. Id. Additionally, in order to prevent or minimize potential scissile Asn-Pro peptide bonds, it may be desirable to alter any Asn-Pro combinations found in a CDR to Gln-Pro, Ala-Pro, or Asn-Ala. Antibodies with such substitutions are subsequently screened to ensure that the substitutions do not decrease the affinity or specificity of the antibody for CD103, or other desired biological activity to unacceptable levels.

TABLE 2

Exemplary stabilizing CDR variants

| CDR Residue | Stabilizing Variant Sequence |
| --- | --- |
| Asn-Gly | Gln-Gly, Ala-Gly, or Asn-Ala |

TABLE 2-continued

Exemplary stabilizing CDR variants

| CDR Residue | Stabilizing Variant Sequence |
| --- | --- |
| (N-G) | (Q-G), (A-G), or (N-A) |
| Asp-Gly | Glu-Gly, Ala-Gly or Asp-Ala |
| (D-G) | (E-G), (A-G), or (D-A) |
| Met | Lys, Leu, Ala, or Phe |
| (M) | (K),(L), (A), or(F) |
| Asn | Gln or Ala |
| (N) | (Q) or (A) |
| Asn-Pro | Gln-Pro, Ala-Pro, or Asn-Ala |
| (N-P) | (Q-P), (A-P), or (N-A) |

Another type of framework modification involves mutating one or more residues within the framework regions to prevent aggregation. The risk of an antibody to aggregate can be assessed using the spatial aggregation propensity— See, Chennamsetty, N et al (2010) J. Phys. Chem. 114, 6614-6624. The method requires the calculation of the Solvent Accessible Area (SAA) for each atom. The molecular aggregation score is then calculated as the sum of all atomic scores. For a given radius and size of molecule, this is an approximate indication of its overall tendency to aggregate. Residues with a high aggregation score are replaced by residues with a lower score (e.g. more hydrophilic amino acids).

Antibody Engineering of the Fc Region

The antibodies (e.g., humanized antibodies) and antigen-binding fragments thereof disclosed herein can also be engineered to include modifications within the Fc region, typically to alter one or more properties of the antibody, such as serum half-life, complement fixation, Fc receptor binding, and/or effector function (e.g., antigen-dependent cellular cytotoxicity). Furthermore, the antibodies and antigen-binding fragments thereof disclosed herein can be chemically modified (e.g., one or more chemical moieties can be attached to the antibody) or be modified to alter its glycosylation, again to alter one or more properties of the antibody or fragment. Each of these embodiments is described in further detail below. The numbering of residues in the Fc region is that of the EU index of Kabat.

The antibodies and antigen-binding fragments thereof disclosed herein also include antibodies and fragments with modified (or blocked) Fc regions to provide altered effector functions. See, e.g., U.S. Pat. No. 5,624,821; WO2003/086310; WO2005/120571; WO2006/0057702. Such modifications can be used to enhance or suppress various reactions of the immune system, with possible beneficial effects in diagnosis and therapy. Alterations of the Fc region include amino acid changes (substitutions, deletions and insertions), glycosylation or deglycosylation, and adding multiple Fc regions. Changes to the Fc can also alter the half-life of antibodies in therapeutic antibodies, enabling less frequent dosing and thus increased convenience and decreased use of material. See Presta (2005) J. Allergy Clin. Immunol. 116: 731 at 734-35.

In one embodiment, the antibody or antigen-binding fragment of the invention is an IgG4 isotype antibody or fragment comprising a Serine to Proline mutation at a position corresponding to position 228 (S228P; EU index; SEQ ID NO: 66) in the hinge region of the heavy chain constant region. This mutation has been reported to abolish the heterogeneity of inter-heavy chain disulfide bridges in the hinge region (Angal et al (1993). *Mol. Immunol.* 30:105-108; position 241 is based on the Kabat numbering system).

In one embodiment of the invention, the hinge region of CH1 is modified such that the number of cysteine residues in the hinge region is increased or decreased. This approach is described further in U.S. Pat. No. 5,677,425. The number of cysteine residues in the hinge region of CH1 is altered, for example, to facilitate assembly of the light and heavy chains or to increase or decrease the stability of the antibody.

In another embodiment, the Fc hinge region of an antibody or antigen-binding fragment of the invention is mutated to decrease the biological half-life of the antibody or fragment. More specifically, one or more amino acid mutations are introduced into the CH2-CH3 domain interface region of the Fc-hinge fragment such that the antibody or fragment has impaired Staphylococcyl protein A (SpA) binding relative to native Fc-hinge domain SpA binding. This approach is described in further detail in U.S. Pat. No. 6,165,745.

In another embodiment, the antibody or antigen-binding fragment of the invention is modified to increase its biological half-life. Various approaches are possible. For example, one or more of the following mutations can be introduced: T252L, T254S, T256F, as described in U.S. Pat. No. 6,277,375. Alternatively, to increase the biological half-life, the antibody can be altered within the CH1 or CL region to contain a salvage receptor binding epitope taken from two loops of a CH2 domain of an Fc region of an IgG, as described in U.S. Pat. Nos. 5,869,046 and 6,121,022.

In yet other embodiments, the Fc region is altered by replacing at least one amino acid residue with a different amino acid residue to alter the effector function(s) of the antibody or antigen-binding fragment. For example, one or more amino acids selected from amino acid residues 234, 235, 236, 237, 297, 318, 320 and 322 can be replaced with a different amino acid residue such that the antibody has an altered affinity for an effector ligand and retains the antigen-binding ability of the parent antibody. The effector ligand to which affinity is altered can be, for example, an Fc receptor or the C1 component of complement. This approach is described in further detail in U.S. Pat. Nos. 5,624,821 and 5,648,260.

In another example, one or more amino acids selected from amino acid residues 329, 331 and 322 can be replaced with a different amino acid residue such that the antibody has altered C1q binding and/or reduced or abolished complement dependent cytotoxicity (CDC). This approach is described in further detail in U.S. Pat. No. 6,194,551.

In another example, one or more amino acid residues within amino acid positions 231 and 239 are altered to thereby alter the ability of the antibody to fix complement. This approach is described further in PCT Publication WO 94/29351.

The proteins of the invention, which are preferably antibodies and most preferably IgG antibodies or fragments thereof, may have altered (e.g., relative to an unmodified antibody) FcγR binding properties (examples of binding properties include but are not limited to, binding specificity, equilibrium dissociation constant ($K_D$), dissociation and association rates ($k_{off}$ and $k_{on}$ respectively), binding affinity and/or avidity) and that certain alterations are more or less desirable. It is known in the art that the equilibrium dissociation constant ($K_D$) is defined as $k_{off}/k_{on}$, and $K_a$ is the reciprocal of $K_D$.

The affinities and binding properties of an Fc region for its ligand, may be determined by a variety of in vitro assay methods (biochemical or immunological based assays) known in the art for determining Fc-FcγR interactions, i.e., specific binding of an Fc region to an FcγR including but not limited to, equilibrium methods (e.g., enzyme-linked immuno absorbent assay (ELISA) or radioimmunoassay (RIA)), or kinetics (e.g. BIACORE®, Octet®, or KinExa® analysis), and other methods such as indirect binding assays, competitive inhibition assays, fluorescence resonance energy transfer (FRET), gel electrophoresis and chromatography (e.g., gel filtration). These and other methods may utilize a label on one or more of the components being examined and/or employ a variety of detection methods including but not limited to chromogenic, fluorescent, luminescent, or isotopic labels.

In certain embodiments, the proteins of the present invention bind to one or more human FcγRs. In certain embodiments, the proteins of the present invention bind to one or more human FcγRs selected from the group consisting of FcγRI, FcγRIIB, FcγRIIC, FcγRIIIA-F158, and FcγRIIIA-V158 with an affinity at least 10-fold, preferably at least 30-fold, and more preferably at least 100-fold, less than equivalent protein having a wild-type human IgG1 heavy chain constant domain (SEQ ID NO: 119) Fc region. In certain embodiments, the proteins of the present invention bind human FcγRI with an affinity at least 10-fold, preferably at least 30-fold, and more preferably at least 100-fold, less than equivalent protein having a wild-type human IgG1 heavy chain constant domain (SEQ ID NO: 119) Fc region. In certain embodiments, the proteins of the present invention bind human FcγRIIB with an affinity at least 10-fold, preferably at least 30-fold, and more preferably at least 100-fold, less than equivalent protein having a wild-type human IgG1 heavy chain constant domain (SEQ ID NO: 119) Fc region. In certain embodiments, the proteins of the present invention bind human FcγRIIC with an affinity at least 10-fold, preferably at least 30-fold, and more preferably at least 100-fold, less than equivalent protein having a wild-type human IgG1 heavy chain constant domain (SEQ ID NO: 119) Fc region. In certain embodiments, the proteins of the present invention bind human FcγRIIIA-F158 with an affinity at least 10-fold, preferably at least 30-fold, and more preferably at least 100-fold, less than equivalent protein having a wild-type human IgG1 heavy chain constant domain (SEQ ID NO: 119) Fc region. In certain embodiments, the proteins of the present invention bind human FcγRIIIA-V158 with an affinity at least 10-fold, preferably at least 30-fold, and more preferably at least 100-fold, less than equivalent protein having a wild-type human IgG1 heavy chain constant domain (SEQ ID NO: 119). Fc region. In certain embodiments, the proteins of the present invention bind to one or more human FcγRs selected from the group consisting of FcγRI, FcγRIIB, FcγRIIC, FcγRIIIA-F158, and FcγRIIIA-V158 with an affinity at least 10-fold, preferably at least 30-fold, and more preferably at least 100-fold, less than equivalent protein having a wild-type human IgG4 heavy chain constant domain (SEQ ID NO: 66) Fc region. In certain embodiments, the proteins of the present invention bind human FcγRI with an affinity at least 10-fold, preferably at least 30-fold, and more preferably at least 100-fold, less than equivalent protein having a wild-type human IgG4 heavy chain constant domain (SEQ ID NO: 66) Fc region. Fc region. In certain embodiments, the proteins of the present invention bind human FcγRIIB with an affinity at least 10-fold, preferably at least 30-fold, and more preferably at least 100-fold, less than equivalent protein having a wild-type human IgG4 heavy chain constant domain (SEQ ID NO: 66) Fc region. In certain embodiments, the proteins of the present invention bind human FcγRIIC with an affinity at least 10-fold, preferably at least 30-fold, and more preferably at least 100-fold, less than equivalent protein having a wild-type human IgG4 heavy chain constant domain (SEQ ID NO: 66) Fc region. In certain embodiments, the proteins of the present invention bind human FcγRIIIA-F158 with an affinity at least 10-fold, preferably at least 30-fold, and more preferably at least 100-fold, less than equivalent protein having a wild-type human IgG4 heavy chain constant domain (SEQ ID NO: 66) Fc region. In certain embodiments, the proteins of the present invention bind human FcγRIIIA-V158 with an affinity at least 10-fold, preferably at least 30-fold, and more preferably at least 100-fold, less than equivalent protein having a wild-type human IgG4 heavy chain constant domain (SEQ ID NO: 66) Fc region.

In various embodiments, the proteins of the invention comprise an immunoglobulin Fc region comprising an immunoglobulin C2 region and an immunoglobulin C3 region and an immunoglobulin hinge region. By way of example, the immunoglobulin Fc region may be an IgG Fc region, an IgE Fc region, or an IgA Fc region. In certain preferred embodiments, the protein comprises two immunoglobulin Fc regions, each immunoglobulin Fc region comprising an immunoglobulin C2 region and an immunoglobulin C3 region and an immunoglobulin hinge region, wherein the hinge region of one of the immunoglobulin Fc regions is bound to the hinge region of the other immunoglobulin Fc region to form a dimeric Fc structure. Most preferably, such a protein is a human or humanized IgG protein.

In certain embodiments, the proteins of the invention comprise a mutated IgG4 Fc region, and preferably the protein is an IgG comprising two mutated IgG4 Fc regions to form a dimeric Fc structure. By way of example, a mutated IgG4 Fc region may comprise one of the mutations, or mutational combinations, recited in Table 3. The numbering system of the constant region referred to in this table is that of the EU index as set forth in Kabat et al. (1991, NIH Publication 91-3242, National Technical Information Service, Springfield, VA). In the table, the first letter and number represent the unmodified amino acid and its position and the second letter represents the substituted amino acid at said position. For those entries that include combinations of more than one mutation, each mutation in the combination is separated by a "/". Deletions are indicated by "Δ"

TABLE 3

| | | |
|---|---|---|
| N297Q | L235E | N297Q/L235E |
| F234A | Q268A | F234A/L235A/G23A/P238A |
| F234A/L235A/ΔG236/G237A/P238A | F234A/L235A/G237A/P238A/Q268A | F234A/L235A/ΔG236/G237A/P238A/Q268A |
| F234A/L235A | L235E/P329G | L235A/G237A/E318A |
| F234A/L235A/G237A/P238S | F234A/L235A/ΔG236/G237A/P238S | F234A/L235A/G237A/P238S/Q268A |
| F234A/L235A/ΔG236/G237A/P238S/Q268A | | |

In certain embodiments, the proteins of the invention comprise a mutated IgG1 Fc region, and preferably the protein is an IgG comprising two mutated IgG1 Fc regions to form a dimeric Fc structure. By way of example, a mutated IgG1 Fc region may comprise one of the mutations recited in Table 4. The numbering system of the constant region referred to in this table is that of the EU index as set forth in Kabat et al. (1991, NIH Publication 91-3242, National Technical Information Service, Springfield, VA). In the table, the first letter and number represent the unmodified amino acid and its position and the second letter represents the substituted amino acid at said position.

TABLE 4

| | | |
|---|---|---|
| K222Y | P232K | A231K |
| E233N | E233Q | E233R |
| E233S | E233T | E233H |
| E233A | E233V | E233L |
| E233F | E233M | E233Y |
| E233W | E233G | L234D |
| L234E | L234N | L234Q |
| L234T | L234H | L234F |
| L234K | L234R | L234S |
| L234A | L234M | L234V |
| L235E | L235T | L235F |
| L235K | L235R | L235A |
| L235M | L235W | L235N |
| L235Q | L235H | L235V |
| G236A | G236N | G236R |
| G236H | G236L | G236F |
| G236P | G237A | G237E |
| G237N | G237Q | G237K |
| G237R | G237S | G237T |
| G237H | G237L | G237I |
| G237F | G237M | G237Y |
| G237P | P238K | P238N |
| P238R | P238S | P238T |
| P238Y | P238G | P238A |
| S239A | S239N | S239F |
| S239K | S239R | S239V |
| S239W | S239P | S239H |
| S239Y | D249H | V240A |
| F241W | F241L | F243W |
| F243L | F243E | P244H |
| P245A | P247V | P247G |
| V253I | V263I | V263T |
| V263M | V264D | V264E |
| V264K | V264F | V264M |
| V264H | V264W | V264G |
| V264Q | V264A | V264L |
| D265A | D265E | D265Q |
| D265S | D265H | D265V |
| D265L | D265F | D265M |
| D265Y | D265N | D265G |
| V266T | V266M | V266A |
| S267G | S267H | S267N |
| S267P | S267R | S267T |
| S267F | S267W | E269A |
| E269K | E269S | E269V |
| E269F | E269I | E269M |
| E269W | E269H | E269T |
| E269L | E269N | E269Y |
| E269R | E269P | E269Q |
| D270A | D270N | D270E |
| D270Q | D270T | D270H |
| D270R | D270S | D270L |
| D270I | D270F | D270W |
| D270P | D270G | P271H |
| P271Q | P271K | P271R |
| P271S | P271V | P271F |
| P271W | D280L | D280W |
| D280P | E293F | E294A |
| E293Y | E294K | E294R |
| E294S | E294V | E294L |
| E294F | Q295A | Q295W |
| Q295P | Q295G | Y296E |
| Y296Q | Y296D | Y296N |
| Y296S | Y296T | Y296L |
| Y296I | Y296A | Y296V |
| Y296M | N297S | N297D |
| N297Q | N297A | S298T |
| S298N | S298K | S298R |
| T299A | T299H | T299D |
| T299E | T299N | T299Q |
| T299K | T299R | T299I |
| T299F | T299M | T299Y |
| T299W | T299S | T299V |
| T299P | T299G | Y300E |
| Y300K | Y300R | Y300S |
| Y300P | Y300W | V303A |

TABLE 4-continued

| | | |
|---|---|---|
| V303D | W313F | E318A |
| E318V | E318Q | E318H |
| E318L | E318Y | K320A |
| K322A | K322E | N325A |
| N325V | N325H | N325K |
| N325Y | N325W | N325P |
| N325G | N325Q | N325D |
| N325E | N325L | N325I |
| A327Q | A327E | A327N |
| A327L | A327I | A327F |
| A327W | L328N | L328F |
| L328H | L328R | L328T |
| L328V | L328I | L328P |
| L328M | L328E | L328A |
| P329A | P329F | P329D |
| P329N | P329Q | P329K |
| P329S | P329T | P329H |
| P329V | P329L | P329M |
| P329Y | P329W | P329G |
| P329R | A330L | A330R |
| A330P | A330T | A330V |
| A330F | A330H | P331A |
| P331S | P331N | P331E |
| I332K | I332N | I332Q |
| I332T | I332H | I332Y |
| I332A | I332R | E333N |
| E333R | I336E | I336Y |
| S337H | | |

In certain embodiments, a mutated IgG1 Fc region may comprise one of the mutational combinations recited in Table 5. The numbering system of the constant region referred to in this table is that of the EU index as set forth in Kabat et al. (1991, NIH Publication 91-3242, National Technical Information Service, Springfield, VA). In the table, the first letter and number represent the unmodified amino acid and its position and the second letter represents the substituted amino acid at said position. For each of the combinations of more than one mutation, each mutation in the combination is separated by a "/" and deletions are indicated by a "Δ".

TABLE 5

| | | |
|---|---|---|
| C220S/C226S/C229S/P238S | C226S/C229S/E233P/L234V/L235A | E233P/L234V/L235A |
| E233P/L234V/L235A/ΔG236 | E233P/L234V/L235A/ΔG236/A327G/A330S/P331S | L234A/L235A |
| L235A/G237A | L235A/G237A/E318S/K320S/K322S | L235A/G237A/P331A |
| L234F/L235E | L234F/L235E/D265A | L234F/L235E/D265A/N297Q/P331S |
| L234F/L235E/N297Q | L234F/L235E/P329G | L234F/L235A/K322Q/M252Y/S254T/T256E |
| L234F/L235Q/K322Q/M252Y/S254T/T256E | L234F/L235Q/P331G/M252Y/S254T/T256E | G236R/L328R |
| S239D/D265I/N297D/I332E | S239D/D265L/N297D/I332E | S239D/D265F/N297D/I332E |
| S239D/D265Y/N297D/I332E | S239D/D265T/N297D/I332E | S239D/N297D/A330Y/I332E |
| S239D/F241S/F243H/V262T/V264T/N297D/K326E/I332E | V264E/N297D/I332E | D265A/P331S |
| D265A/N297Q | N297D/D265Y/T299L/I332E | N297D/D265Y/I332E |
| N297D/I332E/Y296D | N297D/I332E | N297D/I332E/Y296E |
| N297D/I332E/Y296N | N297D/I332E/Y296Q | N297D/I332E/Y296H |
| N297D/I332E/Y296T | N297D/I332E/T299V | N297D/I332E/T299I |
| N297D/I332E/T299L | N297D/I332E/T299F | N297D/I332E/T299H |
| N297D/I332E/T299E | N297D/I332E/A330Y | N297D/I332E/S298A/A330Y |
| N297E/D265F/I332E | N297E/I332E | F241E/F243R/V262E/V264R |
| F241E/F243Q/V262T/V264E | F241L/F243L/V262I/V264I | F241W/F243W |
| F241W/F243W/V262A/V264A | F241L/V262I | F243L/V262I/V264W |
| F241Y/F243Y/V262T/V264T | F241E/F243R/V262E/V264R | F241E/F243Q/V262T/V264E |
| F241R/F243Q/V262T/V264R | F241E/F243Y/V262T/V264R | P244H/P245A/P247V |
| F241E/F243R/V262E/V264R/I332E | F241E/F243Y/V262T/V264R | F241E/F243Y/V262T/V264R/I332E |
| S239E/D265G | S239E/D265N | S239E/D265Q |
| M252Y/S254T/T256E | S267Q/A327S | S267L/A327S |
| N297S/I332E | S239N/I332N | S239N/I332Q |
| S239Q/I332N | S239Q/I332Q | S298N/Y300S |
| S298N/T299A/Y300S | N297Q/S298N/Y300S | E318S/K320S/K322S |
| E318S/K320S/K322S/P311A | L328E/I332E | L328N/I332E |
| L234A/L235A/G237A/P238A/H268A/A330S/P331S | L234A/L235A/G237A/P238A/H268A/A330S/P331S | L234A/L235A/G237A/P238A/H268A/A330S/P331S |
| L328Q/I332E | L328H/I332E | |

In certain embodiments, the proteins of the invention comprise a wild type or mutated IgG2 Fc region, and preferably the protein is an IgG comprising two wild type or mutated IgG2 Fc regions to form a dimeric Fc structure. A mutated IgG2 Fc region may comprise one of the mutations, or mutational combinations, recited in Table 6. The numbering system of the constant region referred to in this table is that of the EU index as set forth in Kabat et al. (1991, NIH Publication 91-3242, National Technical Information Service, Springfield, VA). In the table, the first letter and number represent the unmodified amino acid and its position and the second letter represents the substituted amino acid at said position. For those entries that include combinations of more than one mutation, each mutation in the combination is separated by a "/".

TABLE 6

| | | |
|---|---|---|
| V234A | G237A | A235E/G237A |
| V234A/A235E/G237A | V234A/G237A | V234A/G237A/P238S |
| H268Q/V309L/A330S/P331S | V234A/G237A/H268A/V309L/A330S/P331S | V234A/G237A/H268QA/V309L/A330S/P331S |
| V234A/G237A/P238S/H268A/V309L/A330S/P331S | P233S/V234A/G237A/P238S | P233S/V234A/G237A/H268A/V309L/A330S/P331S |
| P233S/V234A/G237A/H268Q/V309L/A330S/P331S | P233S/V234A/G237A/P238S/H268A/V309L/A330S/P331S | |

Production of Antibodies with Modified Glycosylation

In still another embodiment, the antibodies or antigen-binding fragments of the invention comprise a particular glycosylation pattern. For example, an afucosylated or an aglycosylated antibody or fragment can be made (i.e., the antibody lacks fucose or glycosylation, respectively). The glycosylation pattern of an antibody or fragment may be altered to, for example, increase the affinity or avidity of the antibody or fragment for a CD103 antigen. Such modifications can be accomplished by, for example, altering one or more of the glycosylation sites within the antibody or fragment sequence. For example, one or more amino acid substitutions can be made that result in removal of one or more of the variable region framework glycosylation sites to thereby eliminate glycosylation at that site. Such deglycosylation may increase the affinity or avidity of the antibody or fragment for antigen. See, e.g., U.S. Pat. Nos. 5,714,350 and 6,350,861.

Antibodies and antigen-binding fragments disclosed herein may further include those produced in lower eukaryote host cells, in particular fungal host cells such as yeast and filamentous fungi have been genetically engineered to produce glycoproteins that have mammalian- or human-like glycosylation patterns (See for example, Choi et al, (2003) *Proc. Natl. Acad. Sci.* 100: 5022-5027; Hamilton et al., (2003) *Science* 301: 1244-1246; Hamilton et al., (2006) *Science* 313: 1441-1443; Nett et al., *Yeast* 28(3):237-52 (2011); Hamilton et al., *Curr Opin Biotechnol.* 18(5): 387-92 (2007)). A particular advantage of these genetically modified host cells over currently used mammalian cell lines is the ability to control the glycosylation profile of glycoproteins that are produced in the cells such that compositions of glycoproteins can be produced wherein a particular N-glycan structure predominates (see, e.g., U.S. Pat. Nos. 7,029,872 and 7,449,308). These genetically modified host cells have been used to produce antibodies that have predominantly particular N-glycan structures (See for example, Li et al., (2006) *Nat. Biotechnol.* 24: 210-215).

In particular embodiments, the antibodies and antigen-binding fragments thereof disclosed herein further include those produced in lower eukaryotic host cells and which comprise fucosylated and non-fucosylated hybrid and complex N-glycans, including bisected and multiantennary species, including but not limited to N-glycans such as $GlcNAc_{(1-4)}Man_3GlcNAc_2$; $Gal_{(1-4)}GlcNAc_{(1-4)}Man_3GlcNAc_2$; $NANA_{(1-4)}Gal_{(1-4)}GlcNAc_{(1-4)}Man_3GlcNAc_2$.

In particular embodiments, the antibodies and antigen-binding fragments thereof provided herein may comprise antibodies or fragments having at least one hybrid N-glycan selected from the group consisting of $GlcNAcMan_5GlcNAc_2$; $GalGlcNAcMan_5GlcNAc_2$; and $NANAGalGlcNAcMan_5GlcNAc_2$. In particular aspects, the hybrid N-glycan is the predominant N-glycan species in the composition.

In particular embodiments, the antibodies and antigen-binding fragments thereof provided herein comprise antibodies and fragments having at least one complex N-glycan selected from the group consisting of $GlcNAcMan_3GlcNAc_2$; $GalGlcNAcMan_3GlcNAc_2$; $NANAGalGlcNAcMan_3GlcNAc_2$; $GlcNAc_2Man_3GlcNAc_2$; $GalGlcNAc_2Man_3GlcNAc_2$; $Gal_2GlcNAc_2Man_3GlcNAc_2$; $NANAGal_2GlcNAc_2Man_3GlcNAc_2$; and $NANA_2Gal_2GlcNAc_2Man_3GlcNAc_2$. In particular aspects, the complex N-glycan are the predominant N-glycan species in the composition. In further aspects, the complex N-glycan is a particular N-glycan species that comprises about 30%, 40%, 50%, 60%, 70%, 80%, 90%, 95%, 97%, 98%, 99%, or 100% of the complex N-glycans in the composition. In one embodiment, the antibody and antigen binding fragments thereof provided herein comprise complex N-glycans, wherein at least 50%, 60%, 70%, 80%, 90%, 95%, 97%, 98%, 99%, or 100% of the complex N-glycans comprise the structure $NANA_2Gal_2GlcNAc_2Man_3GlcNAc_2$, wherein such structure is afucosylated. Such structures can be produced, e.g., in engineered *Pichia pastoris* host cells.

In particular embodiments, the N-glycan is fucosylated. In general, the fucose is in an α1,3-linkage with the GlcNAc at the reducing end of the N-glycan, an α1,6-linkage with the GlcNAc at the reducing end of the N-glycan, an α1,2-linkage with the Gal at the non-reducing end of the N-glycan, an α1,3-linkage with the GlcNac at the non-reducing end of the N-glycan, or an α1,4-linkage with a GlcNAc at the non-reducing end of the N-glycan.

Therefore, in particular aspects of the above the glycoprotein compositions, the glycoform is in an α1,3-linkage or α1,6-linkage fucose to produce a glycoform selected from the group consisting of $Man_5GlcNAc_2(Fuc)$, $GlcNAcMan_5GlcNAc_2(Fuc)$, $Man_3GlcNAc_2(Fuc)$, $GlcNAcMan_3GlcNAc_2(Fuc)$, $GlcNAc_2Man_3GlcNAc_2(Fuc)$, $GalGlcNAc_2Man_3GlcNAc_2(Fuc)$, $Gal_2GlcNAc_2Man_3GlcNAc_2(Fuc)$, $NANAGal_2GlcNAc_2Man_3GlcNAc_2(Fuc)$, and $NANA_2Gal_2GlcNAc_2Man_3GlcNAc_2(Fuc)$; in an α1,3-linkage or α1,4-linkage fucose to produce a glycoform selected from the group consisting of $GlcNAc(Fuc)Man_5GlcNAc_2$, $GlcNAc(Fuc)Man_3GlcNAc_2$, $GlcNAc_2(Fuc_{1-2})Man_3GlcNAc_2$, $GalGlcNAc_2(Fuc_{1-2})Man_3GlcNAc_2$, $Gal_2GlcNAc_2(Fuc_{1-2})Man_3GlcNAc_2$, $NANAGal_2GlcNAc_2(Fuc_{1-2})Man_3GlcNAc_2$, and $NANA_2Gal_2GlcNAc_2(Fuc_{1-2})Man_3GlcNAc_2$; or in an α1,2-linkage fucose to produce a glycoform selected from the group consisting of $Gal(Fuc)GlcNAc_2Man_3GlcNAc_2$, $Gal_2(Fuc_{1-2})GlcNAc_2Man_3GlcNAc_2$, $NANAGal_2(Fuc_{1-2})GlcNAc_2Man_3GlcNAc_2$, and $NANA_2Gal_2(Fuc_{1-2})GlcNAc_2Man_3GlcNAc_2$.

In further aspects, the antibodies (e.g., humanized antibodies) or antigen-binding fragments thereof comprise high mannose N-glycans, including but not limited to, $Man_8GlcNAc_2$, $Man_7GlcNAc_2$, $Man_6GlcNAc_2$, Man₅GlcNAc₂, Man₄GlcNAc₂, or N-glycans that consist of the Man₃GlcNAc₂ N-glycan structure.

In further aspects of the above, the complex N-glycans further include fucosylated and non-fucosylated bisected and multiantennary species.

As used herein, the terms "N-glycan" and "glycoform" are used interchangeably and refer to an N-linked oligosaccharide, for example, one that is attached by an asparagine-N-acetylglucosamine linkage to an asparagine residue of a polypeptide. N-linked glycoproteins contain an N-acetylglucosamine residue linked to the amide nitrogen of an asparagine residue in the protein. The predominant sugars found on glycoproteins are glucose, galactose, mannose, fucose, N-acetylgalactosamine (GalNAc), N-acetylglucosamine (GlcNAc) and sialic acid (e.g., N-acetyl-neuraminic acid (NANA)). The processing of the sugar groups occurs co-translationally in the lumen of the ER and continues post-translationally in the Golgi apparatus for N-linked glycoproteins.

N-glycans have a common pentasaccharide core of Man₃GlcNAc₂ ("Man" refers to mannose; "Glc" refers to glucose; and "NAc" refers to N-acetyl; GlcNAc refers to N-acetylglucosamine). Usually, N-glycan structures are presented with the non-reducing end to the left and the reducing end to the right. The reducing end of the N-glycan is the end that is attached to the Asn residue comprising the glycosylation site on the protein. N-glycans differ with respect to the number of branches (antennae) comprising peripheral sugars (e.g., GlcNAc, galactose, fucose and sialic acid) that are added to the Man₃GlcNAc₂ ("Man₃") core structure which is also referred to as the "trimannose core", the "pentasaccharide core" or the "paucimannose core". N-glycans are classified according to their branched constituents (e.g., high mannose, complex or hybrid). A "high mannose" type N-glycan has five or more mannose residues. A "complex" type N-glycan typically has at least one GlcNAc attached to the 1,3 mannose arm and at least one GlcNAc attached to the 1,6 mannose arm of a "trimannose" core. Complex N-glycans may also have galactose ("Gal") or N-acetylgalactosamine ("GalNAc") residues that are optionally modified with sialic acid or derivatives (e.g., "NANA" or "NeuAc", where "Neu" refers to neuraminic acid and "Ac" refers to acetyl). Complex N-glycans may also have intrachain substitutions comprising "bisecting" GlcNAc and core fucose ("Fuc"). Complex N-glycans may also have multiple antennae on the "trimannose core," often referred to as "multiple antennary glycans." A "hybrid" N-glycan has at least one GlcNAc on the terminal of the 1,3 mannose arm of the trimannose core and zero or more mannoses on the 1,6 mannose arm of the trimannose core. The various N-glycans are also referred to as "glycoforms."

With respect to complex N-glycans, the terms "G-2", "G-1", "G0", "G1", "G2", "A1", and "A2" mean the following. "G-2" refers to an N-glycan structure that can be characterized as Man₃GlcNAc₂; the term "G-1" refers to an N-glycan structure that can be characterized as GlcNAcMan₃GlcNAc₂; the term "G0" refers to an N-glycan structure that can be characterized as GlcNAc₂Man₃GlcNAc₂; the term "G1" refers to an N-glycan structure that can be characterized as GalGlcNAc₂Man₃GlcNAc₂; the term "G2" refers to an N-glycan structure that can be characterized as Gal₂GlcNAc₂Man₃GlcNAc₂; the term "A1" refers to an N-glycan structure that can be characterized as NANAGal₂GlcNAc₂Man₃GlcNAc₂; and, the term "A2" refers to an N-glycan structure that can be characterized as NANA₂Gal₂GlcNAc₂Man₃GlcNAc₂. Unless otherwise indicated, the terms G-2", "G-1", "G0", "G1", "G2", "A1", and "A2" refer to N-glycan species that lack fucose attached to the GlcNAc residue at the reducing end of the N-glycan. When the term includes an "F", the "F" indicates that the N-glycan species contains a fucose residue on the GlcNAc residue at the reducing end of the N-glycan. For example, G0F, G1F, G2F, A1F, and A2F all indicate that the N-glycan further includes a fucose residue attached to the GlcNAc residue at the reducing end of the N-glycan. Lower eukaryotes such as yeast and filamentous fungi do not normally produce N-glycans that produce fucose.

With respect to multiantennary N-glycans, the term "multiantennary N-glycan" refers to N-glycans that further comprise a GlcNAc residue on the mannose residue comprising the non-reducing end of the 1,6 arm or the 1,3 arm of the N-glycan or a GlcNAc residue on each of the mannose residues comprising the non-reducing end of the 1,6 arm and the 1,3 arm of the N-glycan. Thus, multiantennary N-glycans can be characterized by the formulas GlcNAc₍₂₋₄₎Man₃GlcNAc₂, Gal₍₁₋₄₎GlcNAc₍₂₋₄₎Man₃GlcNAc₂, or NANA₍₁₋₄₎Gal₍₁₋₄₎GlcNAc₍₂₋₄₎Man₃GlcNAc₂. The term "1-4" refers to 1, 2, 3, or 4 residues.

With respect to bisected N-glycans, the term "bisected N-glycan" refers to N-glycans in which a GlcNAc residue is linked to the mannose residue at the reducing end of the N-glycan. A bisected N-glycan can be characterized by the formula GlcNAc₃Man₃GlcNAc₂ wherein each mannose residue is linked at its non-reducing end to a GlcNAc residue. In contrast, when a multiantennary N-glycan is characterized as GlcNAc₃Man₃GlcNAc₂, the formula indicates that two GlcNAc residues are linked to the mannose residue at the non-reducing end of one of the two arms of the N-glycans and one GlcNAc residue is linked to the mannose residue at the non-reducing end of the other arm of the N-glycan.

In certain embodiments, the proteins of the invention comprise an aglycosylated Fc region. By way of example, an IgG1 Fc region may be aglycosylayed by deleting or substituting residue N297.

Antibody Physical Properties

The antibodies and antigen-binding fragments thereof disclosed herein may further contain one or more glycosylation sites in either the light or heavy chain immunoglobulin variable region. Such glycosylation sites may result in increased immunogenicity of the antibody or fragment or an alteration of the pK of the antibody due to altered antigen-binding (Marshall et al. (1972) *Annu Rev Biochem* 41:673-702; Gala and Morrison (2004) *J Immunol* 172:5489-94; Wallick et al (1988) *J Exp Med* 168:1099-109; Spiro (2002) *Glycobiology* 12:43R-56R; Parekh et al (1985) *Nature* 316: 452-7; Mimura et al. (2000) *Mol Immunol* 37:697-706). Glycosylation has been known to occur at motifs containing an N-X-S/T sequence.

Each antibody or antigen-binding fragment will have a unique isoelectric point (pI), which generally falls in the pH range between 6 and 9.5. The pI for an IgG1 antibody typically falls within the pH range of 7-9.5 and the pI for an IgG4 antibody typically falls within the pH range of 6-8.

Each antibody or antigen-binding fragment will have a characteristic melting temperature, with a higher melting temperature indicating greater overall stability in vivo (Krishnamurthy R and Manning MC (2002) *Curr Pharm Biotechnol* 3:361-71). In general, the $T_{M1}$ (the temperature of initial unfolding) may be greater than 60° C., greater than 65° C., or greater than 70° C. The melting point of an antibody or fragment can be measured using differential scanning calorimetry (Chen et al (2003) *Pharm Res* 20:1952-60; Ghirlando et al (1999) *Immunol Lett* 68:47-52) or circular dichroism (Murray et al. (2002) *J. Chromatogr Sci* 40:343-9).

In a further embodiment, antibodies and antigen-binding fragments thereof are selected that do not degrade rapidly. Degradation of an antibody or fragment can be measured using capillary electrophoresis (CE) and MALDI-MS (Alexander A J and Hughes D E (1995) *Anal Chem* 67:3626-32).

In a further embodiment, antibodies and antigen-binding fragments thereof are selected that have minimal aggregation effects, which can lead to the triggering of an unwanted immune response and/or altered or unfavorable pharmacokinetic properties. Generally, antibodies and fragments are acceptable with aggregation of 25% or less, 20% or less, 15% or less, 10% or less, or 5% or less. Aggregation can be measured by several techniques, including size-exclusion column (SEC), high performance liquid chromatography (HPLC), and light scattering.

Antibody Conjugates

The anti-CD103 antibodies disclosed herein may also be conjugated to a chemical moiety. The anti-CD103 antigen-binding fragments disclosed herein may also be conjugated to a chemical moiety. The chemical moiety may be, inter alia, a polymer. The chemical moiety may be, inter alia, a radionucleotide. The chemical moiety may be, inter alia, a cytotoxic factor. In particular embodiments, the chemical moiety is a polymer which increases the half-life of the antibody or fragment in the body of a subject. Suitable polymers include, but are not limited to, hydrophilic polymers. Such hydrophilic polymers may include but are not limited to polyethylene glycol (PEG) (e.g., PEG with a molecular weight of 2 kDa, 5 kDa, 10 kDa, 12 kDa, 20 kDa, 30 kDa or 40 kDa). Such hydrophilic polymers may include but are not limited to dextran. Such hydrophilic polymers may include but are not limited to monomethoxypolyethylene glycol (mPEG). Lee, et al., (1999) (*Bioconj. Chem.* 10:973-981) discloses PEG conjugated single-chain antibodies. Wen, et al., (2001) (*Bioconj. Chem.* 12:545-553) disclose conjugating antibodies with PEG which is attached to a radiometal chelator (diethylenetriaminpentaacetic acid (DTPA)).

The antibodies and antigen-binding fragments thereof disclosed herein may also be conjugated with labels such as $^{99}$Tc, $^{99m}$Tc, $^{86}$Y, $^{88}$Y, $^{90}$Y, $^{111}$In, $^{32}$P, $^{14}$C, $^{123}$I, $^{124}$I, $^{125}$I, $^{3}$H, $^{131}$I, $^{11}$C, $^{15}$O, $^{13}$N, $^{18}$F, $^{19}$F, $^{35}$S, $^{51}$Cr, $^{57}$To, $^{226}$Ra, $^{60}$Co, $^{59}$Fe, $^{57}$Se, $^{152}$Eu, $^{61}$Cu, $^{62}$Cu, $^{64}$Cu, $^{67}$Cu, $^{66}$Ga, $^{67}$Ga, $^{68}$Ga, $^{72}$Ga, $^{45}$Ti, $^{89}$Zr, $^{217}$Ci, $^{211}$At, $^{212}$Pb, $^{17}$Lu, $^{44}$Sc, $^{47}$Sc, $^{109}$Pd, $^{234}$Th, and $^{40}$K, $^{157}$Gd, $^{55}$Mn, $^{52}$Tr, and $^{56}$Fe.

The antibodies disclosed herein may also be PEGylated, for example to increase its biological (e.g., serum) half-life. The antigen-binding fragments disclosed herein may also be PEGylated. To PEGylate an antibody or fragment, the antibody or fragment, typically is reacted with a reactive form of polyethylene glycol (PEG), such as a reactive ester or aldehyde derivative of PEG, under conditions in which one or more PEG groups become attached to the antibody or antibody fragment. In particular embodiments, the PEGylation is carried out via an acylation reaction or an alkylation reaction with a reactive PEG molecule (or an analogous reactive water-soluble polymer). As used herein, the term "polyethylene glycol" is intended to encompass any of the forms of PEG that have been used to derivatize other proteins, such as mono (C1-C10) alkoxy- or aryloxy-polyethylene glycol or polyethylene glycol-maleimide. In certain embodiments, the antibody or fragment to be PEGylated is an aglycosylated antibody or fragment. Methods for PEGylating proteins are known in the art and can be applied to the antibodies of the invention. See, e.g., EP 0 154 316 and EP 0 401 384.

The antibodies disclosed herein may also be conjugated with fluorescent labels. The antibodies disclosed herein may also be conjugated with chemiluminescent labels. The antigen-binding fragments disclosed herein may also be conjugated with fluorescent labels. The antigen-binding fragments disclosed herein may also be conjugated with chemiluminescent labels. This includes fluorophores such as rare earth chelates, fluorescein and its derivatives, rhodamine and its derivatives, isothiocyanate, phycoerythrin, phycocyanin, allophycocyanin, o-phthalaldehyde, fluorescamine, $^{152}$Eu, dansyl, umbelliferone, luciferin, luminal label, isoluminal label, an aromatic acridinium ester label, an imidazole label, an acridimium salt label, an oxalate ester label, an aequorin label, 2,3-dihydrophthalazinediones, biotin/avidin, spin labels and stable free radicals.

The antibodies of the invention may also be conjugated to a cytotoxic agent. The antigen-binding fragments of the antibodies of the invention may also be conjugated to a cytotoxic agent. The antibodies and antigen-binding fragments thereof of the invention may also be conjugated to a cytotoxic agent such as auristatin F, paclitaxel, docetaxel, vincristine, CC-1065, SN-38, topotecan, morpholino doxorubicin, lysoxin, cyanomorpholino doxorubicin, Dolastatin-10, echinomycin, combretatstatin, chalicheamicin, maytansine, DM-1, netropsin, diptheria toxin, *Pseudomonas aeruginosa* exotoxin A chain, ricin A chain, abrin A chain, modeccin A chain, alpha-sarcin, *Aleurites fordii* proteins and compounds (e.g., fatty acids), dianthin proteins, *Phytoiacca americana* proteins PAPI, PAPII, and PAP-S, *Momordica charantia* inhibitor, curcin, crotin, *Saponaria officinalis* inhibitor, mitogellin, restrictocin, phenomycin, and enomycin. This list is not meant to be limiting. The antibodies of the invention may be conjugated to auristatin F. The antibodies of the invention may be conjugated to paclitaxel. The antibodies of the invention may be conjugated to docetaxel. The antibodies of the invention may be conjugated to vincristine. The antibodies of the invention may be conjugated to CC-1065. The antibodies of the invention may be conjugated to SN-38. The antibodies of the invention may be conjugated to topotecan. The antibodies of the invention may be conjugated to morpholino doxorubicin. The antibodies of the invention may be conjugated to lysoxin. The antibodies of the invention may be conjugated to cyanomorpholino doxorubicin. The antibodies of the invention may be conjugated to Dolastatin-10. The antibodies of the invention may be conjugated to echinomycin. The antibodies of the invention may be conjugated to combretatstatin. The antibodies of the invention may be conjugated to chalicheamicin. The antibodies of the invention may be conjugated to maytansine. The antibodies of the invention may be conjugated to DM-1. The antibodies of the invention may be conjugated to netropsin. The antibodies of the invention may be conjugated to diptheria toxin. The antibodies of the invention may be conjugated to *Pseudomonas aeruginosa* exotoxin A chain. The antibodies of the invention may be conjugated to ricin A chain. The antibodies of the invention may be conjugated to abrin A chain. The antibodies of the invention may be conjugated to modeccin A chain. The antibodies of the invention may be conjugated to alpha-sarcin. The antibodies of the invention may be conjugated to *Aleurites fordii* proteins and compounds (e.g., fatty acids).

The antibodies of the invention may be conjugated to dianthin proteins. The antibodies of the invention may be conjugated to *Phytoiacca americana* protein PAPI. The antibodies of the invention may be conjugated to *Phytoiacca americana* protein PAPII. The antibodies of the invention may be conjugated to *Phytoiacca americana* protein PAP-S. The antibodies of the invention may be conjugated to *Momordica charantia* inhibitor. The antibodies of the invention may be conjugated to curcin. The antibodies of the invention may be conjugated to crotin. The antibodies of the invention may be conjugated to *Saponaria officinalis* inhibitor. The antibodies of the invention may be conjugated to mitogellin. The antibodies of the invention may be conjugated to restrictocin. The antibodies of the invention may be conjugated to phenomycin. The antibodies of the invention may be conjugated to enomycin. The antigen-binding fragments of the antibodies of the invention may be conjugated to auristatin F. The antigen-binding fragments of the antibodies of the invention may be conjugated to paclitaxel. The antigen-binding fragments of the antibodies of the invention may be conjugated to docetaxel. The antigen-binding fragments of the antibodies of the invention may be conjugated to vincristine. The antigen-binding fragments of the antibodies of the invention may be conjugated to CC-1065. The antigen-binding fragments of the antibodies of the invention may be conjugated to SN-38. The antigen-binding fragments of the antibodies of the invention may be conjugated to topotecan. The antigen-binding fragments of the antibodies of the invention may be conjugated to morpholino doxorubicin. The antibodies of the invention may be conjugated to lysoxin. The antigen-binding fragments of the antibodies of the invention may be conjugated to cyanomorpholino doxorubicin. The antigen-binding fragments of the antibodies of the invention may be conjugated to Dolastatin-10. The antigen-binding fragments of the antibodies of the invention may be conjugated to echinomycin. The antigen-binding fragments of the antibodies of the invention may be conjugated to combretatstatin. The antigen-binding fragments of the antibodies of the invention may be conjugated to chalicheamicin. The antigen-binding fragments of the antibodies of the invention may be conjugated to maytansine. The antigen-binding fragments of the antibodies of the invention may be conjugated to DM-1. The antigen-binding fragments of the antibodies of the invention may be conjugated to netropsin. The antigen-binding fragments of the antibodies of the invention may be conjugated to diptheria toxin. The antigen-binding fragments of the antibodies of the invention may be conjugated to *Pseudomonas aeruginosa* exotoxin A chain. The antibodies of the invention may be conjugated to ricin A chain. The antigen-binding fragments of the antibodies of the invention may be conjugated to abrin A chain. The antigen-binding fragments of the antibodies of the invention may be conjugated to modeccin A chain. The antigen-binding fragments of the antibodies of the invention may be conjugated to alpha-sarcin. The antigen-binding fragments of the antibodies of the invention may be conjugated to *Aleurites fordii* proteins and compounds (e.g., fatty acids). The antigen-binding fragments of the antibodies of the invention may be conjugated to dianthin proteins. The antigen-binding fragments of the antibodies of the invention may be conjugated to *Phytoiacca americana* protein PAPI. The antigen-binding fragments of the antibodies of the invention may be conjugated to *Phytoiacca americana* protein PAPII. The antigen-binding fragments of the antibodies of the invention may be conjugated to *Phytoiacca americana* protein PAP-S. The antigen-binding fragments of the antibodies of the invention may be conjugated to *Momordica charantia* inhibitor. The antigen-binding fragments of the antibodies of the invention may be conjugated to curcin. The antigen-binding fragments of the antibodies of the invention may be conjugated to crotin. The antigen-binding fragments of the antibodies of the invention may be conjugated to *Saponaria officinalis* inhibitor. The antigen-binding fragments of the antibodies of the invention may be conjugated to mitogellin. The antigen-binding fragments of the antibodies of the invention may be conjugated to restrictocin. The antigen-binding fragments of the antibodies of the invention may be conjugated to phenomycin. The antigen-binding fragments of the antibodies of the invention may be conjugated to enomycin.

The antibodies of the invention may also be conjugated to an anticancer agent. The antibodies of the invention may also be conjugated to an anticancer agent such as such as erlotinib (TARCEVA®, Genentech/OSI Pharm.), docetaxel (TAXOTERE®, Sanofi-Aventis), 5-FU (fluorouracil, 5-fluorouracil, CAS No. 51-21-8), gemcitabine (GEMZAR®, Lilly), PD-0325901 (CAS No. 391210-10-9, Pfizer), cisplatin (cis-diamine, dichloroplatinum(II), CAS No. 15663-27-1), carboplatin (CAS No. 41575-94-4), paclitaxel (TAXOL®, Bristol-Myers Squibb Oncology, Princeton, N.J.), trastuzumab (HERCEPTIN®, Genentech), temozolomide (4-methyl-5-oxo-2,3,4,6,8-pentazabicyclo [4.3.0] nona-2,7,9-triene-9-carboxamide, CAS No. 85622-93-1, TEMODAR®, TEMODAL®, Schering Plough), tamoxifen ((Z)-2-[4-(1,2-diphenylbut-1-enyl)phenoxy]-N,N-dimethylethanamine, NOLVADEX®, ISTUBAL®, VALODEX®), and doxorubicin (ADRIAMYCIN®). Additional commercially or clinically available anti-cancer agents comprise oxaliplatin (ELOXATIN®, Sanofi), bortezomib (VELCADE®, Millennium Pharm.), sutent (SUNITINIB®, SU11248, Pfizer), letrozole (FEMARA®, Novartis), imatinib mesylate (GLEEVEC®, Novartis), XL-518 (Mek inhibitor, Exelixis, W O 2007/044515), ARRY-886 (Mek inhibitor, AZD6244, Array BioPharma, Astra Zeneca), SF-1126 (PI3K inhibitor, Semafore Pharmaceuticals), BEZ-235 (PI3K inhibitor, Novartis), XL-147 (PI3K inhibitor, Exelixis), PTK787/ZK 222584 (Novartis), fulvestrant (FASLODEX®, AstraZeneca), leucovorin (folinic acid), rapamycin (sirolimus, RAPAMUNE®, Wyeth), lapatinib (TYKERB®, GSK572016, Glaxo Smith Kline), lonafarnib (SARASAR™, SCH 66336, Schering Plough), sorafenib (NEXAVAR®, BAY43-9006, Bayer Labs), gefitinib (IRESSA®, AstraZeneca), irinotecan (CAMPTOSAR®, CPT-11, Pfizer), tipifarnib (ZARNESTRA™, Johnson & Johnson), ABRAXANE™ (Cremophor-free), albumin-engineered nanoparticle formulations of paclitaxel (American Pharmaceutical Partners, Schaumberg, Ill.), vandetanib (rINN, ZD6474, ZACTIMA®, AstraZeneca), chloranmbucil, AG1478, AG1571 (SU 5271; Sugen), temsirolimus (TORISEL®, Wyeth), pazopanib (GlaxoSmithKline), canfosfamide (TELCYTA®, Telik), thiotepa and cyclosphosphamide (CYTOXAN®, NEOSAR®); vinorelbine (NAVELBINE®); capecitabine (XELODA®, Roche), tamoxifen (including NOLVADEX®; tamoxifen citrate, FARESTON® (toremifine citrate) MEGASE® (megestrol acetate), AROMASIN® (exemestane; Pfizer), formestanie, fadrozole, RIVISOR® (vorozole), FEMARA® (letrozole; Novartis), and ARIMIDEX® (anastrozole; AstraZeneca). This list is not meant to be limiting.

The antigen-binding fragments of the antibodies of the invention may also be conjugated to an anticancer agent. The antigen-binding fragments of the antibodies of the invention may also be conjugated to an anticancer agent such as such as erlotinib (TARCEVA®, Genentech/OSI Pharm.), docetaxel (TAXOTERE®, Sanofi-Aventis), 5-FU (fluorouracil, 5-fluorouracil, CAS No. 51-21-8), gemcitabine (GEMZAR®, Lilly), PD-0325901 (CAS No. 391210-10-9, Pfizer), cisplatin (cis-diamine, dichloroplatinum(II), CAS No. 15663-27-1), carboplatin (CAS No. 41575-94-4), paclitaxel (TAXOL®, Bristol-Myers Squibb Oncology, Princeton, N.J.), trastuzumab (HERCEPTIN®, Genentech), temozolomide (4-methyl-5-oxo-2,3,4,6,8-pentazabicyclo [4.3.0] nona-2,7,9-triene-9-carboxamide, CAS No. 85622-93-1, TEMODAR®, TEMODAL®, Schering Plough), tamoxifen ((Z)-2-[4-(1,2-diphenylbut-1-enyl)phenoxy]-N,N-dimethylethanamine, NOLVADEX®, ISTUBAL®, VALODEX®), and doxorubicin (ADRIAMYCIN®). Additional commercially or clinically available anti-cancer agents comprise oxaliplatin (ELOXATIN®, Sanofi), bortezomib (VELCADE®, Millennium Pharm.), sutent (SUNITINIB®, SU11248, Pfizer), letrozole (FEMARA®, Novartis), imatinib mesylate (GLEEVEC®, Novartis), XL-518 (Mek inhibitor, Exelixis, W O 2007/044515), ARRY-886 (Mek inhibitor, AZD6244, Array BioPharma, Astra Zeneca), SF-1126 (PI3K inhibitor, Semafore Pharmaceuticals), BEZ-235 (PI3K inhibitor, Novartis), XL-147 (PI3K inhibitor, Exelixis), PTK787/ZK 222584 (Novartis), fulvestrant (FASLODEX®, AstraZeneca), leucovorin (folinic acid), rapamycin (sirolimus, RAPAMUNE®, Wyeth), lapatinib (TYKERB®, GSK572016, Glaxo Smith Kline), lonafarnib (SARASAR™, SCH 66336, Schering Plough), sorafenib (NEXAVAR®, BAY43-9006, Bayer Labs), gefitinib (IRESSA®, AstraZeneca), irinotecan (CAMPTOSAR®, CPT-11, Pfizer), tipifarnib (ZARNESTRA™, Johnson & Johnson), ABRAXANE™ (Cremophor-free), albumin-engineered nanoparticle formulations of paclitaxel (American Pharmaceutical Partners, Schaumberg, Ill.), vandetanib (rINN, ZD6474, ZACTIMA®, AstraZeneca), chloranmbucil, AG1478, AG1571 (SU 5271; Sugen), temsirolimus (TORISEL®, Wyeth), pazopanib (GlaxoSmithKline), canfosfamide (TELCYTA®, Telik), thiotepa and cyclophosphamide (CYTOXAN®, NEOSAR®); vinorelbine (NAVELBINE®); capecitabine (XELODA®, Roche), tamoxifen (including NOLVADEX®; tamoxifen citrate, FARESTON® (toremifine citrate) MEGASE® (megestrol acetate), AROMASIN® (exemestane; Pfizer), formestanie, fadrozole, RIVISOR® (vorozole), FEMARA® (letrozole; Novartis), and ARIMIDEX® (anastrozole; AstraZeneca). This list is not meant to be limiting.

The antibodies and antigen-binding fragments herein may be detectably labeled using paramagnetic chelates, microparticles, superparamagnetic particles; incorporated into ultrasound bubbles, microparticles, microspheres, emulsions, etc.

A metal chelator(s) is a molecule having one or more polar groups that act as a ligand for, and complex with, a paramagnetic metal. Suitable chelators are known in the art and include acids with methylene phosphonic acid groups, methylene carbohydroxamine acid groups, carboxyethylidene groups, or carboxymethylene groups. Examples of chelators include, but are not limited to, diethylenetriaminepentaacetic acid (DTPA), 1,4,7,10-tetraazacyclo-tetradecane-1,4,7,10-tetraacetic acid (DOTA), 1-substituted 1,4,7,-tricarboxymethyl-1,4,7,10-teraazacyclododecane (DO3A), ethylenediaminetetraacetic acid (EDTA), and 1,4,8,11-tetraazacyclotetradecane-1,4,8,11-tetraacetic acid (TETA). Additional chelating ligands are ethylene bis-(2-hydroxy-phenylglycine) (EHPG), and derivatives thereof, including 5-Cl-EHPG, 5Br-EHPG, 5-Me-EHPG, 5t-Bu-EHPG, and 5 sec-Bu-EHPG; benzodiethylenetriamine pentaacetic acid (benzo-DTPA) and derivatives thereof, including dibenzo-DTPA, phenyl-DTPA, diphenyl-DTPA, benzyl-DTPA, and dibenzyl DTPA; bis-2 (hydroxybenzyl)-ethylene-diaminediacetic acid (HBED) and derivatives thereof; the class of macrocyclic compounds, which contain at least 3 carbon atoms, more preferably at least 6, and at least two heteroatoms (O and/or N), which macrocyclic compounds can consist of one ring, or two or three rings joined together at the hetero ring elements, e.g., benzo-DOTA, dibenzo-DOTA, and benzo-NOTA, where NOTA is 1,4,7-triazacyclononane N,N',N"-triacetic acid, benzo-TETA, benzo-DOTMA, where DOTMA is 1,4,7,10-tetraazacyclotetradecane-1,4,7,10-tetra(methyl tetraacetic acid), and benzo-TETMA, where TETMA is 1,4,8,11-tetraazacyclotetradecane-1,4,8,11-(methyl tetraacetic acid); derivatives of 1,3-propylene-diaminetetraacetic acid (PDTA) and triethylenetetraaminehexaacetic acid (TTHA); derivatives of 1,5,10-N,N',N"-tris(2,3-dihydroxybenzoyl)-tricatecholate (LICAM); and 1,3,5-N,N',N"-tris(2,3-dihydroxybenzoyl) aminomethylbenzene (MECAM). Examples of representative chelators and chelating groups contemplated by the present invention are described in WO 98/18496, WO 86/06605, WO 91/03200, WO 95/28179, WO 96/23526, WO 97/36619, PCT/US98/01473, PCT/US98/20182, and U.S. Pat. Nos. 4,899,755, 5,474,756, 5,846,519 and 6,143,274, all of which are hereby incorporated by reference.

Any method known in the art for conjugating the antibodies and antigen-binding fragments thereof of the invention to the various moieties may be employed, including those methods described by Hunter, et al., (1962) *Nature* 144:945; David, et al., (1974) *Biochemistry* 13:1014; Pain, et al., (1981) *J. Immunol. Meth.* 40:219; and Nygren, J., (1982) *Histochem. and Cytochem.* 30:407. Methods for conjugating antibodies and fragments are conventional and very well known in the art.

Chemical cross-linkers may be classified on the basis of the following:

1. Functional groups and chemical specificity;
 2. length and composition of the cross-bridge;
 3. whether the cross-linking groups are similar (homobifunctional) or different (heterobifunctional);
 4. whether the groups react chemically or photochemically;
 5. whether the reagent is cleavable; and
 6. whether the reagent can be radiolabeled or tagged with another label.

Reactive groups on antibodies and labels that can be targeted using a cross-linker include primary amines, carbonyls, carbohydrates and carboxylic acids. In addition, many reactive groups can be coupled nonselectively using a cross-linker such as photoreactive phenyl azides. For suitable reagents, see Pierce 2003-2004 Applications Handbook and Catalog #1600926, which is hereby incorporated by reference.

Many factors must be considered to determine optimum cross-linker-to-target molar ratios. Depending on the application, the degree of conjugation is an important factor. For example, when preparing immunogen conjugates, a high degree of conjugation is normally desired to increase the immunogenicity of the antigen. However, when conjugating to an antibody or an enzyme, a low-to-moderate degree of conjugation may be optimal to ensure that the biological activity of the protein is retained. It is also important to consider the number of reactive groups on the surface of the protein. If there are numerous target groups, a lower cross-linker-to-protein ratio can be used. For a limited number of potential targets, a higher cross-linker-to-protein ratio may be required. This translates into more cross-linker per gram for a small molecular weight protein.

Conformational changes of proteins associated with a particular interaction may also be analyzed by performing cross-linking studies before and after the interaction. A comparison is made by using different arm-length cross-linkers and analyzing the success of conjugation. The use of cross-linkers with different reactive groups and/or spacer arms may be desirable when the conformation of the protein changes such that hindered amino acids become available for cross-linking.

Cross-linkers are available with varying lengths of spacer arms or bridges connecting the reactive ends. The most apparent attribute of the bridge is its ability to deal with steric considerations of the moieties to be linked. Because steric effects dictate the distance between potential reaction sites for cross-linking, different lengths of bridges may be considered for the interaction. Shorter spacer arms are often used in intramolecular cross-linking studies, while intermolecular cross-linking is favored with a cross-linker containing a longer spacer arm.

The inclusion of polymer portions (e.g., polyethylene glycol ("PEG") homopolymers, polypropylene glycol homopolymers, other alkyl-polyethylene oxides, bis-polyethylene oxides and co-polymers or block co-polymers of poly(alkylene oxides)) in cross-linkers can, under certain circumstances be advantageous. See, e.g., U.S. Pat. Nos. 5,643,575, 5,672,662, 5,705,153, 5,730,990, 5,902,588, and 5,932,462; and Topchieva et al., Bioconjug. Chem. 6: 380-8, 1995). For example, U.S. Pat. No. 5,672,662 discloses bifunctional cross-linkers comprising a PEG polymer portion and a single ester linkage. Such molecules are said to provide a half-life of about 10 to 25 minutes in water.

Designing a cross-linker involves selection of the functional moieties to be employed. The choice of functional moieties is entirely dependent upon the target sites available on the species to be crosslinked. Some species (e.g., proteins) may present a number of available sites for targeting (e.g., lysine ε-amino groups, cysteine sulfhydryl groups, glutamic acid carboxyl groups, etc.), and selection of a particular functional moiety may be made empirically in order to best preserve a biological property of interest (e.g., binding affinity of an antibody, catalytic activity of an enzyme, etc.)

Coupling Through Amine Groups

Imidoester and N-hydroxysuccinimidyl ("NHS") esters are typically employed as amine-specific functional moieties. NHS esters yield stable products upon reaction with primary or secondary amines. Coupling is efficient at physiological pH, and NHS-ester cross-linkers are more stable in solution than their imidate counterparts. Homobifunctional NHS-ester conjugations are commonly used to cross-link amine-containing proteins in either one-step or two-step reactions. Primary amines are the principle targets for NHS-esters. Accessible α-amine groups present on the N-termini of proteins react with NHS-esters to form amides. However, because α-amines on a protein are not always available, the reaction with side chains of amino acids become important. While five amino acids have nitrogen in their side chains, only the ε-amino group of lysine reacts significantly with NHS-esters. A covalent amide bond is formed when the NHS-ester cross-linking agent reacts with primary amines, releasing N-hydroxysuccinimide.

Coupling Through Sulfhydryl Groups

Maleimides, alkyl and aryl halides, α-haloacyls, and pyridyl disulfides are typically employed as sulfhydryl-specific functional moieties. The maleimide group is specific for sulfhydryl groups when the pH of the reaction mixture is kept between pH 6.5 and 7.5. At pH 7, the reaction of the maleimides with sulfhydryls is 1000-fold faster than with amines. Maleimides do not react with tyrosines, histidines or methionines. When free sulfhydryls are not present in sufficient quantities, they can often be generated by reduction of available disulfide bonds.

Coupling Through Carboxyl Groups

Carbodiimides couple carboxyls to primary amines or hydrazides, resulting in formation of amide or hydrazone bonds. Carbodiimides are unlike other conjugation reactions in that no cross-bridge is formed between the carbodiimide and the molecules being coupled; rather, a peptide bond is formed between an available carboxyl group and an available amine group. Carboxy termini of proteins can be targeted, as well as glutamic and aspartic acid side chains. In the presence of excess cross-linker, polymerization may occur because proteins contain both carboxyls and amines. No cross-bridge is formed, and the amide bond is the same as a peptide bond, so reversal of the cross-linking is impossible without destruction of the protein.

Nonselective Labeling

A photoaffinity reagent is a compound that is chemically inert but becomes reactive when exposed to ultraviolet or visible light. Arylazides are photoaffinity reagents that are photolyzed at wavelengths between 250-460 nm, forming a reactive aryl nitrene. The aryl nitrene reacts nonselectively to form a covalent bond. Reducing agents must be used with caution because they can reduce the azido group.

Carbonyl Specific Cross-Linkers

Carbonyls (aldehydes and ketones) react with amines and hydrazides at pH 5-7. The reaction with hydrazides is faster than with amines, making this useful for site-specific cross-linking. Carbonyls do not readily exist in proteins; however, mild oxidation of sugar moieties using sodium metaperiodate will convert vicinal hydroxyls to aldehydes or ketones.

Experimental and Diagnostic Uses

The anti-CD103 antibodies disclosed herein may be used as affinity purification agents. The anti-CD103 antigen-binding fragments disclosed herein may be used as affinity purification agents. In this process, the anti-CD103 antibodies and antigen-binding fragments thereof are immobilized on a solid phase such a Sephadex, glass or agarose resin or filter paper, using methods well known in the art. The immobilized antibody or fragment is contacted with a sample containing the CD103 protein (or a fragment thereof) to be purified, and thereafter the support is washed with a suitable solvent that will remove substantially all the material in the sample except the CD103 protein, which is bound to the immobilized antibody or fragment. Finally, the support is washed with a solvent which elutes the bound CD103 (e.g., protein A). Such immobilized antibodies and fragments form part of the present invention.

Further provided are antigens for generating secondary antibodies which are useful for example for performing Western blots and other immunoassays discussed herein.

anti-CD103 antibodies (e.g., humanized antibodies) and antigen-binding fragments thereof may also be useful in diagnostic assays for CD103 protein, e.g., detecting its expression in specific cells, tissues, or serum, e.g., myeloid cells such as monocytes, macrophages, neutrophils, basophils, eosinophils, and dendritic cells. Such diagnostic methods may be useful in various disease diagnoses.

The present invention includes ELISA assays (enzyme-linked immunosorbent assay) incorporating the use of an anti-CD103 antibody or antigen-binding fragment thereof disclosed herein.

For example, such a method comprises the following steps:
- (a) coat a substrate (e.g., surface of a microtiter plate well, e.g., a plastic plate) with anti-CD103 antibody or antigen-binding fragment thereof;
- (b) apply a sample to be tested for the presence of CD103 to the substrate;
- (c) wash the plate, so that unbound material in the sample is removed;
- (d) apply detectably labeled antibodies (e.g., enzyme-linked antibodies) which are also specific to the CD103 antigen;
- (e) wash the substrate, so that the unbound, labeled antibodies are removed;
- (f) if the labeled antibodies are enzyme linked, apply a chemical which is converted by the enzyme into a fluorescent signal; and
- (g) detect the presence of the labeled antibody.

Detection of the label associated with the substrate indicates the presence of the CD103 protein.

In a further embodiment, the labeled antibody or antigen-binding fragment thereof is labeled with peroxidase which react with ABTS (e.g., 2,2'-azino-bis(3-ethylbenzthiazoline-6-sulphonic acid)) or 3,3',5,5'-Tetramethylbenzidine to produce a color change which is detectable. Alternatively, the labeled antibody or fragment is labeled with a detectable radioisotope (e.g., $^3$H) which can be detected by scintillation counter in the presence of a scintillant.

An anti-CD103 antibody or antigen-binding fragment thereof of the invention may be used in a Western blot or immune-protein blot procedure. Such a procedure forms part of the present invention and includes e.g.:
- (1) optionally transferring proteins from a sample to be tested for the presence of CD103 (e.g., from a PAGE or SDS-PAGE electrophoretic separation of the proteins in the sample) onto a membrane or other solid substrate using a method known in the art (e.g., semi-dry blotting or tank blotting); contacting the membrane or other solid substrate to be tested for the presence of bound CD103 or a fragment thereof with an anti-CD103 antibody or antigen-binding fragment thereof of the invention.
- (2) washing the membrane one or more times to remove unbound anti-CD103 antibody or fragment and other unbound substances; and
- (3) detecting the bound anti-CD103 antibody or fragment.

Such a membrane may take the form of a nitrocellulose or vinyl-based (e.g., polyvinylidene fluoride (PVDF)) membrane to which the proteins to be tested for the presence of CD103 in a non-denaturing PAGE (polyacrylamide gel electrophoresis) gel or SDS-PAGE (sodium dodecyl sulfate polyacrylamide gel electrophoresis) gel have been transferred (e.g., following electrophoretic separation in the gel). Before contacting the membrane with the anti-CD103 antibody or fragment, the membrane is optionally blocked, e.g., with non-fat dry milk or the like so as to bind non-specific protein binding sites on the membrane.

Detection of the bound antibody or fragment indicates that the CD103 protein is present on the membrane or substrate and in the sample. Detection of the bound antibody or fragment may be by binding the antibody or fragment with a secondary antibody (an anti-immunoglobulin antibody) which is detectably labeled and, then, detecting the presence of the secondary antibody.

The anti-CD103 antibodies and antigen-binding fragments thereof disclosed herein may also be used for immunohistochemistry. Such a method forms part of the present invention and comprises, e.g.,
- (1) contacting a cell (e.g., a sample containing myeloid cells such as monocytes, macrophages, neutrophils, basophils, eosinophils, and dendritic cells) to be tested for the presence of CD103 protein with an anti-CD103 antibody or antigen-binding fragment thereof of the invention; and
- (2) detecting the antibody or fragment on or in the cell.

If the antibody or fragment itself is detectably labeled, it can be detected directly. Alternatively, the antibody or fragment may be bound by a detectably labeled secondary antibody which is detected.

Certain anti-CD103 antibodies and antigen-binding fragments thereof disclosed herein may also be used for in vivo tumor imaging. Such a method may include injection of a radiolabeled anti-CD103 antibody or antigen-binding fragment thereof into the body of a patient to be tested for the presence of a tumor associated with CD103 expression (e.g., which expresses CD103, for example, on the tumor cell surface) followed by nuclear imaging of the body of the patient to detect the presence of the labeled antibody or fragment e.g., at loci comprising a high concentration of the antibody or fragment which are bound to the tumor. The detection of the loci indicates the presence of the CD103$^+$ tumor and tumor cells.

Imaging techniques include SPECT imaging (single photon emission computed tomography) or PET imaging (positron emission tomography). Labels include e.g., iodine-123 ($^{123}$I) and technetium-99m ($^{99m}$Tc), e.g., in conjunction with SPECT imaging or $^{11}$C, $^{13}$N, $^{15}$O or $^{18}$F, e.g., in conjunction with PET imaging or Indium-111 (See e.g., Gordon et al., (2005) International Rev. Neurobiol. 67:385-440).

Pharmaceutical Compositions and Administration and Therapeutic Uses

Antibodies of the present invention can inhibit CD103 signaling and, accordingly, in one aspect of the invention, certain antibodies disclosed herein are candidates for treating, or preventing certain conditions and diseases. The present invention provides methods for treating conditions and diseases wherein the course of the condition or disease can be influenced by CD103 signaling. The method includes administering to a subject in need of such treatment, a therapeutically effective amount of an antibody of the present invention.

Integrin family heterodimers play diverse and redundant roles in T-cell activation, homing, and delivery of effector function. The CD103 integrin heterodimer was initially identified by its expression on T cells in the vertebrate gut mucosa, where it is expressed at high levels by >95% of intestinal intraepithelial lymphocytes (iIEL) and ~40% lamina propria lymphocytes. CD103 recognizes the epithelial cell-specific ligand, E-cadherin. In normal mice and humans, CD8+ T cells that reside within the gut epithelium express high levels of CD103, and CD103 is widely expressed in intraepithelial lymphocytes, tumor infiltrating lymphocytes and certain dendritic cells. Previous studies have demonstrated that CD103 serves an important role in the cell lysis caused by tumor-specific infiltrating lymphocytes via interacting with its ligand, E-cadherin, on the tumor cells, triggering lytic granule polarization and exocytosis. Furthermore, the ligation of CD103 and E-cadherin promotes the adhesion of T cells to tumor cells and induces co-stimulation in activated cytotoxic T cells. These findings suggest that CD103 may be a target for enhancing tumor immunity.

In various embodiments, antibodies of the present invention block binding to E-cadherin; are used to deplete CD103+ cells; deplete CD103+CD8+ effector cells; and/or are used to deplete tissue-resident memory T cells ($T_{RM}$).

The present invention also provides a method of treating a CD103 signaling-mediated condition, comprising administering to a patient in need thereof an effective amount of one or more antibodies of the present invention. In some embodiments, CD103 signaling-mediated condition is an autoimmune, inflammatory, or neurodegenerative condition or cancer (see Rayburn, E. R. et al., Mol Cell Pharmacol. 2009; 1(1): 29-43 and Urbanska, A. M. et al., Cell Biochem Biophys. 2015 July; 72(3):757-69).

CD103 in Allograft Rejection

FACS analyses of transplant nephrectomy specimens revealed that a major subset of CD8 effectors that infiltrated allografts undergoing rejection episodes expressed high levels of CD103. Interestingly, CD103+CD8+ effectors are most abundant in renal allografts undergoing rejection episodes in the context of chronic allograft nephropathy. Importantly, CD103+CD8+ effectors are not present in peripheral lymphoid compartments (i.e., peripheral blood lymphocytes), and thus are not detectable by conventional immune monitoring approaches. However, CD103 mRNA is expressed by cells isolated from the urine of renal allograft recipients concomitant with clinical rejection, consistent with the intratubular localization of CD103+CD8+ effectors during rejection episodes. The clinical observations noted above are consistent with a key role for CD103 in promoting destruction of graft epithelial compartments by CD8 effector populations, and support the hypothesis that CD103 expression is required for CD8-mediated destruction of graft epithelial elements. Antibodies of the invention as described herein can be used in the treatment of allograft rejection. Antibodies of the invention as described herein can be used in the prevention of allograft rejection. Antigen binding fragments of the invention as described herein can be used in the treatment of allograft rejection. Antigen binding fragments of the invention as described herein can be used in the prevention of allograft rejection.

Tissue-Resident Memory T Cells

It has long been known that the recurrence of cutaneous chronic inflammation, especially psoriasis and FDE, frequently occurs in previously affected sites. Therefore, immunological memory has been proposed to be involved in flare-up reactivity and the chronicity of inflammatory disorders. With respect to the striking characteristics of $T_{RM}$ cells (long-term survival and low migration in peripheral tissues), it has been suggested that skin $T_{RM}$ cells may actively participate in the recurrence of inflammatory skin disorders.

The primary onset of psoriatic lesions is often followed by recurrence in previously resolved sites, and local resident memory T cells have been suggested to play a role in its development and flare-ups. CD8+ T cells in psoriatic lesions are highly activated and express large amounts of CD69 and CD103. In contrast, few T cells constitutively express these proteins in the peripheral blood, Furthermore, it is clear that $T_{EM}$ cells interact with the vascular addressin E-selectin and are trafficked to the skin during infection or attack. More importantly, recent studies have shown that TCRαβ+ resident T cells accumulate in psoriatic resolved sites, even in normal-appearing skin, and that they are capable of producing IL-17 and IFN-γ to trigger psoriasiform responses. These findings support the important role of lesion-resident T cells in psoriasis development. Antibodies of the invention as described herein can be used in the treatment of psoriasis. Antibodies of the invention as described herein can be used in the prevention of psoriasis. Antigen binding fragments of the invention as described herein can be used in the treatment of psoriasis. Antigen binding fragments of the invention as described herein can be used in the prevention of psoriasis.

Inflammatory Bowel Disease and CD103

An important pathological process increasingly recognised as driving intestinal inflammation and autoimmunity is the loss of immune homeostasis secondary to qualitative or quantitative defects in the regulatory T-cell (Treg) pool. Tregs can be broadly divided into two groups, thymic Tregs (tTregs) or peripherally induced Tregs (pTregs), based on their developmental origin. T cells could be converted into Foxp3-expressing CD4+CD25+ Tregs by T-cell receptor (TCR) costimulation in the presence of transforming growth factor β (TGF-β).14 pTreg conversion in gut-associated lymphoid tissues (GALTs) was enhanced when naive CD4+ T cells encountered antigen in the presence of TGF-β, IL-2 and retinoic acid (RA).15 16 This is facilitated by CD103+ DCs conditioned by the intestinal microenvironment to produce or activate TGF-β and provide RA.17 18 In the absence of CD103 expression, DCs fail to induce Treg development and produce proinflammatory cytokines. In patients with UC, it has been reported that CD103 expression on colonic CD4+ T cells was associated with increased production of proinflammatory Th1, Th17, and Th1/Th17 cytokines, and CD103+ DCs in patients with UC had an ability to drive Th1/Th2/Th17 cell responses. Therefore, the efficacy of targeting integrins might be explained by elimination of colitogenic CD103+ dendritic cells and blockade of lymphocytes recruitment. Antibodies of the invention as described herein can be used in the treatment of inflammatory bowel disease. Antibodies of the invention as described herein can be used in the prevention of inflammatory bowel disease. Antigen binding fragments of the invention as described herein can be used in the treatment of inflammatory bowel disease. Antigen binding fragments of the invention as described herein can be used in the prevention of inflammatory bowel disease.

CD103+ Lymphoproliferative Disorders

Flow cytometric immunophenotyping is vital in the diagnosis of B-cell lymphoproliferative disorders (BC-LPDs), including B-cell chronic lymphocytic leukemia (CLL), mantle cell lymphoma (MCL), and hairy cell leukemia (HCL). In the diagnostic evaluation of low-grade B-cell lymphoproliferative processes, demonstration of CD103 positivity is indicative of a diagnosis of hairy cell leukemia (HCL) or its variant form HCLv.

In addition to these B-cell disorders, CD103 positivity is also a feature in a subset of T cell neoplasms. In one study of 184 cases representing most entities within the current World Health Organization classification of T cell neoplasms, 46% of gastrointestinal lymphomas, 40% of adult T cell leukaemia/lymphoma, and 6.9% of other neoplasms exhibited CD103 positivity. Likewise, Blastic Plasmacytoid Dendritic Cell Neoplasms (BPDCN) express CD103.

Antibodies of the invention as described herein can be used in the treatment of lymphoproliferative disorders. Antigen binding fragments of the invention as described herein can be used in the treatment of lymphoproliferative disorders. Lymphoproliferative disorders expressing CD103 that may be treated using the antibodies of the present invention include, but are not limited to, Hairy Cell leukemia, HCLv, intestinal and extraintestinal lymphomas, enteropathy-associated T-cell lymphoma (EATL), T-lymphoblastic leukemia/lymphoma (T-ALL), T-cell prolymphocytic leukemia (T-PLL), adult T cell leukemia/lymphoma (ATLL), mycosis fungoides (MF), anaplastic large cell lymphoma ALCL, cutaneous T-cell lymphoma (CTCL), and Blastic Plasmacytoid Dendritic Cell Neoplasm.

CD103 in Tumorigenesis

It has been reported that tumor-associated CD103+CD8 T cells have a tolerogenic phenotype with increased expression of CTLA-4 and IL-10 and decreased expression of IFN-γ, TNF-α, and granzymes. Moreover, CD103 has been described as a marker of CD4+ regulatory cells and is present on tolerogenic DCs. Direct targeting of CD103 by an anti-CD103 antibody that reduces CD103+CD8 T cells in mice reportedly provides a therapeutic effect in the B16 melanoma and MC38 CRC models. Antibodies of the invention as described herein can be used in the treatment of tumorigenesis. Antibodies of the invention as described herein can be used in the prevention of tumorigenesis. Antigen binding fragments of the invention as described herein can be used in the treatment of tumorigenesis. Antigen binding fragments of the invention as described herein can be used in the prevention of tumorigenesis. Antibodies of the invention as described herein can be used in mitigating the progression of tumorigenesis.

Therapeutic Applications of CD103 Antibodies of the Present Invention

The present invention provides the use of one or more antibodies of the present invention for inhibiting CD103 signaling in a cell.

The present invention provides the use of one or more antibodies of the present invention for inhibiting CD103 binding to E-cadherin and to E-cadherin-expressing cells.

The present invention further provides the use of one or more antibodies of the present invention for the treatment of a CD103-mediated condition.

The present invention provides the use of one or more antibodies of the present invention for depleting CD103-expressing cells.

The present invention further provides the use of one or more antibodies of the present invention in the manufacture of a medicament for one of the foregoing uses.

Antibodies of the invention as described herein, can be useful in treating a variety of diseases, where the modulation of CD103 signaling can provide therapeutic benefit. In some aspects, a compound of the invention inhibits CD103 signaling, and can be useful in treating a disease selected from the group consisting of atopic dermatitis, allergy, asthma, systemic inflammatory response syndrome (SIRS), sepsis, septic shock, atherosclerosis, celiac disease, dermatomyositis, scleroderma, interstitial cystitis, transplant rejection, graft-versus-host disease, Aicardi-Goutieres Syndrome, Hutchison Guilford progeria syndrome, Singleton-Merten Syndrome, proteasome-associated autoinflammatory syndrome, SAVI (STING-associated vasculopathy with onset in infancy), CANDLE (Chronic Atypical Neutrophilic Dermatosis with Lipodystrophy and Elevated Temperature) syndrome, chilblain lupus erythematosus, systemic lupus erythematosus, rheumatoid arthritis, juvenile rheumatoid arthritis, Wegener's disease, inflammatory bowel disease (e.g. ulcerative colitis, Crohn's disease), idiopathic thrombocytopenic purpura, thrombotic thrombocytopenic purpura, autoimmune thrombocytopenia, multiple sclerosis, psoriasis, IgA nephropathy, IgM polyneuropathies, glomerulonephritis, autoimmune myocarditis, myasthenia gravis, vasculitis, Type 1 diabetes, Type 2 diabetes, Sjorgen's syndrome, X-linked reticulate pigmentary disorder, polymyositis, spondyloenchondrodysplasia, age-related macular degeneration, Alzheimer's disease and Parkinson's disease. In some embodiments, compounds of the invention are useful in treating Aicardi-Goutieres Syndrome, X-linked reticulate pigmentary disorder, dermatomyositis, systemic lupus erythematosus, rheumatoid arthritis, multiple sclerosis, or Type I or Type II diabetes. Antibodies of the invention as described herein are preferably used in the treatment of inflammatory bowel disease. Antibodies of the invention as described herein are preferably used in the treatment of psoriasis.

The present invention provides a method of treating an autoimmune disease in a subject, comprising administering to the subject in need thereof a therapeutically effective amount of one or more antibodies of the present invention. In some embodiments, the autoimmune disease can be a type I interferonopathy (e.g., Aicardi-Goutieres Syndrome, Sjögren's syndrome, Singleton-Merten Syndrome, proteasome-associated autoinflammatory syndrome, SAVI (STING-associated vasculopathy with onset in infancy), CANDLE syndrome, chilblain lupus erythematosus, systemic lupus erythematosus, spondyloenchondrodysplasia), rheumatoid arthritis, juvenile rheumatoid arthritis, idiopathic thrombocytopenic purpura, autoimmune myocarditis, thrombotic thrombocytopenic purpura, autoimmune thrombocytopenia, psoriasis, Type 1 diabetes, or Type 2 diabetes.

The present invention provides a method of treating an inflammatory disease in a subject, comprising administering to the subject in need thereof a therapeutically effective amount of one or more antibodies of the present invention. For example, the inflammatory disease can be selected from the group consisting of atopic dermatitis, allergy, asthma, systemic inflammatory response syndrome (SIRS), sepsis, septic shock, atherosclerosis, celiac disease, dermatomyositis, scleroderma, interstitial cystitis, transplant rejection, graft-versus-host disease, Aicardi-Goutieres Syndrome, Hutchison Guilford progeria syndrome, Singleton-Merten Syndrome, proteasome-associated autoinflammatory syndrome, SAVI (STING-associated vasculopathy with onset in infancy), CANDLE (Chronic Atypical Neutrophilic Dermatosis with Lipodystrophy and Elevated Temperature) syndrome, chilblain lupus erythematosus, systemic lupus erythematosus, rheumatoid arthritis, juvenile rheumatoid arthritis, Wegener's disease, inflammatory bowel disease (e.g. ulcerative colitis, Crohn's disease), idiopathic thrombocytopenic purpura, thrombotic thrombocytopenic purpura, autoimmune thrombocytopenia, multiple sclerosis, psoriasis, IgA nephropathy, IgM polyneuropathies, glomerulonephritis, autoimmune myocarditis, myasthenia gravis, vasculitis, Type 1 diabetes, Type 2 diabetes, Sjorgen's syndrome, X-linked reticulate pigmentary disorder, polymyositis, spondyloenchondrodysplasia, age-related macular degeneration, Alzheimer's disease and Parkinson's disease. In some embodiments, compounds of the invention are useful in treating Aicardi-Goutieres Syndrome, X-linked reticulate pigmentary disorder, dermatomyositis, systemic lupus erythematosus, rheumatoid arthritis, multiple sclerosis, or Type I or Type II diabetes.

The present invention further provides a method of treating neurodegenerative diseases in a subject, comprising administering to the subject in need thereof a therapeutically effective amount of one or more antibodies of the present invention. For example, the neurodegenerative disease can be Alzheimer's disease, Parkinson's disease, multiple sclerosis, IgM polyneuropathies, or myasthenia gravis.

The present invention further provides a method of treating malignancies expressing CD103. For example, the malignancies may be T- and B-cell lymphomas, and particularly Hairy Cell leukemia, HCLv, intestinal and extraintestinal lymphomas, enteropathy-associated T-cell lymphoma (EATL), T-lymphoblastic leukemia/lymphoma (T-ALL), T-cell prolymphocytic leukemia (T-PLL), adult T cell leukemia/lymphoma (ATLL), mycosis fungoides (IMF), anaplastic large cell lymphoma ALCL, cutaneous T-cell lymphoma (CTCL), Sezary Syndrome (SS).

To prepare pharmaceutical or sterile compositions of the anti-CD103 antibodies and antigen-binding fragments of the invention, the antibody or antigen-binding fragment thereof is admixed with a pharmaceutically acceptable carrier or excipient. See, e.g., *Remington's Pharmaceutical Sciences and U.S. Pharmacopeia: National Formulary*, Mack Publishing Company, Easton, PA (1984).

Formulations of therapeutic and diagnostic agents may be prepared by mixing with acceptable carriers, excipients, or stabilizers in the form of, e.g., lyophilized powders, slurries, aqueous solutions or suspensions (see, e.g., Hardman, et al. (2001) *Goodman and Gilman's The Pharmacological Basis of Therapeutics*, McGraw-Hill, New York, NY; Gennaro (2000) *Remington: The Science and Practice of Pharmacy*, Lippincott, Williams, and Wilkins, New York, NY; Avis, et al. (eds.) (1993) *Pharmaceutical Dosage Forms: Parenteral Medications*, Marcel Dekker, NY; Lieberman, et al. (eds.) (1990) *Pharmaceutical Dosage Forms: Tablets*, Marcel Dekker, NY; Lieberman, et al. (eds.) (1990) *Pharmaceutical Dosage Forms: Disperse Systems*, Marcel Dekker, NY; Weiner and Kotkoskie (2000) *Excipient Toxicity and Safety*, Marcel Dekker, Inc., New York, NY).

Toxicity and therapeutic efficacy of the antibodies of the invention, administered alone or in combination with another therapeutic agent, can be determined by standard pharmaceutical procedures in cell cultures or experimental animals, e.g., for determining the $LD_{50}$ (the dose lethal to 50% of the population) and the $ED_{50}$ (the dose therapeutically effective in 50% of the population). The dose ratio between toxic and therapeutic effects is the therapeutic index ($LD_{50}/ED_{50}$). The data obtained from these cell culture assays and animal studies can be used in formulating a range of dosage for use in human. The dosage of such compounds lies preferably within a range of circulating concentrations that include the $ED_{50}$ with little or no toxicity. The dosage may vary within this range depending upon the dosage form employed and the route of administration.

In a further embodiment, a further therapeutic agent that is administered to a subject in association with an anti-CD103 antibody or antigen-binding fragment thereof of the invention in accordance with the Physicians' Desk Reference 2003 (Thomson Healthcare; 57th edition (Nov. 1, 2002)).

The mode of administration can vary. Routes of administration include oral, rectal, transmucosal, intestinal, parenteral; intramuscular, subcutaneous, intradermal, intramedullary, intrathecal, direct intraventricular, intravenous, intraperitoneal, intranasal, intraocular, inhalation, insufflation, topical, cutaneous, transdermal, or intra-arterial.

In particular embodiments, the anti-CD103 antibodies or antigen-binding fragments thereof of the invention can be administered by an invasive route such as by injection. In further embodiments of the invention, an anti-CD103 antibody or antigen-binding fragment thereof, or pharmaceutical composition thereof, is administered intravenously, subcutaneously, intramuscularly, intraarterially, intratumorally, or by inhalation, aerosol delivery. Administration by noninvasive routes (e.g., orally; for example, in a pill, capsule or tablet) is also within the scope of the present invention.

The present invention provides a vessel (e.g., a plastic or glass vial, e.g., with a cap or a chromatography column, hollow bore needle or a syringe cylinder) comprising any of the antibodies or antigen-binding fragments of the invention or a pharmaceutical composition thereof. The present invention also provides an injection device comprising any of the antibodies or antigen-binding fragments of the invention or a pharmaceutical composition thereof. An injection device is a device that introduces a substance into the body of a patient via a parenteral route, e.g., intramuscular, subcutaneous or intravenous. For example, an injection device may be a syringe (e.g., pre-filled with the pharmaceutical composition, such as an auto-injector) which, for example, includes a cylinder or barrel for holding fluid to be injected (e.g., antibody or fragment or a pharmaceutical composition thereof), a needle for piecing skin and/or blood vessels for injection of the fluid; and a plunger for pushing the fluid out of the cylinder and through the needle bore. In an embodiment of the invention, an injection device that comprises an antibody or antigen-binding fragment thereof of the present invention or a pharmaceutical composition thereof is an intravenous (IV) injection device. Such a device includes the antibody or fragment or a pharmaceutical composition thereof in a cannula or trocar/needle which may be attached to a tube which may be attached to a bag or reservoir for holding fluid (e.g., saline; or lactated ringer solution comprising NaCl, sodium lactate, KCl, $CaCl_2$) and optionally including glucose) introduced into the body of the patient through the cannula or trocar/needle. The antibody or fragment or a pharmaceutical composition thereof may, in an embodiment of the invention, be introduced into the device once the trocar and cannula are inserted into the vein of a subject and the trocar is removed from the inserted cannula. The IV device may, for example, be inserted into a peripheral vein (e.g., in the hand or arm); the superior vena cava or inferior vena cava, or within the right atrium of the heart (e.g., a central IV); or into a subclavian, internal jugular, or a femoral vein and, for example, advanced toward the heart until it reaches the superior vena cava or right atrium (e.g., a central venous line). In an embodiment of the invention, an injection device is an autoinjector; a jet injector or an external infusion pump. A jet injector uses a high-pressure narrow jet of liquid which penetrate the epidermis to introduce the antibody or fragment or a pharmaceutical composition thereof to a patient's body. External infusion pumps are medical devices that deliver the antibody or fragment or a pharmaceutical composition thereof into a patient's body in controlled amounts. External infusion pumps may be powered electrically or mechanically. Different pumps operate in different ways, for example, a syringe pump holds fluid in the reservoir of a syringe, and a moveable piston controls fluid delivery, an elastomeric pump holds fluid in a stretchable balloon reservoir, and pressure from the elastic walls of the balloon drives fluid delivery. In a peristaltic pump, a set of rollers pinches down on a length of flexible tubing, pushing fluid forward. In a multi-channel pump, fluids can be delivered from multiple reservoirs at multiple rates.

The pharmaceutical compositions disclosed herein may also be administered with a needleless hypodermic injection device; such as the devices disclosed in U.S. Pat. Nos. 6,620,135; 6,096,002; 5,399,163; 5,383,851; 5,312,335; 5,064,413; 4,941,880; 4,790,824 or 4,596,556. Such needleless devices comprising the pharmaceutical composition are also part of the present invention. The pharmaceutical compositions disclosed herein may also be administered by infusion. Examples of well-known implants and modules for administering the pharmaceutical compositions include those disclosed in: U.S. Pat. No. 4,487,603, which discloses an implantable micro-infusion pump for dispensing medication at a controlled rate; U.S. Pat. No. 4,447,233, which discloses a medication infusion pump for delivering medication at a precise infusion rate; U.S. Pat. No. 4,447,224, which discloses a variable flow implantable infusion apparatus for continuous drug delivery; U.S. Pat. No. 4,439,196, which discloses an osmotic drug delivery system having multi-chamber compartments. Many other such implants, delivery systems, and modules are well known to those skilled in the art and those comprising the pharmaceutical compositions of the present invention are within the scope of the present invention.

Alternately, one may administer the anti-CD103 antibody or antigen-binding fragment of the invention in a local rather than systemic manner, for example, via injection of the antibody or fragment directly into a tumor. Furthermore, one may administer the antibody or fragment in a targeted drug delivery system, for example, in a liposome coated with a tissue-specific antibody, targeting, for example, a tumor. The liposomes will be targeted to and taken up selectively by the afflicted tissue. Such methods and liposomes are part of the present invention.

The administration regimen depends on several factors, including the serum or tissue turnover rate of the therapeutic antibody or antigen-binding fragment, the level of symptoms, the immunogenicity of the therapeutic antibody, and the accessibility of the target cells in the biological matrix. Preferably, the administration regimen delivers sufficient therapeutic antibody or fragment to effect improvement in the target disease state, while simultaneously minimizing undesired side effects. Accordingly, the amount of biologic delivered depends in part on the particular therapeutic antibody and the severity of the condition being treated. Guidance in selecting appropriate doses of therapeutic antibodies or fragments is available (see, e.g., Wawrzynczak (1996) *Antibody Therapy*, Bios Scientific Pub. Ltd, Oxfordshire, UK; Kresina (ed.) (1991) *Monoclonal Antibodies, Cytokines and Arthritis*, Marcel Dekker, New York, NY; Bach (ed.) (1993) *Monoclonal Antibodies and Peptide Therapy in Autoimmune Diseases*, Marcel Dekker, New York, NY; Baert, et al. (2003) *New Engl. J. Med.* 348:601-608; Milgrom et al. (1999) *New Engl. J. Med.* 341:1966-1973; Slamon et al. (2001) *New Engl. J. Med.* 344:783-792; Beniaminovitz et al. (2000) *New Engl. J. Med.* 342:613-619; Ghosh et al. (2003) *New Engl. J. Med.* 348:24-32; Lipsky et al. (2000) *New Engl. J. Med.* 343:1594-1602).

Determination of the appropriate dose is made by the clinician, e.g., using parameters or factors known or suspected in the art to affect treatment. Generally, the dose begins with an amount somewhat less than the optimum dose and it is increased by small increments thereafter until the desired or optimum effect is achieved relative to any negative side effects. Important diagnostic measures include those of symptoms of, e.g., the inflammation or level of inflammatory cytokines produced. In general, it is desirable that a biologic that will be used is derived from the same species as the animal targeted for treatment, thereby minimizing any immune response to the reagent. In the case of human subjects, for example, humanized and fully human antibodies may be desirable.

Antibodies or antigen-binding fragments thereof disclosed herein may be provided by continuous infusion, or by doses administered, e.g., daily, 1-7 times per week, weekly, bi-weekly, monthly, bimonthly, quarterly, semiannually, annually etc. Doses may be provided, e.g., intravenously, subcutaneously, topically, orally, nasally, rectally, intramuscular, intracerebrally, intraspinally, or by inhalation. A total weekly dose is generally at least 0.05 µg/kg body weight, more generally at least 0.2 µg/kg, 0.5 µg/kg, 1 µg/kg, 10 µg/kg, 100 µg/kg, 0.25 mg/kg, 1.0 mg/kg, 2.0 mg/kg, 5.0 mg/mL, 10 mg/kg, 25 mg/kg, 50 mg/kg or more (see, e.g., Yang, et al. (2003) *New Engl. J. Med.* 349:427-434; Herold, et al. (2002) *New Engl. J. Med.* 346:1692-1698; Liu, et al. (1999) *J. Neurol. Neurosurg. Psych.* 67: 451-456; Portielji, et al. (20003) *Cancer Immunol. Immunother.* 52: 151-144). Doses may also be provided to achieve a pre-determined target concentration of anti-CD103 antibody in the subject's serum, such as 0.1, 0.3, 1, 3, 10, 30, 100, 300 µg/mL or more. In other embodiments, An anti-CD103 antibody of the present invention is administered, e.g., subcutaneously or intravenously, on a weekly, biweekly, "every 4 weeks," monthly, bimonthly, or quarterly basis at 10, 20, 50, 80, 100, 200, 500, 1000 or 2500 mg/subject.

As used herein, the term "effective amount" refer to an amount of an anti-CD103 or antigen-binding fragment thereof of the invention that, when administered alone or in combination with an additional therapeutic agent to a cell, tissue, or subject, is effective to cause a measurable improvement in one or more symptoms of disease, for example cancer or the progression of cancer. An effective dose further refers to that amount of the antibody or fragment sufficient to result in at least partial amelioration of symptoms, e.g., tumor shrinkage or elimination, lack of tumor growth, increased survival time. When applied to an individual active ingredient administered alone, an effective dose refers to that ingredient alone. When applied to a combination, an effective dose refers to combined amounts of the active ingredients that result in the therapeutic effect, whether administered in combination, serially or simultaneously. An effective amount of a therapeutic will result in an improvement of a diagnostic measure or parameter by at least 10%; usually by at least 20%; preferably at least about 30%; more preferably at least 40%, and most preferably by at least 50%. An effective amount can also result in an improvement in a subjective measure in cases where subjective measures are used to assess disease severity.

Kits

Further provided are kits comprising one or more components that include, but are not limited to, an anti-CD103 antibody or antigen-binding fragment, as discussed herein in association with one or more additional components including, but not limited to a pharmaceutically acceptable carrier and/or a therapeutic agent, as discussed herein. The antibody or fragment and/or the therapeutic agent can be formulated as a pure composition or in combination with a pharmaceutically acceptable carrier, in a pharmaceutical composition.

In one embodiment, the kit includes an anti-CD103 antibody or antigen-binding fragment thereof of the invention or a pharmaceutical composition thereof in one container (e.g., in a sterile glass or plastic vial) and/or a therapeutic agent and a pharmaceutical composition thereof in another container (e.g., in a sterile glass or plastic vial).

In another embodiment, the kit comprises a combination of the invention, including an anti-CD103 antibody or antigen-binding fragment thereof of the invention along with a pharmaceutically acceptable carrier, optionally in combination with one or more therapeutic agents formulated together, optionally, in a pharmaceutical composition, in a single, common container.

If the kit includes a pharmaceutical composition for parenteral administration to a subject, the kit can include a device for performing such administration. For example, the kit can include one or more hypodermic needles or other injection devices as discussed above.

The kit can include a package insert including information concerning the pharmaceutical compositions and dosage forms in the kit. Generally, such information aids patients and physicians in using the enclosed pharmaceutical compositions and dosage forms effectively and safely. For example, the following information regarding a combination of the invention may be supplied in the insert: pharmacokinetics, pharmacodynamics, clinical studies, efficacy parameters, indications and usage, contraindications, warnings, precautions, adverse reactions, overdosage, proper dosage and administration, how supplied, proper storage conditions, references, manufacturer/distributor information and patent information.

Detection Kits

Also provided are diagnostic or detection reagents and kits comprising one or more such reagents for use in a variety of detection assays, including for example, immunoassays such as ELISA (sandwich-type or competitive format). The kit's components may be pre-attached to a solid support, or may be applied to the surface of a solid support when the kit is used. In some embodiments of the invention, the signal generating means may come pre-associated with an antibody or fragment of the invention or may require combination with one or more components, e.g., buffers, antibody-enzyme conjugates, enzyme substrates, or the like, prior to use. Kits may also include additional reagents, e.g., blocking reagents for reducing nonspecific binding to the solid phase surface, washing reagents, enzyme substrates, and the like. The solid phase surface may be in the form of a tube, a bead, a microtiter plate, a microsphere, or other materials suitable for immobilizing proteins, peptides, or polypeptides. In particular aspects, an enzyme that catalyzes the formation of a chemiluminescent or chromogenic product or the reduction of a chemiluminescent or chromogenic substrate is a component of the signal generating means. Such enzymes are well known in the art. Kits may comprise any of the capture agents and detection reagents described herein. Optionally the kit may also comprise instructions for carrying out the methods of the invention.

The detection kits disclosed herein may also be prepared that comprise at least one of the antibody, peptide, antigen-binding fragment, or polynucleotide disclosed herein and instructions for using the composition as a detection reagent. Containers for use in such kits may typically comprise at least one vial, test tube, flask, bottle, syringe or other suitable container, into which one or more of the detection composition(s) may be placed, and preferably suitably aliquoted. The kits disclosed herein will also typically include a means for containing the vial(s) in close confinement for commercial sale, such as, e.g., injection or blow-molded plastic containers into which the desired vial(s) are retained. Where a radiolabel, chromogenic, fluorigenic, or other type of detectable label or detecting means is included within the kit, the labeling agent may be provided either in the same container as the detection or therapeutic composition itself, or may alternatively be placed in a second distinct container means into which this second composition may be placed and suitably aliquoted. Alternatively, the detection reagent and the label may be prepared in a single container means, and in most cases, the kit will also typically include a means for containing the vial(s) in close confinement for commercial sale and/or convenient packaging and delivery.

General Methods

Standard methods in molecular biology are described Sambrook, Fritsch and Maniatis (1982 & 1989 $2^{nd}$ Edition, 2001 3d Edition) *Molecular Cloning, A Laboratory Manual*, Cold Spring Harbor Laboratory Press, Cold Spring Harbor, NY; Sambrook and Russell (2001) *Molecular Cloning, $3^{rd}$* ed., Cold Spring Harbor Laboratory Press, Cold Spring Harbor, NY; Wu (1993) *Recombinant DNA*, Vol. 217, Academic Press, San Diego, CA). Standard methods also appear in Ausbel, et al. (2001) *Current Protocols in Molecular Biology, Vols.* 1-4, John Wiley and Sons, Inc. New York, NY, which describes cloning in bacterial cells and DNA mutagenesis (Vol. 1), cloning in mammalian cells and yeast (Vol. 2), glycoconjugates and protein expression (Vol. 3), and bioinformatics (Vol. 4).

Methods for protein purification including immunoprecipitation, chromatography, electrophoresis, centrifugation, and crystallization are described (Coligan, et al. (2000) *Current Protocols in Protein Science, Vol.* 1, John Wiley and Sons, Inc., New York). Chemical analysis, chemical modification, post-translational modification, production of fusion proteins, glycosylation of proteins are described (see, e.g., Coligan, et al. (2000) *Current Protocols in Protein Science, Vol.* 2, John Wiley and Sons, Inc., New York; Ausubel, et al. (2001) *Current Protocols in Molecular Biology, Vol.* 3, John Wiley and Sons, Inc., NY, NY, pp. 16.0.5-16.22.17; Sigma-Aldrich, Co. (2001) *Products for Life Science Research*, St. Louis, MO; pp. 45-89; Amersham Pharmacia Biotech (2001) *BioDirectory*, Piscataway, N. J., pp. 384-391). Production, purification, and fragmentation of polyclonal and monoclonal antibodies are described (Coligan, et al. (2001) *Current Protocols in Immunology, Vol.* 1, John Wiley and Sons, Inc., New York; Harlow and Lane (1999) *Using Antibodies*, Cold Spring Harbor Laboratory Press, Cold Spring Harbor, NY; Harlow and Lane, supra). Standard techniques for characterizing ligand/receptor interactions are available (see, e.g., Coligan, et al. (2001) *Current Protocols in Immunology, Vol.* 4, John Wiley, Inc., New York).

Monoclonal, polyclonal, and humanized antibodies can be prepared (see, e.g., Sheperd and Dean (eds.) (2000) *Monoclonal Antibodies*, Oxford Univ. Press, New York, NY; Kontermann and Dubel (eds.) (2001) *Antibody Engineering*, Springer-Verlag, New York; Harlow and Lane (1988) *Antibodies A Laboratory Manual*, Cold Spring Harbor Laboratory Press, Cold Spring Harbor, NY, pp. 139-243; Carpenter, et al. (2000) *J. Immunol.* 165:6205; He, et al. (1998) *J. Immunol.* 160:1029; Tang et al. (1999) J. Biol. Chem. 274:27371-27378; Baca et al. (1997) *J. Biol. Chem.* 272: 10678-10684; Chothia et al. (1989) *Nature* 342:877-883; Foote and Winter (1992) *J. Mol. Biol.* 224:487-499; U.S. Pat. No. 6,329,511).

An alternative to humanization is to use human antibody libraries displayed on phage or human antibody libraries in transgenic mice (Vaughan et al. (1996) *Nature Biotechnol.* 14:309-314; Barbas (1995) *Nature Medicine* 1:837-839; Mendez et al. (1997) *Nature Genetics* 15:146-156; Hoogenboom and Chames (2000) *Immunol. Today* 21:371-377; Barbas et al. (2001) *Phage Display: A Laboratory Manual*, Cold Spring Harbor Laboratory Press, Cold Spring Harbor, NY; Kay et al. (1996) *Phage Display of Peptides and Proteins: A Laboratory Manual*, Academic Press, San Diego, CA; de Bruin et al. (1999) *Nature Biotechnol.* 17:397-399).

Single chain antibodies and diabodies are described (see, e.g., Malecki et al. (2002) *Proc. Natl. Acad. Sci. USA* 99:213-218; Conrath et al. (2001) *J. Biol. Chem.* 276:7346-7350; Desmyter et al. (2001) *J. Biol. Chem.* 276:26285-26290; Hudson and Kortt (1999) *J. Immunol. Methods* 231:177-189; and U.S. Pat. No. 4,946,778). Bifunctional antibodies are provided (see, e.g., Mack, et al. (1995) *Proc. Natl. Acad. Sci. USA* 92:7021-7025; Carter (2001) *J. Immunol. Methods* 248:7-15; Volkel, et al. (2001) *Protein Engineering* 14:815-823; Segal, et al. (2001) *J. Immunol. Methods* 248:1-6; Brennan, et al. (1985) *Science* 229:81-83; Raso, et al. (1997) *J. Biol. Chem.* 272:27623; Morrison (1985) *Science* 229:1202-1207; Traunecker, et al. (1991) *EMBO J.* 10:3655-3659; and U.S. Pat. Nos. 5,932,448, 5,532,210, and 6,129,914).

Bispecific antibodies are also provided (see, e.g., Azzoni et al. (1998) *J. Immunol.* 161:3493; Kita et al. (1999) *J. Immunol.* 162:6901; Merchant et al. (2000) *J. Biol. Chem.* 74:9115; Pandey et al. (2000) *J. Biol. Chem.* 275:38633; Zheng et al. (2001) *J. Biol Chem.* 276:12999; Propst et al. (2000) *J. Immunol.* 165:2214; Long (1999) *Ann. Rev. Immunol.* 17:875).

Purification of antigen is not necessary for the generation of antibodies. Animals can be immunized with cells bearing the antigen of interest. Splenocytes can then be isolated from the immunized animals, and the splenocytes can fused with a myeloma cell line to produce a hybridoma (see, e.g., Meyaard et al. (1997) *Immunity* 7:283-290; Wright et al. (2000) *Immunity* 13:233-242; Preston et al., supra; Kaithamana et al. (1999) *J. Immunol.* 163:5157-5164).

Antibodies can be conjugated, e.g., to small drug molecules, enzymes, liposomes, polyethylene glycol (PEG). Antibodies are useful for therapeutic, diagnostic, kit or other purposes, and include antibodies coupled, e.g., to dyes, radioisotopes, enzymes, or metals, e.g., colloidal gold (see, e.g., Le Doussal et al. (1991) *J. Immunol.* 146:169-175; Gibellini et al. (1998) *J. Immunol.* 160:3891-3898; Hsing and Bishop (1999) *J. Immunol.* 162:2804-2811; Everts et al. (2002) *J. Immunol.* 168:883-889).

Methods for flow cytometry, including fluorescence activated cell sorting (FACS), are available (see, e.g., Owens, et al. (1994) *Flow Cytometry Principles for Clinical Laboratory Practice*, John Wiley and Sons, Hoboken, NJ; Givan (2001) *Flow Cytometry*, 2$^{nd}$ ed.; Wiley-Liss, Hoboken, NJ; Shapiro (2003) *Practical Flow Cytometry*, John Wiley and Sons, Hoboken, NJ). Fluorescent reagents suitable for modifying nucleic acids, including nucleic acid primers and probes, polypeptides, and antibodies, for use, e.g., as diagnostic reagents, are available (Molecular Probes (2003) *Catalogue*, Molecular Probes, Inc., Eugene, OR; Sigma-Aldrich (2003) *Catalogue*, St. Louis, MO).

Standard methods of histology of the immune system are described (see, e.g., Muller-Harmelink (ed.) (1986) *Human Thymus: Histopathology and Pathology*, Springer Verlag, New York, NY; Hiatt, et al. (2000) *Color Atlas of Histology*, Lippincott, Williams, and Wilkins, Phila, PA; Louis, et al. (2002) *Basic Histology: Text and Atlas*, McGraw-Hill, New York, NY).

Software packages and databases for determining, e.g., antigenic fragments, leader sequences, protein folding, functional domains, glycosylation sites, and sequence alignments, are available (see, e.g., GenBank, Vector NTI® Suite (Informax, Inc, Bethesda, MD); GCG Wisconsin Package (Accelrys, Inc., San Diego, CA); DeCypher® (TimeLogic Corp., Crystal Bay, Nevada); Menne, et al. (2000) *Bioinformatics* 16: 741-742; Menne, et al. (2000) *Bioinformatics Applications Note* 16:741-742; Wren, et al. (2002) *Comput. Methods Programs Biomed.* 68:177-181; von Heijne (1983) *Eur. J. Biochem.* 133:17-21; von Heijne (1986) *Nucleic Acids Res.* 14:4683-4690).

EXAMPLES

The following examples serve to illustrate the present invention. These examples are in no way intended to limit the scope of the invention.

Example 1: Reagents

The details of reagents and antibodies used for the following examples are provided in Table 1:

| Antibody/reagents | Dilutions/ concentration | Catalog number/clone | Vendor |
| --- | --- | --- | --- |
| IL-2 | 6000 U/mL | Proleukin | Novartis |
| recombinant TGF | 10 ng/mL | 100-21C | Peprotech |
| PHA | 10 µg/mL | L1668-5MG | Sigma Aldrich |
| Recombinant E-cadherin (1) | 2 µg/mL | 648-EC | R & D systems |
| Recombinant E-cadherin (1) | 2 µg/mL | 10204-H02H | Sino Biological |
| CD103 (2G5.1) antibody | 10-20 µg/mL | MCA708 | Bio-rad |
| CD103 (Ber-ACT8) antibody | 10-20 µg/mL | 550258 | BD |
| CD103 (Ber-ACT8)-FITC antibody | 15 µL per test | 561677 | BD |
| CD3-PE antibody | 2 µL per test | 12-0038-41/42 | eBioscience |
| CD8a-APC-eFlour 780 antibody | 2 µL per test | 47-0088-42 | eBioscience |
| CD33-PE-Cy7 antibody | 2 µL per test | 25-0338-42 | eBioscience |
| CD3-PerCP-Cy5.5 antibody | 2 µL per test | 45-0037-42 | Thermo Fisher Scientific |
| CD324 (E-Cadherin)-PerCP-eFluor 710 antibody | 1 µg/test | 46-3249-82 | eBioscience |
| Mouse IgG1 κ Isotype Control | 10-20 µg/mL | 554721 | BD biosciences |
| Human IgG, Fab fragment | 10-20 µg/mL | 009-000-007 | Jackson Immunoresearch |

-continued

| Antibody/reagents | Dilutions/concentration | Catalog number/clone | Vendor |
|---|---|---|---|
| Zombie Aqua™ Fixable Viability kit | 1:100 | 423102 | BioLegend (ITK diagnostics) |
| Goat anti-mouse Ig-PE | 1:50 | 1010-9 | Southern Biotech |
| F(ab')2 Fragment Goat Anti-Human IgG (H + L)-APC | 1:50 | 109-136-088 | Jackson Immunoresearch |
| Murine CD3-FITC antibody | 2 μL per test | 11-0032-82 | eBioscience |
| Murine CD8a-PE-Cy7 antibody | 2 μL per test | 25-0081-82 | eBioscience |
| Murine CD 103-PE antibody | 2 μL per test | 12-1031-82 | eBioscience |

Example 2: Primary Material and Cell Lines

Chinese hamster ovary (CHO)-K1 cells and the human adenocarcinoma cell line MCF7 were obtained from the American Type Culture Collection (ATCC). Cells were quarantined until screening for microbial contamination and *mycoplasma* was performed and proven to be negative. CHO-K1 cells were grown in DMVEM/JF12 (Gibco), 1% PenStrep (Gibco), 500 NCBS (Biowest) and incubated in a humidified atmosphere with 5% $CO_2$ at 37° C. MCF7 cells were grown in EMVEM (ATCC), 1% PenStrep (Gibco), 10% FBS (Gibco) and incubated in a humidified atmosphere with 500 $CO_2$ at 37° C. A CHO-K1.hCD103/hBeta7 cell line was generated by transfecting CHO-K1 cells with pCI-neo and pcDNA3.1(+)-hygro vectors encoding the full length open reading frames of human integrin AlphaE (UniProt P38570) and human integrin Beta 7 (UniProt P26010), respectively. Stable clones were obtained by limiting dilution in CHO medium supplemented with geneticin (50 ug/mL, Gibco) and hygromycin B (50 ug/mL, Invitrogen). CHO-K1.hAlpha4/hBeta7 expressing cells were generated by transient transfection of CHO-K1 cells with pCI-neo and pcDNA3.1(+)-hygro vectors encoding the full length open reading frames of human integrin Alpha4 (UniProt P13612) and human integrin Beta 7, respectively. CHO-K1.rhCD103/rhBeta7 expressing cells were generated by transient transfection of CHO-K1 cells with pCI-neo and pcDNA3.1(+)-hygro vectors encoding the full length open reading frames of rhesus integrin AlphaE (UniProt H9Z8N2) and rhesus integrin Beta 7 (NCBI XP_015007317.1), respectively.

The human non-small cell lung cancer cell line A549 was obtained from the American Type Culture Collection (ATCC). Cells were quarantined until screening for microbial contamination and mycoplasma was performed and proven to be negative. Cells were grown in DMEM/F-12, GlutaMAX™ Supplement+5% FCS+25 mM HEPES for CHO-K1 and RPMI+10% FCS for A549, and incubated in a humidified atmosphere with 5% $CO_2$ at 37° C. The A549 cell line was subjected to knockout of CDH1 (E-cadherin) by nonliposomal transfection (Fugene) using a plasmid encoding guide RNAs, a fully functional CAS9 cassette and GFP (plasmid pSpCas9(BB)-2A-GFP (PX458) (Ran et al. Nature Protocols 8:2281-2308 (2013)) (Addgene plasmid #48138; n2t.net/addgene:48138;RRID:Addgene_48138)). GFP-positive single-cell clones were isolated using a Moflo Astrios sorter (Beckman Coulter). Disruption was confirmed by Sanger sequencing with tracking of indels.

CD103 positive T cells were generated as follows. Human peripheral blood mononuclear cells (PBMC) were isolated via Ficoll-Paque density gradient centrifugation (Ficoll-Paque PLUS, GE Healthcare Life Sciences, Marlborough, MA, USA) of buffy coats from healthy volunteers after informed consent (Sanquin). Next, CD8 positive T cells were negatively selected using a MagniSort™ Human CD8 T cell Enrichment Kit according to standard protocol (Thermo Fisher Scientific). Subsequently, cells were stimulated with 10 μg/mL PHA, 6000 U/mL IL-2 and 10 ng/mL recombinant TGFβ, and cultivated in RPMI supplemented with 10% FCS and penicillin/streptomycin (100 U/mL). Cells were cultured for at least 10 days to obtain >80% CD103 positive CD8 cells.

Fresh tumor material was obtained from ovarian cancer patients undergoing cytoreductive surgery. With a scalpel, tumor pieces of approximately 1 $mm^3$ were cut, and subjected to enzymatic digestion (RPMI supplemented with 1 mg/ml collagenase type IV (Life technologies), 31 U/ml rhDNase (Pulmozyme, Genentech, California, USA) and 10% FCS) for 30 minutes at 37° C. or overnight at room temperature. Subsequently, the digestion medium containing remaining tumor pieces was filtered over a 70 m cell strainer (Corning, Amsterdam, The Netherlands). For flow cytometric analyses, cells were pelleted, washed, and cryopreserved until further use.

Spleens from immunocompetent Balb/c and C57/BL6 mice, and the thymus from Balb/c mice were harvested, followed by mincing of the tissue on a 70 μm strainer with a plunger. Red blood cells were removed using Red Blood Cell Lysis Buffer (Biolegend). Cells were pelleted, washed, and cryopreserved until further use.

Example 3: Monoclonal Antibody Generation

To generate human CD103 antibodies, mice were immunized with the cDNA plasmid constructs encoding full length open reading frames of human CD103 (integrin alpha-E) and human integrin beta-7. The pCI-neo and pcDNA3.1(+) were custom-based synthesized and obtained from GeneArt/ThermoFisher (Regensburg, Germany). Mice were immunized by gene gun immunization using a Helios Gene gun (BioRad, Hercules, CA, USA) and DNA coated gold bullets (BioRad) following manufacturer's instructions at Envigo (Horst, The Netherlands). Briefly, 1 μm gold particles were coated with pCI-neo-hCD103 and pcDNA3.1 (+)-hBeta7 cDNA and commercial expression vectors for mouse Flt3L and mouse GM-CSF (both from Aldevron) in a 1:1:1:1 ratio. A total of 50 μg of plasmid DNA was used to coat 25 mg of gold particles. Specifically, 7-8 weeks old female BALB/C mice (Harlan) were immunized in the ears with a gene gun, receiving 3 administration cycles in both ears.

Antibody titer was assessed by cell ELISA ("CELISA"), using a CHO-K1.hCD103/hBeta7 stable cell line. Cells were seeded into 96-well flat-bottom tissue culture plates at $8 \times 10^4$ cells/well and cultured at 37° Celsius, 5% CO2 and 95% humidity until cell layers were confluent. Cells were incubated with each sample of the diluted mouse sera for 1 hour at 37° C., 5% CO2 and 95% humidity. Next, cells were washed with phosphate buffered saline (PBS)/0.05% Tween-20 (PBS-T) and incubated with goat-anti-mouse IgG-HRP conjugate (Southern Biotech) for 1 hour at 37° C., 5% CO2 and 95% humidity. Subsequently, cells were washed three times with PBS-T and anti-hCD103/hBeta7 immunoreactivity was visualized with TMB Stabilized Chromogen (Invitrogen). Reactions were stopped with 0.5 M $H_2SO_4$ and absorbances were read at 450 and 610 nm. The anti-hCD103/hBeta7 titer was higher than 1:2500 in each individual mouse serum sample as detected after two DNA immunizations. All mice were immunized for a final, third time and sacrificed 4 days later. Erythrocyte-depleted spleen and lymph-node cell populations were prepared according to published protocols.

To select anti-hCD103 antibody producing B-cells, a selection strategy was designed and developed that preferentially bound B-cells expressing antibodies that bind specifically to hCD103, preferably with cross-reactivity to monkey CD103. As cynomolgus CD103 sequences were not known, cross-reactivity studies were performed using rhesus CD103. Splenocytes and lymphocytes from the hCD103/hBeta7 immunized mice were incubated with hCD103 negative MCF-7 that were seeded into T25 culture flasks and irradiated at 30 Gray. After 1 hour unbound cells were gently removed by moving the flask back and forth. Medium containing unbound cells was then transferred to a new T25 flask containing irradiated CHO-K1.hAlpha4/hBeta7 cells (transient transfection). This procedure was repeated one more time on ice in order to negatively select hBeta7-reactive B-cells. Next, medium containing unbound B-cells was incubated with CHO-K1.hCD103/hBeta7 cells that were irradiated with 30 Gy. After 1.5 hours incubation on ice unbound cells were removed with multiple wash steps using culture medium. Subsequently, T25 flasks containing CHO-K1.hCD103/hBeta7 cells with bound lymphocytes were harvested with Trypsin-EDTA (Sigma). Selected B-cells were mixed with 10% (v/v) T-cell supernatant and 50,000 irradiated (25 Gy) EL-4 B5 feeder cells in a final volume of 200 µl medium in 96-well flat-bottom tissue culture plates. On day four, cell culture medium was refreshed. On day eight, supernatants were screened for hCD103/hBeta7 reactivity by cell ELISA as described below. CHO-K1.hCD103/hBeta7, CHO.K1.rhCD103/rhBeta7 (transient transfection) and CHO-K1.hAlpha4/hBeta7 (transient transfection) were seeded in culture medium (DMEM-F12 (Gibco) supplemented with 10% Fetal Bovine Serum (Hyclone) and 80 U Pen/Strep (Gibco)) in 96-well flat-bottom tissue culture plates and cultured at 37° C., 5% CO2 and 95% humidity until they were confluent. Subsequently, culture medium was removed and cells were incubated for 1 hour at 37° C., 5% $CO_2$ and 95% humidity with supernatants from the B-cell cultures. Next, cells were washed with PBS-T and incubated for 1 hour at 37° C., 5% CO2 and 95% humidity with goat-anti-mouse IgG-HRP conjugate (Southern Biotech). Subsequently, cells were washed three times with PBS-T and anti-hCD103/hBeta7, and anti-hAlpha4/hBeta7 immunoreactivity was visualized with TMB Stabilized Chromogen (Invitrogen). Reactions were stopped with 0.5 M $H_2SO_4$ and absorbances were read at 450 and 610 nm.

B-cell clones from the hCD103/hBeta7 reactive supernatants, which were not or which were minimally reactive to hAlpha4/hBeta7 were immortalized by mini-electrofusion following a published procedure (Steenbakkers et al. (1992) *Mol. Biol. Rep.* 19: 125) with some minor deviations. Briefly, B-cells were mixed with $10^6$ Sp2/0-Ag14 murine myeloma cells (ATCC CRL-1581) in Electrofusion Isomolar Buffer (Eppendorf). Electrofusions were performed in a 50 µL fusion chamber by an alternating electric field of 15 s, 1 MHz, 23 Vrms AC followed by a square, high field DC pulse of 10 as, 180 Volt DC and again by an alternating electric field of 15 s, 1 MHz, 23 Vrms AC. Content of the chamber was transferred to hybridoma selective medium and plated in a 96-well plate under limiting dilution conditions. On day 8 following the electrofusion, hybridoma supernatants were screened for hCD103/hBeta7, rhCD103/rhBeta7, and hAlpha4/hBeta7 binding activity by cell ELISA as described above. Hybridomas that secreted antibodies in the supernatant that specifically bound CD103 were frozen at −180° C. (−1 batch) and subcloned by limited dilution to safeguard their integrity and stability. Stable hybridomas were frozen at −180° C. (−LD1 batch) until cell layers were confluent.

Selected stable hybridomas were cultured in serum-free media for 7 days; supernatants were harvested and antibodies were purified using MabSelect Sure Protein A resin according to the manufacturer's instructions (GE Healthcare). Antibody concentrations were quantified using spectrophotometry. Antibody monomericity was assessed by SEC-HPLC. Supernatants of the hybridoma cultures were used to isotype the hybridomas. In short, isotyping was done using a mouse monoclonal antibody isotyping kit (Biorad) based on a dipstick with immobilized goat-anti-mouse antibody bands to each of the common mouse isotypes and light chains. Recovered antibodies were all identified as mouse IgG1. Antibody sequences were elucidated by sequencing of variable regions of the mouse IgG 1 hybridoma material performed at LakePharma (CA, USA), using the following method: the total RNA of the hybridoma cells was extracted, which allowed cDNA synthesis. Rapid Amplification of cDNA Ends (RACE) was performed that allowed cloning of positive fragments in a TOPO (Thermo Fisher Scientific) vector. TOPO clones were sequenced and sequences were annotated using VBASE2.

Figure 2:
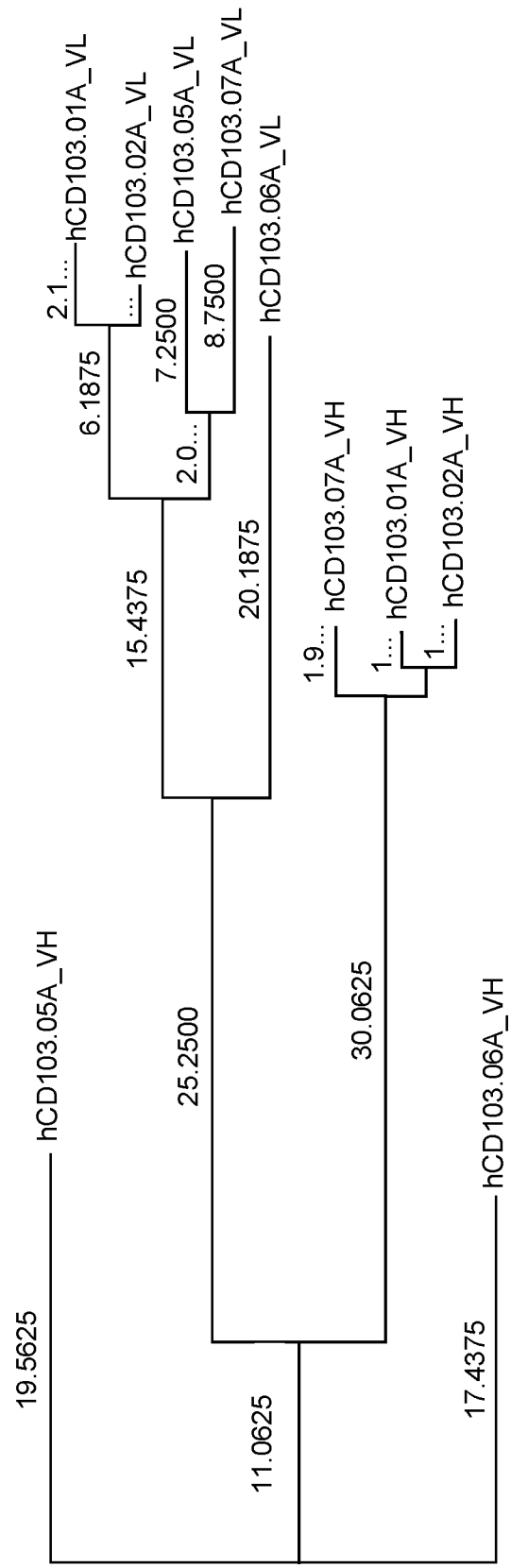
FIG. 2: Phylogenetic tree for the different hCD103 VL and VH sequences.

The mAb discovery campaign yielded 6 different mAb candidates that showed specific binding to the human CD103 (integrin alpha-E) domain of the integrin heterodimer hCD103/hBeta7. The 6 selected candidates were produced from hybridoma and purified. FIG. 1 presents the cell binding data of the purified anti-hCD103 mAbs to CHO.K1-hCD103/hBeta7, CHO.K1-rhCD103/rhBeta7, and CHO.K1-hAlpha4/hBeta7. Expression of the integrin heterodimers by the transfected CHO-K1 cell lines was confirmed by commercial mAbs against integrin human CD103, integrin human Alpha-4, and integrin human Beta-7. Selected hybridomas were sequenced and a phylogenetic tree was built using Discovery Studio (FIG. 2), showing that all VH and VL sequences are unique with different degrees of similarity. As shown, the antibodies exhibit binding to hCD103, but no binding to hBeta7. Binding to rhesusCD103/rhBeta7 is different for the various candidates Example 4: Generation of Anti-hCD103 Fab Fragments Anti-hCD103 Fab candidates were produced by ImmunoPrecise (Oss, the Netherlands). Synthetic vectors encoding for the DNA sequences of the VH and VL domains of candidates hCD103.01A, hCD103.05A, and hCD103.06A were synthesized and subsequently cloned into ImmunoPrecise's human IgG1-Fab-K vector and human kappa light chain vector, respectively, followed by transfection of HEK293 cells. Fab fragments from harvested supernatants were purified by endotoxin-free purification using CaptureSelect IgG-CH1 affinity matrix. Fab concentrations were quantified using Spectrophotometry and Fab purity was assessed by SDS-PAGE and HP-SEC. Endotoxin levels were determined by LAL assay.

Example 5: Fluorescent Labelling of mAbs and Fabs

Fabs and mAbs were conjugated with a 6× molar excess of Alexa Fluor 647-NHS (Thermo Scientific). In short, mAbs/Fabs were rebuffered to 0.2M sodium bicarbonate pH 8.3 using Zeba 7K MWCO spin columns. A 6-fold molar excess of Alexa Fluor 647-NHS (from a 10 mg/mL stock in DMSO) was added. The reaction was allowed for 1 h in the dark at room temperature. Non-reacted Alexa Fluor-NHS was removed using Zeba 7K MWCO spin columns. Antibody and AF647 concentrations were measured using spectrophotometry at 280 nm and 650 nm, respectively. The amount of residual non-reacted AF647 was determined by HP-SEC using a dual detector system (280 nm and 650 nm). Labeling yields of +/−4 dyes per mAb and +/−2-3 dyes per Fab were observed.

Example 6: Immunoreactivity to CHO Cells Expressing Human CD103/Beta7

Non-labeled mAbs and Fabs were analysed for cellular binding to CHO.K1-hCD103/hBeta7 by CELISA as described earlier. Next, cellular binding experiments were also performed using flow cytometry to determine the binding profiles of the AF647 labeled mAbs/Fabs on CHO.K1-hCD103/hBeta7 and CHO.K1. $1×10^5$ detached cells were incubated with mAb/Fab at 4° C. for 30 min. After washing, the cells were resuspended in 1% BSA/DPBS/1× DAPI and analysed on the FACS-CantoII (BD Biosciences).

Figure 3:
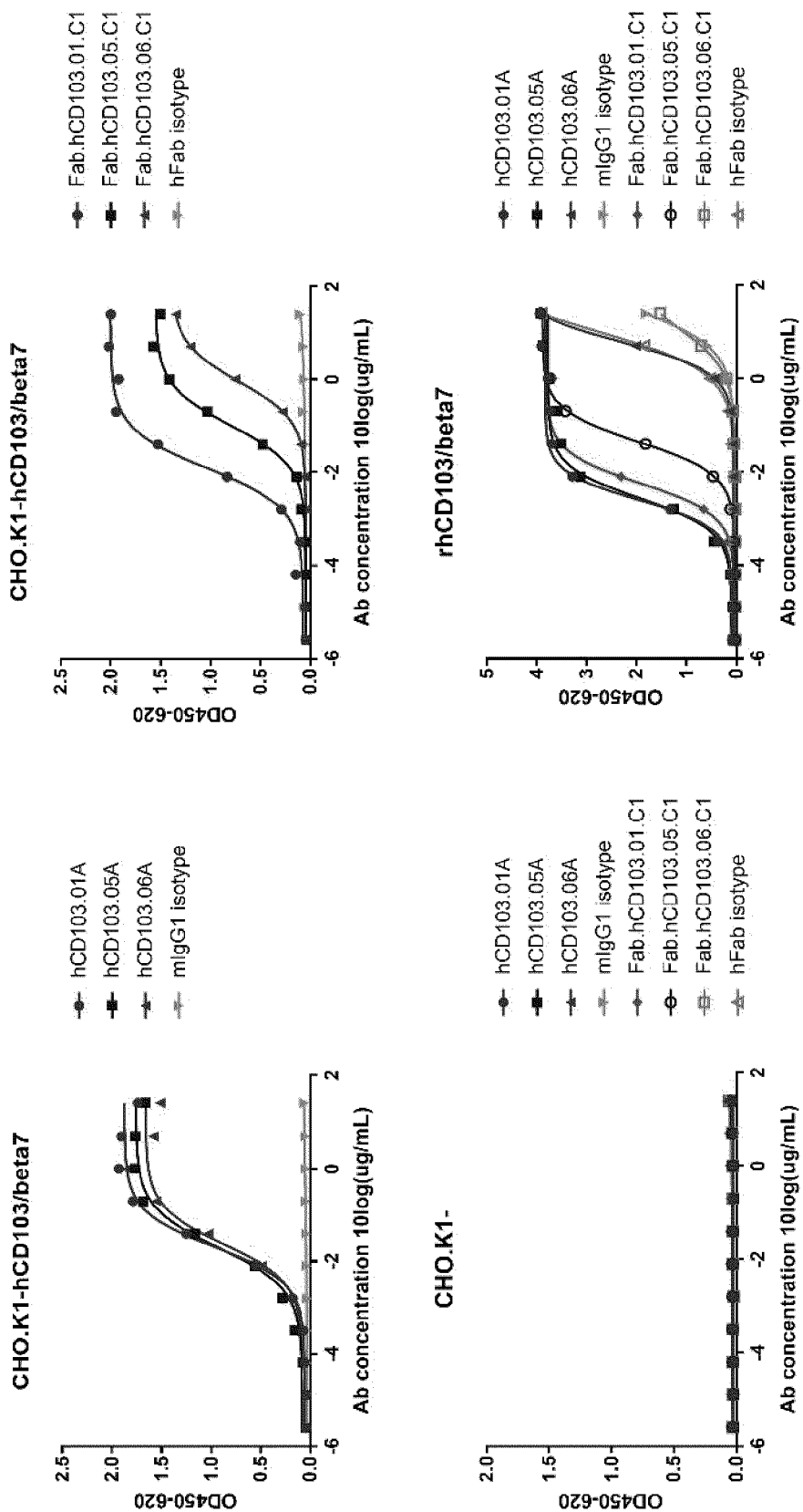
FIG. 3: CELISA binding data of hCD103.01A, hCD103.05A, hCD103.06A, Fab.hCD103.01.C1, Fab.hCD103.05.C1, and Fab.hCD103.06.C1 to CHO.K1.hCD103/hBeta7, CHO.K1, and recombinant human CD103/Beta7.

FIG. 3 presents the binding data of the various non-labeled mAbs/Fabs in cell ELISA. Potent binding of hCD103.01 mAb/Fab and hCD103.05 mAb to both CHO.K1.hCD103/beta7 and recombinant hCD103/beta7, somewhat reduced binding of hCD103.05 Fab to both CHO.K1.hCD103/beta7 and recombinant hCD103/beta7 and weak/minimal binding of hCD103.06 mAb/Fab to recombinant hCD103/beta7 (Acro Biosystems), while strong binding of hCD103.06 mAb to CHO.K1.hCD103/hBeta7

Figure 4:
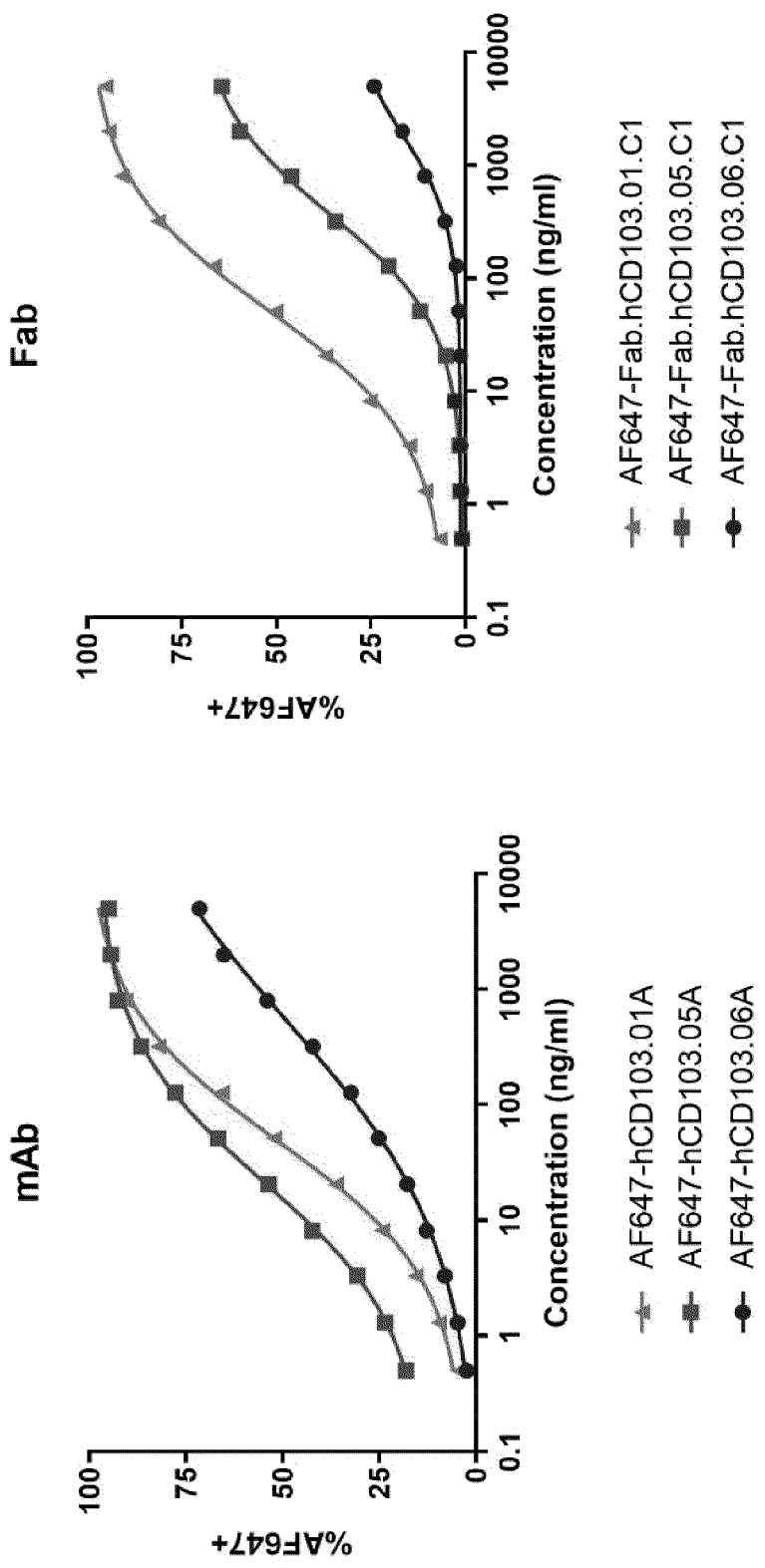
FIG. 4: Cellular binding of AF647-hCD103.01A, AF647-hCD103.05A, AF647-hCD103.06A, AF647-Fab.hCD103.01.C1, AF647-Fab.hCD103.05.C1, and AF647-Fab.hCD103.06.C1 to CHO.K1.hCD103/hBeta7, respectively.

FIG. 4 presents the binding data of the various AF647-labeled mAbs/Fabs in flow cytometry. No dose dependent binding of the mAb and Fab reagents was observed on non-transfected CHO.K1 (data not shown).

Example 7: Immunoreactivity to Recombinant Human CD103/Beta7

Immunoreactivity to human CD103/Beta7 was assessed by ELISA using recombinant hCD103/hBeta7 Fc-protein (Acro-Biosystems) coated 96-well MaxiSorp flat-bottom plates. Protein coated 96-well plates were blocked in protein-free blocking buffer (Pierce) for 1.5 hour at 37° C. Plates were washed and incubated for 1 hour at RT with mAb/Fab in 0.1% Tween-20 in PBS. Next, plates were washed with PBS-T and incubated for 1 hour at RT with goat-anti-mouse IgG-HRP conjugate (Southern Biotech) for mAbs, and goat-anti-human Fab-HRP conjugate (Jackson Immuno Research) for the Fab fragments in 0.1% Tween-20 in PBS. Subsequently, wells were washed three times with PBS-T and anti-hCD103 immunoreactivity was visualized with TMB Stabilized Chromogen (Invitrogen). Reactions were stopped with 0.5 M $H_2SO_4$ and absorbances were read at 450 and 610 nm.

Example 8: Flow Cytometry Analysis

For binding assays of anti-CD103 mAbs and Fab fragments in tumor digests, samples were divided in multiple aliquots and stained using either a live/dead marker and commercial antibodies against human CD3, CD8a, CD33 and CD103, or commercial antibodies against CD3, CD8a, CD33 and our anti-CD103 mAbs or Fabs with secondary detection reagent. For binding assays of anti-CD103 with murine CD103 positive T cells spleen and thymus single cells suspensions were divided in multiple aliquots and stained using either a live/dead marker and commercial antibodies against murine CD8 and CD103. Additional aliquots were stained with relevant isotype controls or as fluorescence minus one controls ("FMO" controls are cells stained with all the fluorophores minus one fluorophore; the relevant isotype controls contain either a directly labeled unspecific isotype antibody or an unspecific isotype antibody combined with secondary detection reagent). Percentage binding of fluorescently labeled mAbs was determined using flow cytometry. Maximum binding was set at 100%. Measurement was performed on a BD FACSVerse (BD Biosciences). Data analysis was performed with FlowJo v10 (Tree Star) and surface receptor levels were expressed as mean fluorescent intensity (MFI).

Figure 6:
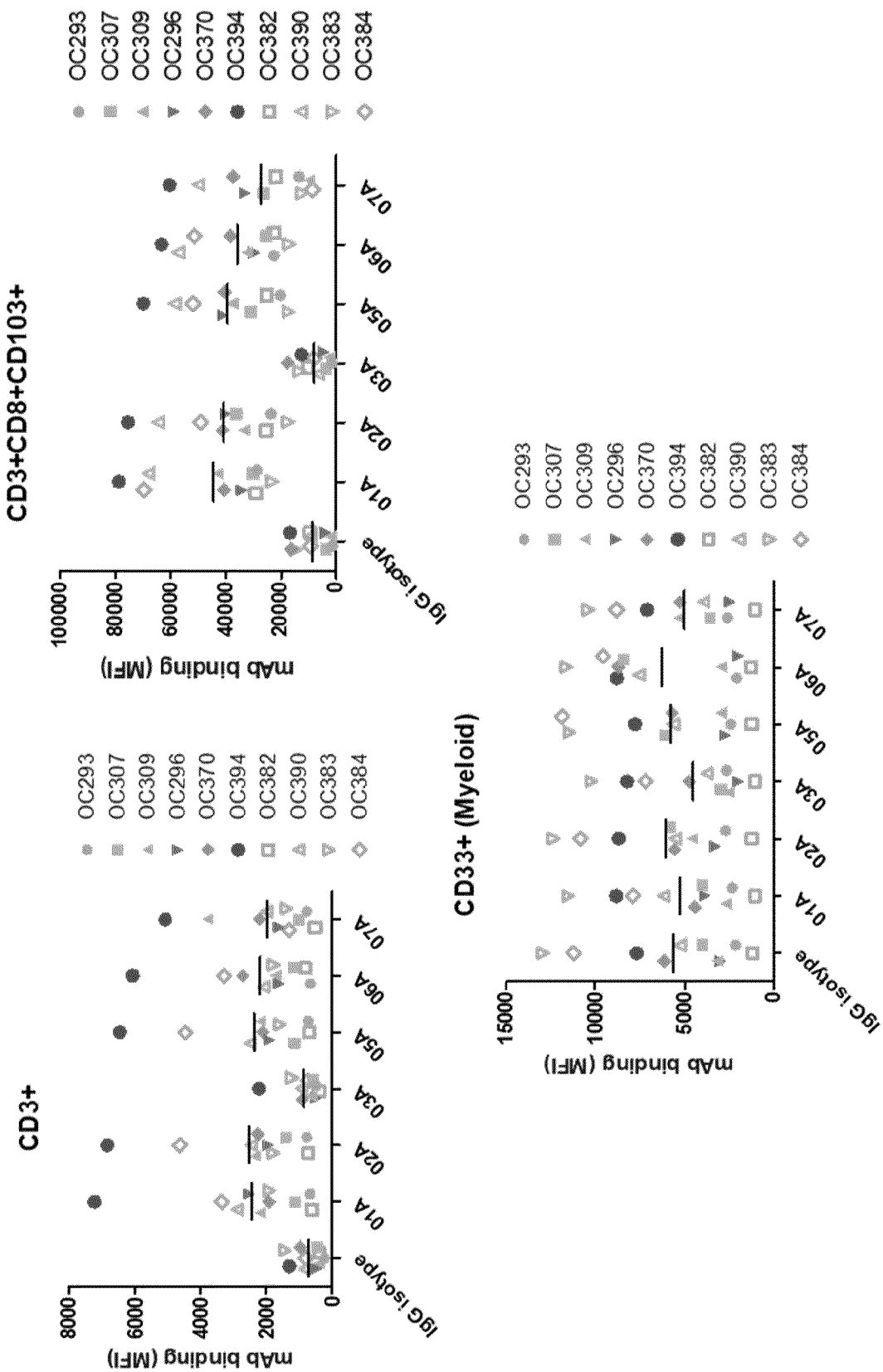
FIG. 6: Binding of anti-hCD103 mAb candidates to CD3+ cells (total T-cell population), CD3+CD103+CD8+ cells (T-cell subpopulation), and CD33+ cells (myeloid population). N=10 different tumor digests.
Figure 7:
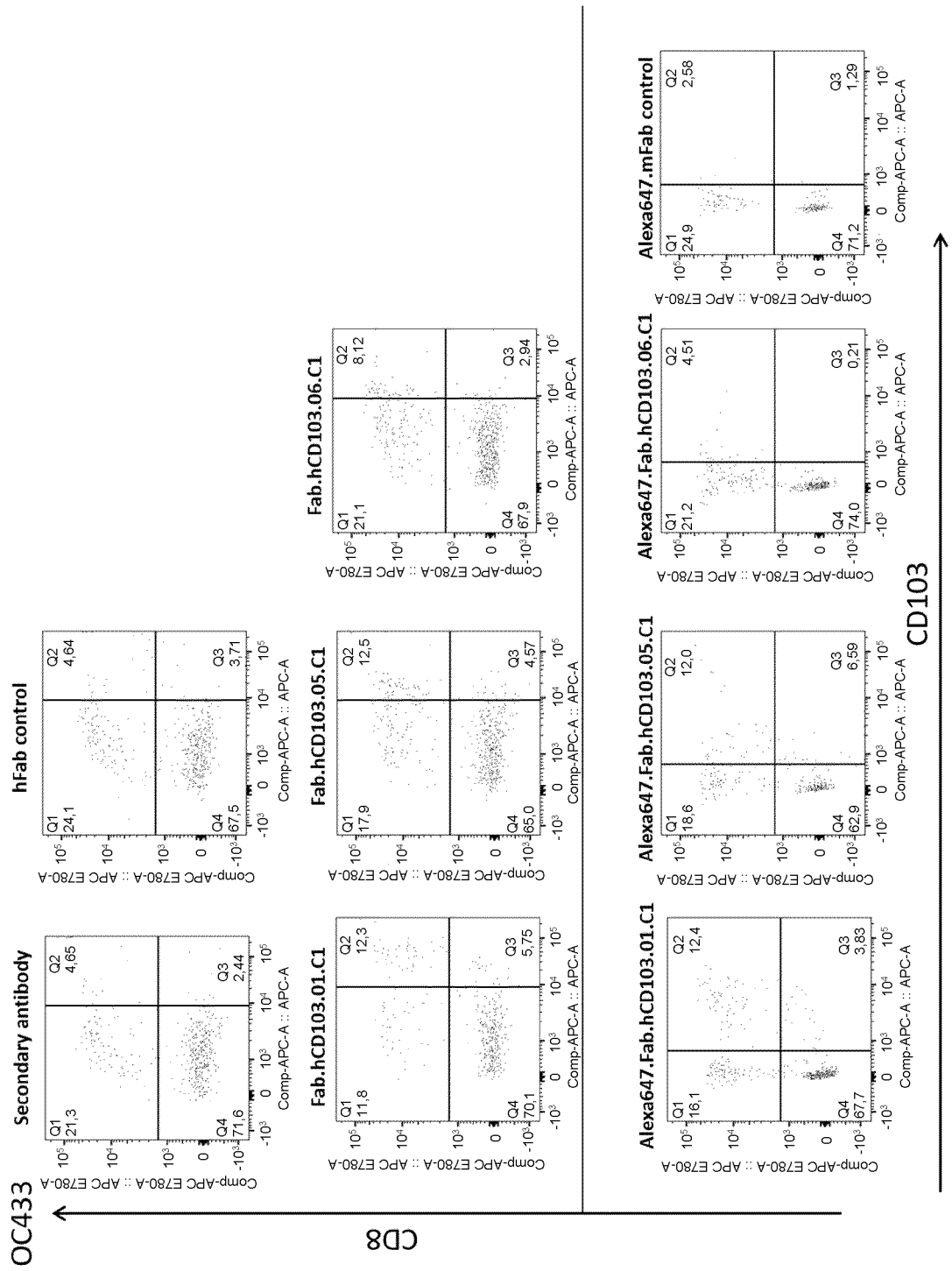
FIG. 7: Staining of tumor digest for CD8 and CD103 with control reagents or anti-hCD103 Fabs. Top two rows show staining with parental Fabs (non-labeled) and detection with a secondary anti-Fab reagent, while bottom row shows results for staining with AF647 conjugated Fabs and direct read-out.

Using ex vivo human tumor digests, the anti-CD103 mAbs were assessed against a benchmark commercial anti-CD103 mAb (BD bioscience) routinely used in flow cytometry, gating on CD3+CD8+ T cells. The anti-CD103 mAbs readily identified the CD103+CD8+ T cell subpopulation at frequencies identical to that observed for the commercial anti-CD103 mAb (FIG. 5). No binding to CD4+ T cells or CD33+(myeloid) cells was detected in these digests. mAb binding to the CD103+CD8+ T cell subpopulation in ten independent patients was highest for clone 01A, whereas clone 03A showed the lowest binding (FIG. 6). Additionally, recombinant Fab fragments from antibody clone 01A, 05A and 06A. showed respectively the strongest binding to the CD103+CD8+ T cell subpopulation for Fab.hCD103.01.C1, whereas Fab.hCD103.06.C1 showed the lowest binding in human tumor digests (FIG. 7), in line with the mAb binding data.

To assess differences in affinity and competition between the mAbs, CD103+CD8+ T cells were pre-incubated with our anti-CD103 mAbs or the commercial anti-CD103 mAbs in FACS medium for 1 hour at 4° C. and subsequently incubated with their fluorescently labeled counterparts for 1 hour at 4° C. Percentage binding of fluorescently labeled mAbs was determined using flow cytometry. Maximum binding was set at 100%

Flow cytometry was used to determine whether the CD103 mAb clones cross-react with murine CD103+ T cells. Mouse spleen and thymus were examined for expression of CD103 using a commercial anti-mouse CD103 mAb. Approximately half of the CD8 cells were positive for CD103. However, the anti-human CD103 mAb clones showed no specific binding to murine CD103 (data not shown). Competition assays revealed that binding of most of the mAbs in our panel, except clone 03A and 06A, inhibited binding of the commercial CD103 mAb and vice-versa, indicating binding to the same region on CD103 (FIG. 8). Nevertheless, differences in binding characteristics were observed. Clone 01A and 02A blocked binding of most other mAb clones in a competition assay, whereas clone 03A, 05A, 06A and 07A did not, suggesting distinct binding epitopes. Additionally, fluorescently labeled 05A, 06A and 07A showed binding after saturation with the same clone, indicating lower binding affinities.

Internalization and dissociation of anti-CD103 mAbs and Fab fragments, and membranous turnover of CD103 were determined using a previously described protocol. Briefly, CHO.K1-hCD103/hBeta7 cells or CD103 positive T cells were stained on ice with the anti-CD103 mAbs and Fab fragments (20 µg/mL final concentration). After staining; 1) cells were washed with ice-cold FACS buffer and incubated with secondary antibody diluted 1:50 in FACS medium for 1 hour at 4° C. to measure surface expression. 2) Cells were washed with ice-cold FACS buffer, incubated in culture medium at 37° C. for 4 hours and subsequently incubated with secondary antibody for 1 hour at 4° C. to measure non-internalized CD103-antibody complexes since the secondary antibodies only bind to surface bound CD103 mAbs or Fab fragments. 3) Cells were washed with ice-cold FACS buffer, incubated in culture medium at 37° C. for 4 hours and subsequently re-incubated with the CD103 mAbs or Fab fragments, followed by secondary antibody to measure non-internalized, reappeared receptors and possible de novo synthesis of receptors. Duplicate samples were measured for each treatment condition, and corrected for background fluorescence and unspecific binding of the secondary antibody. Measurement was performed on a BD FACSVerse or BD Accuri C6 (BD Biosciences). Data analysis was performed with FlowJo v10 (Tree Star) and surface receptor expression was expressed as mean fluorescent intensity (MFI). Four hours incubation at 37° C. resulted in different amounts of remaining mAbs and Fab fragments bound at the cell surface. A decrease could indicate internalized mAb and Fab fragments. However, performing the same experiment using directly labeled mAbs and Fab fragments showed that the decrease in remaining mAb or Fab fragment at the cells surface was due to dissociation. Of note, CD103 surface expression levels were only marginally changed by the incubation with mAbs or Fab fragments (data not shown).

Example 9: CD103+ T Cell Adhesion Assays

CD103+ T cell adhesion assays were performed as follows. One day before the experiment, 96 wells plates were coated overnight at 4° C. with 100 µL recombinant E-cadherin at 2 µg/mL in Dulbecco's PBS (DPBS) containing 1 mM $Ca^{2+}$ and $Mg^{2+}$. Next, wells were blocked for at least 1 hour using 1% bovine serum albumin (BSA) in DPBS. CD103+ T cells were labeled with CFSE (Thermo Fisher Scientific) as described earlier (3) and resuspended in RPMI+10% FCS+1 mM $Mn^{2+}$. CFSE labeled cells were either preincubated with 10 µg/mL antibody or Fab fragments for 30 minutes on ice followed by incubation in E-cadherin coated wells (50,000 cells/well) for 30 minutes at 37° C. or cells were directly transferred to E-cadherin coated wells for 30 minutes at 37° C. followed by 10 µg/mL antibody or Fab fragment treatment for 30 minutes at 37° C.

For adhesion assays using A549 wild-type and E-cadherin knock-out cells, one day before the experiment, tumor cells (30,000 cells/well) were seeded in 96 wells plates. Next, CFSE labeled CD103+ T cells were preincubated with 10 µg/mL antibody for 30 minutes on ice followed by incubation in tumor cell seeded wells for 60 minutes at 37° C.

After incubation, unbound cells were removed by inverting the plate and washing with DPBS. Finally, cells were fixed using 3.7% formalin in DPBS. Images were captured using a conventional fluorescent microscope (Invitrogen™ EVOS™ FL Imaging System). Bound T cells were quantified using Image J software analysis (1.50v).

Figure 9:
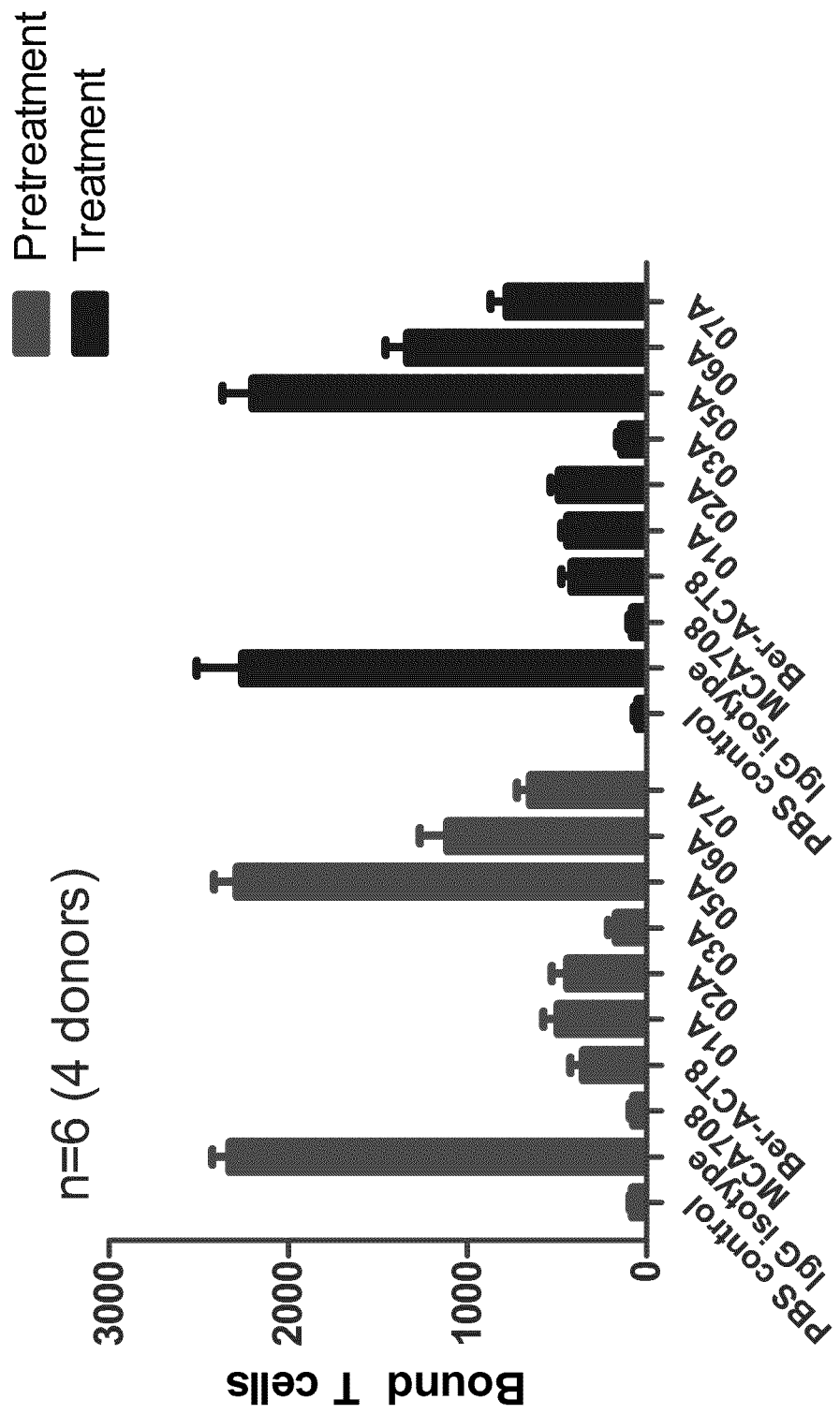
FIG. 9: CD103+ T cell binding to recombinant E-cadherin in the presence of anti-hCD103 mAbs and controls. Antibodies were pre-incubated with cells before incubation with recombinant E-cadherin (left set of bars, pre-treatment) or cells were first incubated with recombinant E-cadherin whereafter the mAbs were added (right set of bars, treatment).

As shown in FIG. 9, CD103 mAb clone 01A, 02A, 03A and 07A showed the strongest inhibition of T cell binding, whereas 06A partially inhibited the binding to E-cadherin. Clone 05A was the only clone that did not interfere with CD103-mediated T cell adhesion. Similar effects were observed for Fab.hCD103.01.C1, Fab.hCD103.05.C1, and Fab.hCD103.06.C1 (data not shown). CRISPR-knockout of CDH1 (E-cadherin) in A549 tumor cells resulted in reduced CD103+ T cell adhesion, however no clear effects of our CD103 mAbs were observed in E-cadherin wild-type and E-cadherin-knockout cells.

Example 10: Cell Based ELISA

One day before the procedure, CD103/07 transfected CHO cells (30,000 cells/well) were seeded in 96 wells plates. Subsequently, serial dilutions of CD103 mAbs, Fab fragments and isotype controls were added to each well of a 96-well plate and incubated for 1 h at 37° C. Wells were washed with PBS and incubated with Rabbit anti-Mouse/ IgG-HRP (1:4000, Dako) or Fab specific Goat anti-Human/ IgG-HRP (1:4000; Sigma Aldrich) for 1 h at 37° C. Next, wells were washed with PBS and TMB substrate (KPL) was added. The color reaction was stopped by adding 1M HCl solution and the absorbance was measured by a microplate reader (Thermo Scientific).

Example 11: $^{89}$Zr-hCD103.01A, $^{89}$Zr-hCD103.05A, $^{89}$Zr-Fab.hCD103.01.C1 and $^{89}$Zr-hCD103.05.C1 Tracer Development and Quality Control hCD103.01A, hCD103.05A, Fab.hCD103.01.C1 and Fab.hCD103.05.C1 were incubated with a 3 or 4-fold molar excess of TFP-N-Suc-desferal-Fe (Df, ABX GmbH, Hamburg, Germany) and subsequent $^{89}$Zr-labeling was performed using clinical grade $^{89}$Zr (Perkin Elmer, Groningen, The Netherlands). Maximal attainable specific activity was determined using varying amounts of $^{89}$Zr per mg antibody or Fab fragment ranging between 250 and 1000 MBq/mg. Radiochemical purity (RCP) was assessed by trichloroacetic acid (TCA) precipitation test. Radiochemical purity for $^{89}$Zr-Fab.hCD103.01.C1 and Fab.hCD103.05.C1 was >96% for three $^{89}$Zr levels tested (250, 500, and 750 MBq $^{89}$Zr). Df-mAb and -Fab conjugates were checked for aggregation and fragmentation by size exclusion ultra-performance liquid chromatography (SE-UPLC). The Waters SE-UPLC system was equipped with a dual wavelength absorbance detector, in-line radioactivity detector and TSK-GEL G3000SWXL column (JSB, Eindhoven, The Netherlands).

Figure 10:
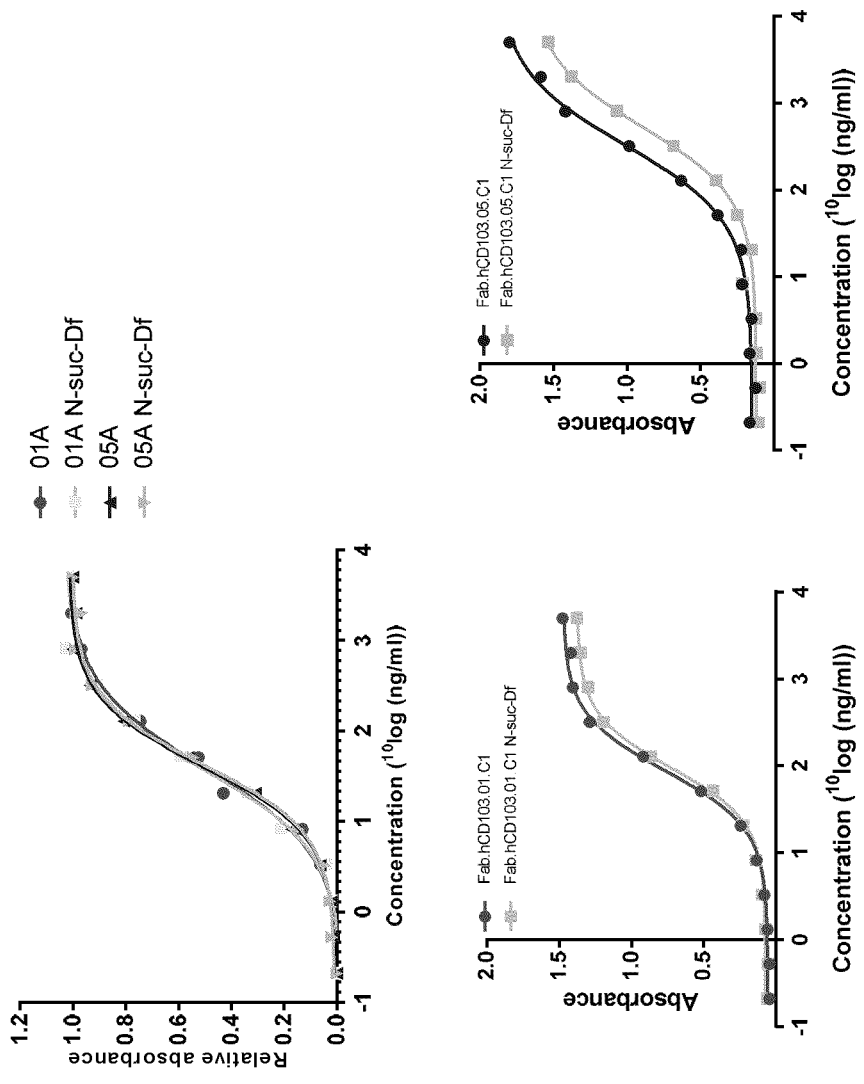
FIG. 10: Binding of Df-conjugated and parental anti-hCD103 mAbs (candidates hCD103.01A and hCD103.05A), or Fab fragments (candidates Fab.hCD103.01.C1 and Fab.hCD103.05.C1) to CHO.K1-hCD103/hBeta7.
Figure 11:
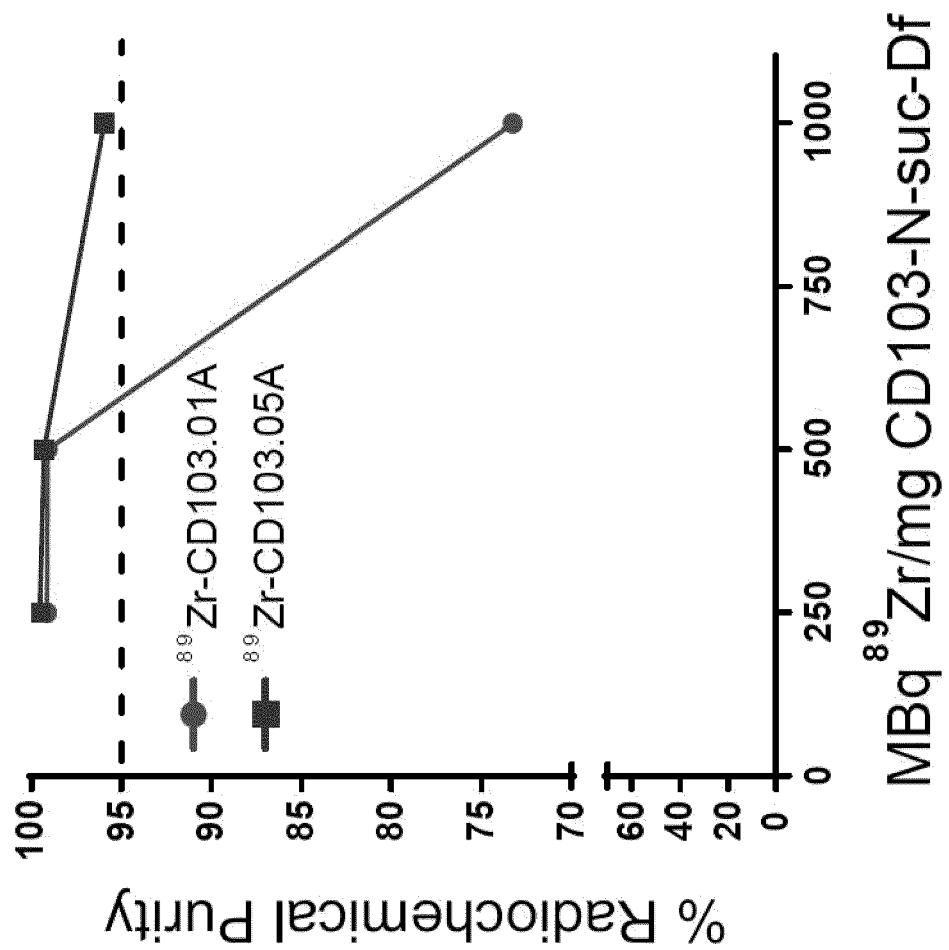
FIG. 11: Radiochemical purity of $^{89}$Zr-labeled anti-hCD103 mAbs (candidates hCD103.01A and hCD103.05A) at different $^{89}$Zr levels.
Figure 12:
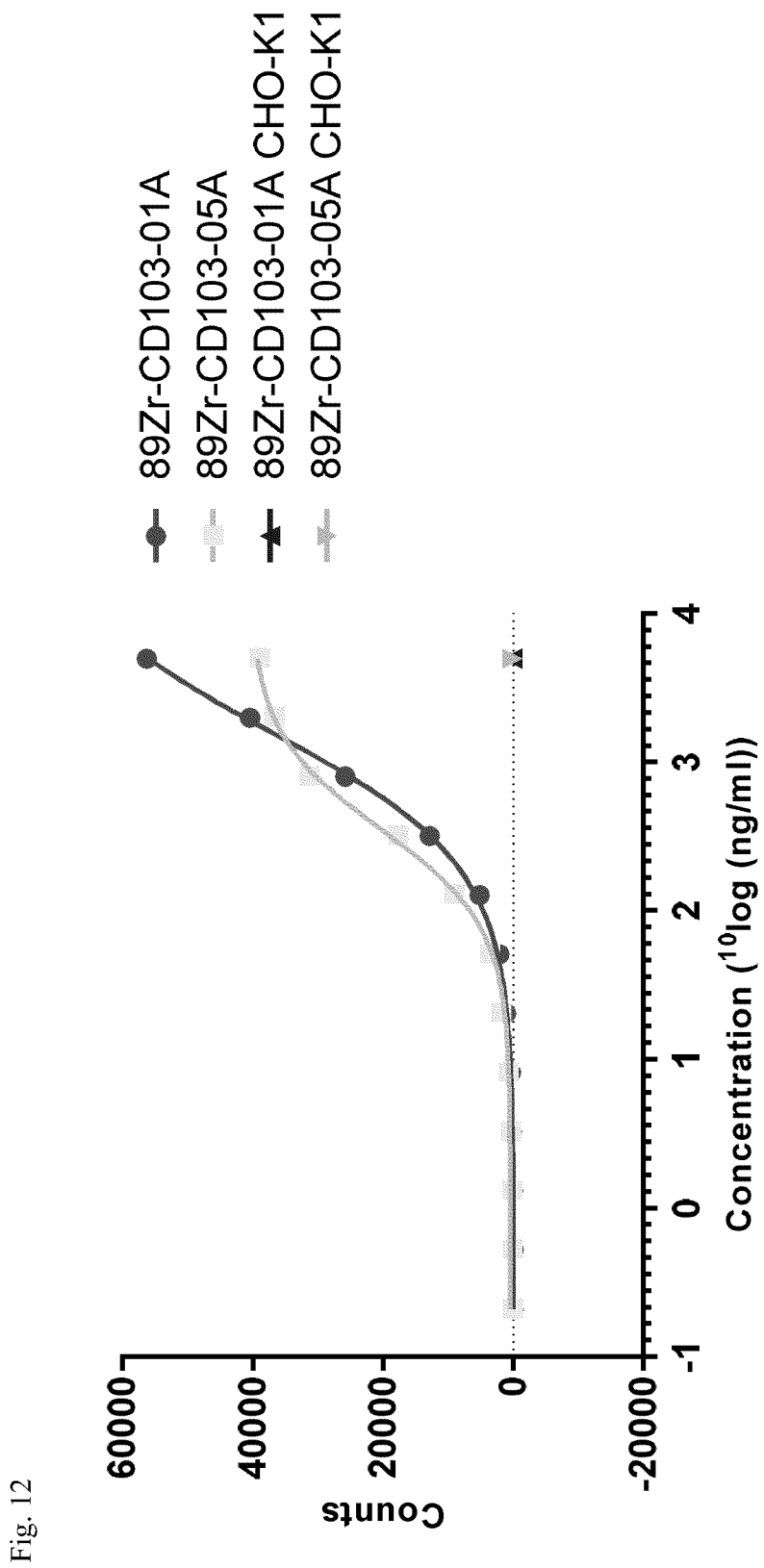
FIG. 12: Binding of $^{89}$Zr-labeled anti-hCD103 mAbs (candidates hCD103.01A and hCD103.05A) to CHO.K1-hCD103/hBeta7 (red) and CHO.K1 (blue). Binding was measured as amount of $^{89}$Zr-mAb bound activity.

CD103 binding affinity of the two Df-conjugated CD103 mAbs and Fab fragments was similar to their unmodified counterparts (FIG. 10). In addition, both the Df-conjugated mAbs and the Fab fragments achieved a specific activity of 500 MBq $^{89}$Zr/mg at a radiochemical purity of >95%, without further purification (FIG. 11). As such, these tracers are suitable for PET imaging with amounts as low as 10 µg (PET imaging) or even less when used in biodistribution studies. In vitro, hCD103.01A and hCD103.05A showed specific binding to a CD103 transfected CHO-K1 model cell line (CHO.K1-hCD103/hBeta7), but not to CHO-K1 wild type cells (CHO.WT) (FIG. 12).

Example 12: Animal Studies

FIG. 13A depicts an exemplary PET imaging protocol for $^{89}$Zr-hCD103.01A and $^{89}$Zr-hCD103.05A. Male nude mice (BALB/cOlaHsd-Foxnlnu, Envigo, The Netherlands) were subcutaneously (sc) inoculated with CHO.K1 or CHO.CD103 ($5 \times 10^6$ in 300 μL 1:1 PBS and high growth factor Matrigel (BD Biosciences, Breda, The Netherlands)). Xenografts were allowed to grow to at least 200 mm$^3$. For microPET imaging with mAbs, xenograft-bearing mice (n=3 per group) were injected intravenously (iv) via the penile vein with 8.7±0.48 μg $^{89}$Zr-CD103.01A or 8.76±0.42 μg $^{89}$Zr-CD103.05A. MicroPET scans were made 1, 3 and 6 days post injection (pi) using a Focus 220 PET scanner (CTI Siemens), followed by ex vivo biodistribution analysis after the final scan. For biodistribution experiments with Fab fragments, xenograft-bearing mice (n=2 or 3 per group) were injected intravenously (iv) via the penile vein with ~10 μg $^{89}$Zr-Fab.hCD103.01.C1 or $^{89}$Zr-Fab.hCD103.05.C1 followed by ex vivo biodistribution analysis after 24 hours.

Scans were reconstructed and in vivo quantification was performed using AMIDE (v1.0.4, Stanford University, Stanford, CA, USA). MicroPET data are presented as mean standardized uptake value (SUVmean). Region of interests (ROI) were drawn for tumor based upon ex vivo weight, assuming 1 g/ml tissue density. For blood pool measurements, a fixed-sized sphere was drawn in the center of the heart, for liver and spleen a fixed-sized ellipsoid ROI was drawn in representative parts of the organs. After the final scan, mice were sacrificed and organs of interest collected for biodistribution studies. Organs and standards of the injected tracer were counted in a calibrated well type LKB-1282-Compu-gamma system (LKB WALLAC) and weighed. After decay correction, ex vivo tissue activity was expressed as the percentage of injected dose per gram tissue (% ID/g).

Figure 13:
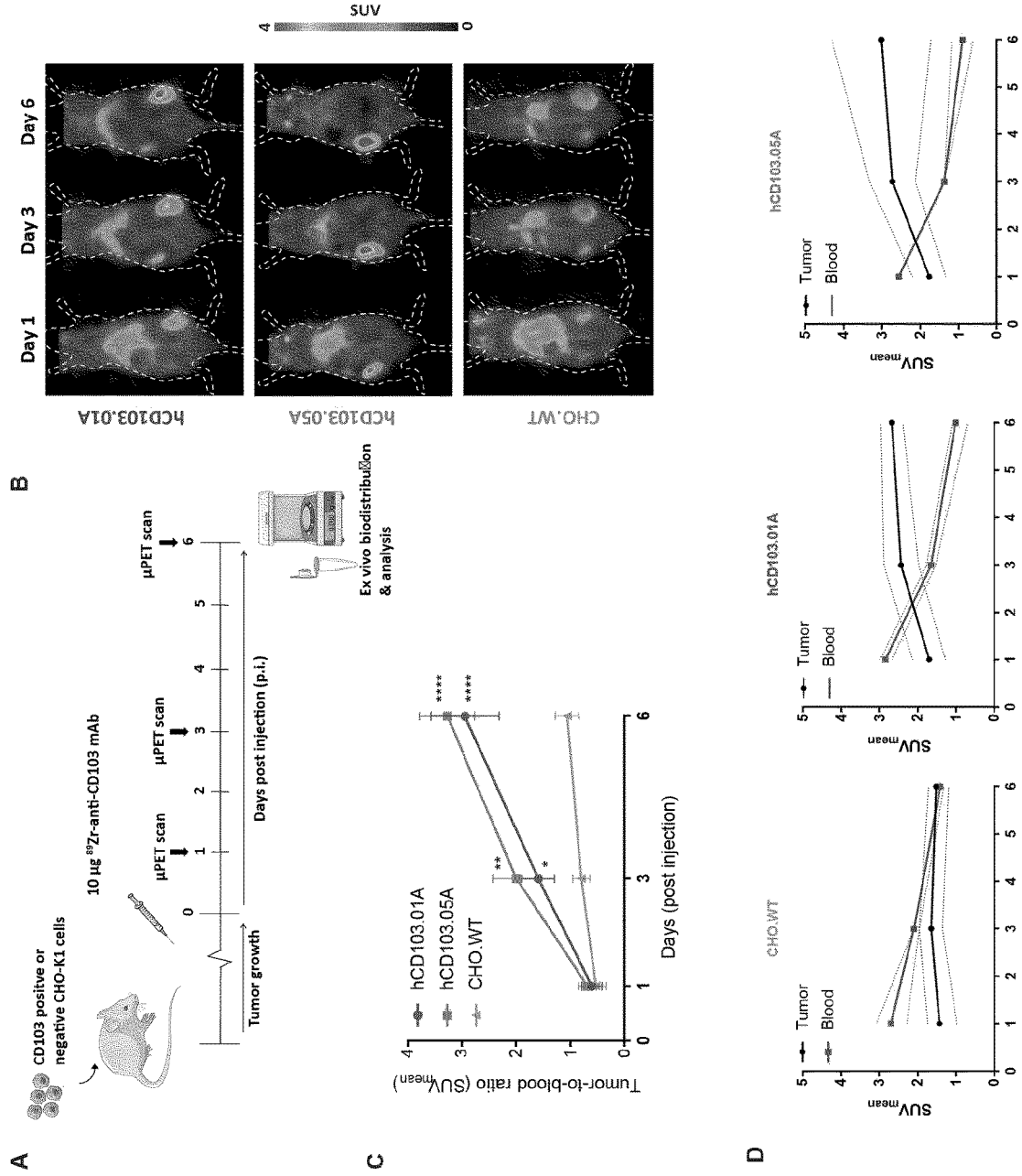
FIG. 13A-E: PET imaging protocol for $^{89}$Zr-hCD103.01A and $^{89}$Zr-hCD103.05A (13A), PET imaging 2D visualization (coronals) (13B), target to blood ratio of $^{89}$Zr-hCD103.01A and $^{89}$Zr-hCD103.05A, and $^{89}$Zr-hCD103.01A and $^{89}$Zr-hCD103.05A levels in blood versus target tissue, in CHO.K1-hCD103/hBeta7 or CHO.K1 WT bearing mice (13C and 13D), and comparative tissue distribution ratios (13E). Tumor (target) here means CHO.K1-hCD103/hBeta7 (red and green) or CHO.K1 WT (grey), respectively. CHO.K1 WT bearing mice were injected with $^{89}$Zr-hCD103.01A as an unspecific control group.
Figure 13E:
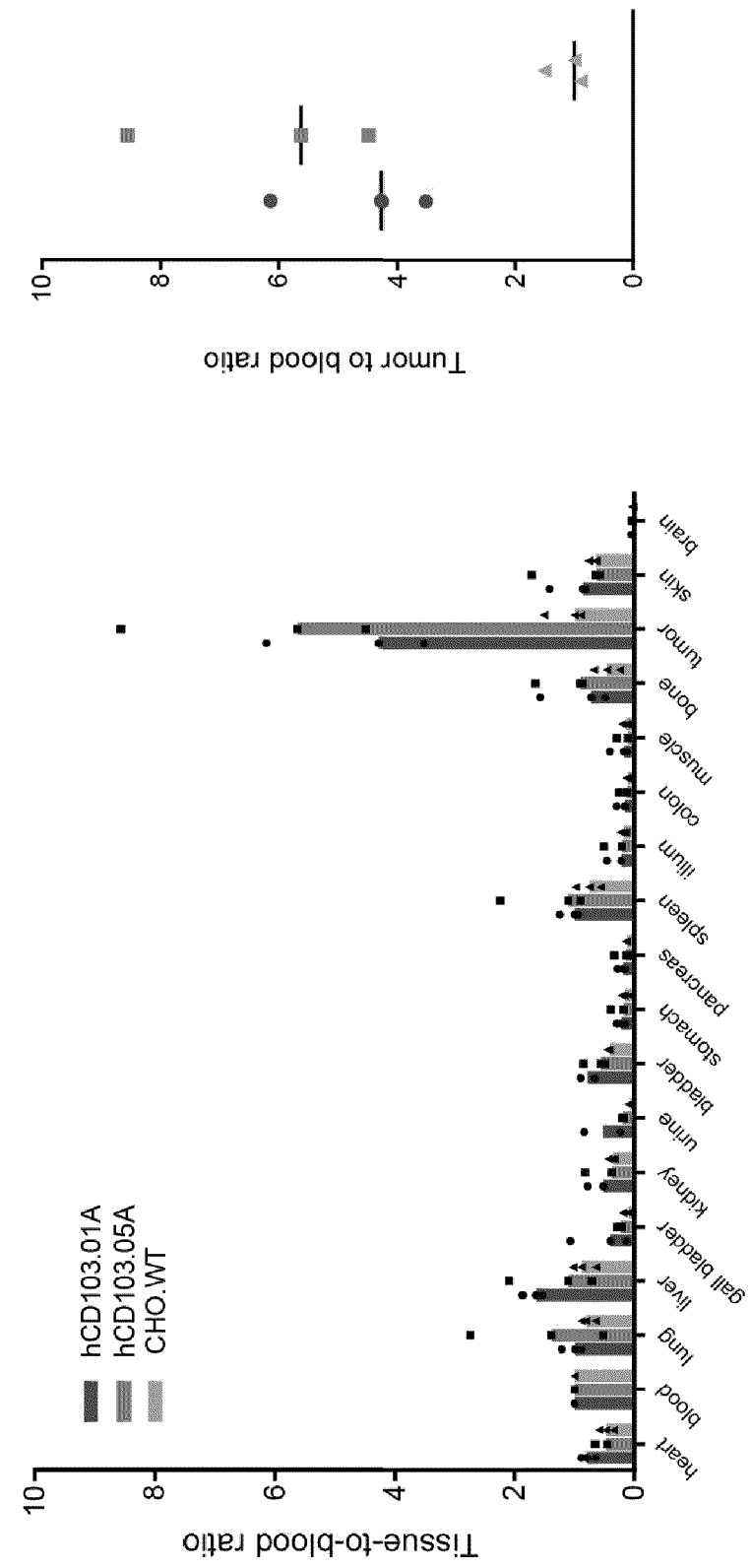
Figure 14:
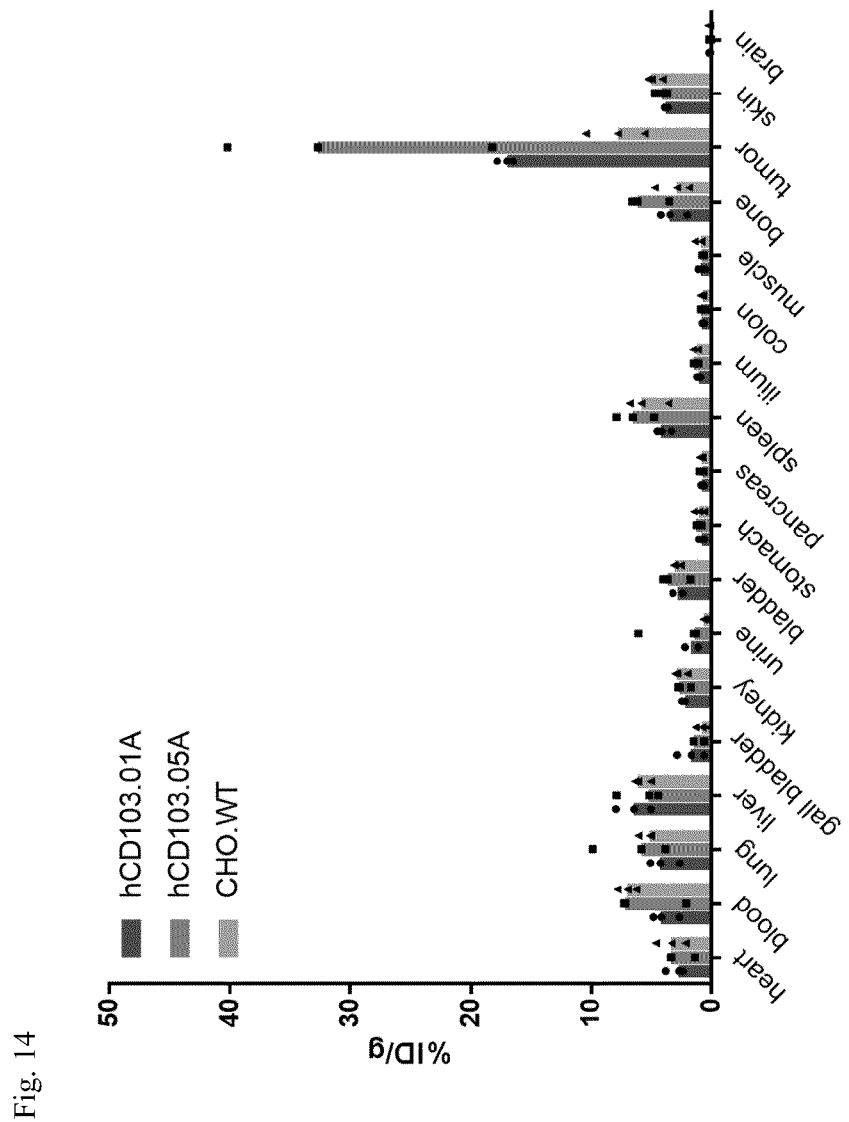
FIG. 14: Biodistribution results for $^{89}$Zr-hCD103.01A and $^{89}$Zr-hCD103.05A in CHO.K1-hCD103/hBeta7 or CHO.K1 WT bearing mice (n=3) 6 days post-injection. Tumor here means CHO.K1-hCD103/hBeta7 (red or green) or CHO.K1 (grey), respectively. CHO.K1 WT bearing mice were injected with $^{89}$Zr-hCD103.01A as an unspecific control group.
Figure 15:
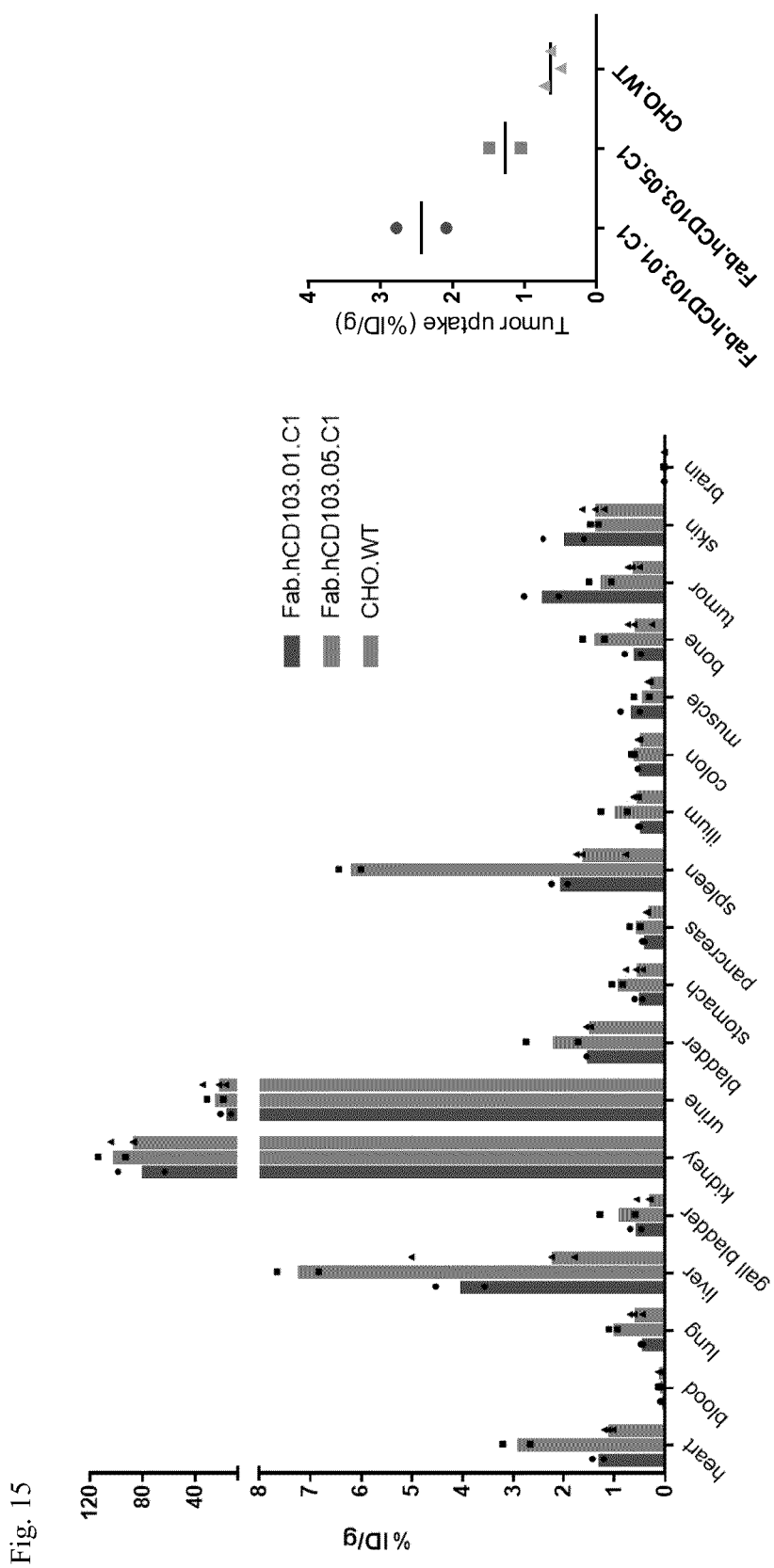
FIG. 15: Biodistribution results for $^{89}$Zr-Fab.hCD103.01.C1 and $^{89}$Zr-Fab.hCD103.05.C1 in CHO.K1-hCD103/hBeta7 (n=2) or CHO.K1 WT bearing mice (n=3) 24 hours post-injection. Tumor here means CHO.K1-hCD103/hBeta7 (red or green) or CHO.K1 WT (grey), respectively. CHO.K1 WT bearing mice were injected with $^{89}$Zr-Fab.hCD103.01.C1 as an unspecific control group.

CD103 membrane expression in CHO.K1-hCD103/hBeta7 is comparable to CD103 expression in TILs (data not shown). PET scans of CHO.K1-hCD103/hBeta7 tumor bearing mice showed that $^{89}$Zr-hCD103.01A and $^{89}$Zr-hCD103.05A tumor uptake increased over time (FIG. 13B), with highest tumor and least background organ uptake observed at day 6 post injection (median mean standardized uptake value (SUVmean) tumor: 2.7, median SUVmean blood: 0.9 for $^{89}$Zr-hCD103.01A and median SUVmean tumor: 3.0, median SUVmean blood: 0.9 for $^{89}$Zr-hCD103.05A; FIGS. 13 C, D and E). $^{89}$Zr-hCD103.01A showed no accumulation in CHO.K1 WT xenografts (SUVmean tumor: 1.5, SUVmean blood: 1.4), which was used as a non-specific control group. Similarly, ex vivo biodistribution analysis on day 6 showed high CD103 specific $^{89}$Zr-hCD103.01A and $^{89}$Zr-hCD103.05A tumor uptake (17.0 and 32.8 percentage of injected dose per gram tissue (% ID/g), respectively, for CHO.K1-hCD103/hBeta7 vs. 7.8% ID/g for CHO.K1 WT) and no major sink organs (FIG. 14). For the Fab fragments, ex vivo biodistribution analysis after 24 hours post injection showed CD103 specific $^{89}$Zr-Fab.hCD103.01.C1 and $^{89}$Zr-Fab.hCD103.05.C1 tumor uptake (2.44 and 1.27% ID/g, respectively, for CHO.K1-hCD103/hBeta7 vs. 0.64% ID/g for CHO.K1 WT) (FIG. 15).

Example 13: Use of a CD103 Targeting Radiopharmaceutical to Monitor Treatment

Prior to initiation of (immuno)therapy, a 'CD103 PET' scan is performed, alone or combined with a low-dose CT scan. Uptake of the CD103 radiopharmaceutical is quantified. CD103 PET-CT scans may be repeated and quantified at intervals during (immuno)therapy. Baseline uptake, on-treatment uptake, or treatment-induced changes in uptake from baseline are used to guide clinical decision making. This may include, but is not limited to, continuation of therapy, cessation of therapy or dose-adjustments.

Example 14: Sequences

| Description | SEQ ID NO: | SEQUENCE |
|---|---|---|
| hCD103.01A heavy chain CDR1 (amino acid sequence) | 1 | GDSITSGY |
| hCD103.01A heavy chain CDR2 (amino acid sequence) | 2 | ITYSGST |
| hCD103.01A heavy chain CDR3 (amino acid sequence) | 3 | TRHYYGSDAMDY |
| hCD103.01A light chain CDR1 (amino acid sequence) | 4 | QDVSIA |
| hCD103.01A light chain CDR2 (amino acid sequence) | 5 | SAS |
| hCD103.01A light chain CDR3 (amino acid sequence) | 6 | QQHYSTPWT |
| hCD103.01A heavy chain (amino acid sequence) | 7 | EVQLQESGPSLVKPSQTLSLTCSVTGDSITSGYWN WIRKFPGNKLEYMGYITYSGSTYYNPSLKSRISITR DTSKNQYYLQLNSVTTEDTATYYCTRHYYGSDA MDYWGQGTSVTVSS |

-continued

| Description | SEQ ID NO: | SEQUENCE |
|---|---|---|
| Example 14: Sequences | | |
| hCD103.01A light chain (amino acid sequence) | 8 | DIVMTQSHKFMSTSVGDRVSITCKASQDVSIAVAW YQQRPGQSPKLLIYSASYRYTGVPDRFTGSGSGTD FTFTISSVQAEDLAVYYCQQHYSTPWTFGGGTKLE IK |
| hCD103.02A heavy chain CDR1 (amino acid sequence) | 9 | GDSITSGY |
| hCD103.02A heavy chain CDR2 (amino acid sequence) | 10 | ITYSGST |
| hCD103.02A heavy chain CDR3 (amino acid sequence) | 11 | ARGYYGSDAMDY |
| hCD103.02A light chain CDR1 (amino acid sequence) | 12 | QDVSTA |
| hCD103.02A light chain CDR2 (amino acid sequence) | 13 | SAS |
| hCD103.02A light chain CDR3 (amino acid sequence) | 14 | QQHYSPPWT |
| hCD103.02A heavy chain (amino acid sequence) | 15 | EVQLQESGPSLVKPSQTLSLTCSVTGDSITSGYWN WIRKFPGNKLEYMGYITYSGSTYYNPSLKSRISITR DTSKNQYYLQFNSVTTEDTATYYCARGYYGSDA MDYWGQGTSVTVSS |
| hCD103.02A light chain (amino acid sequence) | 16 | DIVMTQSHKFMSTSVGDRVSITCKASQDVSTAVA WYQQKPGQSPKLLIYSASYRYTGVPDRFTGSGSGT DFTFTISSVQAEDLAVYYCQQHYSPPWTFGGGTKL EIK |
| hCD103.05A heavy chain CDR1 (amino acid sequence) | 17 | GYSFTGYN |
| hCD103.05A heavy chain CDR2 (amino acid sequence) | 18 | IDPYYGGT |
| hCD103.05A heavy chain CDR3 (amino acid sequence) | 19 | ARSFYGYDAGSPYNYAMDY |
| hCD103.05A light chain CDR1 (amino acid sequence) | 20 | QDVGTF |
| hCD103.05A light chain CDR2 (amino acid sequence) | 21 | WAS |
| hCD103.05A light chain CDR3 (amino acid sequence) | 22 | HQYSSYPYT |
| hCD103.05A heavy chain (amino acid sequence) | 23 | EVQLQQSGPELEKPGASAKISCKASGYSFTGYNMN WVKQSNGKSLEWIGNIDPYYGGTSYNQKFKGKAT LTVDKSSSTAYMQLKSLTSEDSAVYYCARSFYGY DAGSPYNYAMDYWGQGTPVTVSP |
| hCD103.05A light chain (amino acid sequence) | 24 | DIVMTQSHKFMSTSVGDRVSITCKASQDVGTFVA WYQQKPGQSPKLLIYWASTRHTGVPDRFTGSGSG TDFTLTISNVQSEDLADYFCHQYSSYPYTFGGGTQ LEIK |

-continued

| Description | SEQ ID NO: | SEQUENCE |
|---|---|---|
| Example 14: Sequences | | |
| hCD103.06A heavy chain CDR1 (amino acid sequence) | 25 | GYTFTSYW |
| hCD103.06A heavy chain CDR2 (amino acid sequence) | 26 | IYPGSGST |
| hCD103.06A heavy chain CDR3 (amino acid sequence) | 27 | TRGVYDNPYYFDY |
| hCD103.06A light chain CDR1 (amino acid sequence) | 28 | DHINNW |
| hCD103.06A light chain CDR2 (amino acid sequence) | 29 | GAT |
| hCD103.06A light chain CDR3 (amino acid sequence) | 30 | QQYWSIPLT |
| hCD103.06A heavy chain (amino acid sequence) | 31 | QVQLQQPGSELVRPGASVKLSCKASGYTFTSYWM HWVKQRHGQGLEWIGNIYPGSGSTNYDEKFKSKG TLTVDTSSSTAYMHLSSLTSEDSAVYYCTRGVYDN PYYFDYWGQGTTLTVSS |
| hCD103.06A light chain (amino acid sequence) | 32 | DIQMTQSSSNLSVSLGGRVTITCKASDHINNWLAW YQQKPGNAPRVLISGATSLETGVPSRFSGSGSGKD YTLSITSLQTEDVATYYCQQYWSIPLTFGAGTKLE LK |
| hCD103.07A heavy chain CDR1 (amino acid sequence) | 33 | GDSITSGY |
| hCD103.07A heavy chain CDR2 (amino acid sequence) | 34 | ITYSGST |
| hCD103.07A heavy chain CDR3 (amino acid sequence) | 35 | ARNYYGSSSMDY |
| hCD103.07A light chain CDR1 (amino acid sequence) | 36 | QNVGSD |
| hCD103.07A light chain CDR2 (amino acid sequence) | 37 | SAS |
| hCD103.07A light chain CDR3 (amino acid sequence) | 38 | QQYNSYPST |
| hCD103.07A heavy chain (amino acid sequence) | 39 | EVQLQESGPSLVKPSQTLSLTCSVTGDSITSGYWN WIRKFPGNKLEYMGYITYSGSTYYNPSLKSRISITR DTSKNQYYLQLNSVTTEDTATYYCARNYYGSSSM DYWGQGTSVTVSS |
| hCD103.07A light chain (amino acid sequence) | 40 | DIVMTQSQKFMSTSVADRVSVTCKASQNVGSDVA WYQQKPGQSPKSLIYSASYRYSGVPDRFTGSGSGT DFTLTISNVQSEDLAEYFCQQYNSYPSTFGGGTKL EIK |
| human integrin Alpha-E (amino acid sequence) | 41 | MWLFHTLLCIASLALLAAFNVDVARPWLTPKGGA PFVLSSLLHQDPSTNQTWLLVTSPRTKRTPGPLHR CSLVQDEILCHPVEHVPIPKGRHRGVTVVRSHHGV LICIQVLVRRPHSLSSELTGTCSLLGPDLRPQAQAN FFDLENLLDPDARVDTGDCYSNKEGGGEDDVNTA RQRRALEKEEEEDKEEEEDEEEEEAGTEIAIILDGS |

-continued

Example 14: Sequences

| Description | SEQ ID NO: | SEQUENCE |
|---|---|---|
| | | GSIDPPDFQRAKDFISNMMRNFYEKCFECNFALVQ YGGVIQTEFDLRDSQDVMASLARVQNITQVGSVT KTASAMQHVLDSIFTSSHGSRRKASKVMVVLTDG GIFEDPLNLTTVINSPKMQGVERFAIGVGEEFKSAR TARELNLIASDPDETHAFKVTNYMALDGLLSKLRY NIISMEGTVGDALHYQLAQIGFSAQILDERQVLLG AVGAFDWSGGALLYDTRSRRGRFLNQTAAAAAD AEAAQYSYLGYAVAVLHKTCSLSYIAGAPRYKHH GAVFELQKEGREASFLPVLEGEQMGSYFGSELCPV DIDMDGSTDFLLVAAPFYHVHGEEGRVYVYRLSE QDGSFSLARILSGHPGFTNARFGFAMAAMGDLSQ DKLTDVAIGAPLEGFGADDGASFGSVYIYNGHWD GLSASPSQRIRASTVAPGLQYFGMSMAGGFDISGD GLADITVGTLGQAVVFRSRPVVRLKVSMAFTPSAL PIGFNGVVNVRLCFEISSVTTASESGLREALLNFTL DVDVGKQRRRLQCSDVRSCLGCLREWSSGSQLCE DLLLMPTEGELCEEDCFSNASVKVSYQLQTPEGQT DHPQPILDRYTEPFAIFQLPYEKACKNKLFCVAELQ LATTVSQQELVVGLTKELTLNINLTNSGEDSYMTS MALNYPRNLQLKRMQKPPSPNIQCDDPQPVASVLI MNCRIGHPVLKRSSAHVSVVWQLEENAFPNRTAD ITVTVTNSNERRSLANETHTLQFRHGFVAVLSKPSI MYVNTGQGLSHHKEFLPHVHGENLFGAEYQLQIC VPTKLRGLQVVAVKKLTRTQASTVCTWSQERACA YSSVQHVEEWHSVSCVIASDKENVTVAAEISWDH SEELLKDVTELQILGEISFNKSLYEGLNAENHRTKI TVVFLKDEKYHSLPIIIKGSVGGLLVLIVILVILFKC GFFKRKYQQLNLESIRKAQLKSENLLEEEN |
| human integrin Beta-7 (amino acid sequence) | 42 | MVALPMVLLLLVLSRGESELDAKIPSTGDATEW RNPHLSMLGSCQPAPSCQKCILSHPSCAWCKQLNF TASGEAEARRCARREELLARGCPLEELEEPRGQQE VLQDQPLSQGARGEGATQLAPQRVRVTLRPGEPQ QLQVRFLRAEGYPVDLYYLMDLSYSMKDDLERV RQLGHALLVRLQEVTHSVRIGFGSFVDKTVLPFVS TVPSKLRHPCPTRLERCQSPFSFHHVLSLTGDAQAF EREVGRQSVSGNLDSPEGGFDAILQAALCQEQIGW RNVSRLLVFTSDDTFHTAGDGKLGGIFMPSDGHCH LDSNGLYSRSTEFDYPSVGQVAQALSAANIQPIFA VTSAALPVYQELSKLIPKSAVGELSEDSSVVWQLIM DAYNSLSSTVTLEHSSLPPGVHISYESQCEGPEKRE GKAEDRGQCNHVRINQTVTFWVSLQATHCLPEPH LLRLRALGFSEELIVELHTLCDCNCSDTQPQAPHCS DGQGHLQCGVCSCAPGRLGRLCECSVAELSSPDLE SGCRAPNGTGPLCSGKGHCQCGRCSCSGQSSGHL CECDDASCERHEGILCGGFGRCQCGVCHCHANRT GRACECSGDMDSCISPEGGLCSGHGRCKCNRCQC LDGYYGALCDQCPGCKTPCERHRDCAECGAFRTG PLATNCSTACAHTNVTLALAPILDDGWCKERTLD NQLFFFLVEDDARGTVVLRVRPQEKGADHTQAIV LGCVGGIVAVGLGLVLAYRLSVEIYDRREYSRFEK EQQQLNWKQDSNPLYKSAITTTINPRFQEADSPTL |
| rhesus integrin Alpha-E (amino acid sequence) | 43 | MWLVHTLLCMASLAPLAAFNVDVARPWLTPKGG APFVLSSLLHQDPGTNHTWLLVTSPRTERTPVPLH RCSLVQDEILCHSVEHVPIPKGRHRGVTVARSHHG VLICIQVLARRPYSLSSEFTGTCGLLGPDLRPQAQA NFFDLENLLDPDARVDTGDCYSNKEGSRGEDVNT ARRRRALEKEEEEDEEEEEDEEEEAGTEIAIILDGS GSIDPPDFQRAKDFISNMMRNFYEKCFECNFALVQ YGGVIQTEFDLRDSQDVMASLAKVQNITQVGSVT KTASAMQHVLDNIFTSSHGSRRKASKVMVVLTDG GIFEDPLDLTTVINSPKMHGVERFAIGVGEEFKSAR TERELNLIASDPDETHAFKVTNYMALDGLLSKLRY NIISMEGTVGDALHYQLAQIGFSAQILDERQVLLG AVGAFDWSGGALLYNTRSRRGRFLNQTAAAVDG EAAQYSYLGYAVAVLHKTCSVSYVAGAPRYKHH GAVFELQKEGTETSFLPVLEGEQMGSYFGSELCPV DIDMDGTTDFLLVAAPFYHVHGEEGRVYVYRLSE QDGSFSLARILSGHPGFASARFGFAMAAVGDISQD KLTDVAIGAPLEGFGAGDGASFGSVYIYNGHWDG LSAGPSQRIRASAVAPGLQYFGMSVAGGFDISGDG LADITVGTLGRAVVFRSRPVVRLEVSMAFTPSALPI GFNGVVNVRLCFEISSVATVSASGLRGAFLNFTLD |

Example 14: Sequences

| Description | SEQ ID NO: | SEQUENCE |
|---|---|---|
| | | VDVGKERKRLQCSDGRSCLGCLREWSSGSRLCED<br>LLLVPTEGELHEEDCFSNATVKVGYQLQTPEGQTD<br>HPQPILDRYAETFAIFQLPYEKACKNKLFCVAELQL<br>ATTVSQQELVVGLTKELTLNISLTNSGEDSYMTSM<br>ALNYPRNLQFKRMQKPPSPNIQCDDPQPAASVLV<br>MTCRIGHPVLRRSSAHVSVVWQLEENAFPNRTADI<br>TVTVTNSNERRSVAEETHTLQFRHGFVAVLSKPSI<br>MYVHTGQVLSHHKEFVFHIHGENLFGAEYQLRIC<br>VPTKLRGLQIVTVKNLTRTQAFTVCTWSQERACGF<br>IPVQHVEEWHSVSCVIASDKENVTVAAEISVDHSE<br>ELLKDVTELQILGEISFNKSLYEGLNAENHRTKITV<br>VFLKDEKYHSLPVIIKGSIGGLLVLIVILVILFKCGFF<br>KRKYQQLNLENIRKAQLKSETLLEEEN |
| rhesus integrin Beta-7 (amino acid sequence) | 44 | MGFCHVDQGMVALPVVLVLLLVLSRGESELDAKT<br>PSTGEATEWGNPHLSLLGSCQPAPSCQKCIVSHPSC<br>AWCKQLNFTASGEAEARRCARREELLARGCPLEE<br>LEEPRGQQEVLQDQPLSQGARGEGATQLAPQRVRI<br>TLRPGEPQQLQVRFLRAEGYPVDLYYLMDLSYSM<br>KDDLERVRQLGHALLVRLQEVTHSVRIGFGSFVD<br>KTVLPFVSTVPSKLRHPCPTRLERCQSPFSFHHVLS<br>LTGDAQAFEREVGRQSVSGNLDSPEGGFDAILQAA<br>LCQEQIGWRNVSRLLVFTSDDTFHTAGDGKLGGIF<br>MPSDGHCHLDSNGLYSRSTEFDYPSVGQVAQALS<br>AANIQPIFAVTSAALPVYQELSKLIPKSAVGELSED<br>SSNVVQLIMDAYNSLSSTVTLEHSSLPPGVHISYES<br>QCEGPEKTEGKAEDRGQCNHVQINQTVTFWVSLQ<br>ATHCLPEPHLLRLALGFSEELIVELHTLCDCNCSD<br>TQAQAPHCSDGQGHLQCGVCSCAPGRLGRLCECS<br>EAELSSLDLESGCRAPNGTGPLCSGKGQCQCGHCS<br>CNGQSSGHLCECDDASCERHEGILCGGFGRCQCG<br>VCHCHANRTGRACECSGDMDSCISPEGGLCSGHG<br>RCKCNRCQCSDGYYGALCDQCPGCKTPCERHRDC<br>AECGAFGTGLLATNCSTACAHTNVTLVLAPILDDG<br>WCKERTLDNHLFFFLVEDDARGRVVLRVRPQEKG<br>ADHTQAIVLGCVGGIVAVGLGLVLAYRLSVEIYDR<br>REYSRFEKEQQQLNWKQDSNPLYKSAITTTINPRF<br>QEADSPIL |
| human integrin Alpha-4 (amino acid sequence) | 45 | MAWEARREPGPRRAAVRETVMLLLCLGVPTGRPY<br>NVDTESALLYQGPHNTLFGYSVVLHSHGANRWLL<br>VGAPTANWLANASVINPGAIYRCRIGKNPGQTCEQ<br>LQLGSPNGEPCGKTCLEERDNWLGVTLSRQPGE<br>NGSIVTCGHRWKNIFYIKNENKLPTGGCYGVPPDL<br>RTELSKRIAPCYQDYVKKFGENFASCQAGISSFYT<br>KDLIVMGAPGSSYWTGSLFVYNITTNKYKAFLDK<br>QNQVKFGSYLGYSVGAGHFRSQHTTEVVGGAPQH<br>EQIGKAYIFSIDEKELNILHEMKGKKLGSYFGASVC<br>AVDLNADGFSDLLVGAPMQSTIREEGRVFVYINSG<br>SGAVMNAMETNLVGSDKYAARFGESIVNLGDIDN<br>DGFEDVAIGAPQEDDLQGAIYIYNGRADGISSTFSQ<br>RIEGLQISKSLSMFGQSISGQIDADNNGYVDVAVG<br>AFRSDSAVLLRTRPVVIVDASLSHPESVNRTKFDC<br>VENGWPSVCIDLTLCFSYKGKEVPGYIVLFYNMSL<br>DVNRKAESPPRFYFSSNGTSDVITGSIQVSSREANC<br>RTHQAFMRKDVRDILTPIQIEAAYHLGPHVISKRST<br>EEFPPLQPILQQKKEKDIMKKTINFARFCAHENCSA<br>DLQVSAKIGFLKPHENKTYLAVGSMKTLMLNVSL<br>FNAGDDAYETTLHVKLPVGLYFIKILELEEKQINCE<br>VTDNSGVVQLDCSIGYIYVDHLSRIDISFLLDVSSLS<br>RAEEDLSITVHATCENEEEMDNLKHSRVTVAIPLK<br>YEVKLTVHGFVNPTSFVYGSNDENEPETCMVEKM<br>NLTFHVINTGNSMAPNVSVEIMVPNSFSPQTDKLF<br>NILDVQTTTGECHFENYQRVCALEQQKSAMQTLK<br>GIVRFLSKTDKRLLYCIKADPHCLNFLCNFGKMES<br>GKEASVHIQLEGRPSILEMDETSALKFEIRATGFPEP<br>NPRVIELNKDENVAHVLLEGLHHQRPKRYFTIVIIS<br>SSLLLGLIVLLLISYVMWKAGFFKRQYKSILQEENR<br>RDSWSYINSKSNDD |

Example 15: References

Khalil, D. N., Smith, E. L., Brentjens, R. J. & Wolchok, J. D. The future of cancer treatment: immunomodulation, CARs and combination immunotherapy. Nat. Rev. Clin. Oncol. 2016; 13: 273-290.

Rizvi, N. A., Hellmann, M. D., Snyder, A., Kvistborg, P., Makarov, V., Havel, J. J., Lee, W., Yuan, J., Wong, P., Ho, T. S., Miller, M. L., Rekhtman, N., Moreira, A. L., Ibrahim, F., Bruggeman, C., Gasmi, B., Zappasodi, R., Maeda, Y., Sander, C., Garon, E. B., Merghoub, T., Wolchok, J. D., Schumacher, T. N. & Chan, T. A. Mutational landscape determines sensitivity to PD-1 blockade in non-small cell lung cancer. Science 2015; 348: 124-128.

McGranahan, N., Furness, A. J. S., Rosenthal, R., Ramskov, S., Lyngaa, R., Saini, S. K., Jamal-Hanjani, M., Wilson, G. A., Birkbak, N. J., Hiley, C. T., Watkins, T. B. K., Shafi, S., Murugaesu, N., Mitter, R., Akarca, A. U., Linares, J., Marafioti, T., Henry, J. Y., Van Allen, E. M., Miao, D., Schilling, B., Schadendorf, D., Garraway, L. A., Makarov, V., Rizvi, N. A., Snyder, A., Hellmann, M. D., Merghoub, T., Wolchok, J. D., Shukla, S. A., Wu, C. J., Peggs, K. S., Chan, T. A., Hadrup, S. R., Quezada, S. A. & Swanton, C. Clonal neoantigens elicit T cell immunoreactivity and sensitivity to immune checkpoint blockade. Science 2016; 351: 1463-1469.

Le, D. T., Durham, J. N., Smith, K. N., Wang, H., Bartlett, B. R., Aulakh, L. K., Lu, S., Kemberling, H., Wilt, C., Luber, B. S., Wong, F., Azad, N. S., Rucki, A. A., Laheru, D., Donehower, R., Zaheer, A., Fisher, G. A., Crocenzi, T. S., Lee, J. J., Greten, T. F., Duffy, A. G., Ciombor, K. K., Eyring, A. D., Lam, B. H., Joe, A., Kang, S. P., Holdhoff, M., Danilova, L., Cope, L., Meyer, C., Zhou, S., Goldberg, R. M., Armstrong, D. K., Bever, K. M., Fader, A. N., Taube, J., Housseau, F., Spetzler, D., Xiao, N., Pardoll, D. M., Papadopoulos, N., Kinzler, K. W., Eshleman, J. R., Vogelstein, B., Anders, R. A. & Diaz, L. A. Mismatch-repair deficiency predicts response of solid tumors to PD-1 blockade. Science 2017; doi:10.1126/science.aan6733.

Sharma, P. & Allison, J. P. The future of immune checkpoint therapy. Science 2015; 348: 56-61.

Adams, J. L., Smothers, J., Srinivasan, R. & Hoos, A. Big opportunities for small molecules in immuno-oncology. Nat. Rev. Drug Discov. 2015; 14: 603-22.

Topalian, S. L., Drake, C. G. & Pardoll, D. M. Immune checkpoint blockade: A common denominator approach to cancer therapy. Cancer Cell 2015; 27: 450-61.

Postow, M. A., Callahan, M. K. & Wolchok, J. D. Immune checkpoint blockade in cancer therapy. J. Clin. Oncol. 2015; 33: 1974-82.

Buchbinder, E. & Hodi, F. S. Cytotoxic T lymphocyte antigen-4 and immune checkpoint blockade. J. Clin. Invest. 2015; 125: 3377-83.

Mahoney, K. M., Rennert, P. D. & Freeman, G. J. Combination cancer immunotherapy and new immunomodulatory targets. Nat. Rev. Drug Discov. 2015; 14: 561-584.

Lesterhuis, W. J., Bosco, A., Millward, M. J., Small, M., Nowak, A. K. & Lake, R. A. Dynamic versus static biomarkers in cancer immune checkpoint blockade: unravelling complexity. Nat. Rev. Drug Discov. 2017; 16: 264-272.

Gnjatic, S., Bronte, V., Brunet, L. R., Butler, M. O., Disis, M. L., Galon, J., Hakansson, L. G., Hanks, B. A., Karanikas, V., Khleif, S. N., Kirkwood, J. M., Miller, L. D., Schendel, D. J., Tanneau, I., Wigginton, J. M. & Butterfield, L. H. Identifying baseline immune-related biomarkers to predict clinical outcome of immunotherapy. J. Immunother. Cancer 2017; 5: 44.

Nishino, M., Ramaiya, N. H., Hatabu, H. & Hodi, F. S. Monitoring immune-checkpoint blockade: response evaluation and biomarker development. Nat. Rev. Clin. Oncol. 2017; doi:10.1038/nrclinonc.2017.88.

Djenidi, F., Adam, J., Goubar, A., Durgeau, A., Meurice, G., de Montpreville, V., Validire, P., Besse, B. & Mami-Chouaib, F. CD8+CD103+ tumor-infiltrating lymphocytes are tumor-specific tissue-resident memory T cells and a prognostic factor for survival in lung cancer patients. J. Immunol. 2015; 194: 3475-3486.

Webb, J. R., Milne, K. & Nelson, B. H. PD-1 and CD103 are widely coexpressed on prognostically favorable intraepithelial CD8 T cells in human ovarian cancer. Cancer Immunol. Res. 2015; 3: 926-935.

Bösmüller, H.-C., Wagner, P., Peper, J. K., Schuster, H., Pham, D. L., Greif, K., Beschorner, C., Rammensee, H.-G., Stevanović, S., Fend, F. & Staebler, A. Combined immunoscore of CD103 and CD3 identifies long-term survivors in high-grade serous ovarian cancer. Int. J. Gynecol. Cancer 2016; 26: 671-679.

Workel, H. H., Komdeur, F. L., Wouters, M. C. A., Plat, A., Klip, H. G., Eggink, F. A., Wisman, G. B. A., Arts, H. J. G., Oonk, M. H. M., Mourits, M. J. E., Yigit, R., Versluis, M., Duiker, E. W., Hollema, H., de Bruyn, M. & Nijman, H. W. CD103 defines intraepithelial CD8+PD1+ tumour-infiltrating lymphocytes of prognostic significance in endometrial adenocarcinoma. Eur. J. Cancer 2016; 60: 1-11.

Santoiemma, P. P., Reyes, C., Wang, L.-P., McLane, M. W., Feldman, M. D., Tanyi, J. L. & Powell, D. J. Systematic evaluation of multiple immune markers reveals prognostic factors in ovarian cancer. Gynecol. Oncol. 2016; 143: 120-127.

Komdeur, F. L., Wouters, M. C. A., Workel, H. H., Tijans, A. M., Terwindt, A. L. J., Brunekreeft, K. L., Plat, A., Klip, H. G., Eggink, F. A., Leffers, N., Helfrich, W., Samplonius, D. F., Bremer, E., Wisman, G. B. A., Daemen, T., Duiker, E. W., Hollema, H., Nijman, H. W. & de Bruyn, M. CD103+ intraepithelial T cells in high-grade serous ovarian cancer are phenotypically diverse TCRαβ+CD8αβ+ T cells that can be targeted for cancer immunotherapy. Oncotarget 2016; 7: 75130-75144.

Boutet, M., Gauthier, L., Leclerc, M., Gros, G., de Montpreville, V., Theret, N., Donnadieu, E. & Mami-Chouaib, F. TGFβ signaling intersects with CD103 integrin signaling to promote T-lymphocyte accumulation and antitumor activity in the lung tumor microenvironment. Cancer Res. 2016; 76: 1757-1769.

Ganesan, A.-P., Clarke, J., Wood, O., Garrido-Martin, E. M., Chee, S. J., Mellows, T., Samaniego-Castruita, D., Singh, D., Seumois, G., Alzetani, A., Woo, E., Friedmann, P. S., King, E. V, Thomas, G. J., Sanchez-Elsner, T., Vijayanand, P. & Ottensmeier, C. H. Tissue-resident memory features are linked to the magnitude of cytotoxic T cell responses in human lung cancer. Nat. Immunol. 2017; 18: 940-950.

Wang, B., Wu, S., Zeng, H., Liu, Z., Dong, W., He, W., Chen, X., Dong, X., Zheng, L., Lin, T. & Huang, J. CD103+ tumor infiltrating lymphocytes predict a favorable prognosis in urothelial cell carcinoma of the bladder. J. Urol. 2015; 194: 556-562.

Wang, Z. Q., Milne, K., Derocher, H., Webb, J. R., Nelson, B. H. & Watson, P. H. CD103 and intratumoral immune response in breast cancer. Clin. Cancer Res. 2016; 22: 6290-6297.

Kato R., Yamasaki M., Urakawa S., Nishida K., Makino T., Morimoto-Okazawa A., Kawashima A., Iwahori K., Suzuki S., Ueda R., Mori M., Satoh T., Doki Y., Wada H. Increased Tim-3+ T cells in PBMCs during nivolumab therapy correlate with responses and prognosis of advanced esophageal squamous cell carcinoma patients. Cancer Immunol Immunother. 2018. doi: 10.1007/s00262-018-2225-x.

Rocha P., Hardy-Werbin M., Naranjo D., Taus Á., Rodrigo M., Zuccarino F., Roth R., Wood O., Ottensmeier C. H., Arriola E. CD103+CD8+ Lymphocytes Characterize the Immune Infiltration in a Case With Pseudoprogression in Squamous NSCLC. J Thorac Oncol. 2018; 13):e193-e196.

Edwards J., Wilmott J. S., Madore J., Gide T. N., Quek C., Tasker A., Ferguson A., Chen J., Hewavisenti R., Hersey P., Gebhardt T., Weninger W., Britton W. J., Saw R. P. M., Thompson J. F., Menzies A. M., Long G. V., Scolyer R. A., Palendira U. CD103+Tumor-Resident CD8+ T Cells Are Associated with Improved Survival in Immunotherapy-Naïve Melanoma Patients and Expand Significantly During Anti-PD-1 Treatment. Clin Cancer Res. 2018; 24:3036-3045 van Kruchten, M., de Vries, E. G. E., Brown, M., de Vries, E. F. J., Glaudemans, A. W. J. M., Dierckx, R. A. J. O., Schroder, C. P. & Hospers, G. A. P. PET imaging of oestrogen receptors in patients with breast cancer. Lancet Oncol. 2013; 14: e465-75.

van Kruchten, M., Hospers, G. A. P., Glaudemans, A. W. J. M., Hollema, H., Arts, H. J. G. & Reyners, A. K. L. Positron emission tomography imaging of oestrogen receptor-expression in endometrial stromal sarcoma supports oestrogen receptor-targeted therapy: case report and review of the literature. Eur. J. Cancer 2013; 49: 3850-5.

Talbot, J. N., Gligorov, J., Nataf, V., Montravers, F., Huchet, V., Michaud, L., Ohnona, J., Balogova, S., Cussenot, O., Darai, E., Lotz, J. P. & Kerrou, K. Current applications of PET imaging of sex hormone receptors with a fluorinated analogue of estradiol or of testosterone. Q. J. Nucl. Med. Mol. Imaging 2015; 59: 4-17.

Grootjans, W., de Geus-Oei, L.-F., Troost, E. G. C., Visser, E. P., Oyen, W. J. G. & Bussink, J. PET in the management of locally advanced and metastatic NSCLC. Nat. Rev. Clin. Oncol. 2015; 12: 395-407.

Houshmand, S., Boursi, B., Salavati, A., Simone, C. B. & Alavi, A. Applications of Fluorodeoxyglucose PET/Computed tomography in the assessment and prediction of radiation therapy-related complications. PET Clin. 2015; 10: 555-71.

Bernard-Gauthier, V., Bailey, J. J., Berke, S. & Schirrmacher, R. Recent advances in the development and application of radiolabeled kinase inhibitors for PET imaging. Molecules 2015; 20: 22000-27.

Challapalli, A. & Aboagye, E. O. Positron emission tomography imaging of tumor cell metabolism and application to therapy response monitoring. Front. Oncol. 2016; 6: 44.

Spick, C., Herrmann, K. & Czernin, J. 18F-FDG PET/CT and PET/MRI perform equally well in vancer: Evidence from studies on more than 2,300 patients. J. Nucl. Med. 2016; 57: 420-30.

Bollineni, V. R., Kramer, G. M., Jansma, E. P., Liu, Y. & Oyen, W. J. G. A systematic review on [(18)F]FLT-PET uptake as a measure of treatment response in cancer patients. Eur. J. Cancer 2016; 55: 81-97.

Eggink, F. A., Van Gool, I. C., Leary, A., Pollock, P. M., Crosbie, E. J., Mileshkin, L., Jordanova, E. S., Adam, J., Freeman-Mills, L., Church, D. N., Creutzberg, C. L., De Bruyn, M., Nijman, H. W. & Bosse, T. Immunological profiling of molecularly classified high-risk endometrial cancers identifies POLE-mutant and microsatellite unstable carcinomas as candidates for checkpoint inhibition. Oncoimmunology 2017; 6:e1264565.

F. A. Ran, P. D. Hsu, J. Wright, V. Agarwala, D. A. Scott, F. Zhang, Genome engineering using the CRISPR-Cas9 system, Nat. Protoc. 8, 2281-2308 (2013).

A. Kol, A. T. van Scheltinga, M. Pool, C. Gerdes, E. de Vries, S. de Jong, ADCC responses and blocking of EGFR-mediated signaling and cell growth by combining the anti-EGFR antibodies imgatuzumab and cetuximab in NSCLC cells., Oncotarget 8, 45432-45446 (2017).

B. J. C. Quah, H. S. Warren, C. R. Parish, Monitoring lymphocyte proliferation in vitro and in vivo with the intracellular fluorescent dye carboxyfluorescein diacetate succinimidyl ester., Nat. Protoc. 2, 2049-2056 (2007).

E. C. F. Dijkers, J. G. W. Kosterink, A. P. Rademaker, L. R. Perk, G. a M. S. van Dongen, J. Bart, J. R. de Jong, E. G. E. de Vries, M. N. Lub-de Hooge, Development and characterization of clinical-grade 89Zr-trastuzumab for HER2/neu immunoPET imaging., J. Nucl. Med. 50, 974-981 (2009).

F. A. Ran, P. D. Hsu, J. Wright, V. Agarwala, D. A. Scott, F. Zhang. Genome engineering using the CRISPR-Cas9 system. Nat. Protoc. 8: 2281-2308 (2013)

P. G. Steenbakkers, F. van Meel, W. Olijve. A new approach to the generation of human or murine antibody producing hybridomas. J Immunol Methods. 152: 69-77 (1992).

All references cited herein are incorporated by reference to the same extent as if each individual publication, database entry (e.g. Genbank sequences or GeneID entries), patent application, or patent, was specifically and individually indicated to be incorporated by reference. This statement of incorporation by reference is intended by Applicants, pursuant to 37 C.F.R. § 1.57(b)(1), to relate to each and every individual publication, database entry (e.g. Genbank sequences or GeneID entries), patent application, or patent, each of which is clearly identified in compliance with 37 C.F.R. § 1.57(b)(2), even if such citation is not immediately adjacent to a dedicated statement of incorporation by reference. The inclusion of dedicated statements of incorporation by reference, if any, within the specification does not in any way weaken this general statement of incorporation by reference. Citation of the references herein is not intended as an admission that the reference is pertinent prior art, nor does it constitute any admission as to the contents or date of these publications or documents. To the extent that the references provide a definition for a claimed term that conflicts with the definitions provided in the instant specification, the definitions provided in the instant specification shall be used to interpret the claimed invention.

While the invention has been described and exemplified in sufficient detail for those skilled in this art to make and use it, various alternatives, modifications, and improvements should be apparent without departing from the spirit and scope of the invention. The examples provided herein are representative of preferred embodiments, are exemplary, and are not intended as limitations on the scope of the invention. Modifications therein and other uses will occur to those skilled in the art. These modifications are encompassed within the spirit of the invention and are defined by the scope of the claims.

It will be readily apparent to a person skilled in the art that varying substitutions and modifications may be made to the invention disclosed herein without departing from the scope and spirit of the invention.

All patent applications, patents, publications and other references mentioned in the specification are indicative of the levels of those of ordinary skill in the art to which the invention pertains and are each incorporated herein by reference. The references cited herein are not admitted to be prior art to the claimed invention.

Unless otherwise defined, all technical and scientific terms used herein have the same meaning as commonly understood by one of ordinary skill in the art to which this invention belongs. In the case of conflict, the present specification, including definitions, will control.

The use of the articles "a", "an", and "the" in both the description and claims are to be construed to cover both the singular and the plural, unless otherwise indicated herein or clearly contradicted by context. The terms "comprising", "having", "being of" as in "being of a chemical formula", "including", and "containing" are to be construed as open terms (i.e., meaning "including but not limited to") unless otherwise noted. Additionally whenever "comprising" or another open-ended term is used in an embodiment, it is to be understood that the same embodiment can be more narrowly claimed using the intermediate term "consisting essentially of" or the closed term "consisting of".

The term "about", "approximately", or "approximate", when used in connection with a numerical value, means that a collection or range of values is included. For example, "about X" includes a range of values that are ±20%, ±10%, ±5%, ±2%, ±1%, ±0.5%, ±0.2%, or ±0.1% of X, where X is a numerical value. In one embodiment, the term "about" refers to a range of values which are 10% more or less than the specified value. In another embodiment, the term "about" refers to a range of values which are 5% more or less than the specified value. In another embodiment, the term "about" refers to a range of values which are 1% more or less than the specified value.

Recitation of ranges of values are merely intended to serve as a shorthand method of referring individually to each separate value falling within the range, unless otherwise indicated herein, and each separate value is incorporated into the specification as if it were individually recited herein. A range used herein, unless otherwise specified, includes the two limits of the range. For example, the terms "between X and Y" and "range from X to Y, are inclusive of X and Y and the integers there between. On the other hand, when a series of individual values are referred to in the disclosure, any range including any of the two individual values as the two end points is also conceived in this disclosure. For example, the expression "a dose of about 100 mg, 200 mg, or 400 mg" can also mean "a dose ranging from 100 to 200 mg", "a dose ranging from 200 to 400 mg", or "a dose ranging from 100 to 400 mg".

The invention illustratively described herein suitably may be practiced in the absence of any element or elements, limitation or limitations which is not specifically disclosed herein. Thus, for example, in each instance herein any of the terms "comprising", "consisting essentially of" and "consisting of" may be replaced with either of the other two terms. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

The invention claimed is:

1. An antibody or antigen binding fragment thereof that binds to human CD103, wherein the antibody or antigen binding fragment comprises:
   a. a heavy chain variable region CDR1 comprising the amino acid sequence of SEQ ID NO: 1,
   b. a heavy chain variable region CDR2 comprising the amino acid sequence of SEQ ID NO: 2,
   c. a heavy chain variable region CDR3 comprising the amino acid sequence of SEQ ID NO: 3,
   d. a light chain variable region CDR1 comprising the amino acid sequence of SEQ ID NO: 4,
   e. a light chain variable region CDR2 comprising the amino acid sequence of SEQ ID NO: 5, and
   f. a light chain variable region CDR3 comprising the amino acid sequence of SEQ ID NO: 6
   or an antibody or antigen binding fragment thereof that binds to human CD103, wherein the antibody or antigen binding fragment comprises:
   g. a heavy chain variable region CDR1 comprising the amino acid sequence of SEQ ID NO: 9,
   h. a heavy chain variable region CDR2 comprising the amino acid sequence of SEQ ID NO: 10,
   i. a heavy chain variable region CDR3 comprising the amino acid sequence of SEQ ID NO: 11,
   j. a light chain variable region CDR1 comprising the amino acid sequence of SEQ ID NO: 12, k. a light chain variable region CDR2 comprising the amino acid sequence of SEQ ID NO: 13, and
l. a light chain variable region CDR3 comprising the amino acid sequence of SEQ ID NO: 14
or
an antibody or antigen binding fragment thereof that binds to human CD103, wherein the antibody or antigen binding fragment comprises:
m. a heavy chain variable region CDR1 comprising the amino acid sequence of SEQ ID NO: 17,
n. a heavy chain variable region CDR2 comprising the amino acid sequence of SEQ ID NO: 18,
o. a heavy chain variable region CDR3 comprising the amino acid sequence of SEQ ID NO: 19,
p. a light chain variable region CDR1 comprising the amino acid sequence of SEQ ID NO: 20,
q. a light chain variable region CDR2 comprising the amino acid sequence of SEQ ID NO: 21, and
r. a light chain variable region CDR3 comprising the amino acid sequence of SEQ ID NO: 22
or
an antibody or antigen binding fragment thereof that binds to human CD103, wherein the antibody or antigen binding fragment comprises: one or more, and optionally each, of:
s. a heavy chain variable region CDR1 comprising the amino acid sequence of SEQ ID NO: 25,
t. a heavy chain variable region CDR2 comprising the amino acid sequence of SEQ ID NO: 26,
u. a heavy chain variable region CDR3 comprising the amino acid sequence of SEQ ID NO: 27,
v. a light chain variable region CDR1 comprising the amino acid sequence of SEQ ID NO: 28,
w. a light chain variable region CDR2 comprising the amino acid sequence of SEQ ID NO: 29, and
x. a light chain variable region CDR3 comprising the amino acid sequence of SEQ ID NO: 30
or
an antibody or antigen binding fragment thereof that binds to human CD103, wherein the antibody or antigen binding fragment comprises:
y. a heavy chain variable region CDR1 comprising the amino acid sequence of SEQ ID NO: 33,
z. a heavy chain variable region CDR2 comprising the amino acid sequence of SEQ ID NO: 34,
aa. a heavy chain variable region CDR3 comprising the amino acid sequence of SEQ ID NO: 35,
bb. a light chain variable region CDR1 comprising the amino acid sequence of SEQ ID NO: 36,
cc. a light chain variable region CDR2 comprising the amino acid sequence of SEQ ID NO: 37, and
dd. a light chain variable region CDR3 comprising the amino acid sequence of SEQ ID NO: 38.

2. An antibody or antigen binding fragment thereof that binds to human CD103 according to claim 1, wherein
the heavy chain of the antibody or antigen binding fragment comprises the amino acid sequence of SEQ ID NO: 7 and the light chain of the antibody or antigen binding fragment comprises the amino acid sequence of SEQ ID NO: 8
or
the heavy chain of the antibody or antigen binding fragment comprises the amino acid sequence of SEQ ID NO: 15 and the light chain of the antibody or antigen binding fragment comprises the amino acid sequence of SEQ ID NO: 16
or
the heavy chain of the antibody or antigen binding fragment comprises the amino acid sequence of SEQ ID NO: 23 and the light chain of the antibody or antigen binding fragment comprises the amino acid sequence of SEQ ID NO: 24
or
the heavy chain of the antibody or antigen binding fragment comprises the amino acid sequence of SEQ ID NO: 31 and the light chain of the antibody or antigen binding fragment comprises the amino acid sequence of SEQ ID NO: 32
or
the heavy chain of the antibody or antigen binding fragment comprises the amino acid sequence of SEQ ID NO: 39 and the light chain of the antibody or antigen binding fragment comprises the amino acid sequence of SEQ ID NO: 40.

3. The antibody or antigen binding fragment of claim 1, wherein the antibody is an intact IgG, an scFv an Fab or an $F(ab')_2$.

4. The antibody or antigen binding fragment of claim 1, wherein the antibody comprises a wild-type or mutated IgG2 Fc region.

5. The antibody or antigen binding fragment of claim 1, wherein the antibody comprises a mutated IgG1 Fc region.

6. The antibody or antigen binding fragment of claim 1, wherein the antibody comprises a mutated IgG4 Fc region.

7. An antibody or antigen binding fragment thereof that binds to the same epitope of human CD103 as an antibody as an antibody according to claim 1.

8. The antibody or antigen binding fragment of claim 1, wherein the antibody or antigen binding fragment is humanized.

9. One or more nucleic acids encoding an antibody according to claim 1.

10. An expression system comprising one or more nucleic acids encoding an antibody according to claim 9 and regulatory sequences operably connected thereto configured to express the antibody in a host cell.

11. A host cell comprising expression system of claim 10.

12. The host cell of claim 11, which is a bacterial cell, a human cell, a mammalian cell, a Pichia cell, a plant cell, an HEK293 cell, or a Chinese hamster ovary cell.

13. A composition comprising the antibody or antigen binding fragment of claim 1 and a pharmaceutically acceptable carrier or diluent.

14. A method of producing an antibody or antigen binding fragment comprising:
culturing a host cell comprising a polynucleotide encoding the heavy chain and/or the light chain of antibody or antigen binding fragment of claim 1 under conditions favorable to expression of the polynucleotide; and optionally, recovering the antibody or antigen binding fragment from the host cell and/or culture medium.

15. A method for detecting the presence of CD103 in a biological specimen comprising contacting the specimen with an anti-CD103 antibody of claim 1 or antigen binding fragment thereof; and
detecting the presence or amount of binding of the antibody or antigen binding fragment in a complex with CD103 present in the biological specimen, wherein detection of the complex indicates the presence or amount of CD103 present in the biological specimen.

16. A method according to claim 15, wherein the antibody or antigen binding fragment comprises a diagnostic label.

17. A method according to claim 16, wherein the detecting step comprises performing PET imaging, single-photon emission computed tomography (SPECT) imaging, MRI, optical imaging, or (photo) acoustic imaging.

18. A method according to claim 17, wherein the diagnostic label is selected from the group consisting of $^{11}$C, $^{13}$N, $^{15}$O, $^{99m}$Tc, $^{61}$Cu, $^{62}$Cu, $^{64}$Cu, $^{67}$Cu, $^{18}$F, $^{19}$F, $^{66}$Ga, $^{67}$Ga, $^{68}$Ga, $^{72}$Ga, $^{123}$I, $^{124}$I, $^{111}$In, $^{177}$Lu, $^{44}$Sc, $^{47}$Sc, $^{86}$Y, $^{88}$Y, $^{90}$Y, $^{45}$Ti, $^{89}$Zr, indocyanine green, IRDye 800CW, fluorescein (FITC), and a magnetic (e.g., iron oxide) nanoparticle.

19. A method according to claim 14, wherein the antibody or antigen binding fragment does not block CD103 binding to E-cadherin.

20. A method according to claim 14, wherein the antibody or antigen binding fragment at least partially blocks CD103 binding to E-cadherin.

21. A method according to claim 14, wherein the detecting step comprises an in vivo imaging method for detecting the complex.

22. A method according to claim 21, wherein the detecting step comprises an in vivo imaging method for detecting the complex in a tumor.

23. An imaging agent, comprising:
a detectably labeled anti-CD103 antibody according to claim 1 or antigen binding fragment thereof.

24. An imaging agent according to claim 23, wherein the antibody is an anti-CD103 antibody of claim 1 or antigen binding fragment thereof that is detectably labeled by a label selected from the group consisting of $^{11}$C, $^{13}$N, $^{15}$O, $^{99m}$Tc, $^{61}$Cu, $^{62}$Cu, $^{64}$Cu, $^{67}$Cu, $^{18}$F, $^{19}$F, $^{66}$Ga, $^{67}$Ga, $^{68}$Ga, $^{72}$Ga, $^{123}$I, $^{124}$I, $^{111}$In, $^{177}$Lu, $^{44}$Sc, $^{47}$Sc, $^{86}$Y, $^{88}$Y, $^{90}$Y, $^{45}$Ti, $^{89}$Zr, indocyanine green, IRDye 800CW, fluorescein (FITC), and a magnetic (e.g., iron oxide) nanoparticle.

25. A method for treating or preventing cancer in an individual in need thereof, comprising:
administering an effective amount of an anti-CD103 antibody of claim 1 or antigen binding fragment thereof to the individual wherein the anti-CD103 antibody is optionally coupled to a cytotoxic agent.

26. A method for inhibiting CD103 signaling in a cell, comprising:
contacting the cell with an anti-CD103 antibody of claim 1 or antigen binding fragment thereof.

27. A method for inhibiting CD103 binding to E-cadherin present on a cell, comprising:
contacting the cell with an anti-CD103 antibody of claim 1 or antigen binding fragment thereof.

28. A method for depleting CD103-expressing cells in an individual, comprising:
administering an effective amount of an anti-CD103 antibody of claim 1 or antigen binding fragment thereof to the individual, wherein the anti-CD103 antibody is optionally coupled to a cytotoxic agent.

29. A method for treating an autoimmune or inflammatory condition in an individual in need thereof, comprising:
administering an effective amount of an anti-CD103 antibody of claim 1 or antigen binding fragment thereof to the individual wherein the anti-CD103 antibody is optionally coupled to a cytotoxic agent.

30. The antibody or antigen binding fragment of claim 1, wherein the antibody or antigen binding fragment comprises
the heavy chain variable region CDR1 comprising the amino acid sequence of SEQ ID NO: 1,
the heavy chain variable region CDR2 comprising the amino acid sequence of SEQ ID NO: 2,
the heavy chain variable region CDR3 comprising the amino acid sequence of SEQ ID NO: 3,
the light chain variable region CDR1 comprising the amino acid sequence of SEQ ID NO: 4,
the light chain variable region CDR2 comprising the amino acid sequence of SEQ ID NO: 5, and
the light chain variable region CDR3 comprising the amino acid sequence of SEQ ID NO: 6.

31. The antibody or antigen binding fragment of claim 1, wherein the antibody or antigen binding fragment comprises
the heavy chain variable region CDR1 comprising the amino acid sequence of SEQ ID NO: 9,
the heavy chain variable region CDR2 comprising the amino acid sequence of SEQ ID NO: 10,
the heavy chain variable region CDR3 comprising the amino acid sequence of SEQ ID NO: 11,
the light chain variable region CDR1 comprising the amino acid sequence of SEQ ID NO: 12,
the light chain variable region CDR2 comprising the amino acid sequence of SEQ ID NO: 13, and
the light chain variable region CDR3 comprising the amino acid sequence of SEQ ID NO: 14.

32. The antibody or antigen binding fragment of claim 1, wherein the antibody or antigen binding fragment comprises
the heavy chain variable region CDR1 comprising the amino acid sequence of SEQ ID NO: 17,
the heavy chain variable region CDR2 comprising the amino acid sequence of SEQ ID NO: 18,
the heavy chain variable region CDR3 comprising the amino acid sequence of SEQ ID NO: 19,
the light chain variable region CDR1 comprising the amino acid sequence of SEQ ID NO: 20,
the light chain variable region CDR2 comprising the amino acid sequence of SEQ ID NO: 21, and
the light chain variable region CDR3 comprising the amino acid sequence of SEQ ID NO: 22.

33. The antibody or antigen binding fragment of claim 1, wherein the antibody or antigen binding fragment comprises
the heavy chain variable region CDR1 comprising the amino acid sequence of SEQ ID NO: 25,
the heavy chain variable region CDR2 comprising the amino acid sequence of SEQ ID NO: 26,
the heavy chain variable region CDR3 comprising the amino acid sequence of SEQ ID NO: 27,
the light chain variable region CDR1 comprising the amino acid sequence of SEQ ID NO: 28,
the light chain variable region CDR2 comprising the amino acid sequence of SEQ ID NO: 29, and
the light chain variable region CDR3 comprising the amino acid sequence of SEQ ID NO: 30.

34. The antibody or antigen binding fragment of claim 1, wherein the antibody or antigen binding fragment comprises
the heavy chain variable region CDR1 comprising the amino acid sequence of SEQ ID NO: 33,
the heavy chain variable region CDR2 comprising the amino acid sequence of SEQ ID NO: 34,
the heavy chain variable region CDR3 comprising the amino acid sequence of SEQ ID NO: 35,
the light chain variable region CDR1 comprising the amino acid sequence of SEQ ID NO: 36,
the light chain variable region CDR2 comprising the amino acid sequence of SEQ ID NO: 37, and
the light chain variable region CDR3 comprising the amino acid sequence of SEQ ID NO: 38.

* * * * *